(12) United States Patent
Murase et al.

(10) Patent No.: US 8,610,345 B2
(45) Date of Patent: Dec. 17, 2013

(54) LIGHT-EMITTING DEVICE MATERIAL AND LIGHT-EMITTING DEVICE

(75) Inventors: Seiichiro Murase, Otsu (JP); Kazumasa Nagao, Otsu (JP); Kazunori Sugimoto, Otsu (JP); Takeshi Ishigaki, Kamakura (JP); Takafumi Ogawa, Otsu (JP)

(73) Assignee: TORAY Industries, Inc., Tokyo (JP)

( * ) Notice: Subject to any disclaimer, the term of this patent is extended or adjusted under 35 U.S.C. 154(b) by 957 days.

(21) Appl. No.: 11/991,461

(22) PCT Filed: Sep. 8, 2006

(86) PCT No.: PCT/JP2006/317810
§ 371 (c)(1),
(2), (4) Date: Mar. 26, 2008

(87) PCT Pub. No.: WO2007/029798
PCT Pub. Date: Mar. 15, 2007

(65) Prior Publication Data
US 2009/0096356 A1    Apr. 16, 2009

(30) Foreign Application Priority Data

Sep. 8, 2005    (JP) .................................. 2005-260247
Sep. 13, 2005   (JP) .................................. 2005-264773

(51) Int. Cl.
*C09K 11/06* (2006.01)
*H05B 33/14* (2006.01)
*H01L 51/54* (2006.01)

(52) U.S. Cl.
USPC ........... 313/504; 313/506; 428/690; 428/917; 257/40; 257/E51.049

(58) Field of Classification Search
None
See application file for complete search history.

(56) References Cited

U.S. PATENT DOCUMENTS

| | | | | |
|---|---|---|---|---|
| 4,769,292 | A * | 9/1988 | Tang et al. .................... | 428/690 |
| 6,660,410 | B2 * | 12/2003 | Hosokawa .................... | 428/690 |
| 2003/0186081 | A1 * | 10/2003 | Sotoyama et al. ............ | 428/690 |
| 2004/0076852 | A1 | 4/2004 | Cheng et al. .................. | 428/690 |
| 2005/0079385 | A1 * | 4/2005 | Nomura et al. ............... | 428/690 |
| 2006/0051613 | A1 * | 3/2006 | Tomita et al. ................ | 428/690 |
| 2006/0115678 | A1 * | 6/2006 | Saitoh et al. ................. | 428/690 |
| 2006/0177691 | A1 * | 8/2006 | Tai et al. ...................... | 428/690 |
| 2006/0240283 | A1 * | 10/2006 | Tai et al. ...................... | 428/690 |
| 2009/0131673 | A1 | 5/2009 | Tanabe et al. ................ | 546/88 |

FOREIGN PATENT DOCUMENTS

| | | |
|---|---|---|
| CN | 1673312 | 6/2009 |
| EP | 1 345 278 A2 | 9/2003 |
| EP | 1 533 290 A1 | 5/2005 |
| EP | 1 621 597 A1 | 2/2006 |
| JP | 2000-273056 A | 10/2000 |
| JP | 2002-63988 A | 2/2002 |
| JP | 2003-138251 A | 5/2003 |
| JP | 2003-272864 A | 9/2003 |
| JP | 2004-75567 A | 3/2004 |
| JP | 2004-139957 A | 5/2004 |
| JP | 2006-151845 A | 6/2006 |
| WO | 2004/096945 | 11/2004 |
| WO | 2006/043539 A1 | 4/2006 |
| WO | 2007/004799 A1 | 1/2007 |

OTHER PUBLICATIONS

Inoue et al., JP (2005)-206551, Machine Assisted Translation.*

(Continued)

*Primary Examiner* — Jennifer Chriss
*Assistant Examiner* — Brett A Crouse
(74) *Attorney, Agent, or Firm* — Kubovcik & Kubovcik

(57) ABSTRACT

A light emitting device material containing a pyrene compound of formula (1) and a light emitting device. In formula (1), $R^1$ to $R^{18}$ are the same or different and are selected from hydrogen, alkyl, cycloalkyl, heterocyclic, alkenyl, cycloalkenyl, alkynyl, alkoxy, alkylthio, arylether, arylthioether, aryl, heteroaryl, halogen, carbonyl, carboxyl, oxycarbonyl, carbamoyl, amino, phosphine oxide and silyl; adjacent substituents among $R^1$ to $R^{18}$ may be combined with each other to form a ring; n represents an integer of 1 to 3; X is —O—, —S— or —$NR^{19}$—; $R^{19}$ is selected from hydrogen, alkyl, cycloalkyl, heterocyclic, alkenyl, cycloalkenyl, alkynyl, aryl, heteroaryl or amino; $R^{19}$ may be combined with $R^{11}$ or $R^{18}$ to form a ring; Y is a single bond, arylene or heteroarylene; and n substituents among $R^1$ to $R^{10}$ and any one of $R^{11}$ to $R^{19}$ are used for linkage with Y

[Chemical Formula 1]

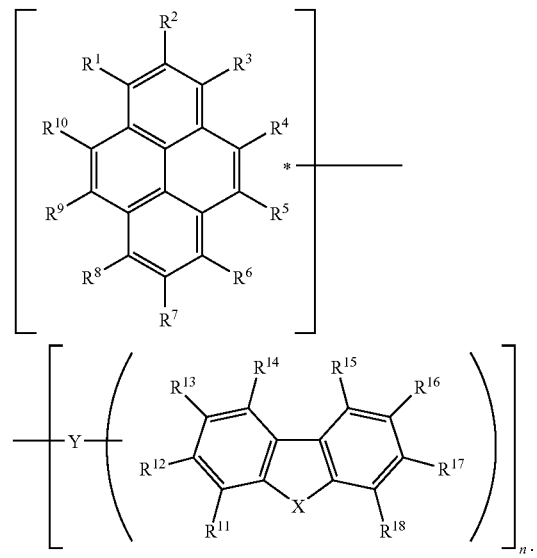

(1)

6 Claims, No Drawings

(56) References Cited

OTHER PUBLICATIONS

Xing Y et al. "Carbazole-pyrene-based organic emitters for electroluminescent devise" Chemical Physics Letters, vol. 408, pp. 169-173 (2005).

C.W. Tang et al., "Organic Electroluminescent Diodes," Applied Physics Letters, vol. 51, No. 12, Sep. 21, 1987, pp. 913-915.

U.S. Appl. No. 11/817,143, filed Feb. 23, 2006, Kazuo Sugimoto et al.

Office Action issued May 29, 2012, in European Patent Appln. No. 06 797 666-2-2111.

* cited by examiner

LIGHT-EMITTING DEVICE MATERIAL AND LIGHT-EMITTING DEVICE

This application is a 371 of international application PCT/JP2006/317810 filed Sep. 8, 2006, which claims priority based on Japanese patent application Nos. 2005-260247 and 2005-264773 filed Sep. 8 and Sep. 13, 2005, respectively, each of which is incorporated herein by reference.

TECHNICAL FIELD

The present invention relates to a light emitting device material which is useful as a fluorescent dye and a charge transporting material, and a light emitting device using the same. The light emitting device of the present invention can be applied to the fields of display elements, flat panel displays, backlights, illuminations, interiors, signs, billboards, electrophotographic machines and optical signal generators.

BACKGROUND ART

There has recently been made an intensive study on an organic thin-film light emitting device wherein light is emitted when electrons injected from a cathode and holes injected from an anode are recombined in an organic luminous body interposed between both electrodes. Intense interest has been shown toward this light emitting device because of such a feature that it is thin and enables high-luminance light emission under a low driving voltage and multicolor light emission by selection of an emissive material.

Since technology of enabling high-luminance light emission using an organic thin-film light emitting device was found by C. W. Tang et al. of Eastman Kodak Company, a lot of research organizations have studied this technology. A typical constitution of an organic thin-film light emitting device proposed by Eastman Kodak Company is that a diamine compound having hole transporting properties, an emissive layer made of tris(8-quinolinolate)aluminum(III) and a cathode made of a Mg—Ag alloy are sequentially formed on an ITO glass substrate, which enables green light emission of 1,000 cd/m² at a driving voltage of about 10 V (see Non Patent Document 1).

Since the organic thin-film light emitting device enables various color light emissions by using various fluorescent materials as an emissive layer, a study on its practical use as a display has intensively been made. A most advanced study is a study on a green emissive material among emissive materials of three primary colors. At present, a study on a red emissive material and a blue emissive material has intensively made for the purpose of improving characteristics.

One of the largest problems in the organic thin-film light emitting device is to enhance durability of an element. With respect to a blue light emitting device, there are few blue emissive materials having excellent durability and high reliability. For example, blue light emitting devices using a pyrene compound substituted with an aryl group are disclosed (see Patent Documents 1 to 5). There is also disclosed an example using a pyrene compound having four carbazolyl groups (see Patent Document 6) in the blue light emitting device. However, any blue light emitting device is insufficient in durability.

Patent Document 1: Japanese Unexamined Patent Publication (Kokai) No. 2000-273056 (claims 1 to 2)
Patent Document 2: Japanese Unexamined Patent Publication (Kokai) No. 2002-63988 (claim 1)
Patent Document 3: WO2004/096945 pamphlet (patent claims)
Patent Document 4: Japanese Unexamined Patent Publication (Kokai) No. 2004-75567 (claims 1 to 4)
Patent Document 5: Japanese Unexamined Patent Publication (Kokai) No. 2004-139957 (claim 1)
Patent Document 6: Japanese Unexamined Patent Publication (Kokai) No. 2003-272864 (claim 1)
Non Patent Document 1: Applied Physics Letters, USA, 1987, Vol. 51, No. 12, pp. 913-915

DISCLOSURE OF THE INVENTION

As described above, according to a conventional organic thin-film light emitting device, a blue light emitting device having high luminance efficiency and excellent durability has never been provided. Thus, an object of the present invention is to solve the problems of the prior art and to provide a light emitting device material which enables production of a blue light emitting device having high luminance efficiency and excellent durability, and a light emitting device using the same.

The present invention pertains to a pyrene compound represented by the general formula (1):

[Chemical Formula 1]

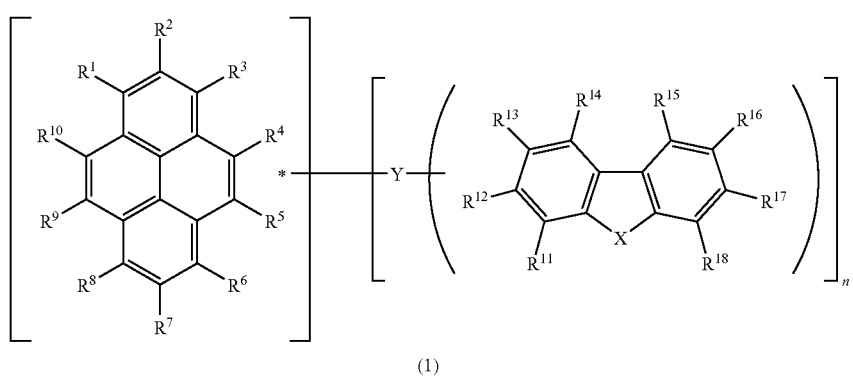

(1)

wherein $R^1$ to $R^{18}$ may be the same or different and represent a group selected from hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, a phosphine oxide group and a silyl group; adjacent substituents among $R^1$ to $R^{18}$ may be combined with each other to form a ring; n represents an integer of 1 to 3; X represents a group selected from —O—, —S— and —$NR^{19}$—; $R^{19}$ represents a group selected from hydrogen, an alkyl group, a cycloalkyl group, a heterocyclic group, an alkenyl group, a cycloalkenyl group, an alkynyl group, an aryl group, a heteroaryl group and an amino group; $R^{19}$ may be combined with $R^{11}$ or $R^{18}$ to form a ring; Y represents a single bond, an arylene group or a heteroarylene group; and n substituents among $R^1$ to $R^{10}$ and any one of $R^{11}$ to $R^{19}$ are used for linkage with Y.

Also, the present invention pertains to a light emitting device comprising an anode, a cathode and an organic layer existing between the anode and the cathode, the organic layer containing at least an emissive layer, the emissive layer emitting light by electric energy, wherein the organic layer contains a pyrene compound represented by the general formula (1).

Effect of the Invention

The light emitting device of the present invention material can provide a light emitting device material which can be utilized in a light emitting device and is excellent in thin-film stability. According to the present invention, a light emitting device having high luminance efficiency and excellent durability can be obtained.

BEST MODE FOR CARRYING OUT THE INVENTION

The pyrene compound represented by the general formula (1) is described.

aromatic hydrocarbon group such as a phenyl group, a naphthyl group, a biphenyl group, a phenanthryl group, a terphenyl group or a pyrenyl group, and may have a substituent or not The number of carbon atoms of the arylene group is not specifically limited and is usually within a range from 6 to 40. The number of the arylene group is more preferably within a range from 6 to 12, including a substituent.

The heteroarylene group represents a divalent group derived from an aromatic group having one or plural atom(s) other than a carbon atom in the ring, such as a pyridyl group, a quinolinyl group, a pyrazinyl group, a naphthyridyl group, a dibenzofuranyl group, a dibenzothiophenyl group or a carbazolyl group, and may have a substituent or not. The number of the heteroarylene groups is not specifically limited and is usually within a range from 2 to 30, and more preferably from 2 to 12, including a substituent.

In the general formula (1), $R^1$ to $R^{18}$ may be the same or different and represents a group selected from hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, a phosphine oxide group and a silyl group. Adjacent substituents among $R^1$ to $R^{18}$ may be combined to form a ring.

At least one of $R^1$ to $R^{10}$ is preferably an aryl group or a heteroaryl group.

X is a group selected from —O—, —S— and —$NR^{19}$—. $R^{19}$ is a group selected from hydrogen, an alkyl group, a cycloalkyl group, a heterocyclic group, an alkenyl group, a cycloalkenyl group, an alkynyl group, an aryl group, a heteroaryl group and an amino group. $R^{19}$ may be combined with $R^{11}$ or $R^{18}$ to form a ring.

[Chemical Formula 2]

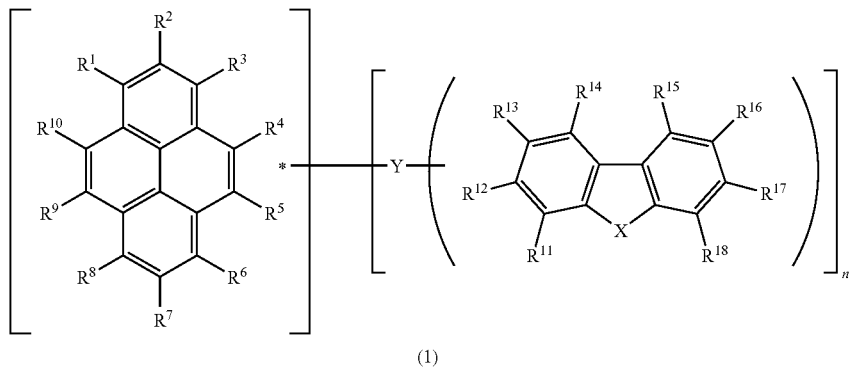

(1)

The pyrene compound represented by the general formula (1) has a pyrene skeleton and one to three groups selected from electrons donative fused aromatic groups such as a dibenzofuran group, a dibenzothiophene group and a carbazole group, and both are linked through a linking group Y. The pyrene compound has high thin-film stability and excellent heat resistance since it has such a structure. When n is 4 or more in the general formula (1), thin-film stability and heat resistance deteriorate. n is preferably within a range from 1 to 2 in the general formula (1) since thin-film stability and heat resistance are more excellent.

The linking group Y is a single bond, an arylene group or a heteroarylene group. The linking group Y is preferably an arylene group or a heteroarylene group. As used herein, the arylene group represents a divalent group derived from an N substituents of $R^1$ to $R^{10}$ and at least one of $R^{11}$ to $R^{19}$ are used for linkage with Y. At least one of $R^1$, $R^3$, $R^6$ and $R^8$ is preferably used for linkage with Y.

Of these substituents, the alkyl group represents a saturated aliphatic hydrocarbon group such as a methyl group, an ethyl group, an n-propyl group, an isopropyl group, an n-butyl group, a sec-butyl group or a tert-butyl group, and may have a substituent or not. When substituted, an additional substituent is not specifically limited and includes, for example, an alkyl group, an aryl group and a heteroaryl group, and this respect is common to the description below. The number of carbon atoms of the alkyl group is not specifically limited, and is usually 1 or more and 20 or less, and more preferably 1 or more and 8 or less, in view of ease of availability and cost.

The cycloalkyl group represents a saturated alicyclic hydrocarbon group such as cyclopropyl, cyclohexyl, norbornyl or adamantyl, and may have a substituent or not. The number of carbon atoms of the cycloalkyl group is not specifically limited, and is usually 3 or more and 20 or less.

The heterocyclic group represents an aliphatic ring having an atom other than a carbon atoms in the ring, such as a pyran ring, a piperidine ring or a cyclic amide, and may have a substituent or not. The number of carbon atoms of the heterocyclic group is not specifically limited, and is usually 2 or more and 20 or less.

The alkenyl group represents a double bond-containing unsaturated aliphatic hydrocarbon group such as a vinyl group, an allyl group or a butadienyl group, and may have a substituent or not. The number of carbon atoms of the alkenyl group is not specifically limited, and is usually within a range from 2 to 20.

The cycloalkenyl group represents a double bond-containing unsaturated alicyclic hydrocarbon group such as a cyclopentenyl group, a cyclopentadienyl group or a cyclohexenyl group, and may have a substituent or not. The number of carbon atoms of the cycloalkenyl group is not specifically limited, and is usually 3 or more and 20 or less.

The alkynyl group represents a triple bond-containing unsaturated aliphatic hydrocarbon group such as an ethynyl group, and may have a substituent or not. The number of carbon atoms of the alkynyl group is not specifically limited, and is usually within a range from 2 to 20.

The alkoxy group represents a functional group linked with an aliphatic hydrocarbon group through an ether bond, such as a methoxy group, an ethoxy group, or a propoxy group, and the aliphatic hydrocarbon group may have a substituent or not. The number of carbon atoms of the alkoxy group is not specifically limited, and is usually 1 or more and 20 or less.

The alkylthio group is a group wherein an oxygen atom of an ether bond of an alkoxy group is substituted with a sulfur atom. A hydrocarbon group of the alkylthio group may have a substituent or not. The number of carbon atoms of the alkylthio group is not specifically limited, and is usually 1 or more and 20 or less.

The arylether group represents a functional group linked with an aromatic hydrocarbon group through an ether bond, such as a phenoxy group, and the aromatic hydrocarbon group may have a substituent or not. The number of carbon atoms of the arylether group is not specifically limited, and is usually 6 or more and 40 or less.

The arylthioether group is a group wherein an oxygen atom of an ether bond of an arylether group is substitute with a sulfur atom. The aromatic hydrocarbon group in the arylether group may have a substituent or not. The number of carbon atoms of the arylthioether group is not specifically limited, and is usually 6 or more and 40 or less.

The aryl group represents an aromatic hydrocarbon group such as a phenyl group, a naphthyl group, a biphenyl group, a phenanthryl group, a terphenyl group or a pyrenyl group. The aryl group may have a substituent or not. The number of carbon atoms of the aryl group is not specifically limited, and is usually within a range from 6 to 40.

The heteroaryl group represents a 6-membered ring aromatic group having one or plural atoms other than a carbon atom in the ring, such as a pyridyl group, a quinolinyl group, a pyrazinyl group or a naphthyridyl group, a dibenzofuranyl group, a dibenzothiophenyl group or a carbazolyl group, and may be substituted or not. The number of carbon atoms of the heteroaryl group is not specifically limited, and is usually within a range from 2 to 30.

The halogen atom represents fluorine, chlorine, bromine and iodine.

The carbonyl group, the carboxyl group, the oxycarbonyl group, the carbamoyl group, the amino group and the phosphine oxide group may have a substituent or not. Examples of the substituent include the above-described alkyl group, cycloalkyl group, aryl group and heteroaryl group.

The silyl group represents a functional group having a bond to a silicon atom, such as a trimethylsilyl group, and may have a substituent or not. The number of carbon atoms of the silyl group is not specifically limited, and is usually within a range from 3 to 20. The number of silicons is usually within a range from 1 to 6.

When a ring is formed of adjacent substituents, optionally adjacent two substituents (for example, $R^1$ and $R^2$ represented by the general formula (1)) can be combined with each other to form a conjugated or non-conjugated fused ring. The constituent element of the fused ring may include, in addition to carbon, elements selected from nitrogen, oxygen, sulfur, phosphorus and silicon. The fused ring may be fused with another ring.

In the pyrene compound represented by the general formula (1), at least one of $R^3$, $R^6$ and $R^8$ is preferably a group which is different from $R^1$, since molecular symmetry decreases and a good amorphous thin-film can be formed.

In the pyrene compound represented by the general formula (1), $R^1$ is preferably an aryl group or a heteroaryl group and at least one Y is preferably linked at the position of $R^6$ or $R^8$, since the interaction between pyrene compounds is suppressed and high luminance efficiency can be attained. $R^1$ is more preferably an aryl group. $R^2$ is preferably an alkyl group or a cycloalkyl group and at least one Y is preferably linked at the position of $R^6$ or $R^8$, since molecular amorphous properties are improved and a stable thin-film can be formed.

The compound represented by the general formula (1) is preferably a compound wherein X is —$NR^{19}$—, namely, an electron donative fused aromatic is a carbazole group and at least one Y is preferably linked at the position of $R^6$ or $R^8$ and $R^{19}$. Namely, the pyrene compound represented by the general formula (1) is preferably a compound represented by the general formula (2).

[Chemical Formula 3]

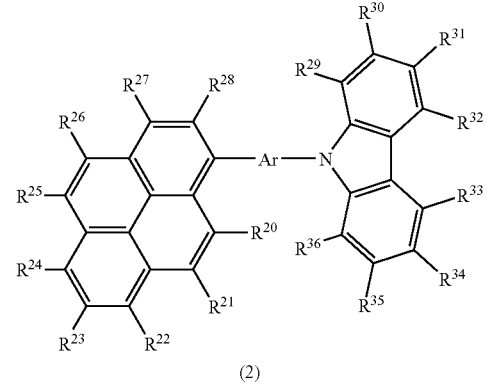

(2)

$R^{20}$ to $R^{36}$ may be the same or different and represent a group selected from hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group, a heteroaryl group, a halogen, a carbonyl group, a carboxyl group, an oxycarbonyl group, a carbamoyl group, an amino group, a phosphine oxide group and a silyl group. Adjacent substituents among $R^{20}$ to $R^{36}$ may be combined to form a ring. Ar is a single bond, an arylene group or a heteroarylene group. Ar is preferably an arylene group or a heteroarylene group.

The description of each substituent is the same as that of the general formula (1).

In the pyrene compound represented by the general formula (2), at least one of $R^{22}$ and $R^{24}$ is preferably an aryl group or a heteroaryl group since the intermolecular interaction between pyrene skeletons is suppressed and high-efficiency light emission can be attained and also a stable thin-film can be formed. $R^{24}$ is more preferably an aryl group or heteroaryl group since it becomes easy to perform a synthetic process and the cost can be reduced.

A preferred embodiment of the pyrene compound represented by the general formula (2) is that $R^{23}$ is an alkyl group or a cycloalkyl group. $R^{27}$ is more preferably an aryl group or a heteroaryl group since the intermolecular interaction is suppressed and high efficiency light emission can be attained.

Furthermore, a preferred embodiment is that at least one of $R^{11}$ to $R^{18}$ in the general formula (1) or at least one of $R^{29}$ to $R^{36}$ in the general formula (2) is a group selected from an alkyl group, a cycloalkyl group, an aryl group and a heteroaryl group. Alternatively, a preferred embodiment is that at least two adjacent substituents of $R^{11}$ to $R^{18}$ or at least two adjacent substituents of $R^{29}$ to $R^{36}$ are combined to form a ring. With such a structure, the interaction between pyrene compounds is suppressed and thus high luminance efficiency can be attained and also thin-film stability is improved, preferably.

The pyrene compound is not specifically limited and specific examples thereof include the following.

[Chemical Formula 4]

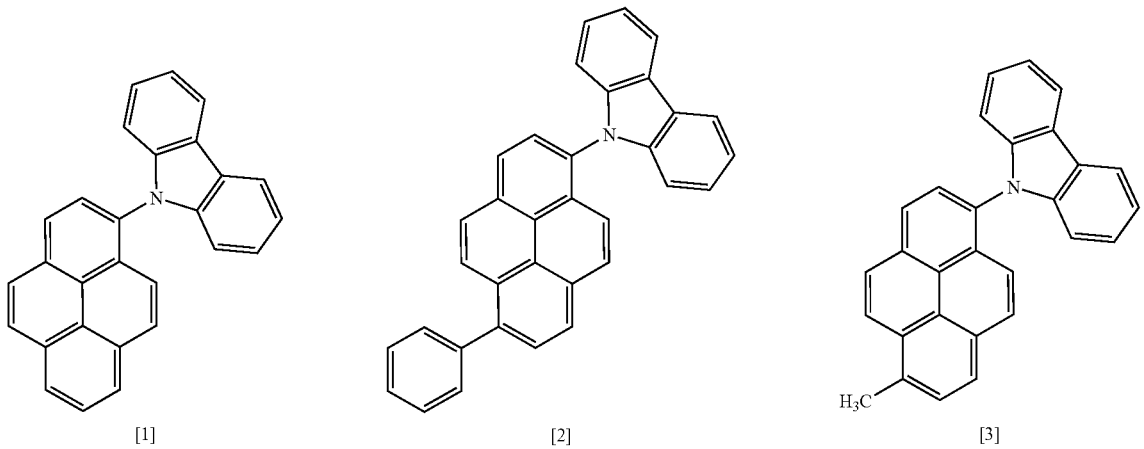

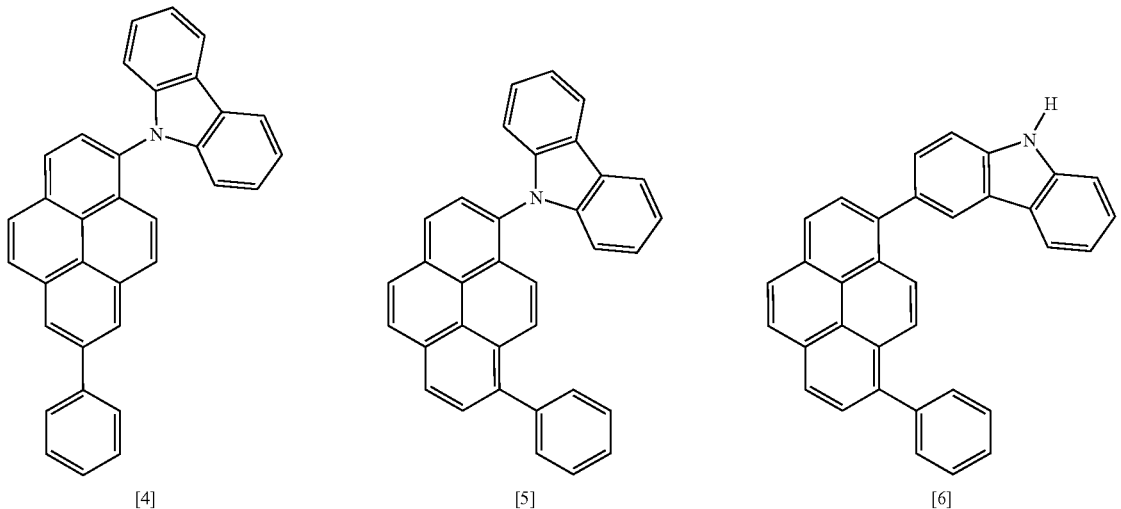

-continued
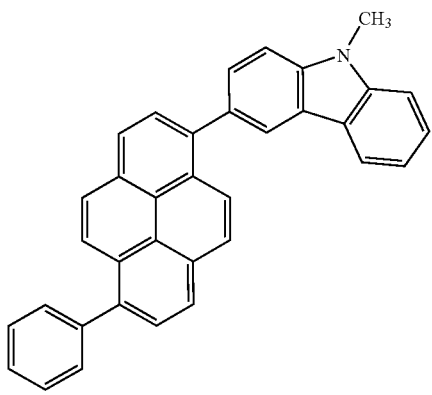
[7]
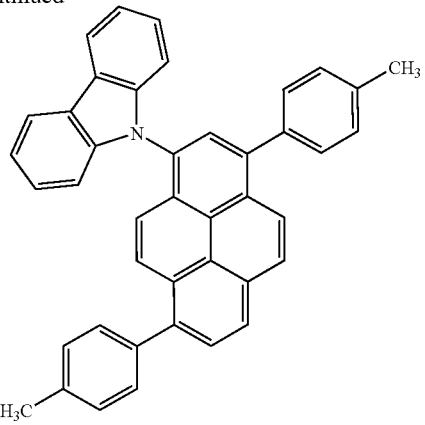
[8]
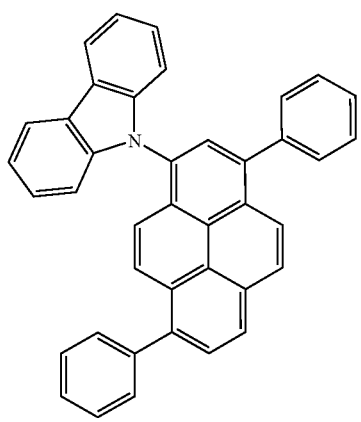
[9]
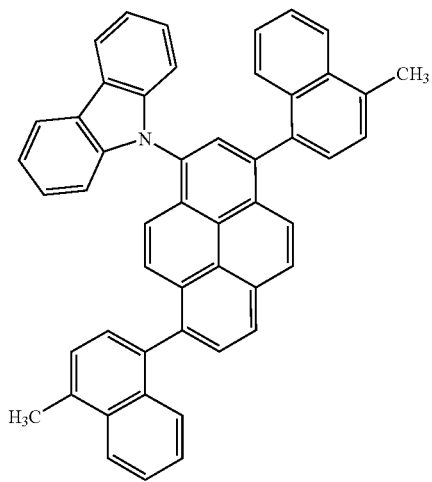
[10]
[Chemical Formula 5]
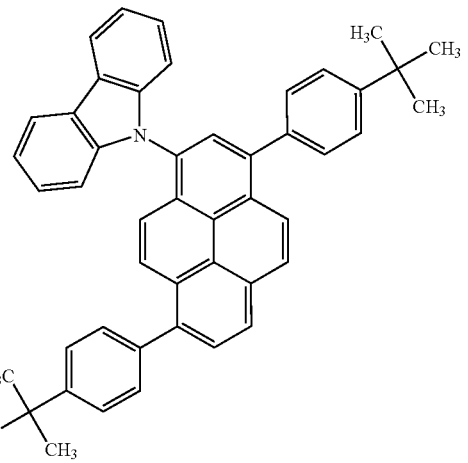
[11]

-continued
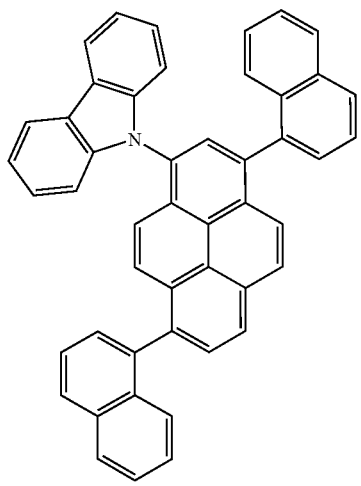
[12]
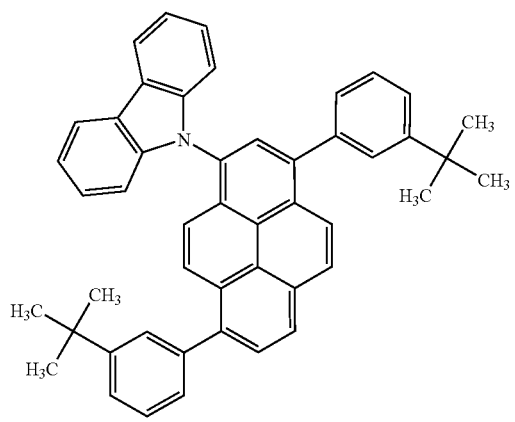
[13]
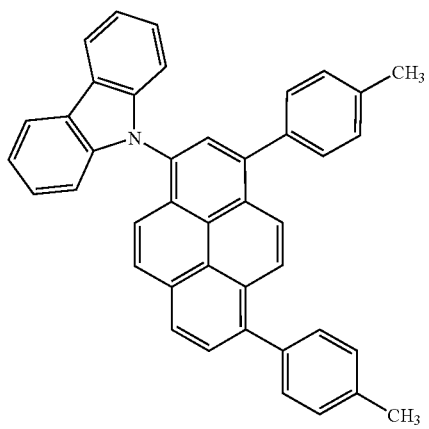
[14]
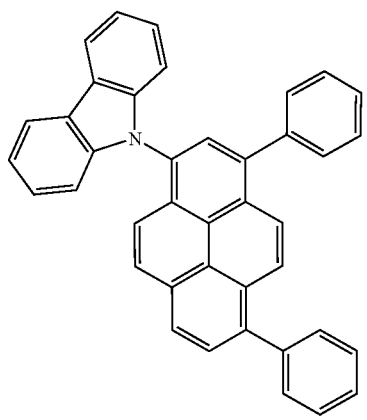
[15]
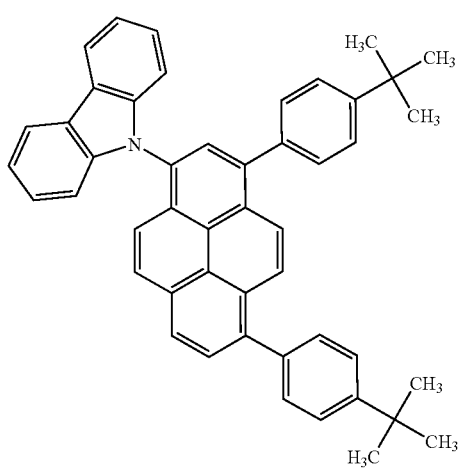
[16]
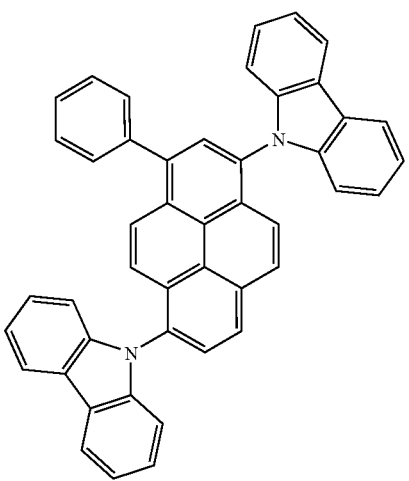
[17]

-continued
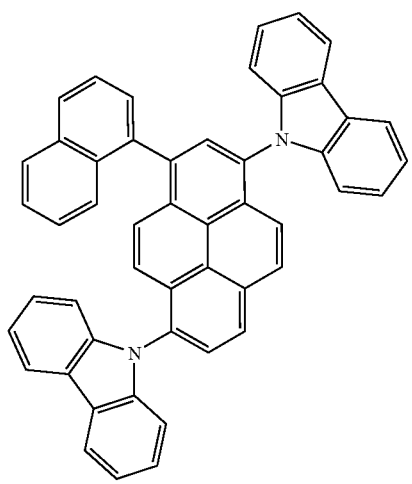
[18]
[Chemical Formula 6]
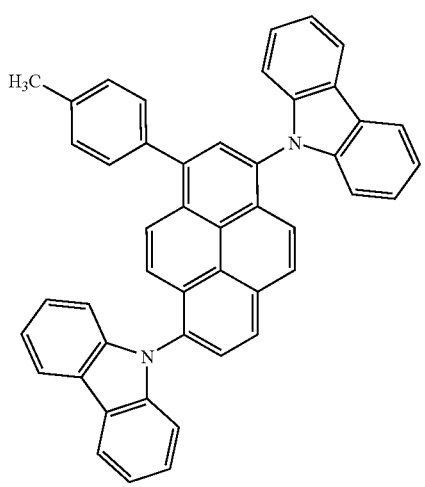
[19]
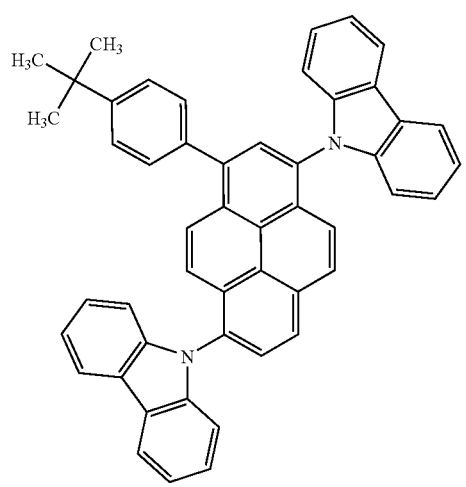
[20]
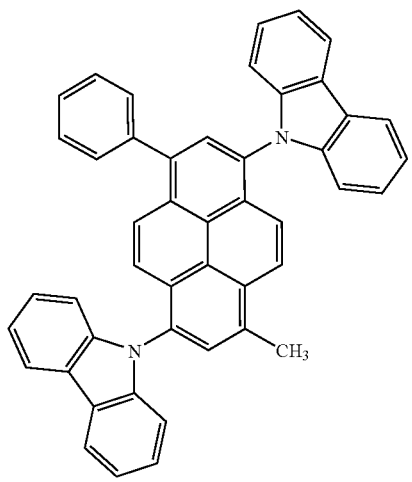
[21]
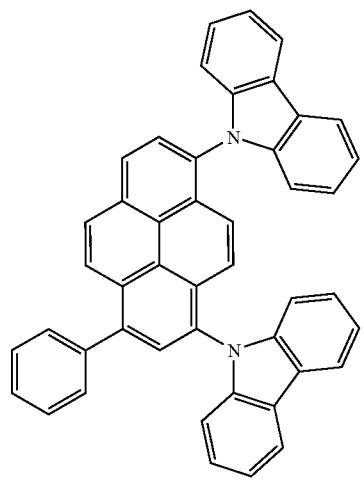
[22]

-continued
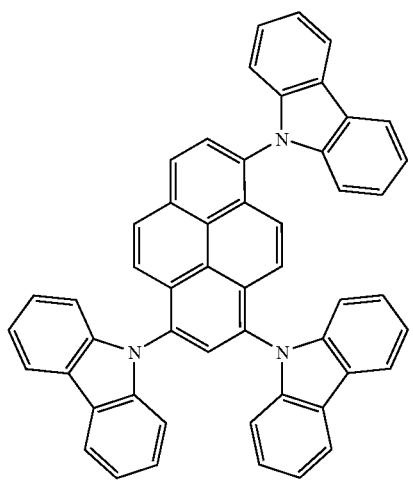
[23]
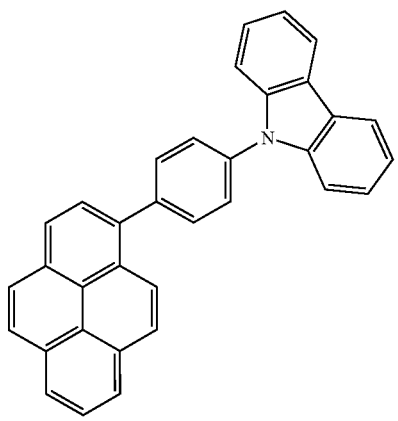
[24]
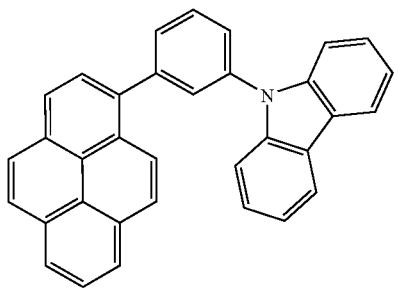
[25]
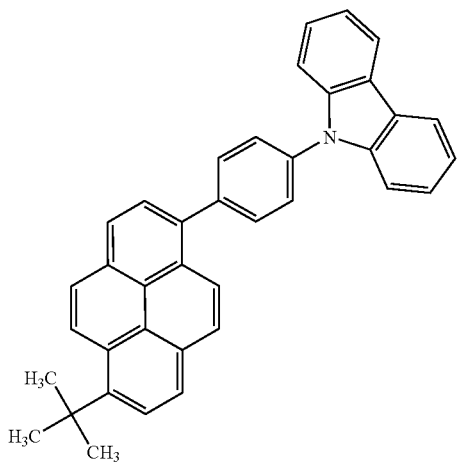
[26]
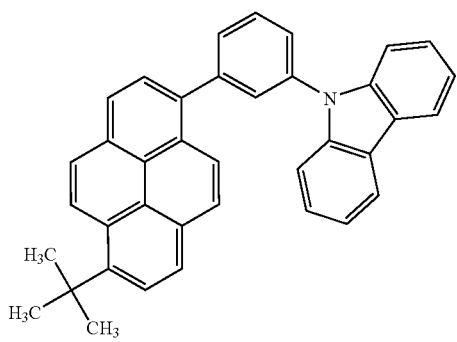
[27]

-continued
[Chemical Formula 7]
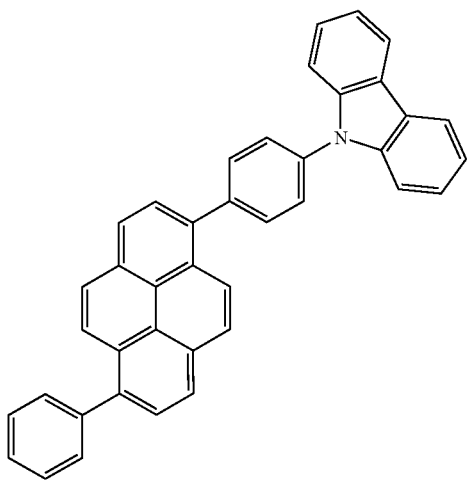
[28]
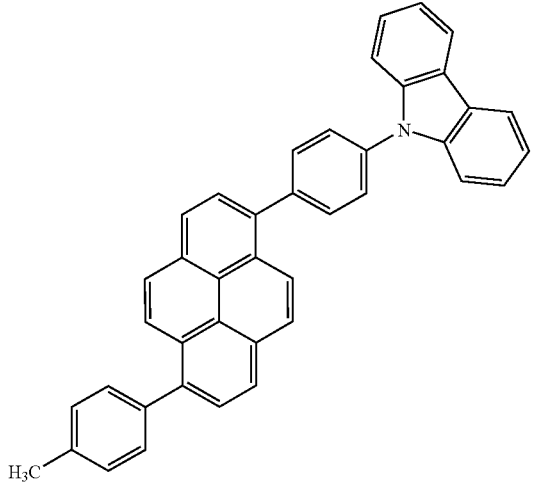
[29]
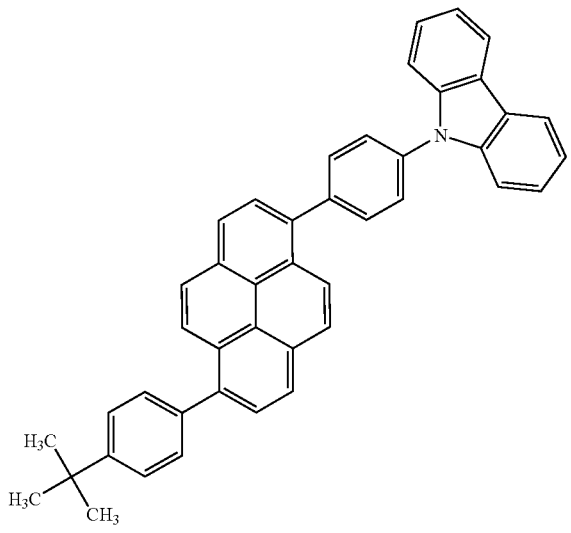
[30]
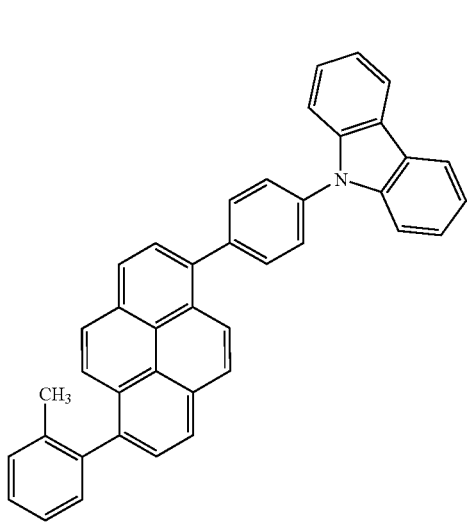
[31]
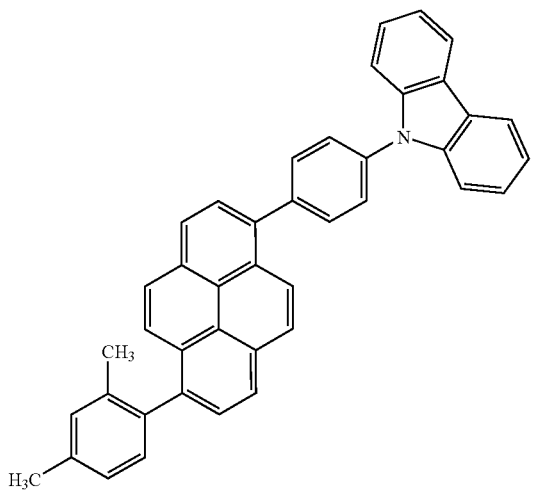
[32]
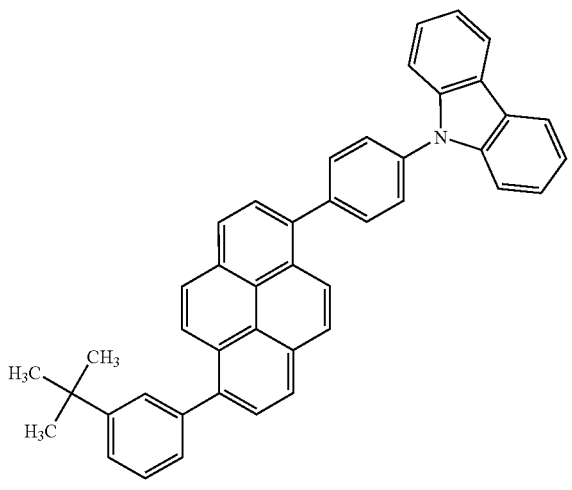
[33]

-continued
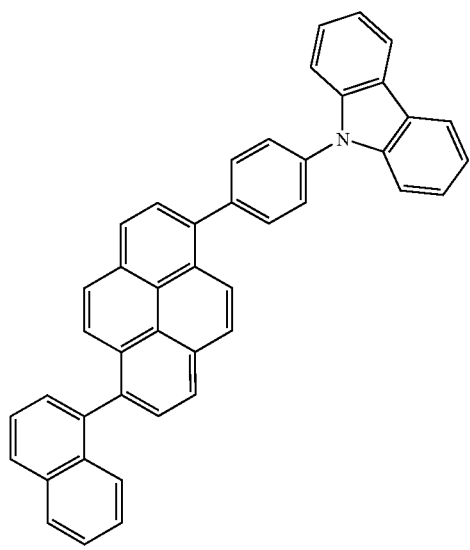
[34]
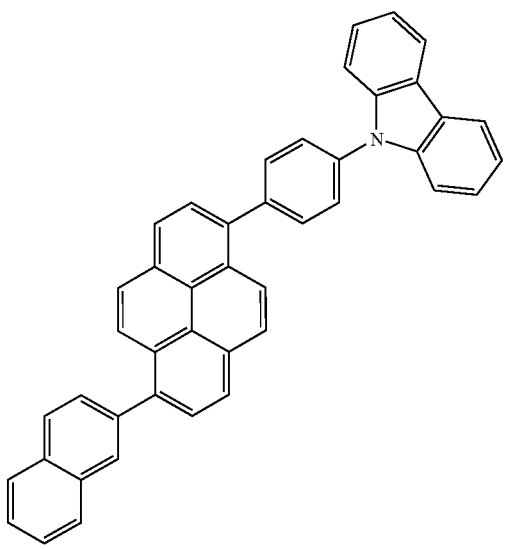
[35]
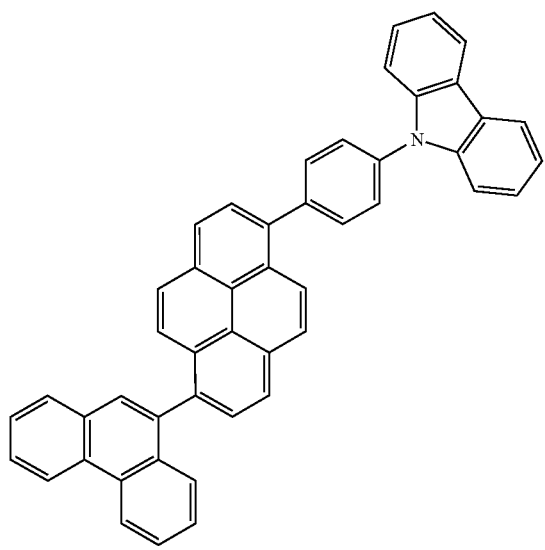
[36]

-continued
[Chemical Formula 8]
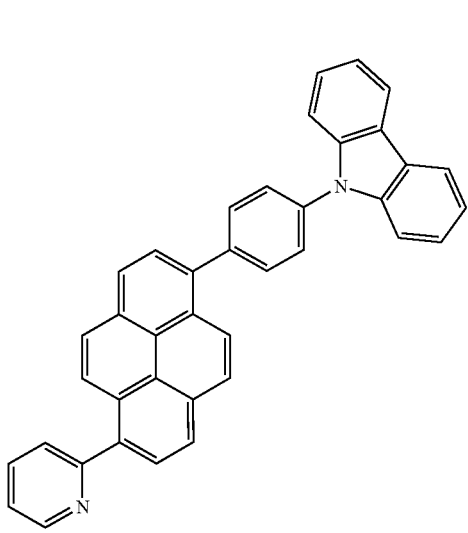
[37]
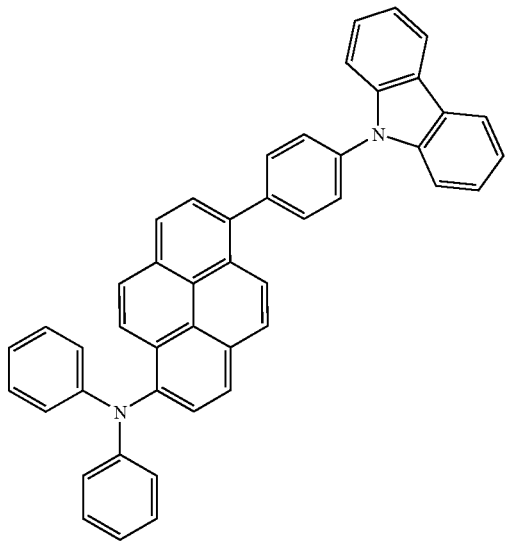
[38]
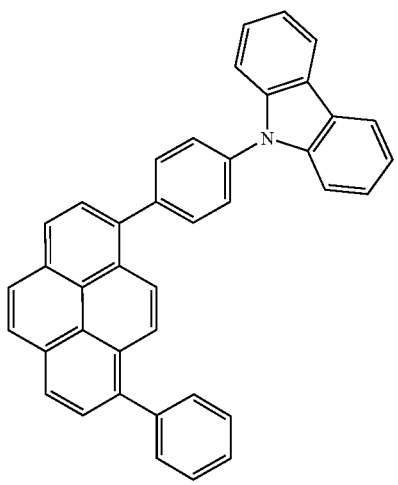
[39]
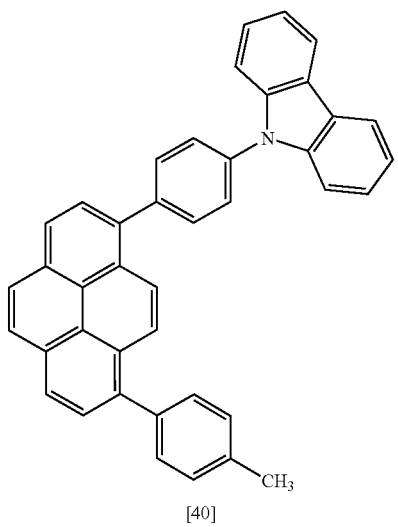
[40]
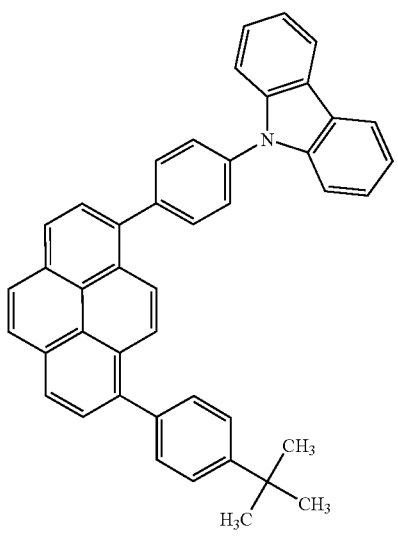
[41]
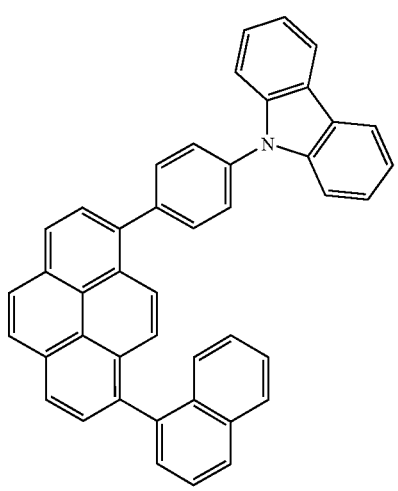
[42]

-continued
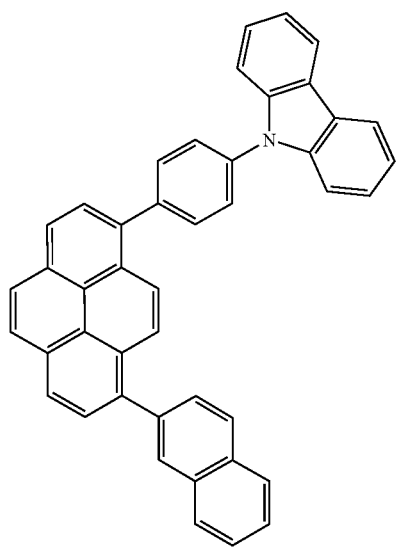
[43]
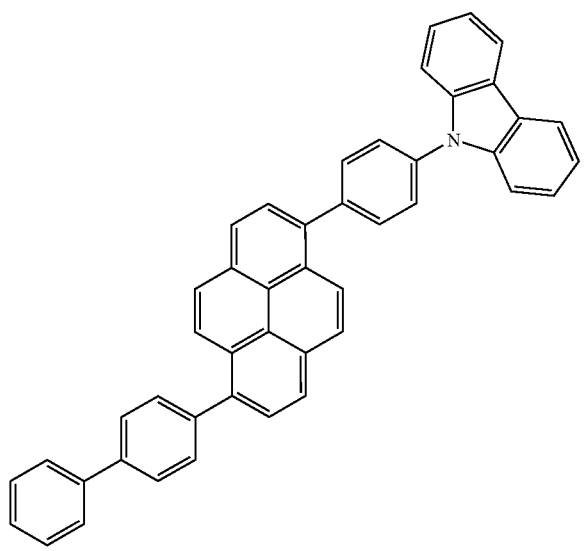
[44]
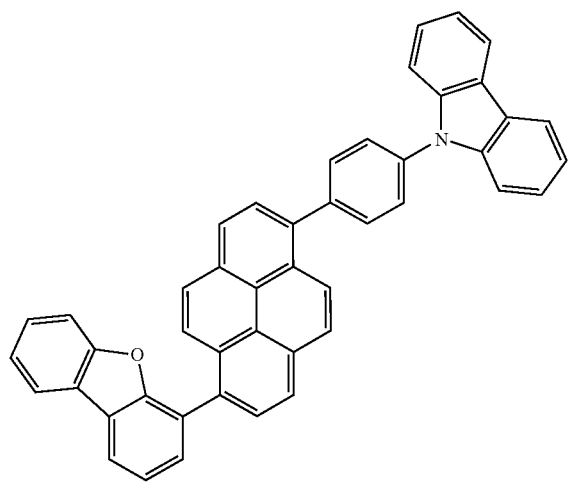
[45]
[Chemical Formula 9]
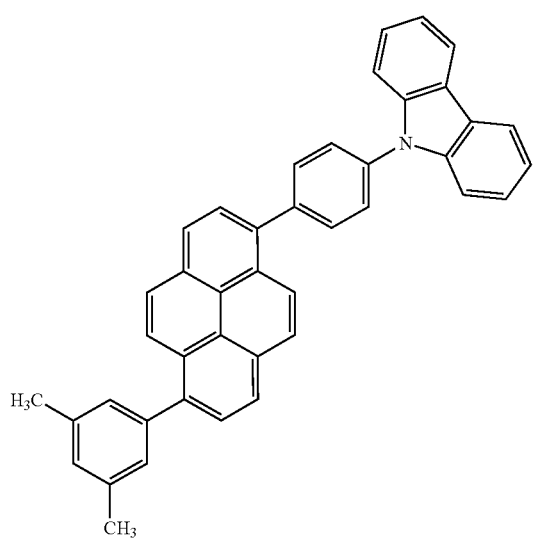
[46]
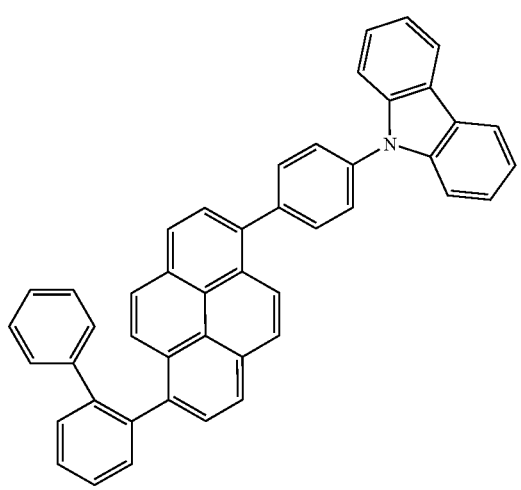
[47]

-continued
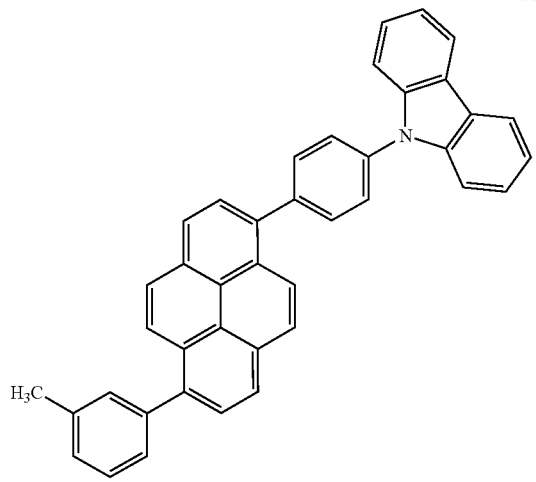
[48]
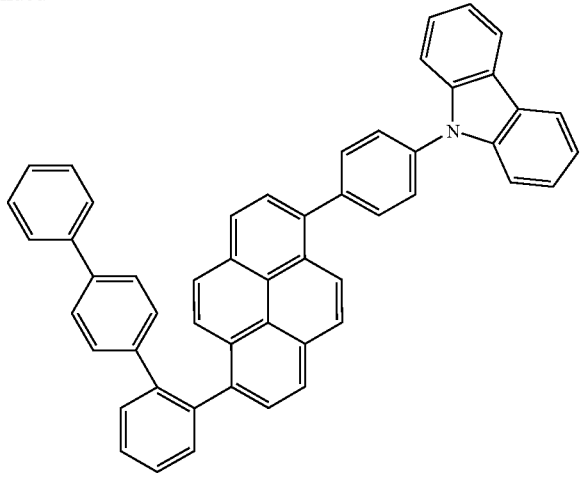
[49]
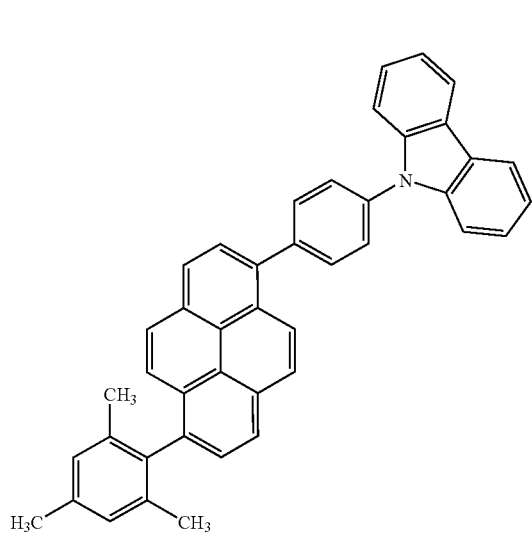
[50]
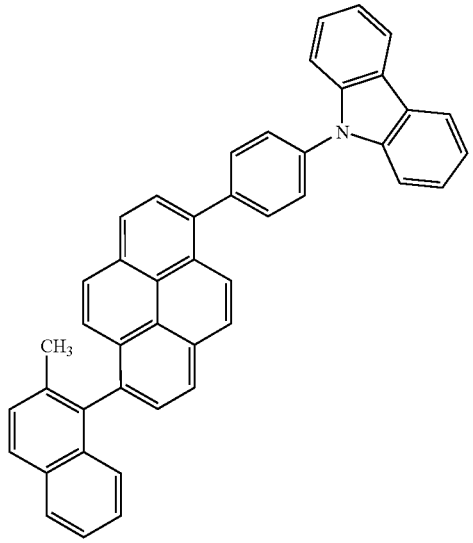
[51]
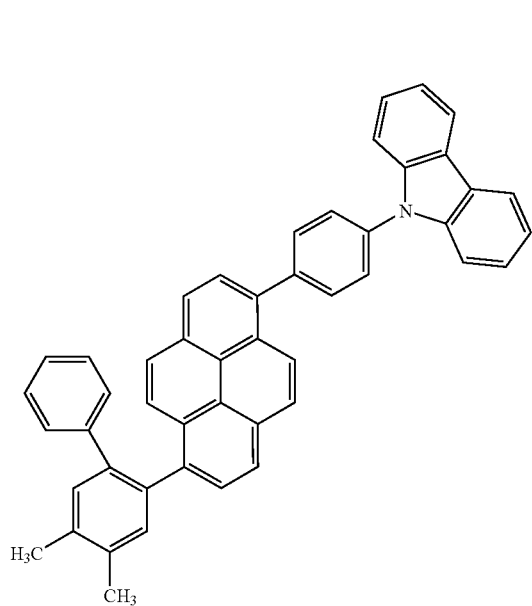
[52]
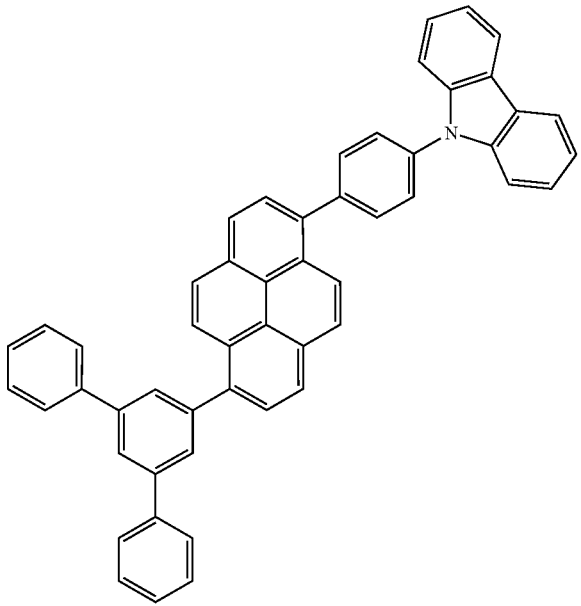
[53]

-continued
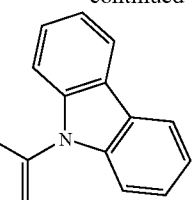
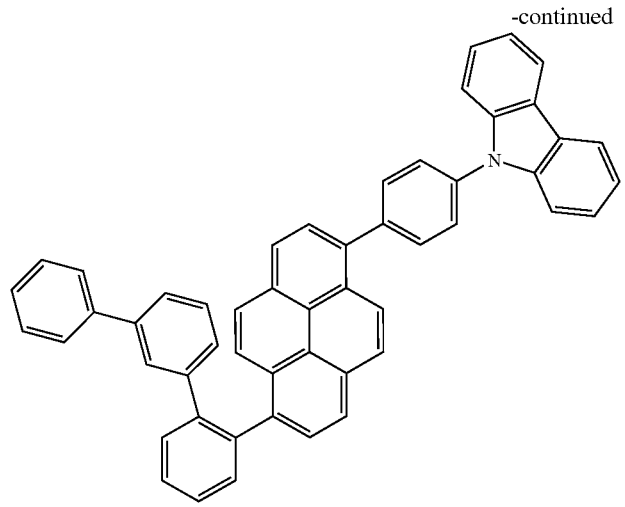
[54]
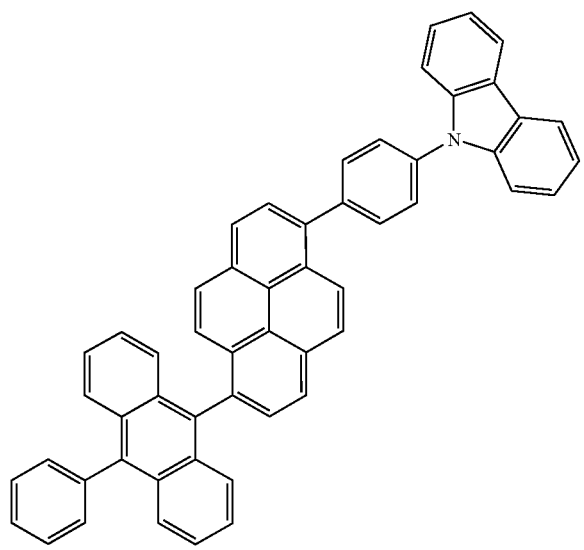
[55]
[Chemical Formula 10]
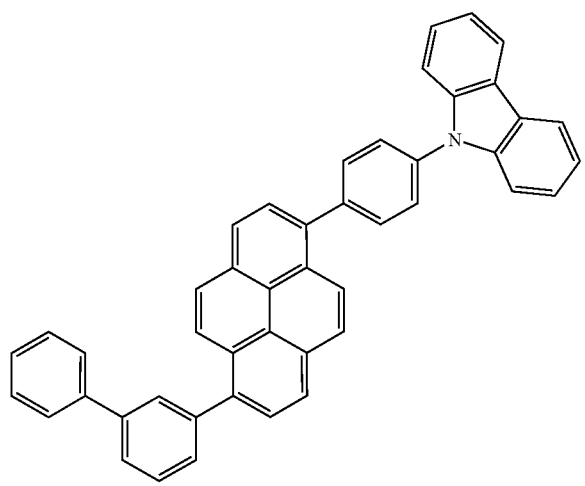
[56]

-continued
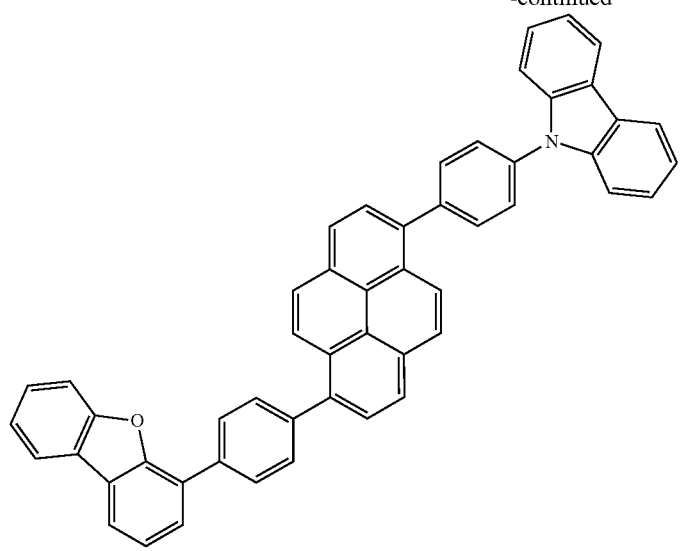
[57]
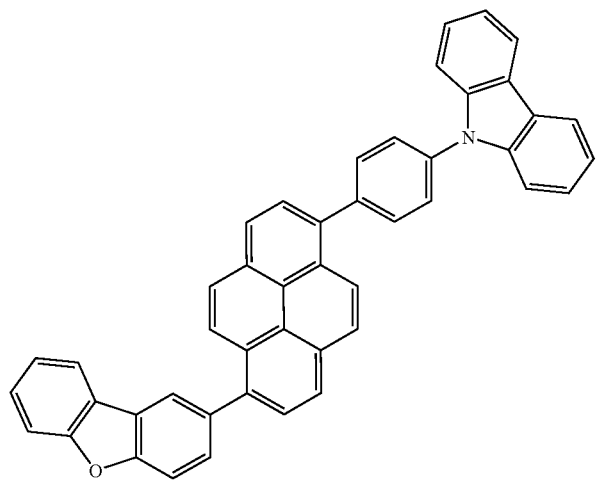
[58]
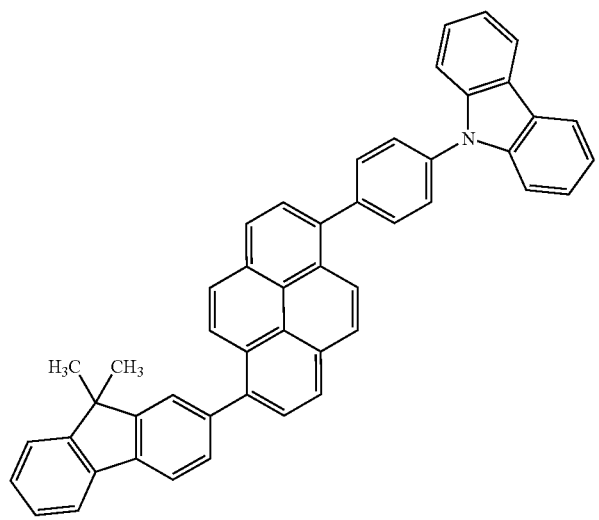
[59]

-continued
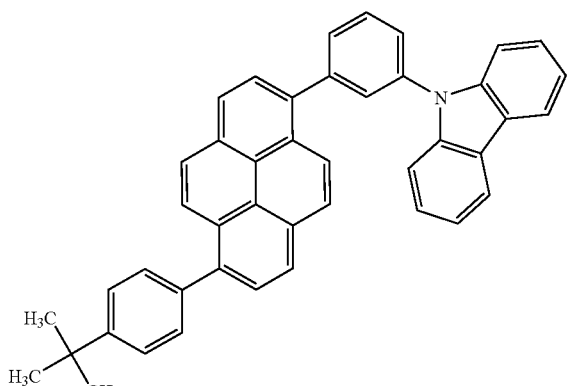
[60]
[Chemical Formula 11]
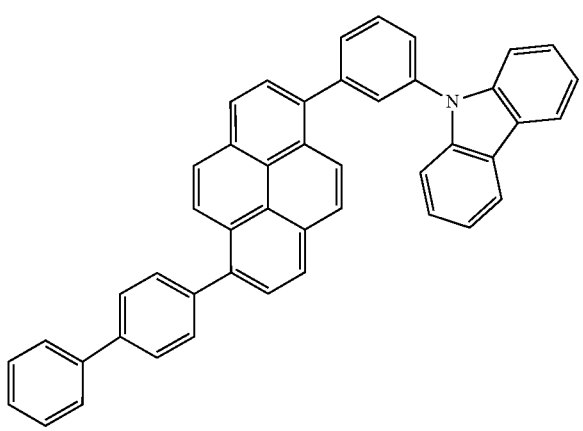
[61]
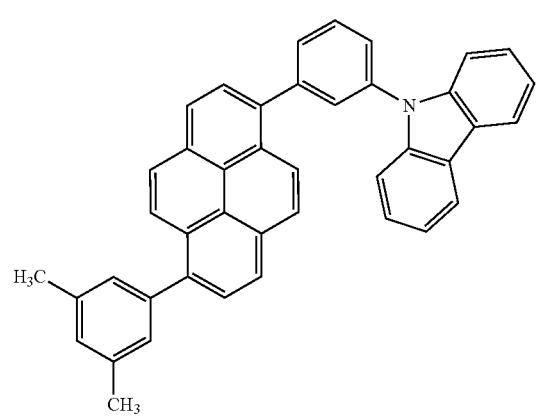
[62]
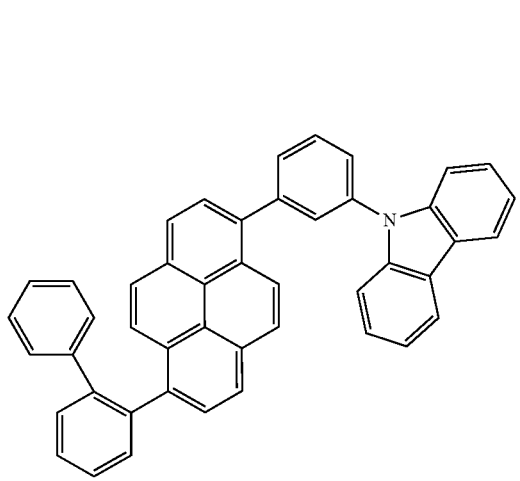
[63]
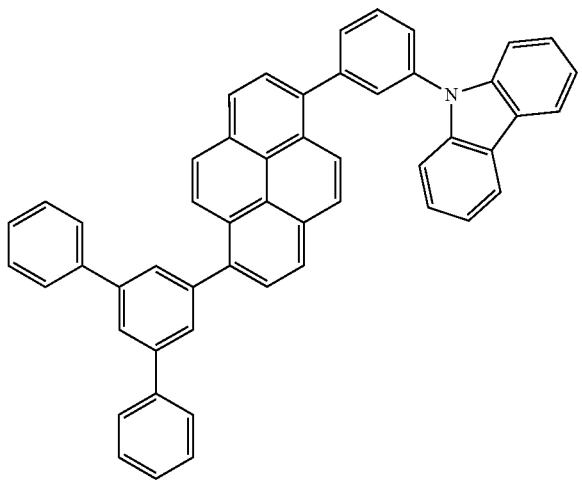
[64]

-continued
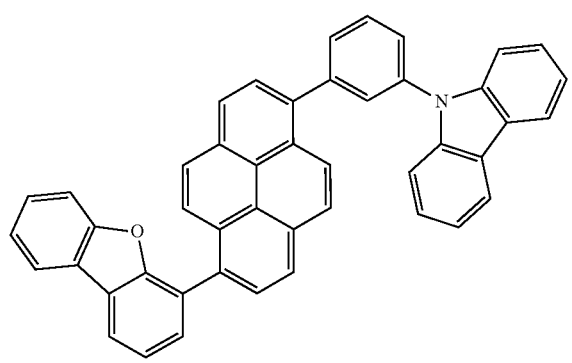
[65]
[66]
[67]
[68]
[69]
[Chemical Formula 12]
[70]
[71]

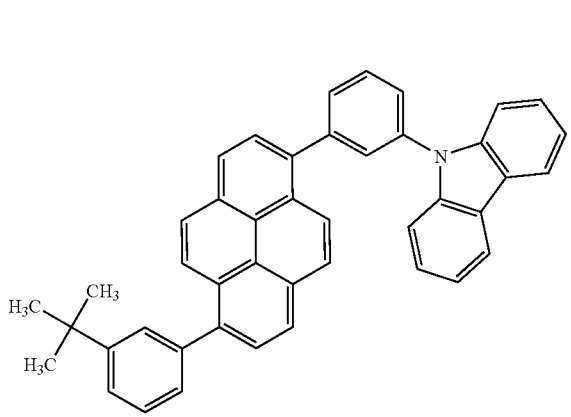
[72]
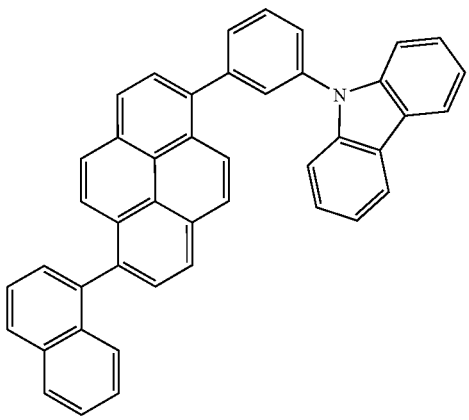
[73]
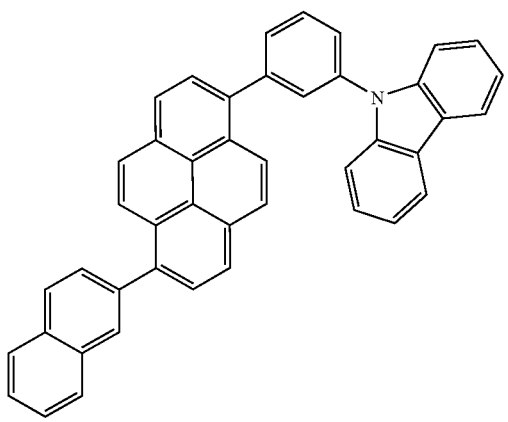
[74]
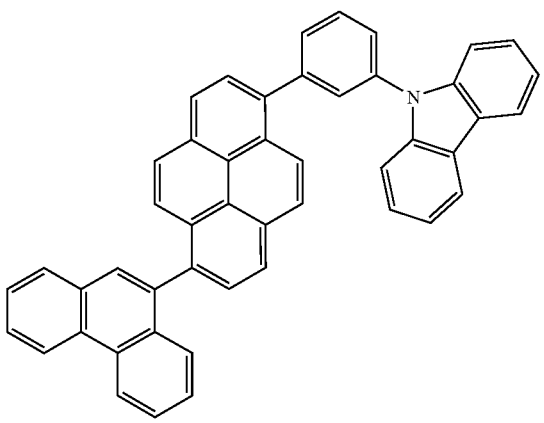
[75]
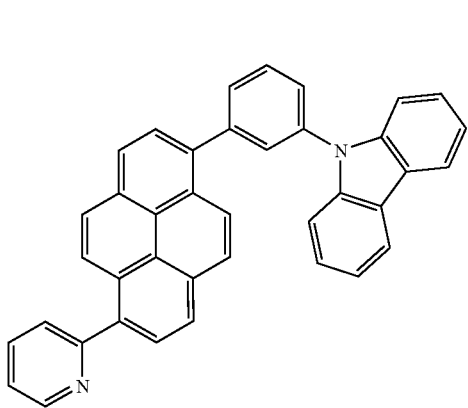
[76]
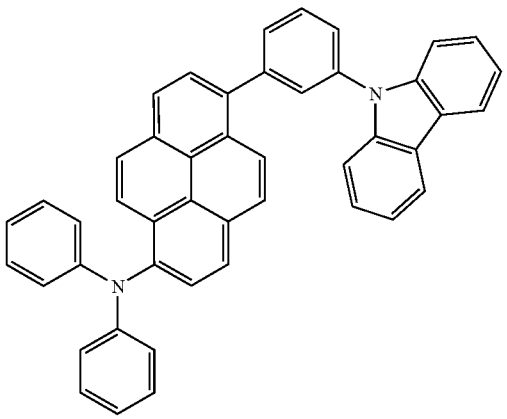
[77]

-continued
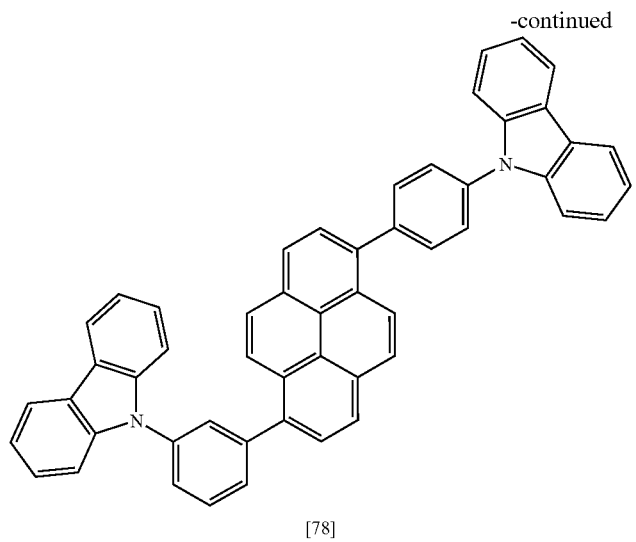
[78]
[Chemical Formula 13]
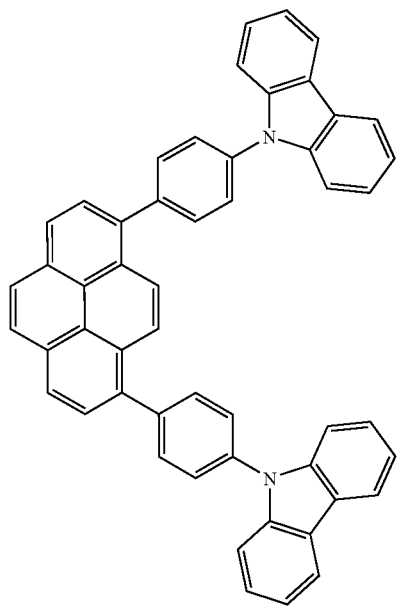
[79]
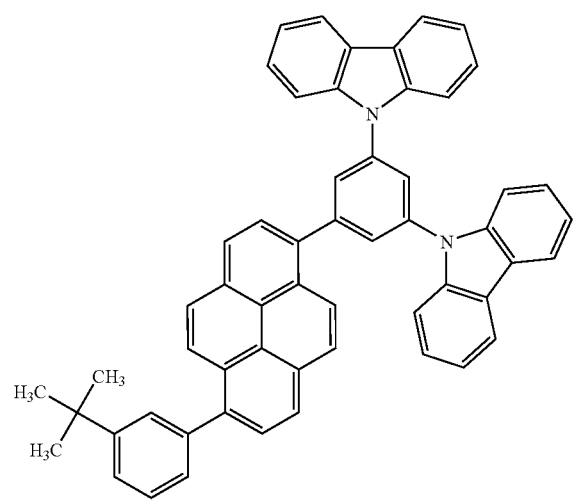
[80]
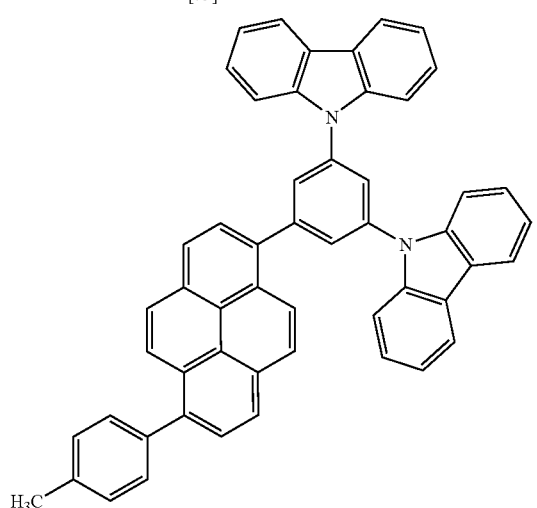
[81]
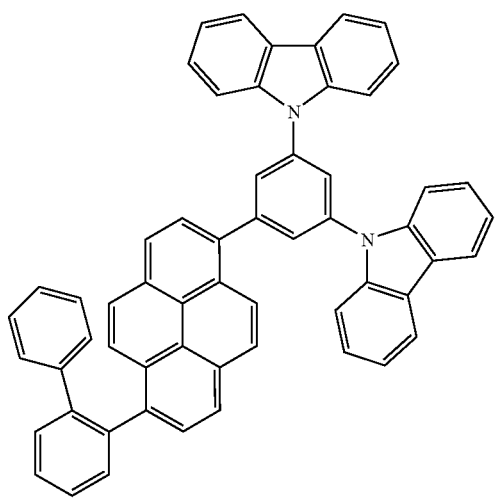
[82]

-continued
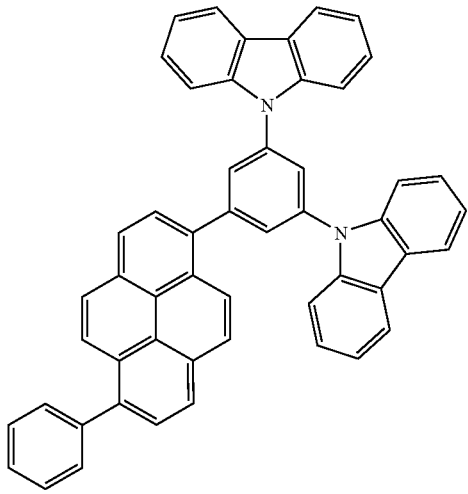
[83]
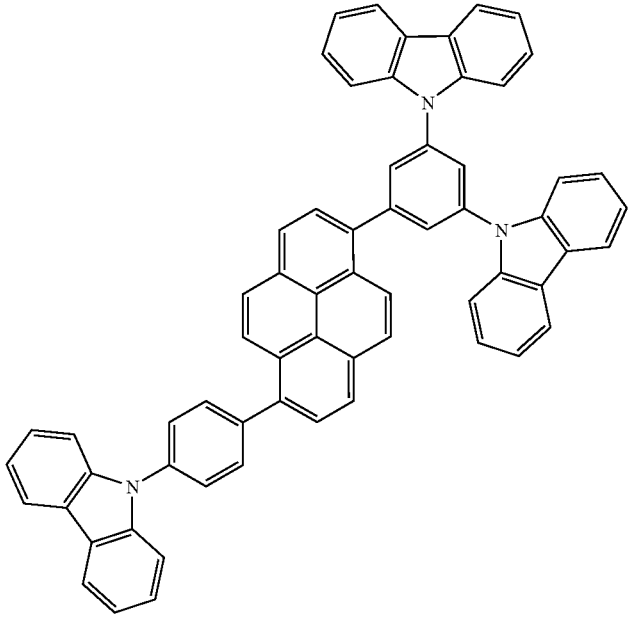
[84]
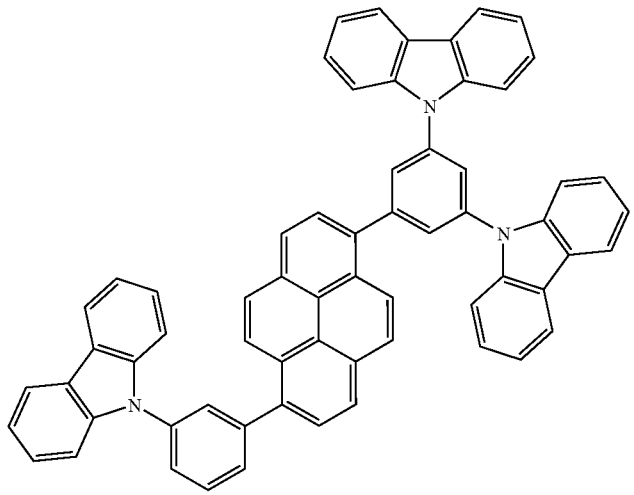
[85]
[Chemical Formula 14]
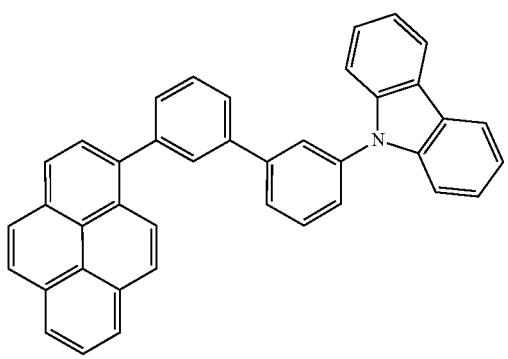
[86]
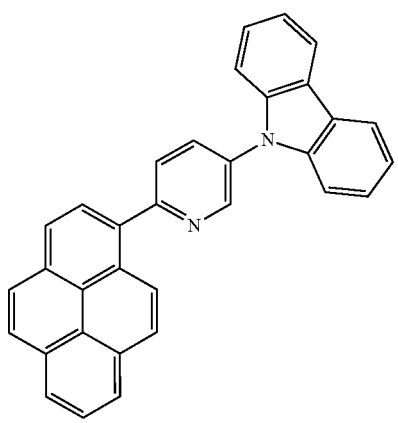
[87]

-continued
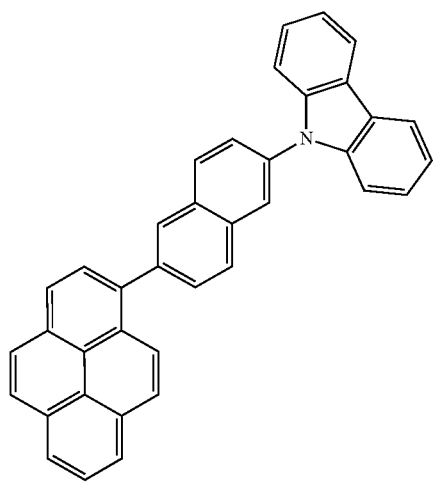
[88]
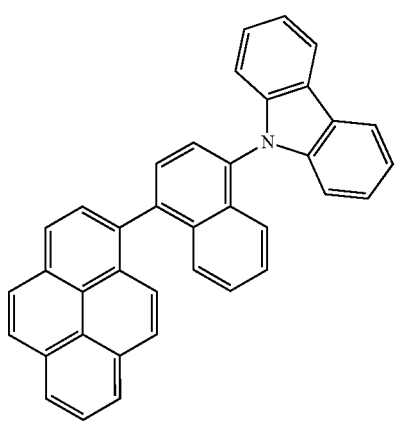
[89]
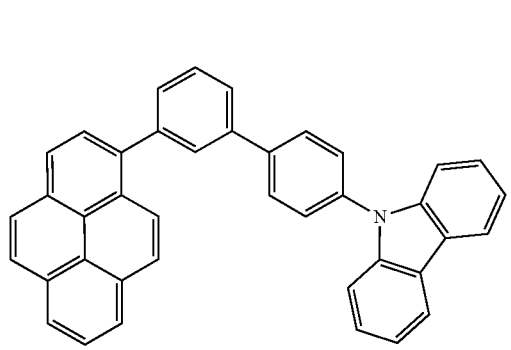
[90]
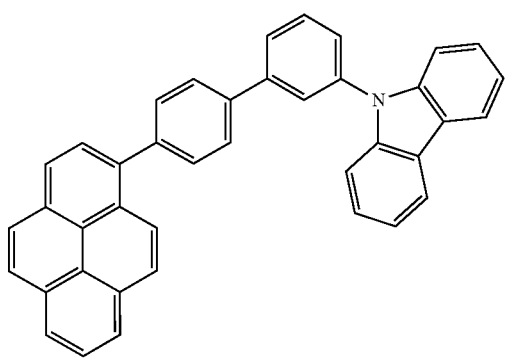
[91]
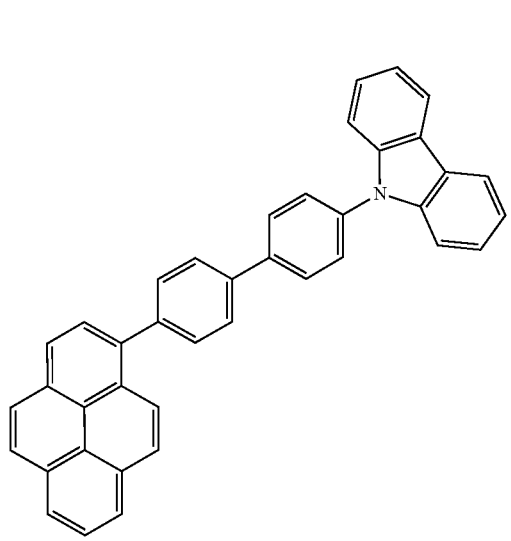
[92]
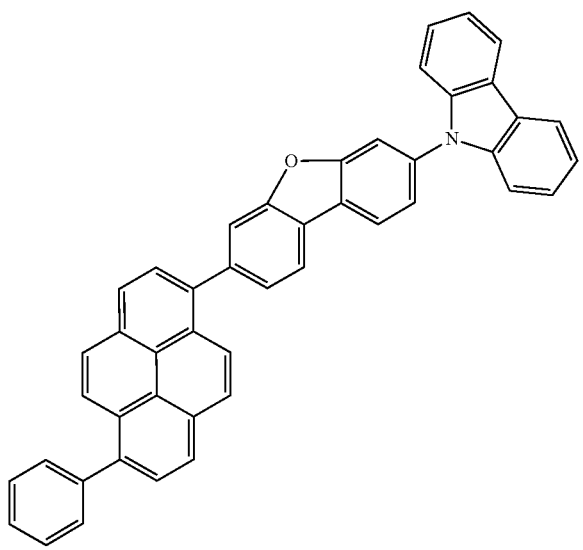
[93]

-continued
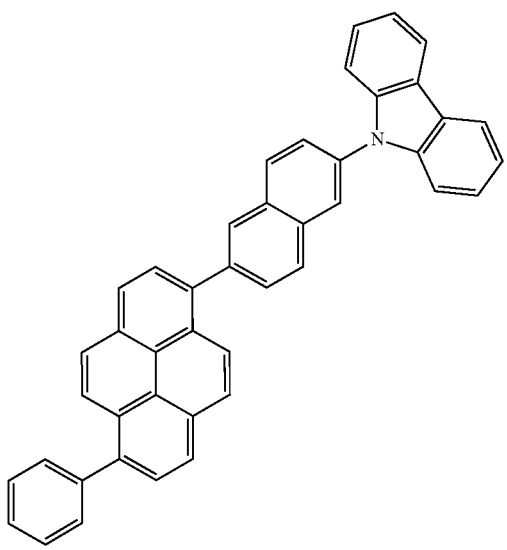
[94]
[Chemical Formula 15]
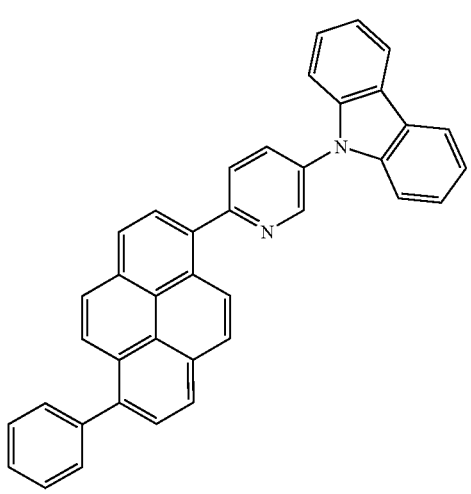
[95]
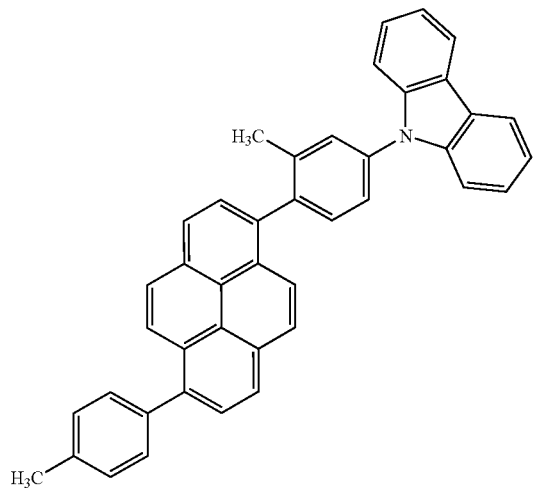
[96]
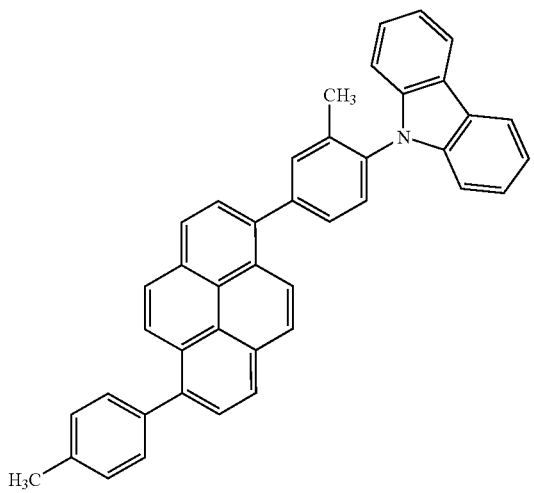
[97]
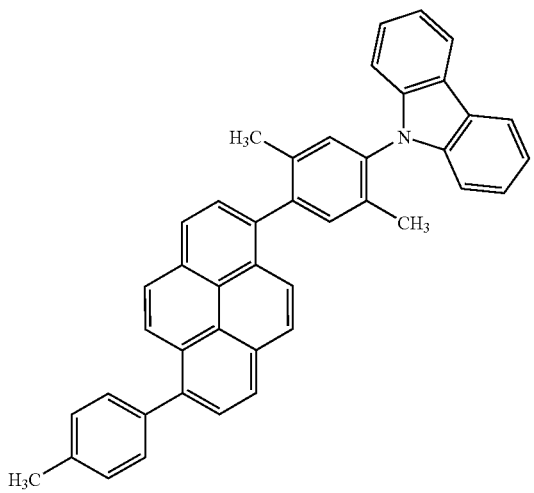
[98]

-continued
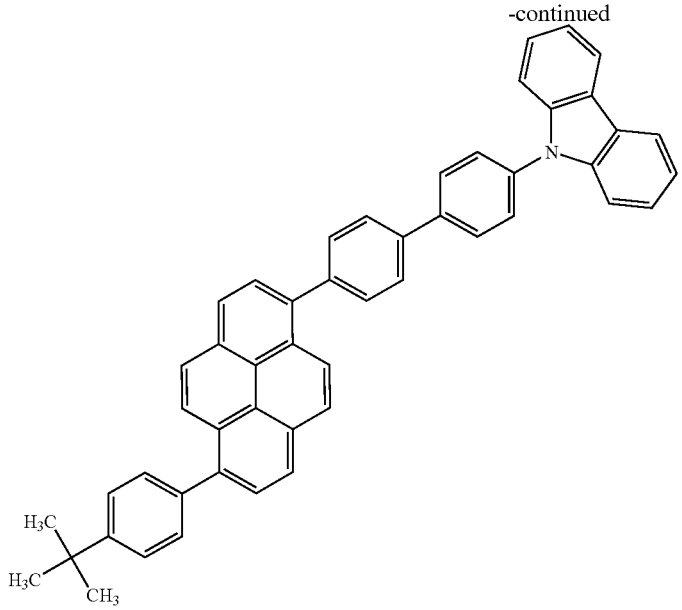
[99]
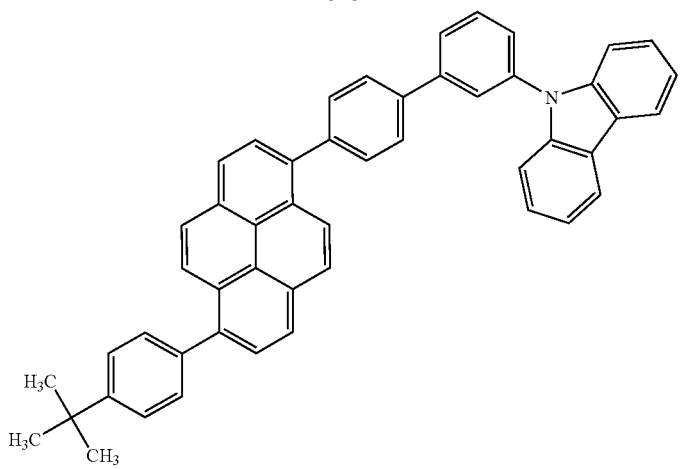
[100]
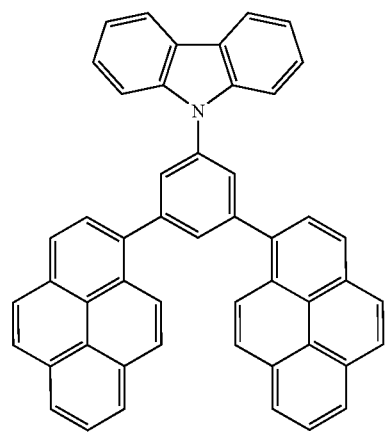
[101]
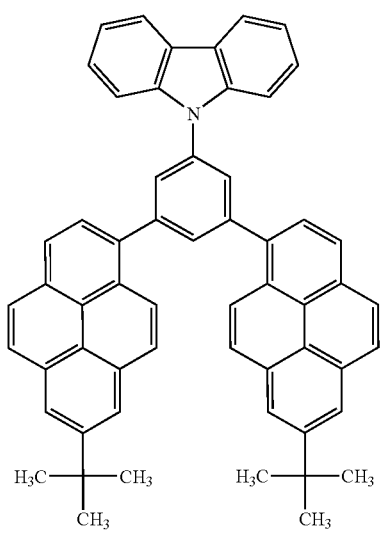
[102]
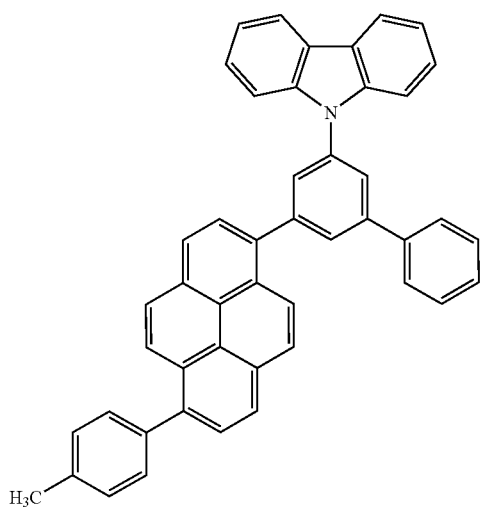
[103]

[Chemical Formula 16]
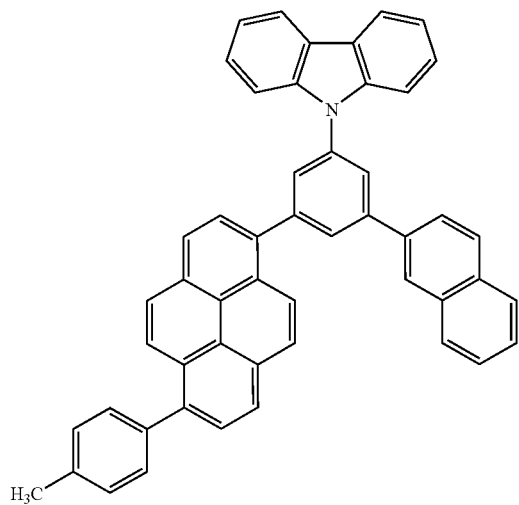
[104]
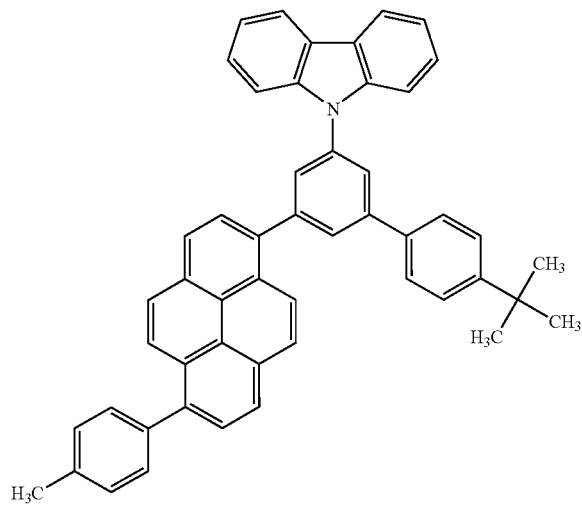
[105]
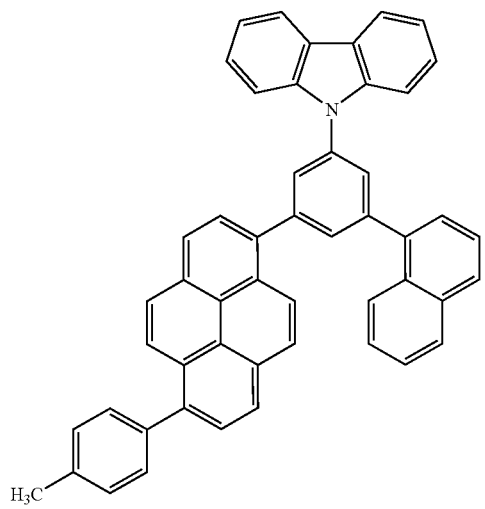
[106]
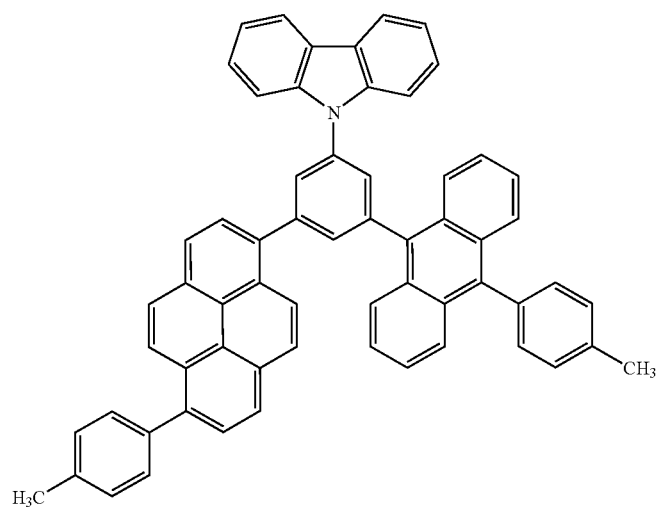
[107]
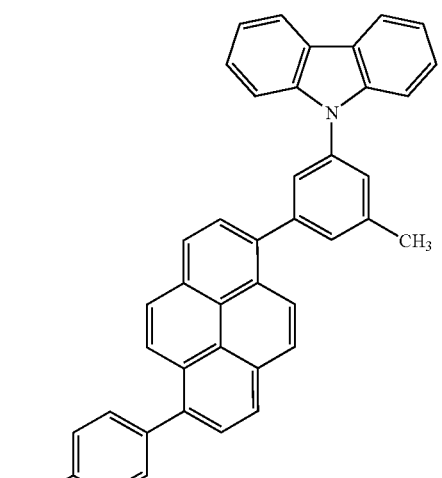
[108]
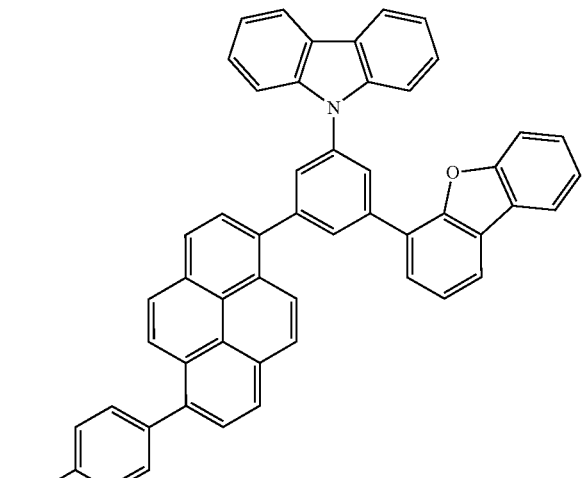
[109]

-continued
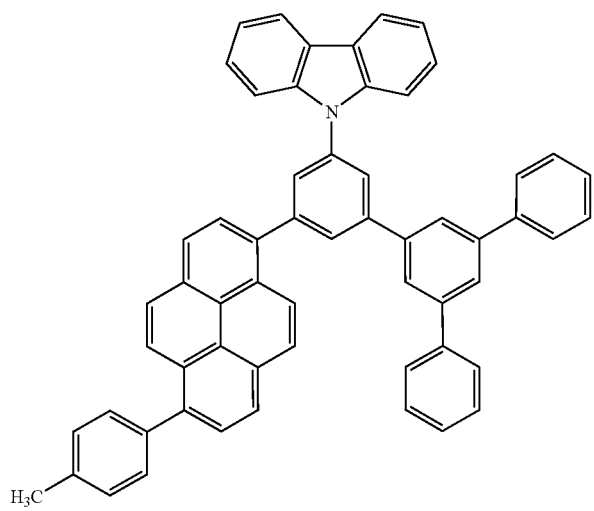
[110]
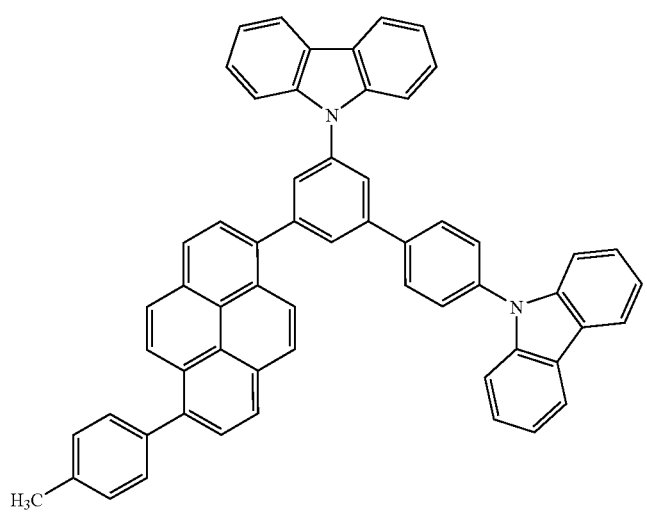
[111]
[Chemical Formula 17]
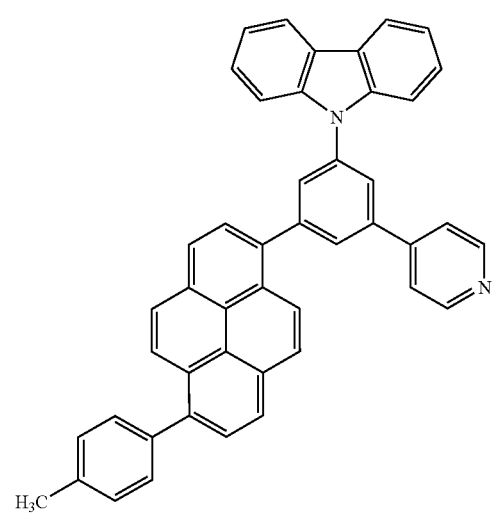
[112]
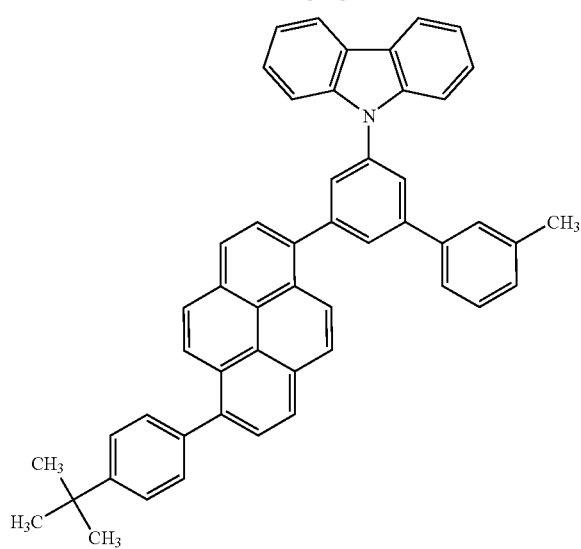
[113]
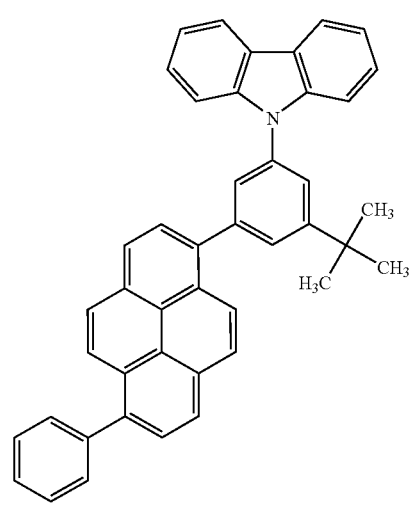
[114]

-continued
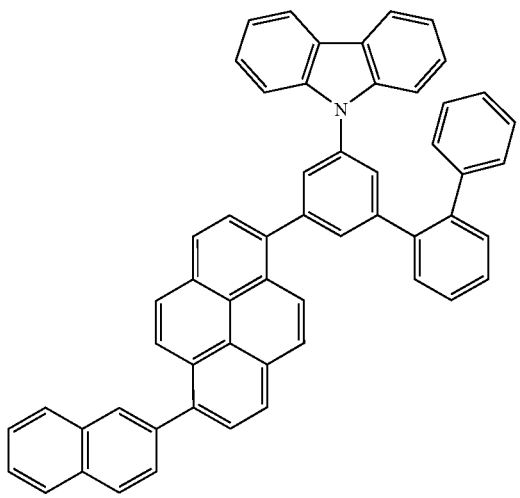
[115]
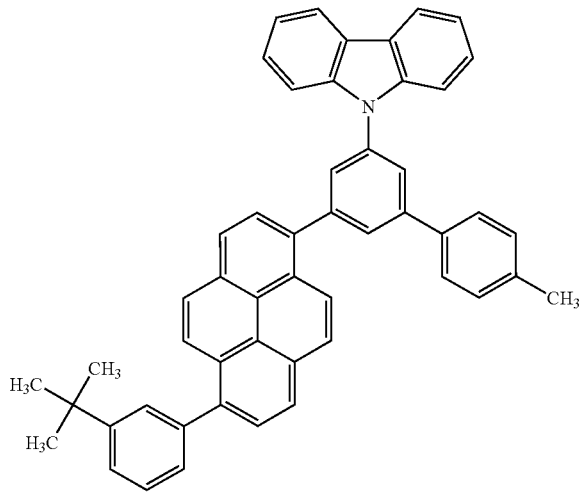
[116]
[Chemical Formula 18]
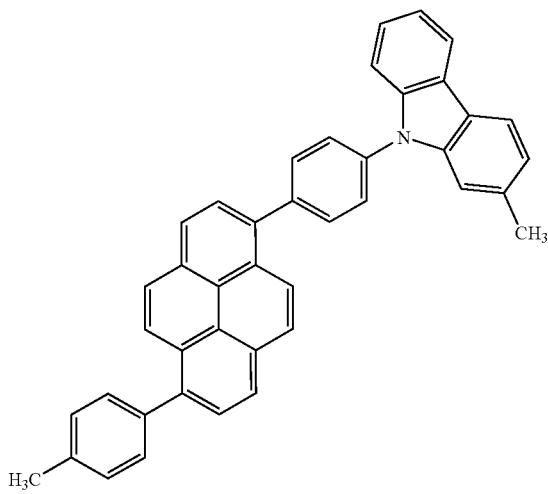
[117]
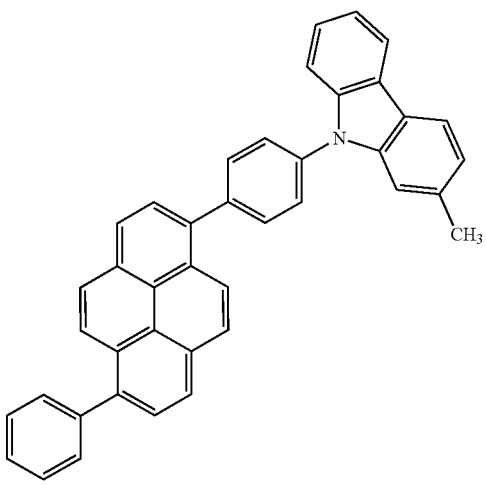
[118]
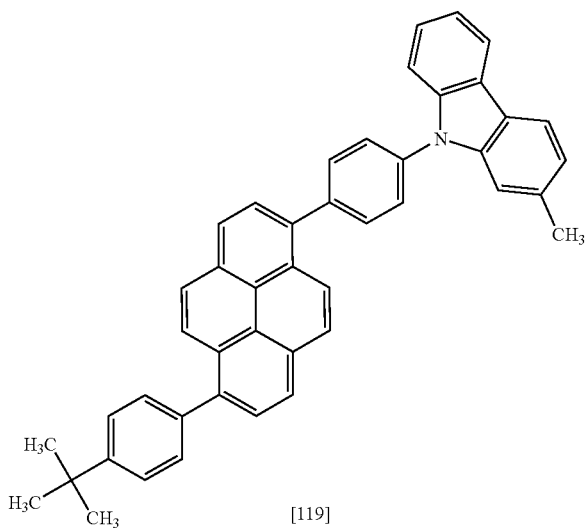
[119]

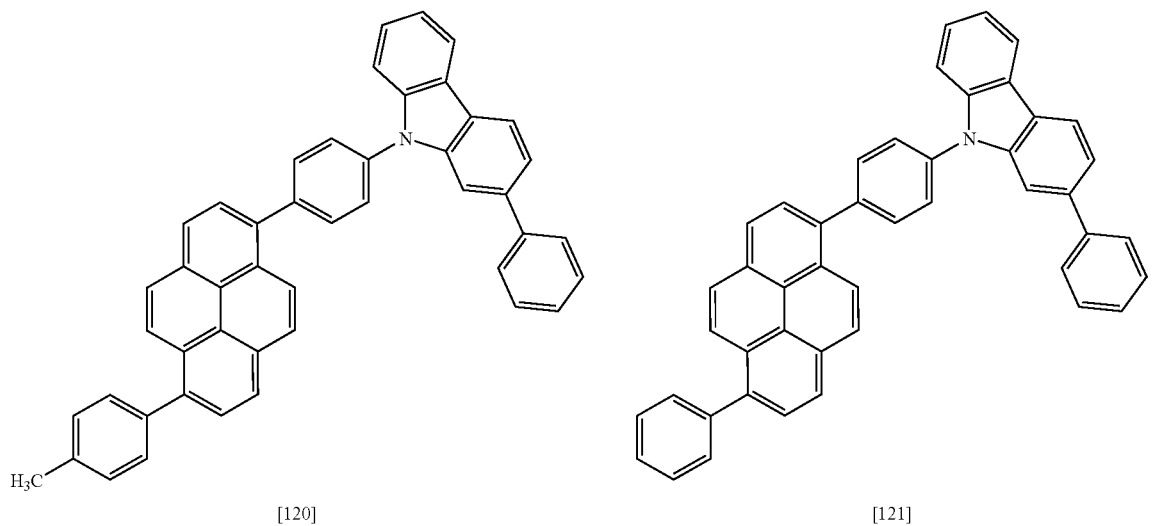
[120]
[121]
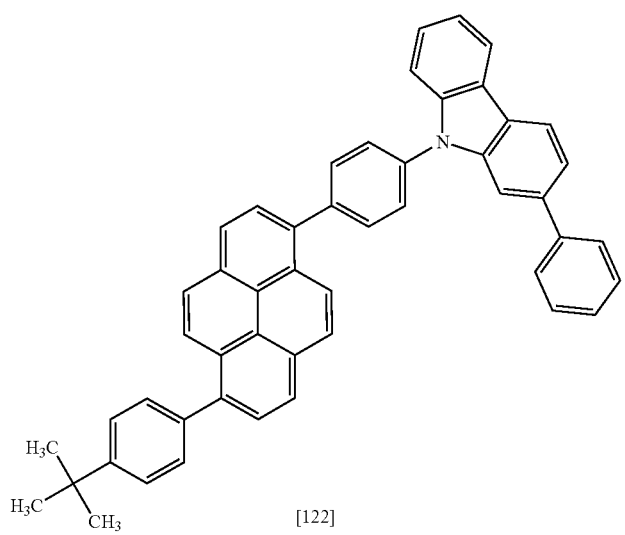
[122]
[Chemical Formula 19]
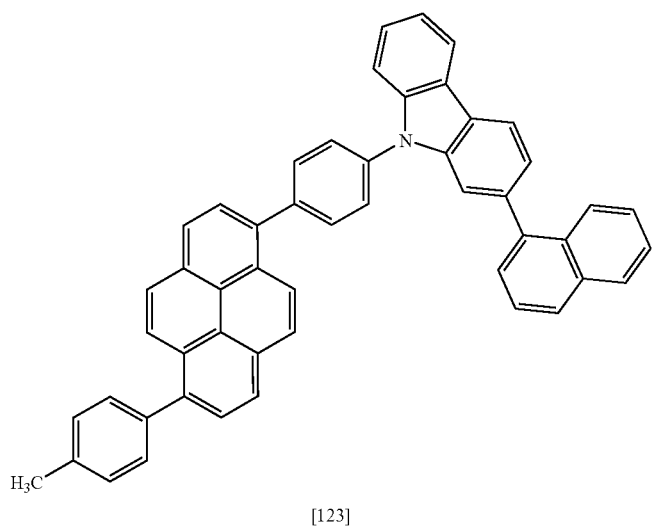
[123]

-continued
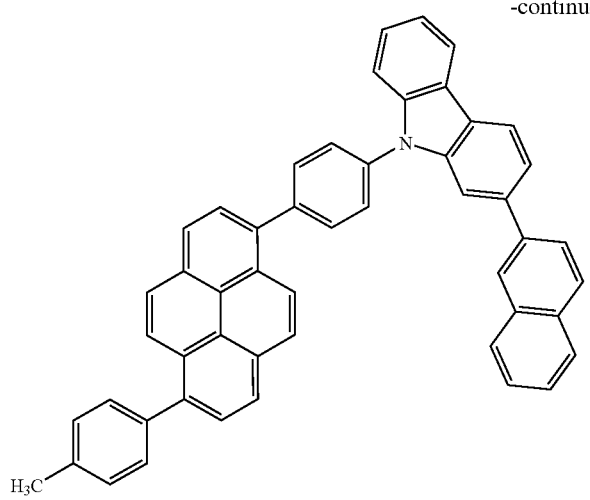
[124]
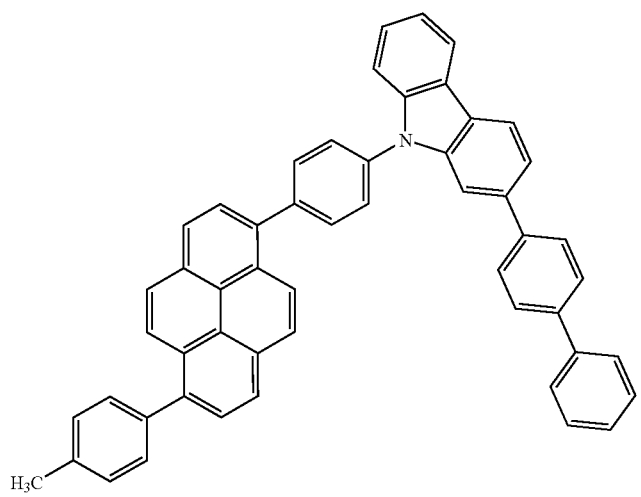
[125]
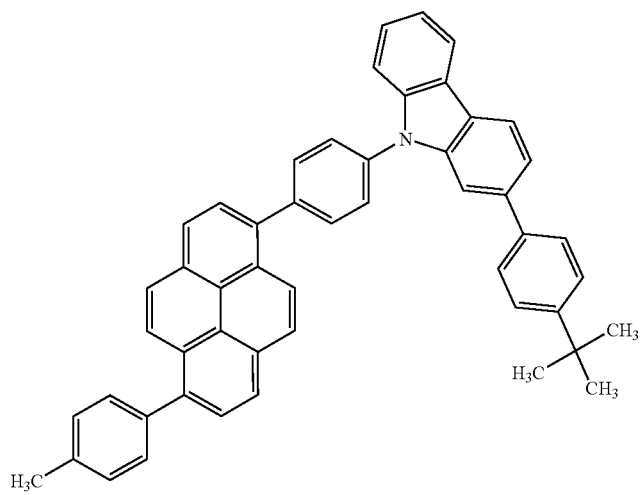
[126]

-continued
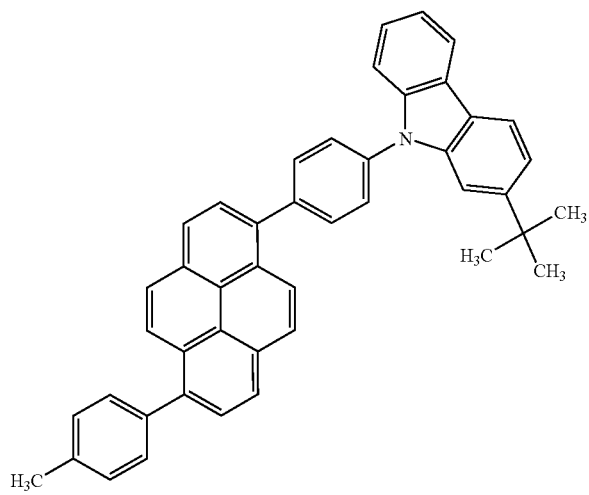
[127]
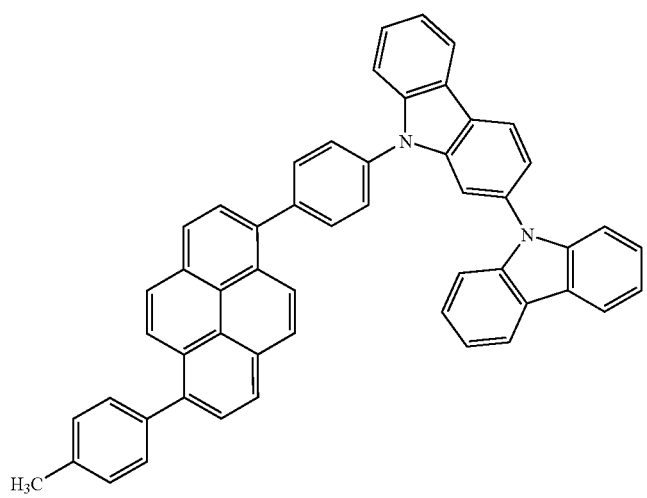
[128]
[Chemical Formula 20]
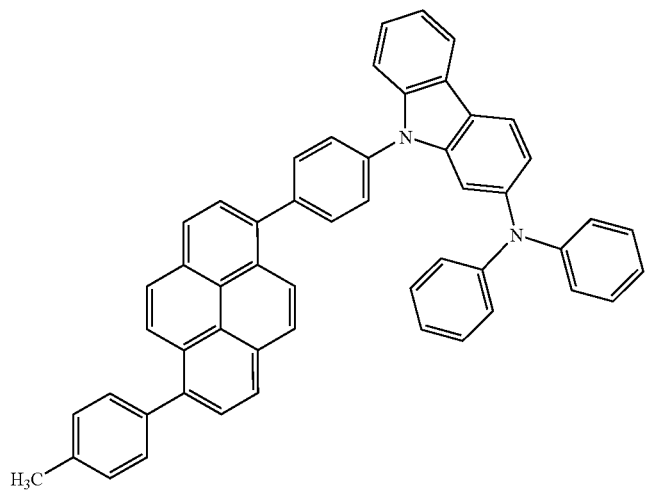
[129]

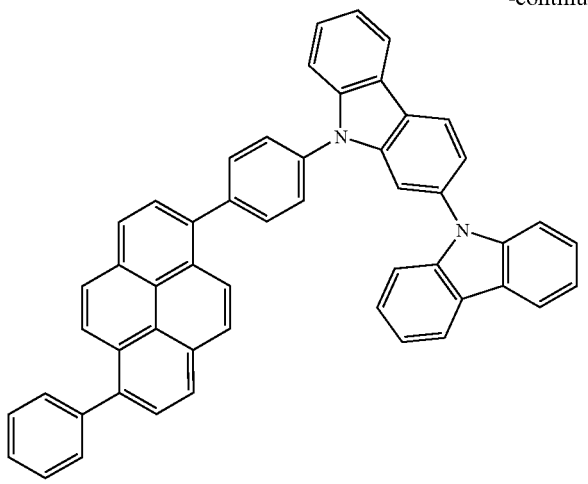
[130]
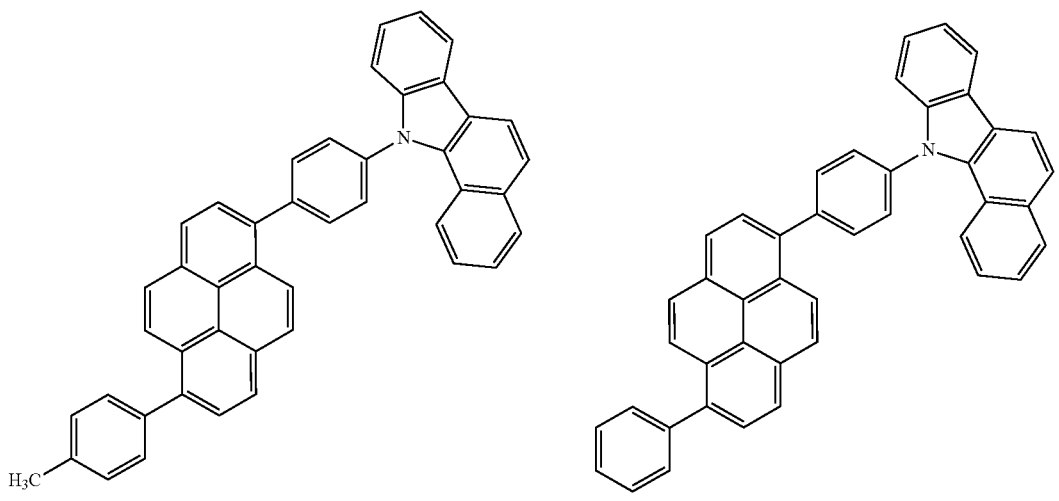
[131]     [132]
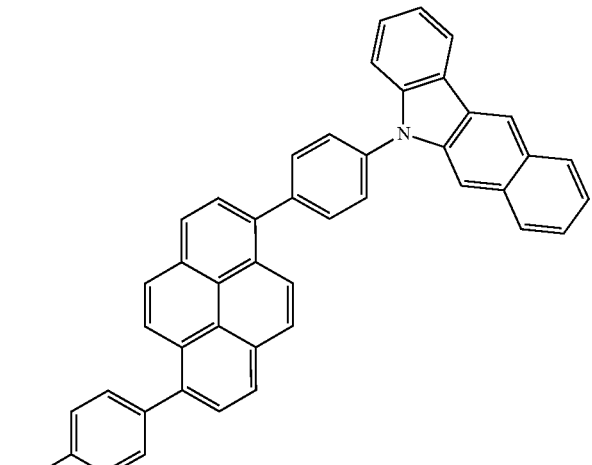
[133]

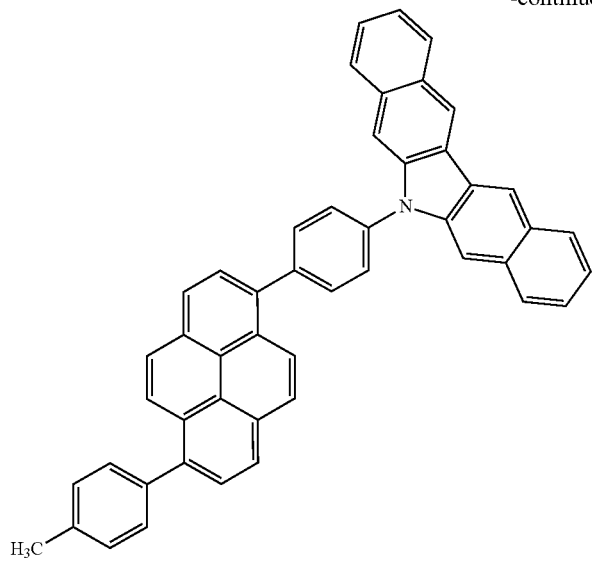
[134]
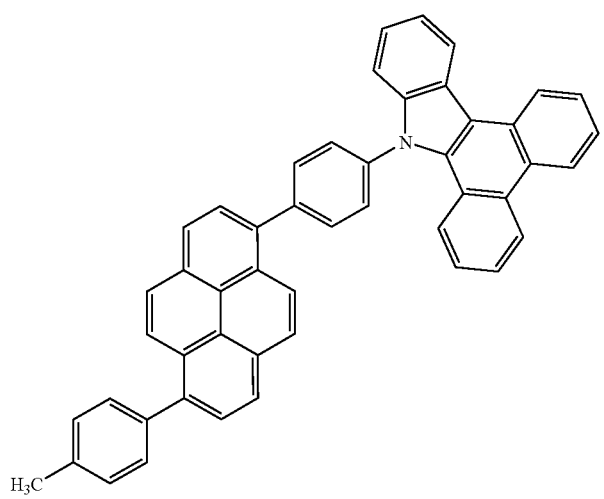
[135]
[Chemical Formula 21]
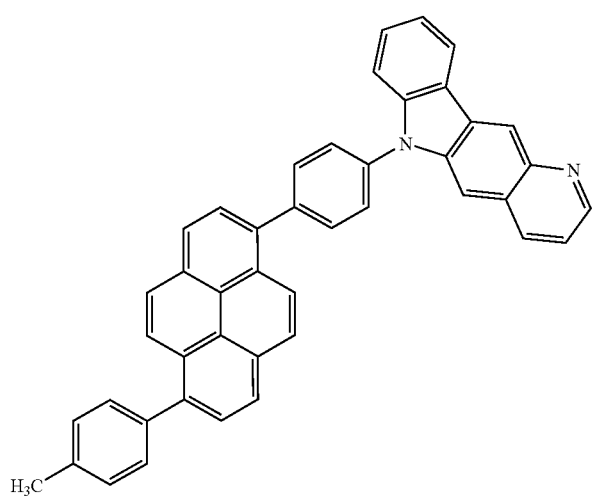
[136]

-continued
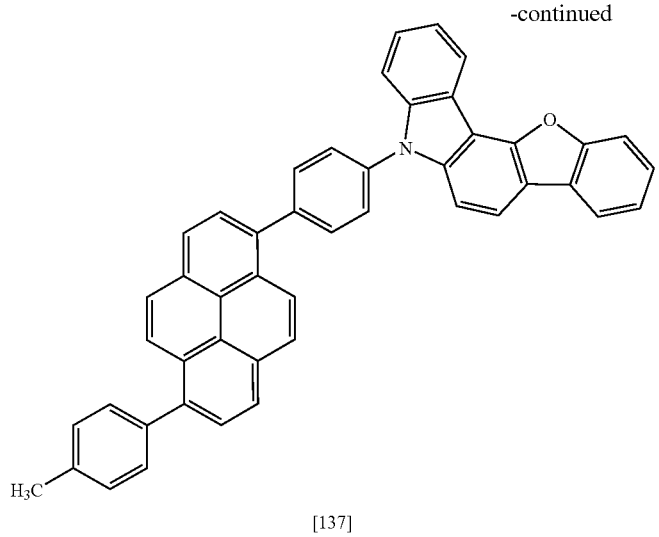
[137]
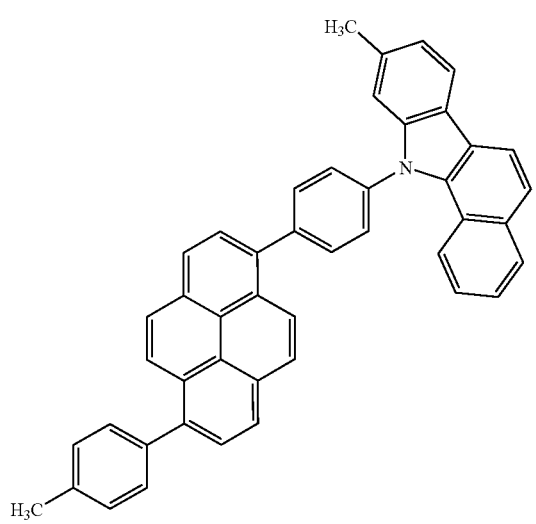
[138]
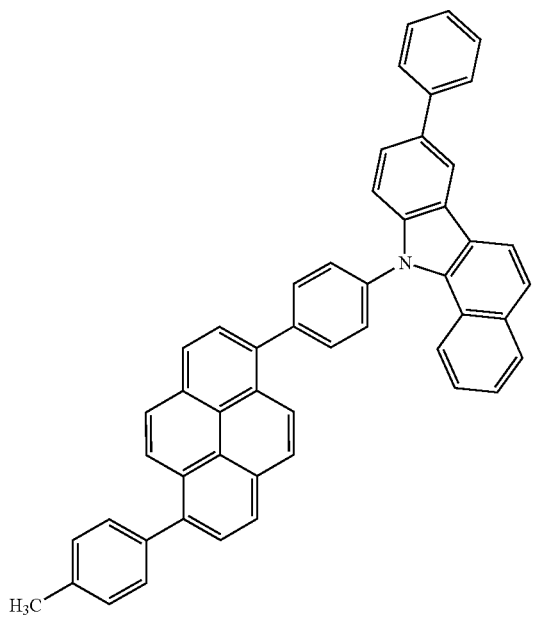
[139]
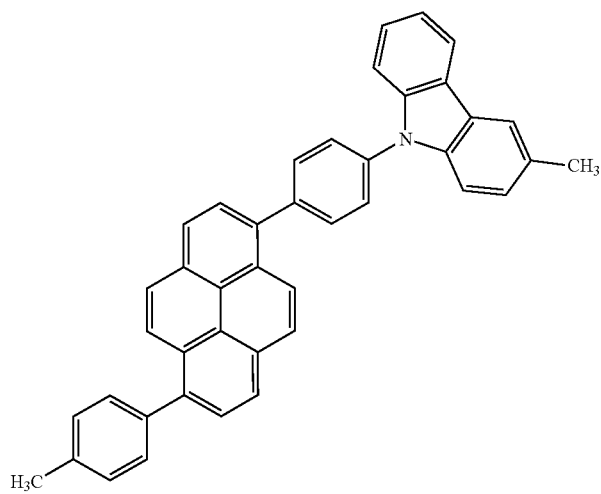
[140]

-continued
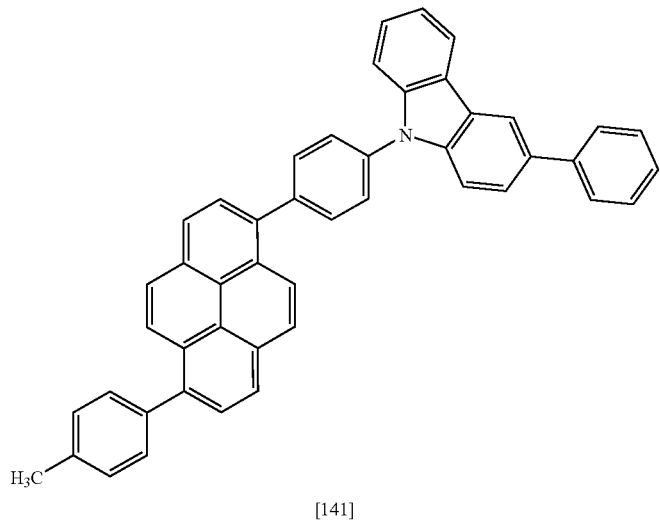
[141]
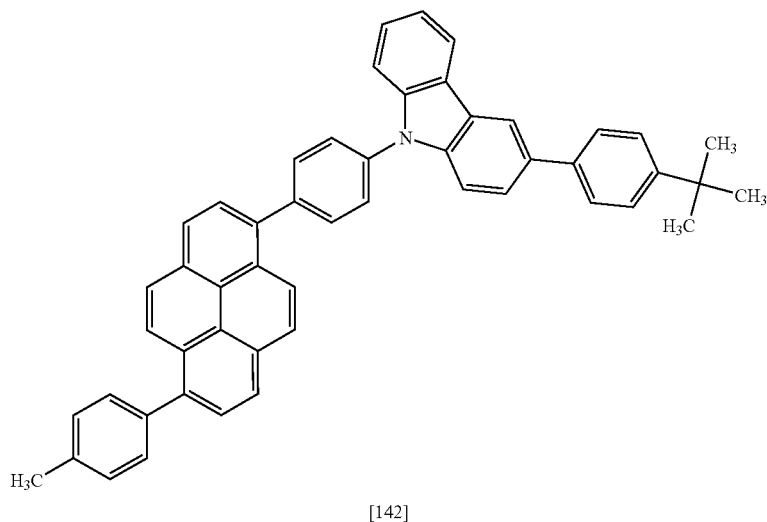
[142]
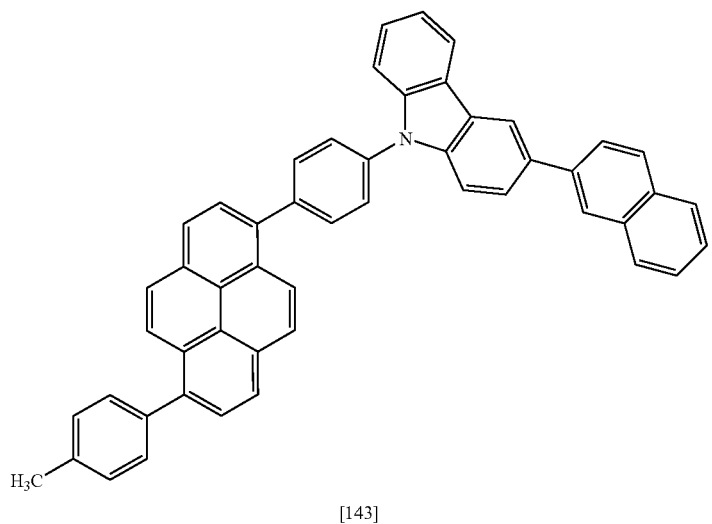
[143]
[Chemical Formula 22]

-continued
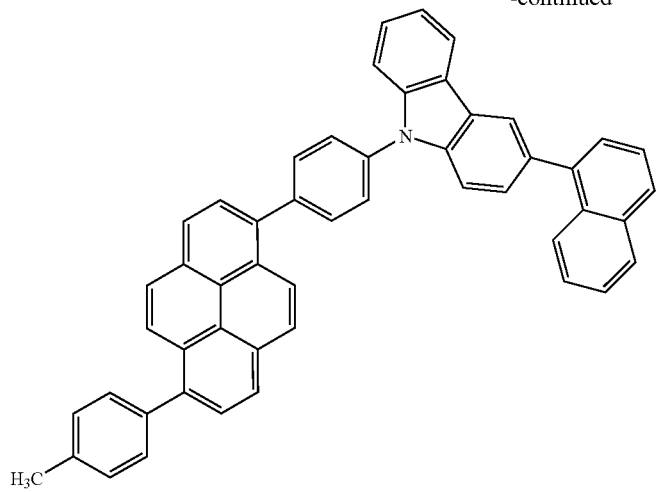
[144]
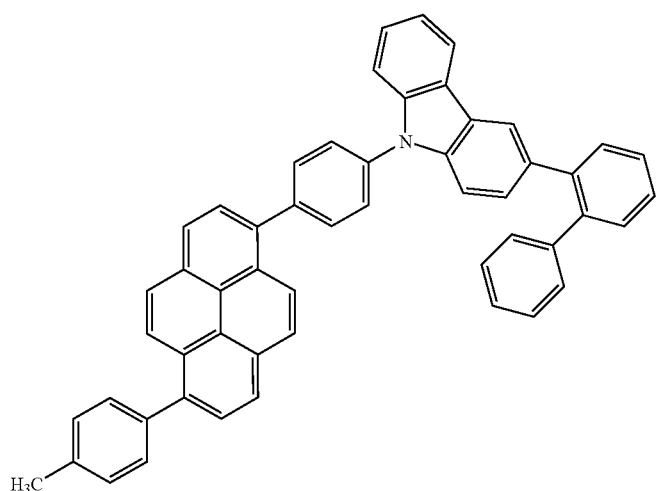
[145]
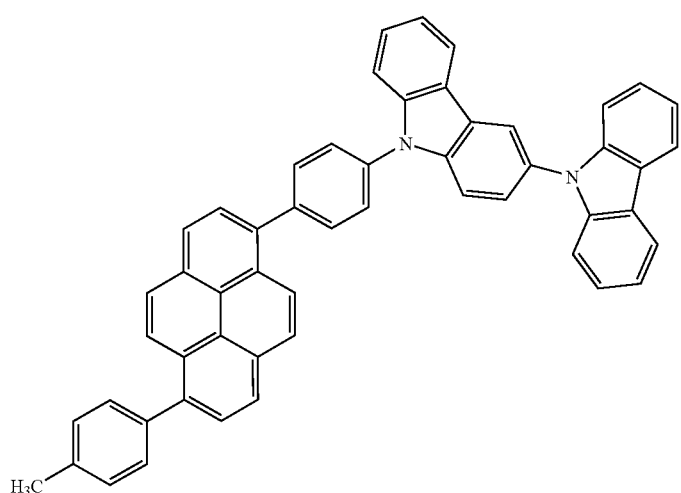
[146]

[Chemical Formula 23]
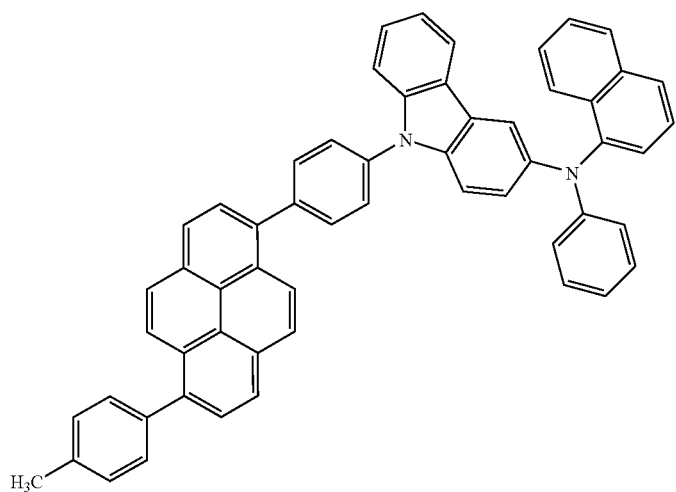
[147]
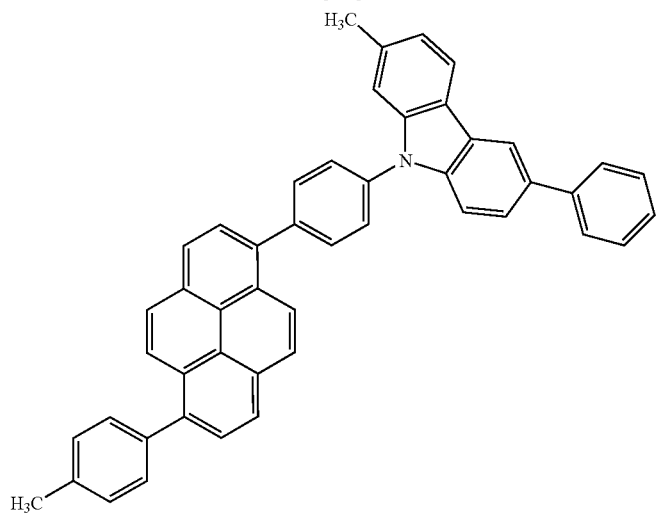
[148]
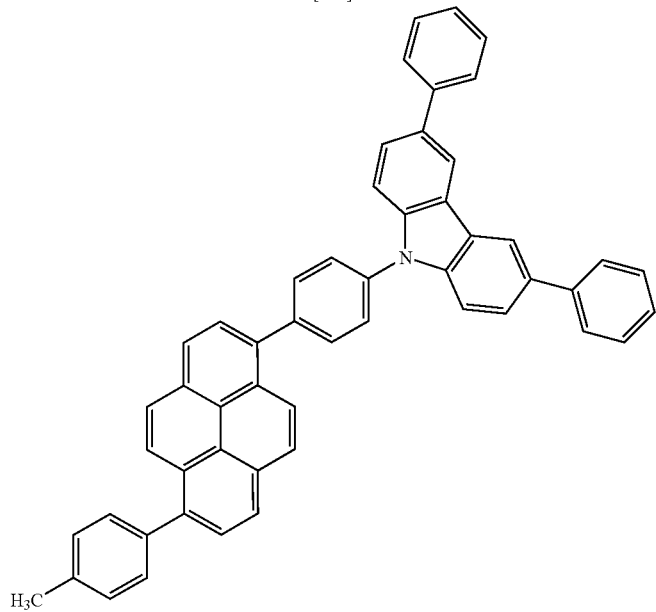
[149]

-continued
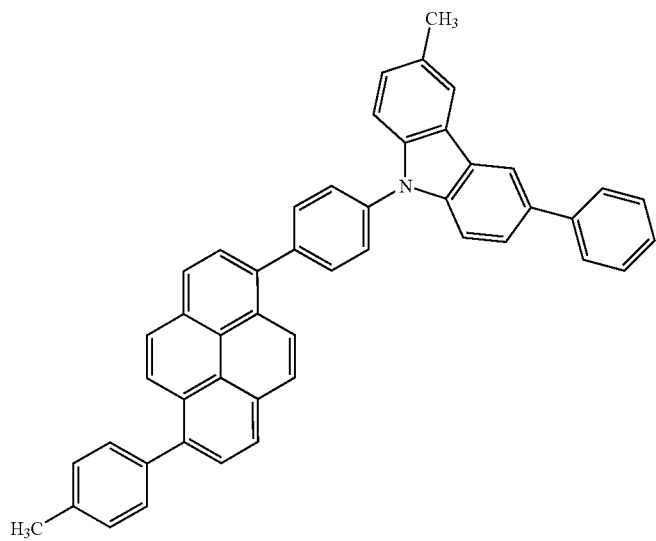
[150]
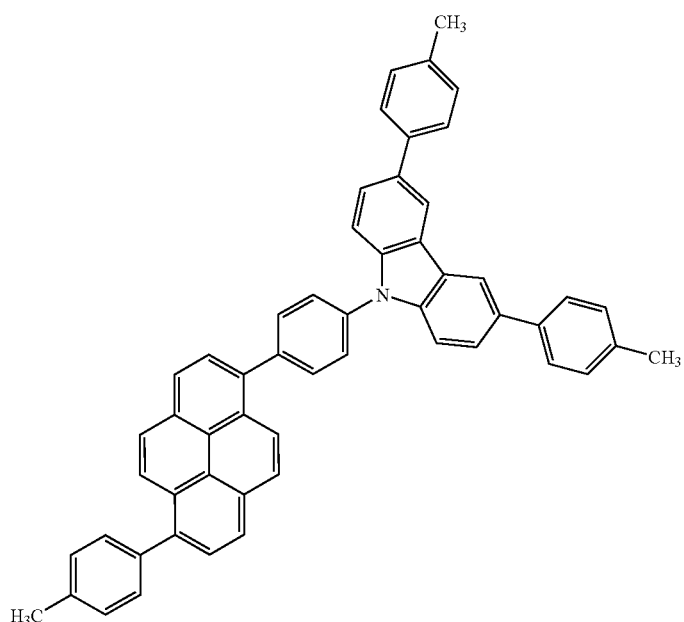
[151]

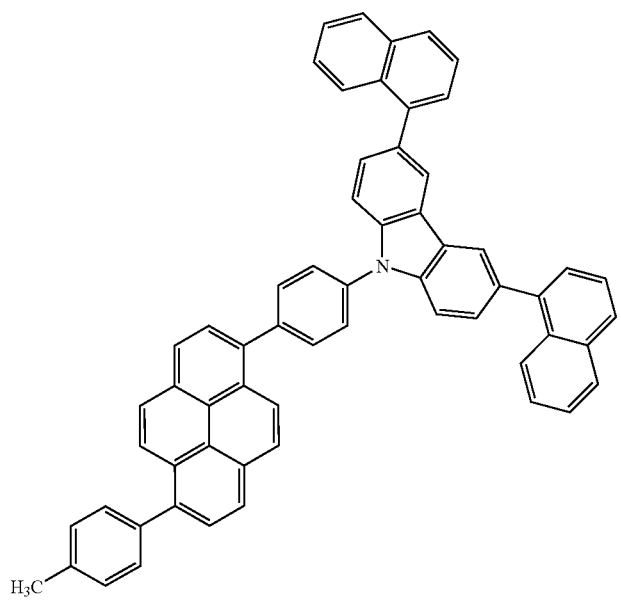
[152]
[Chemical Formula 24]
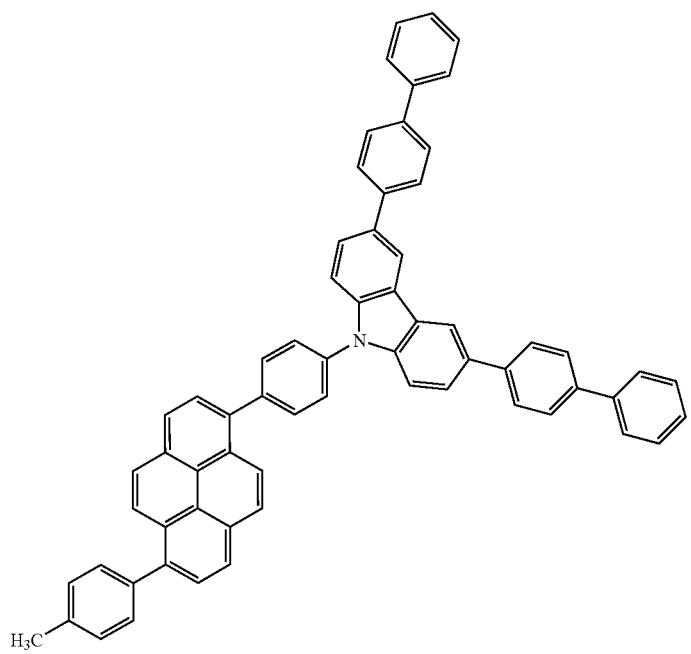
[153]

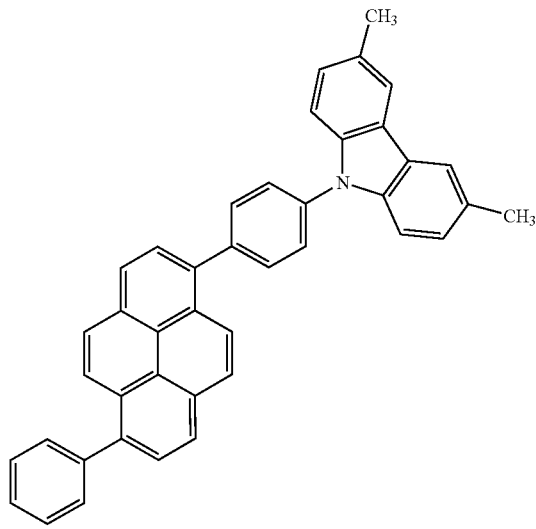
[154]
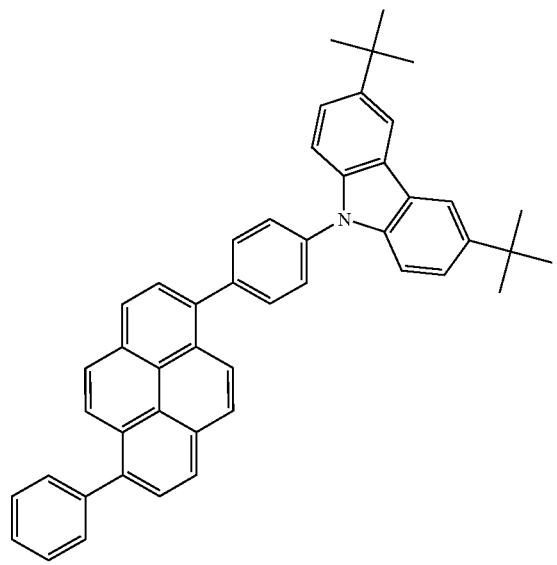
[155]
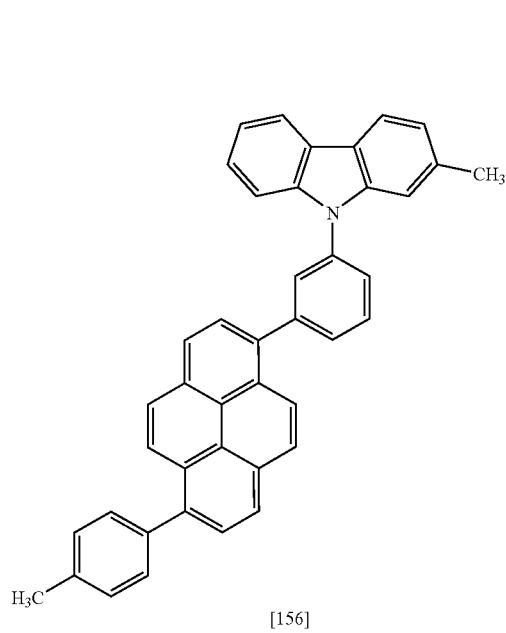
[156]
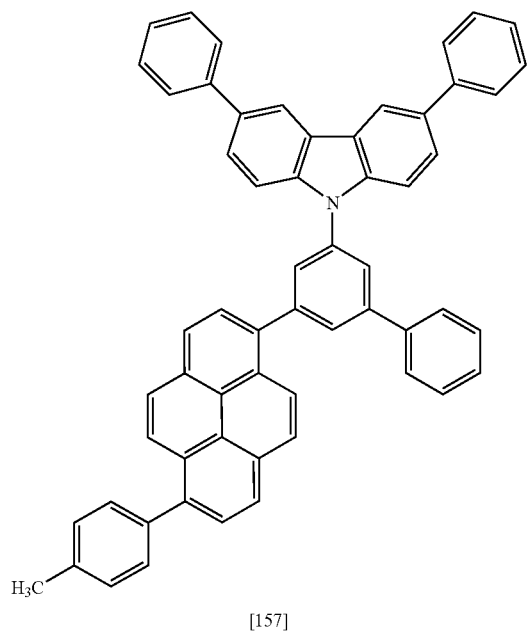
[157]

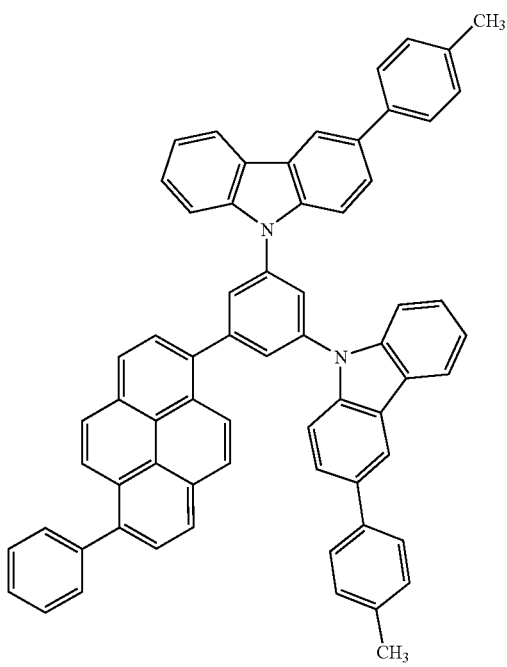
[158]
[Chemical Formula 25]
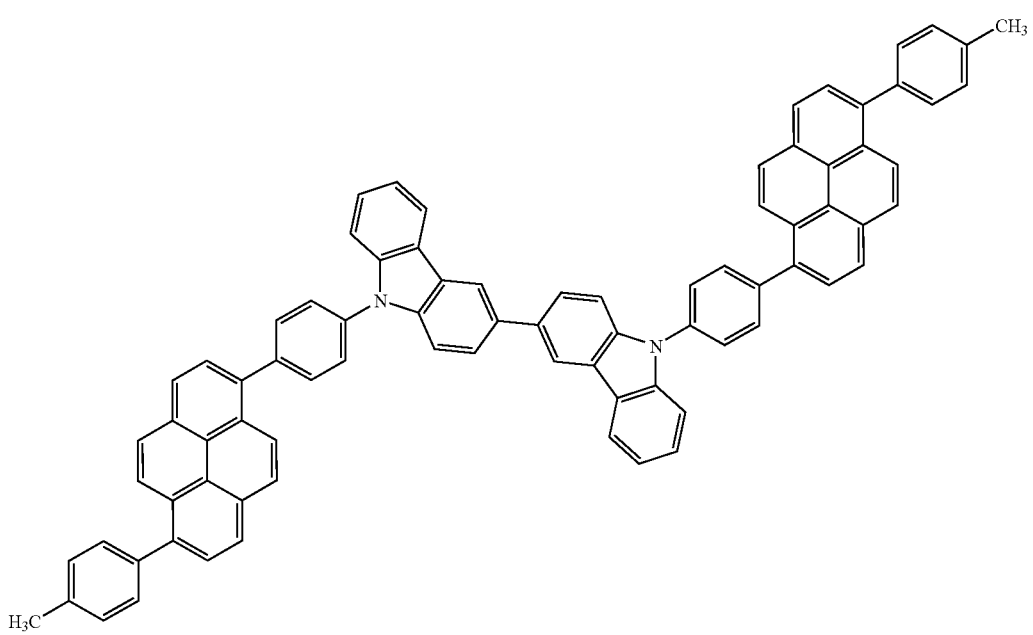
[159]

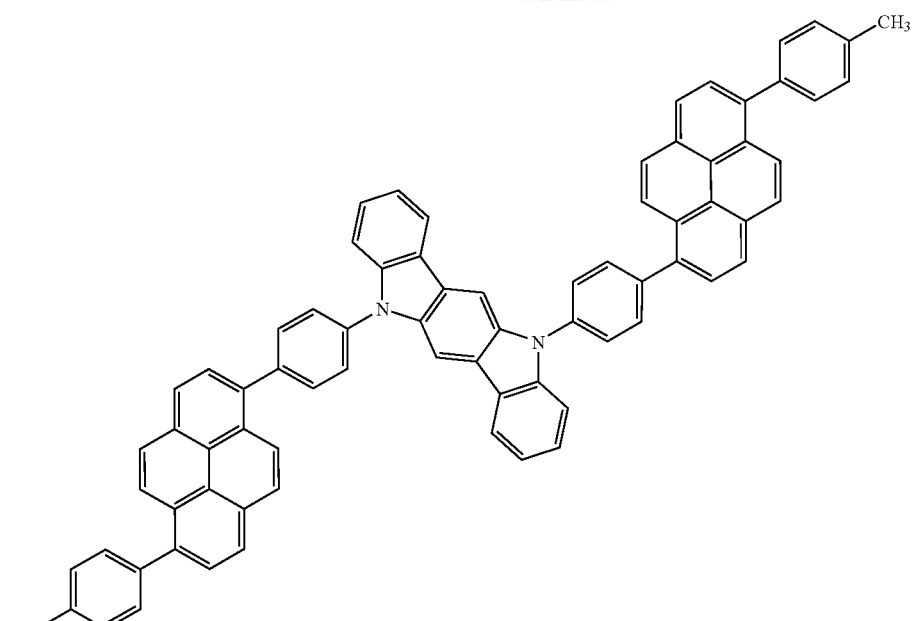
[160]
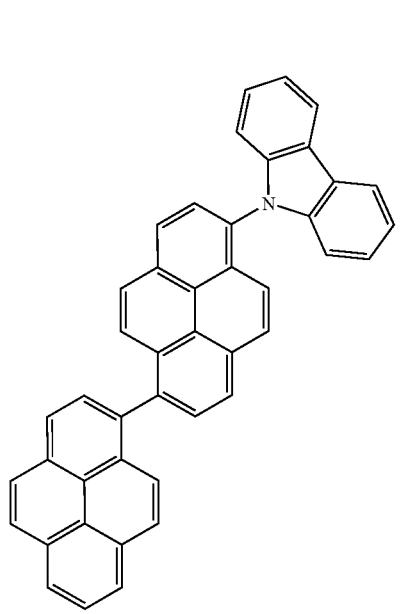
[161]
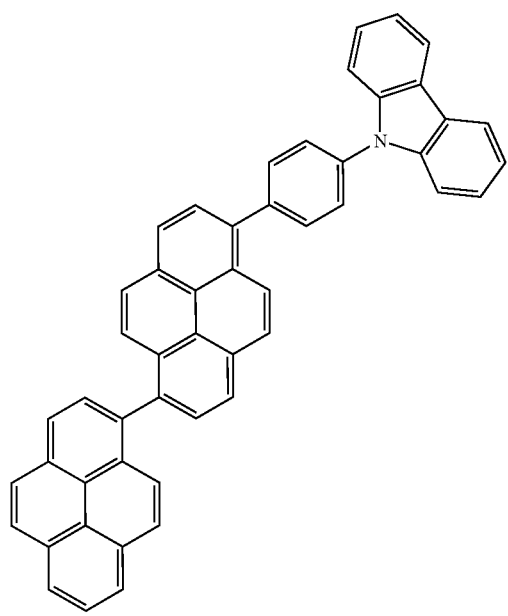
[162]

[Chemical Formula 26]
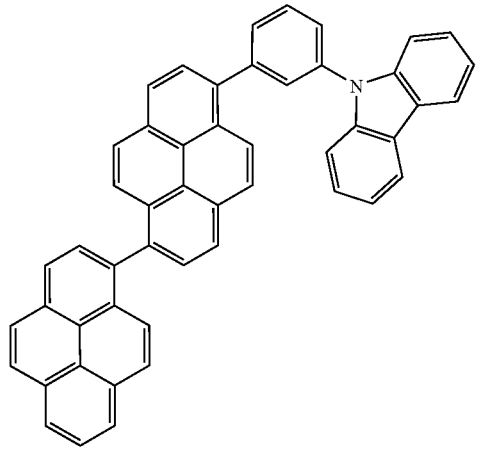
[163]
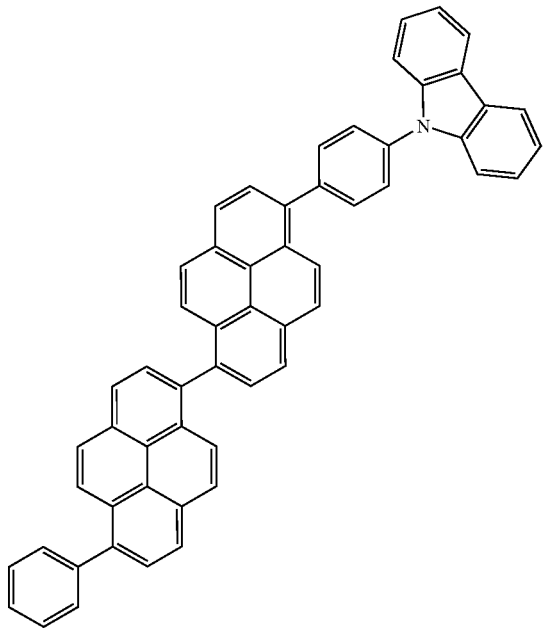
[164]
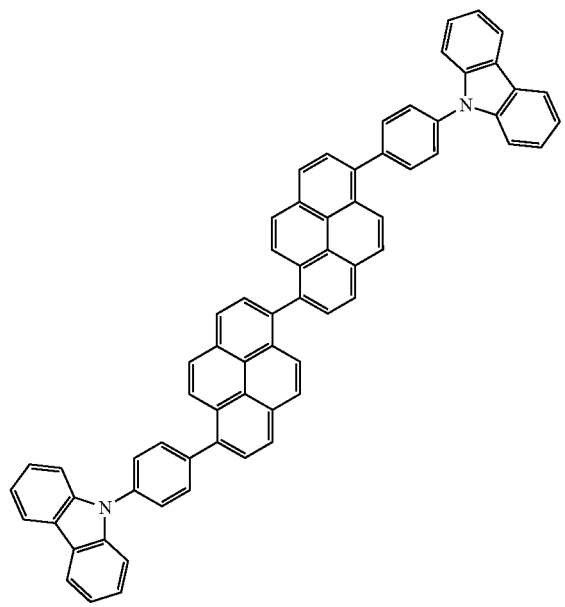
[165]
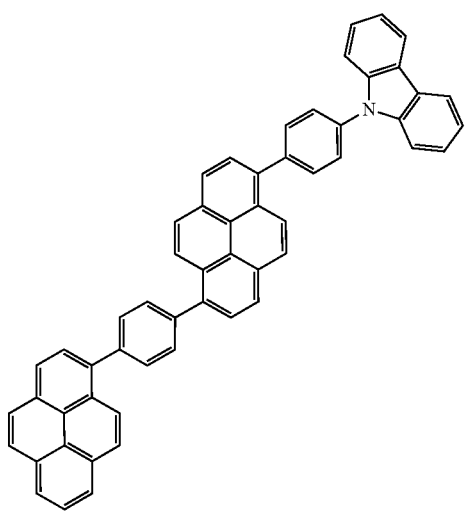
[166]

-continued
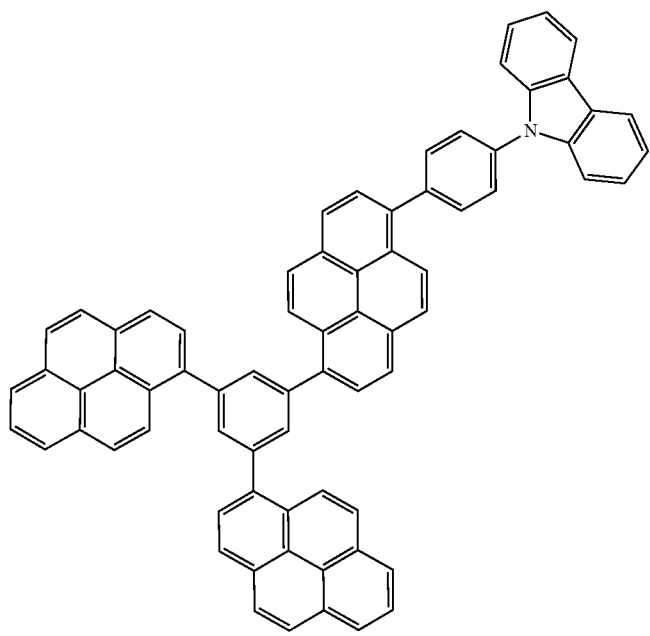
[167]
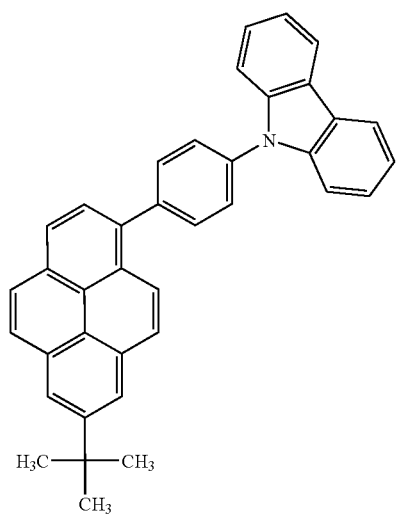
[168]

-continued
[Chemical Formula 27]
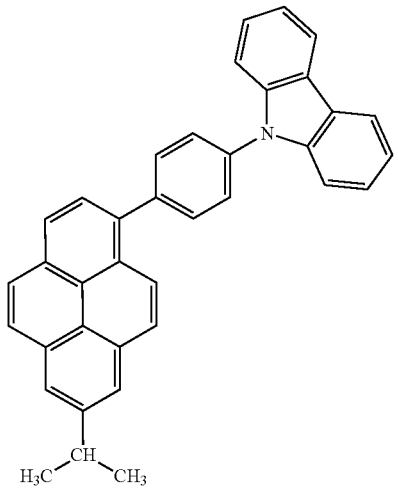
[169]
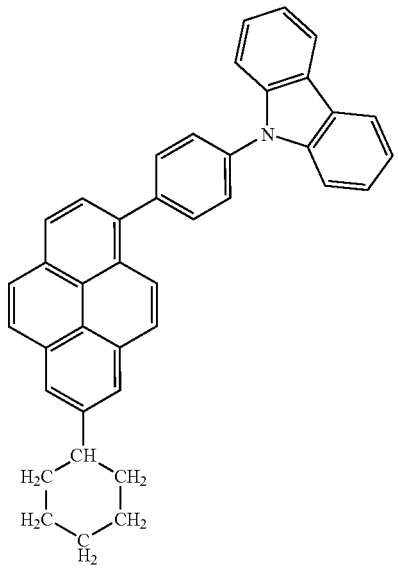
[170]
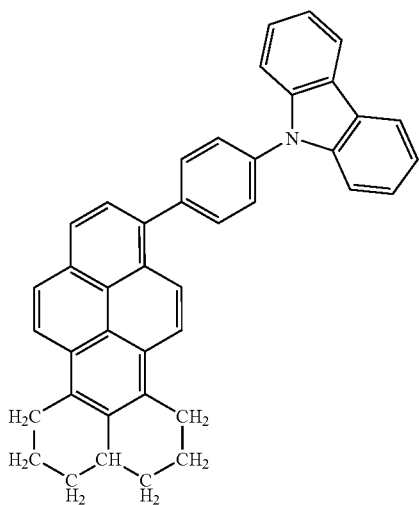
[171]
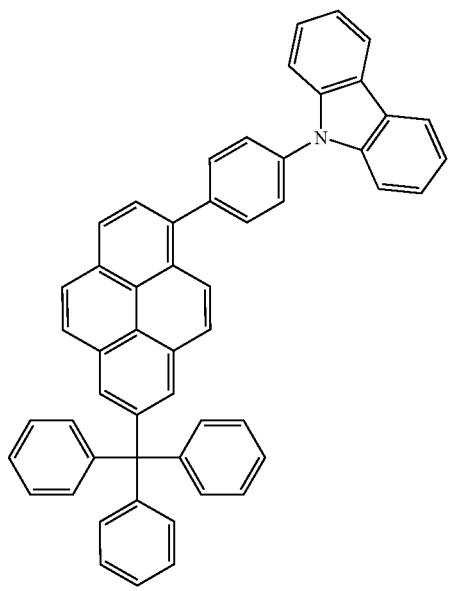
[172]

-continued
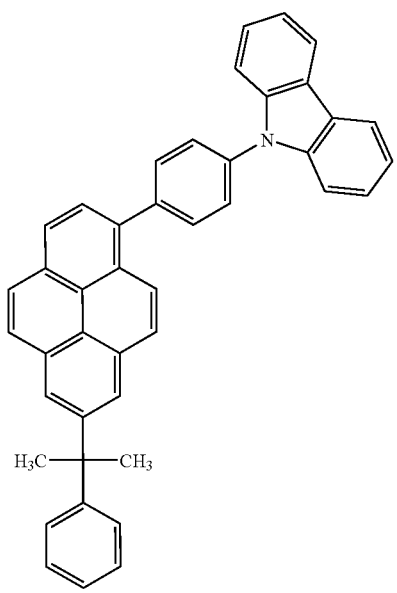
[173]
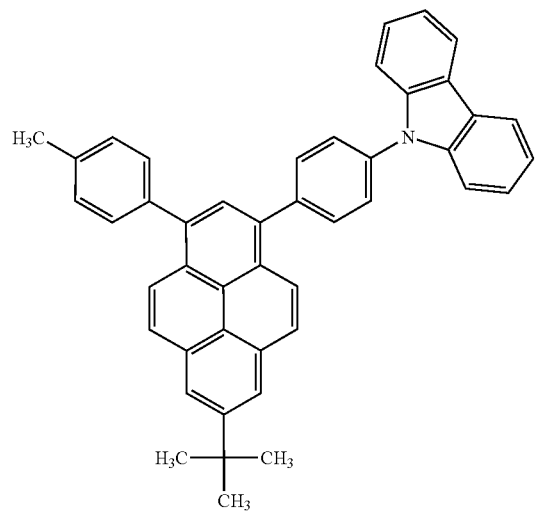
[174]
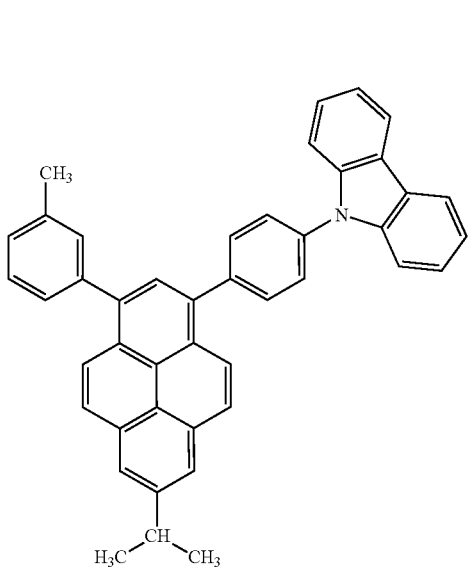
[175]
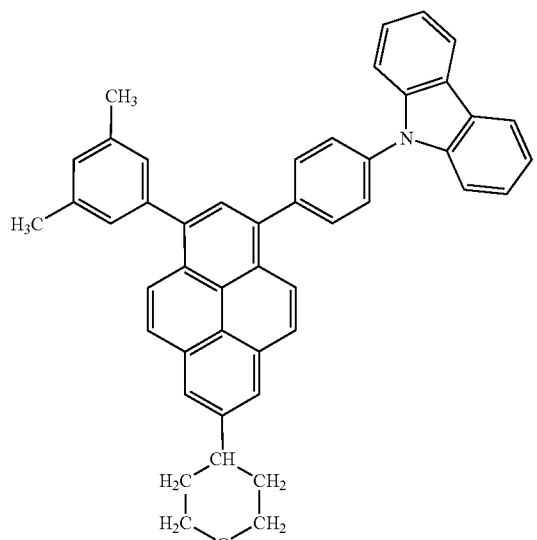
[176]

[Chemical Formula 28]
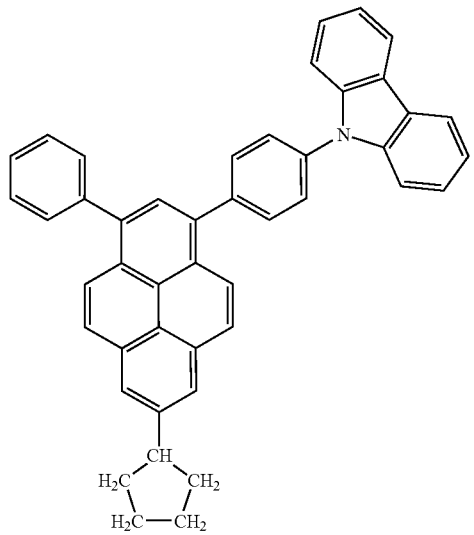
[177]
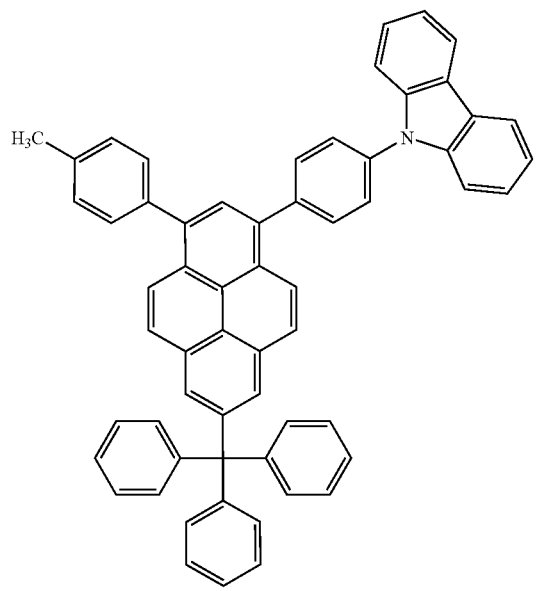
[178]
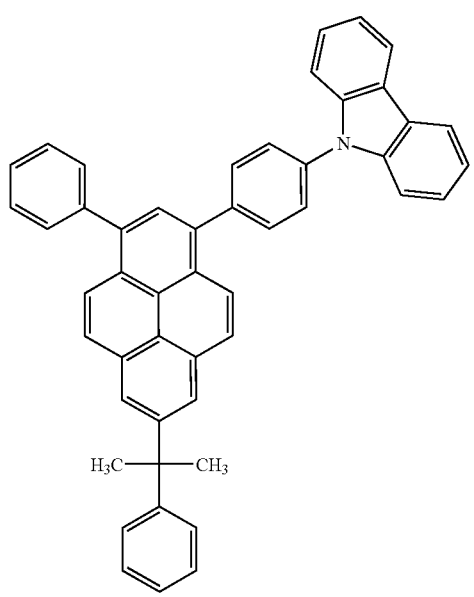
[179]
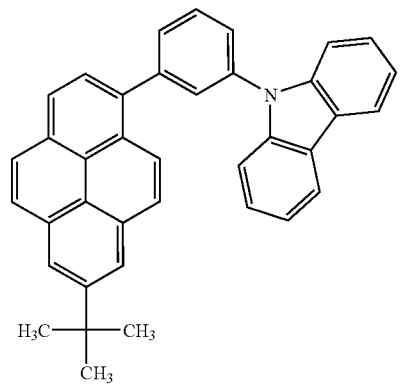
[180]

-continued
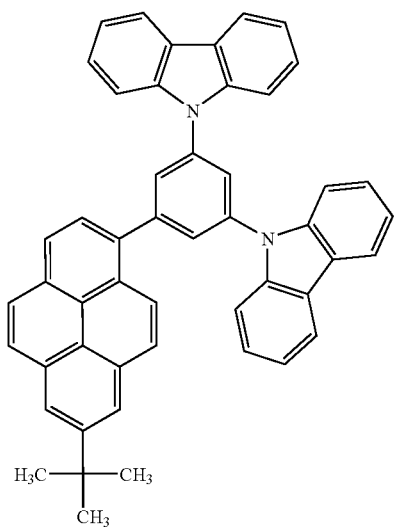
[181]
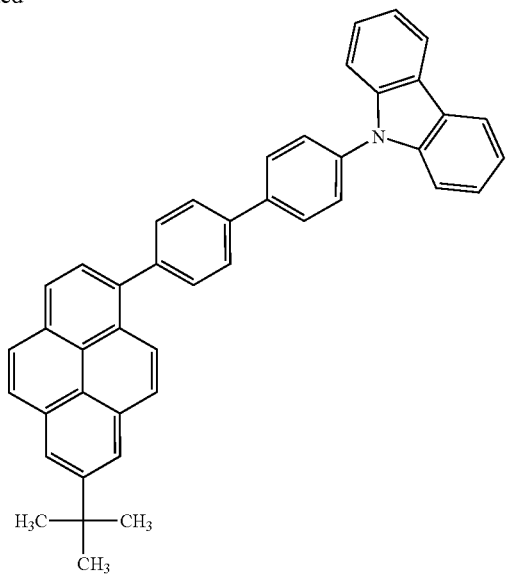
[182]
[Chemical Formula 29]
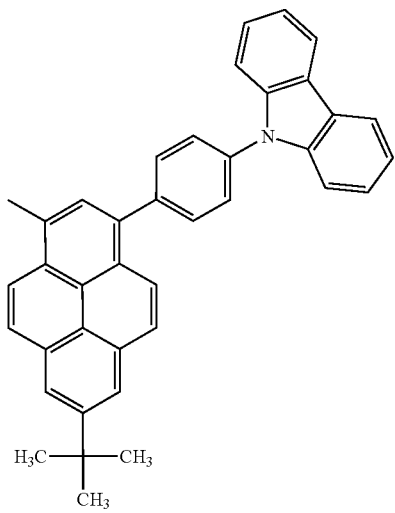
[183]
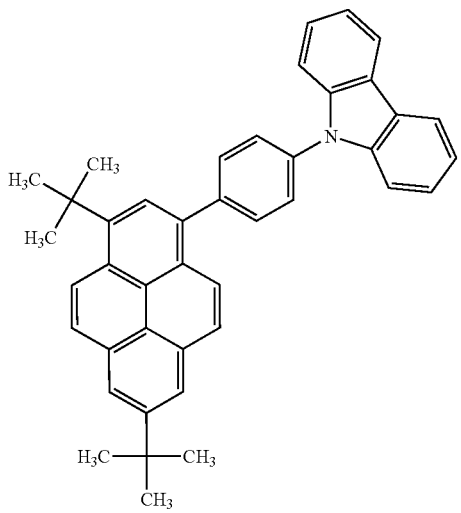
[184]
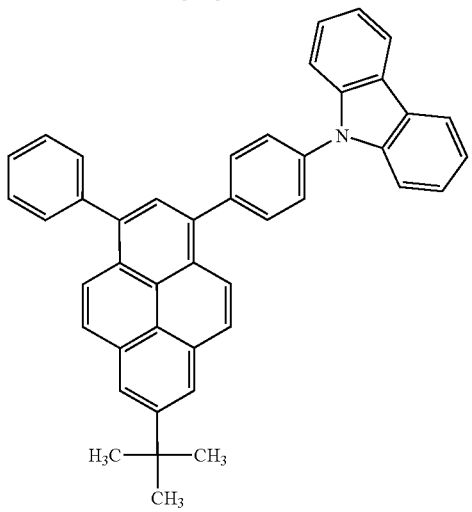
[185]
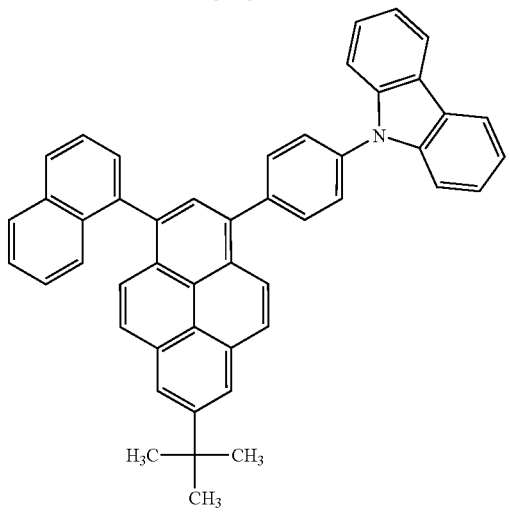
[186]

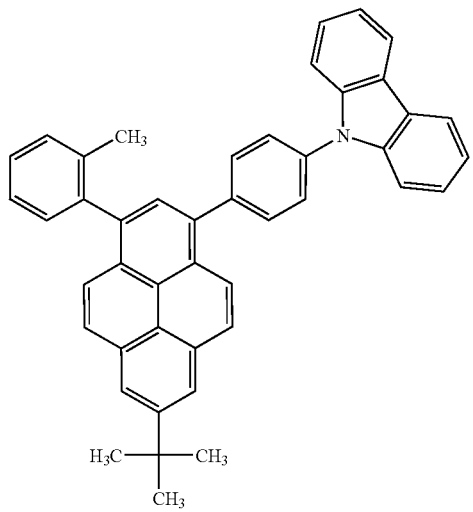
[187]
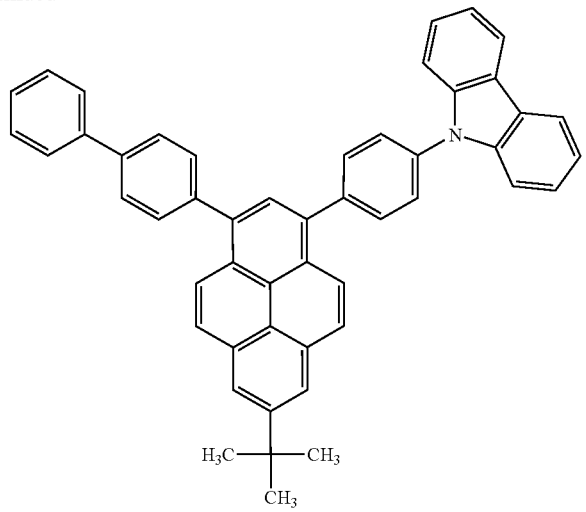
[188]
[Chemical Formula 30]
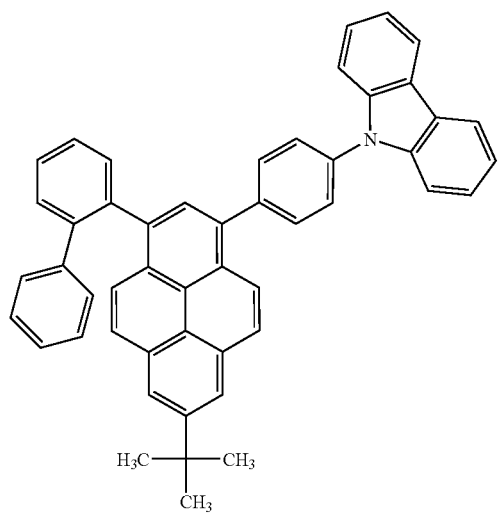
[189]
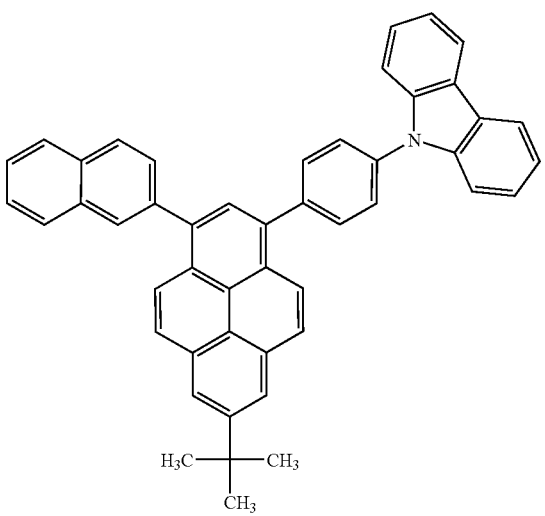
[190]
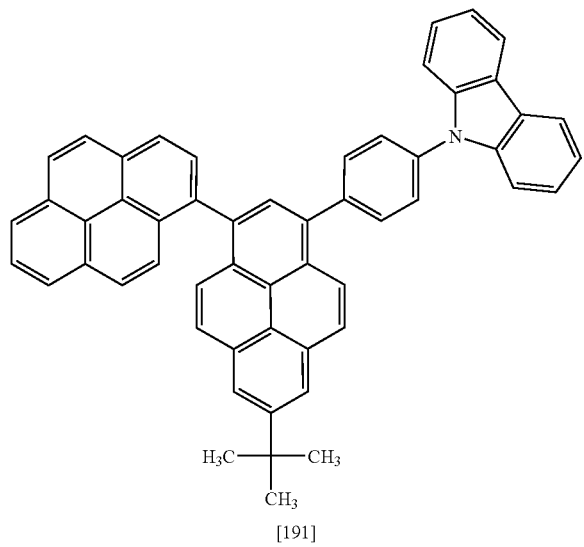
[191]

-continued
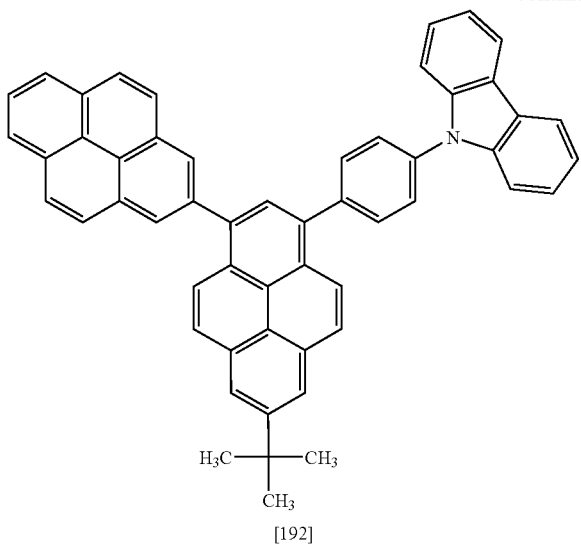
[192]
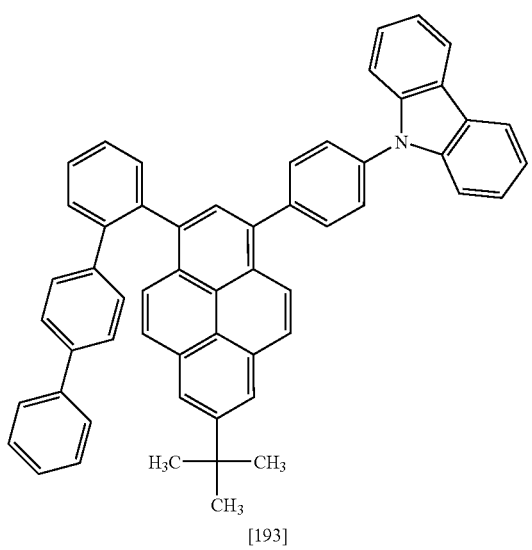
[193]
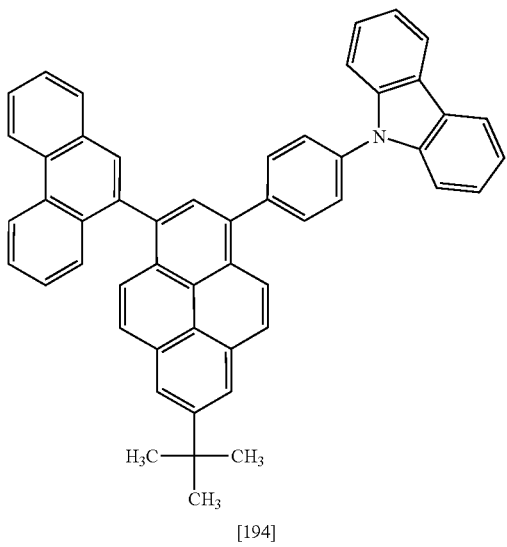
[194]
[Chemical Formula 31]
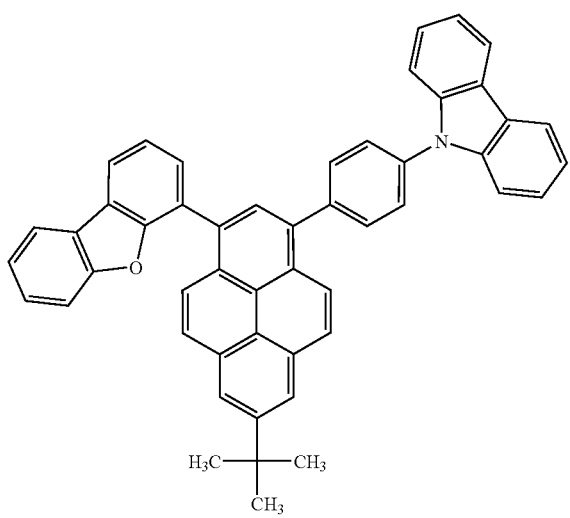
[195]
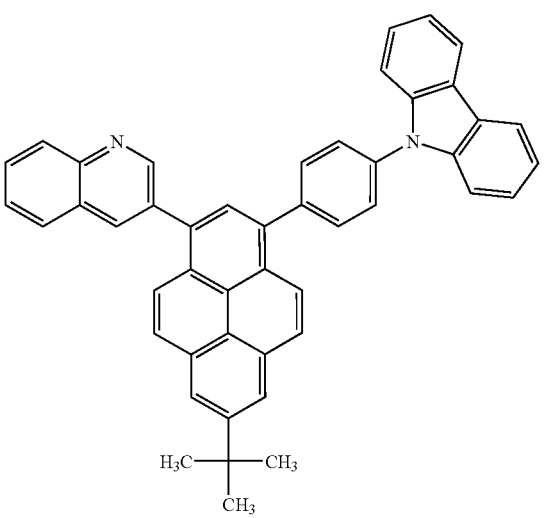
[196]

-continued
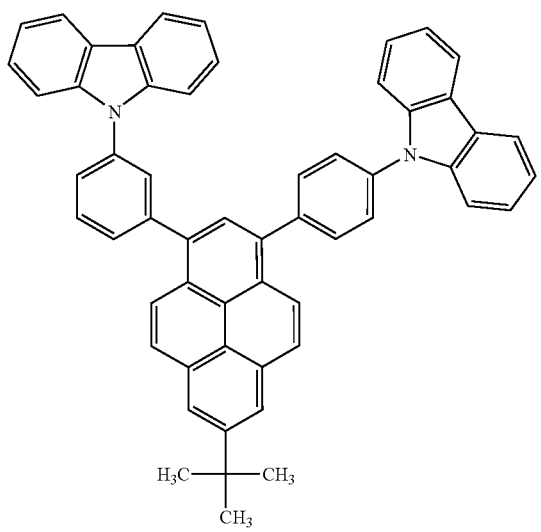
[197]
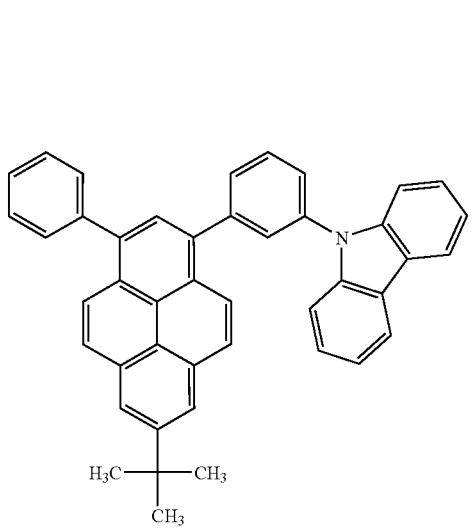
[198]
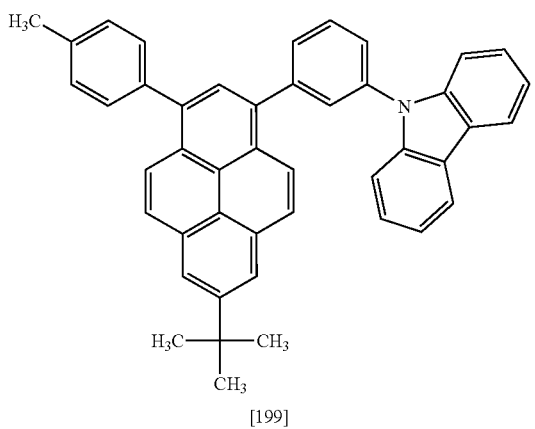
[199]
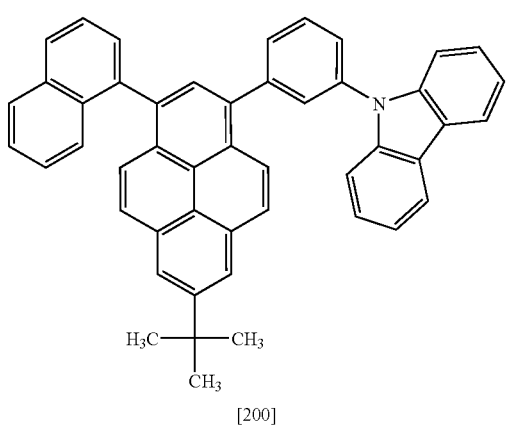
[200]
[Chemical Formula 32]
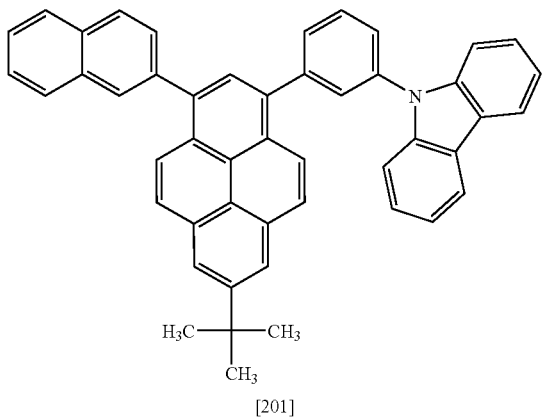
[201]
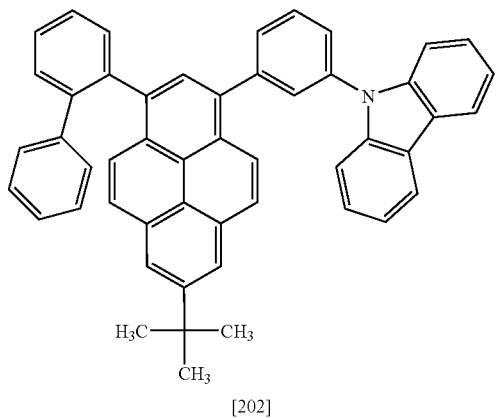
[202]

-continued
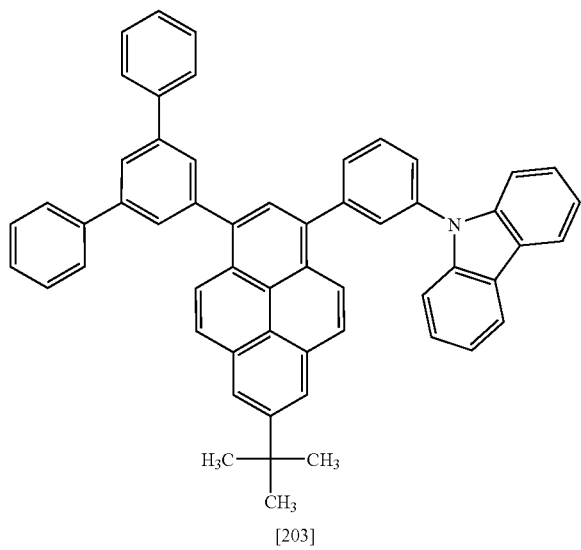
[203]
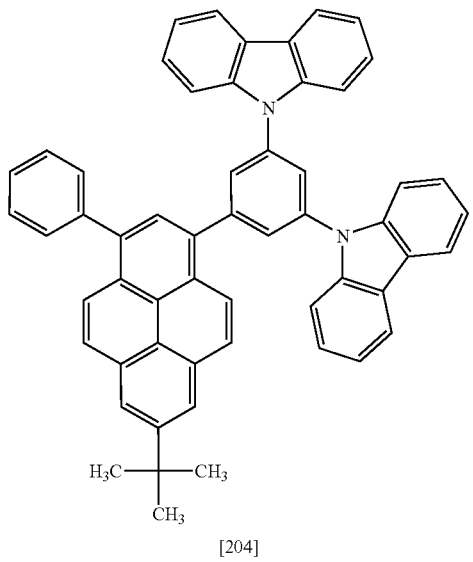
[204]
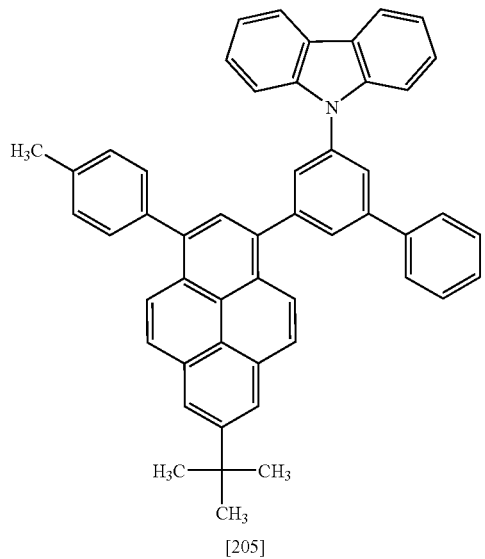
[205]
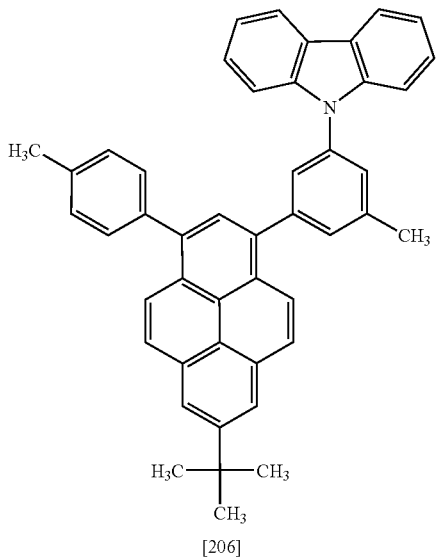
[206]
[Chemical Formula 33]
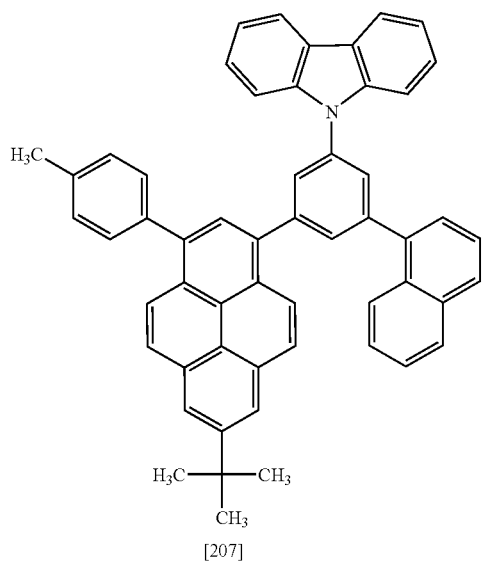
[207]
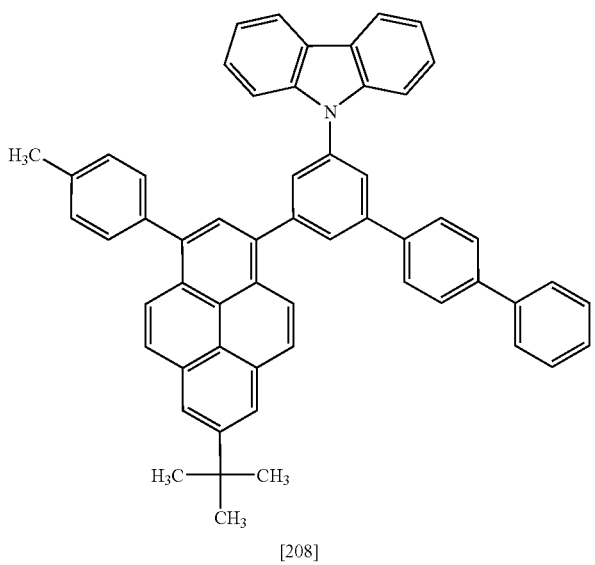
[208]

-continued
101
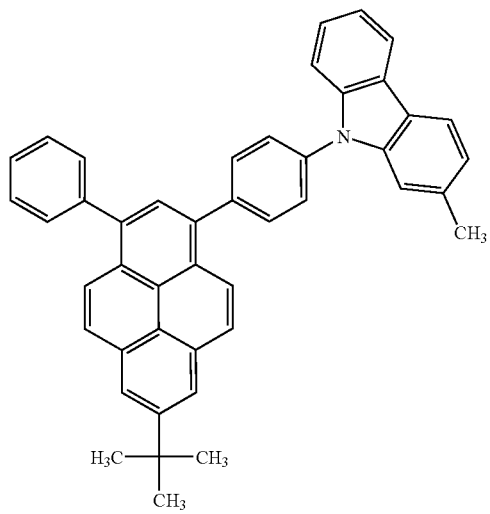
[209]
102
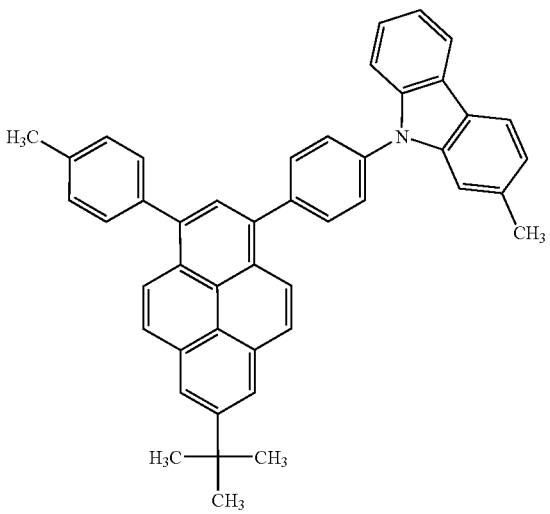
[210]
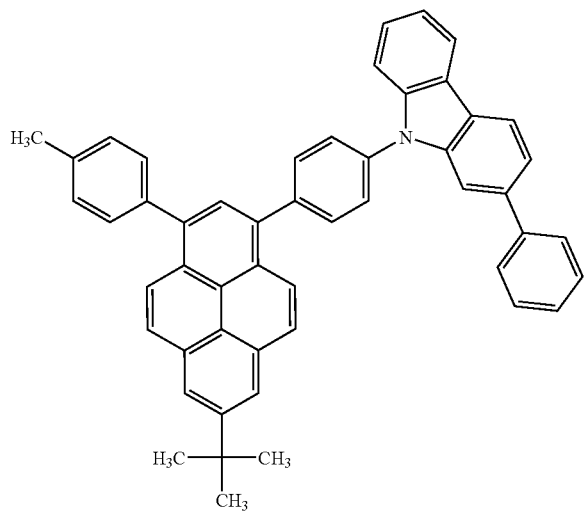
[211]
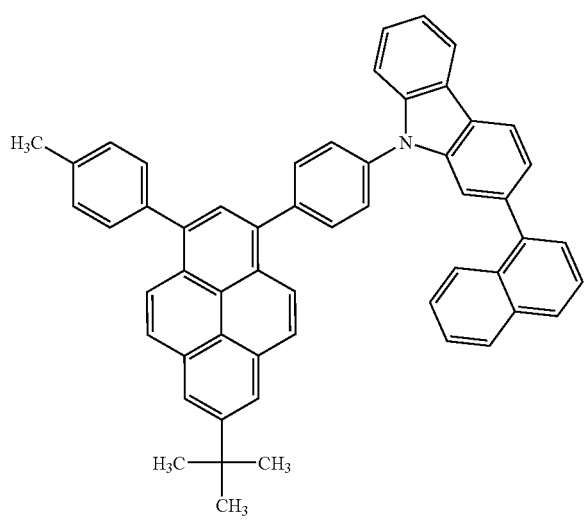
[212]

-continued
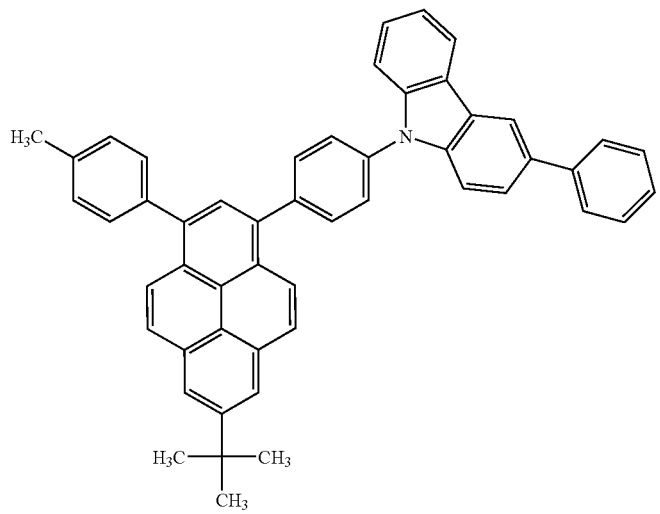
[213]
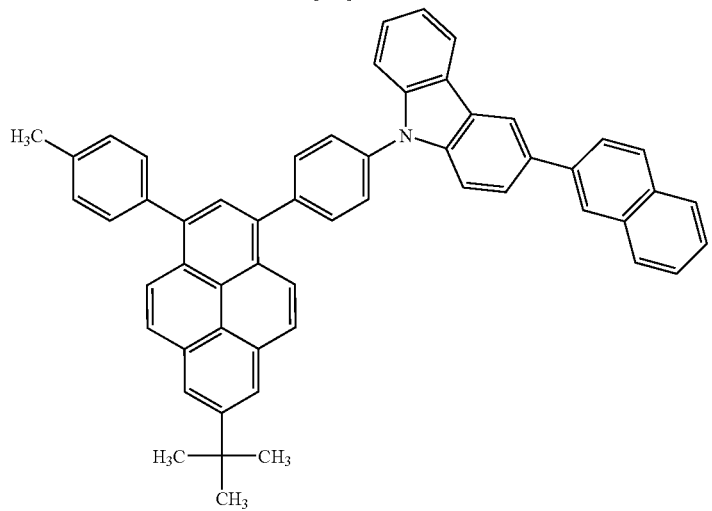
[214]
[Chemical Formula 34]
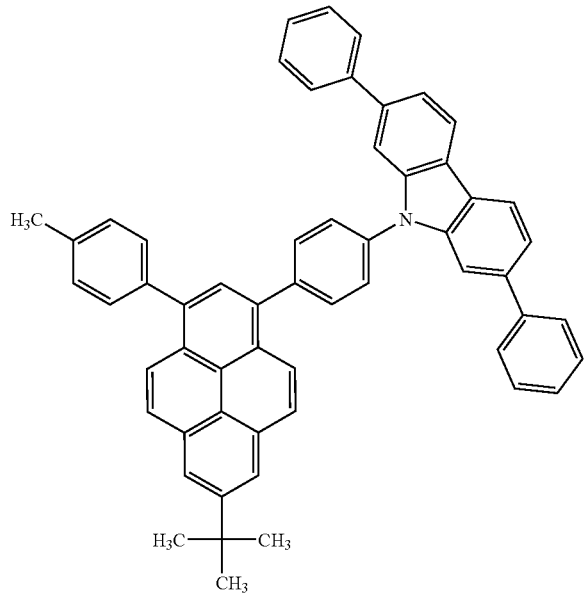
[215]

-continued
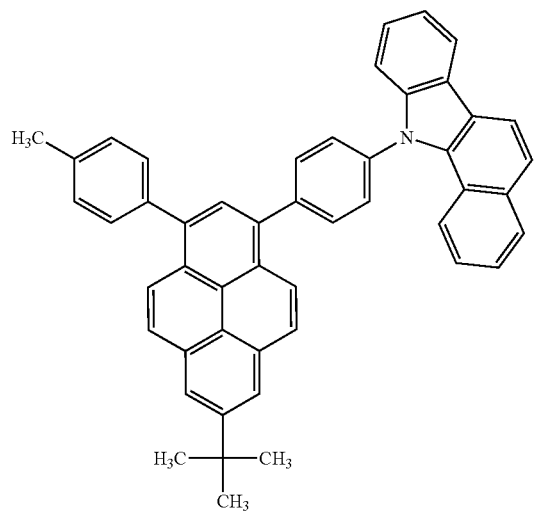
[216]
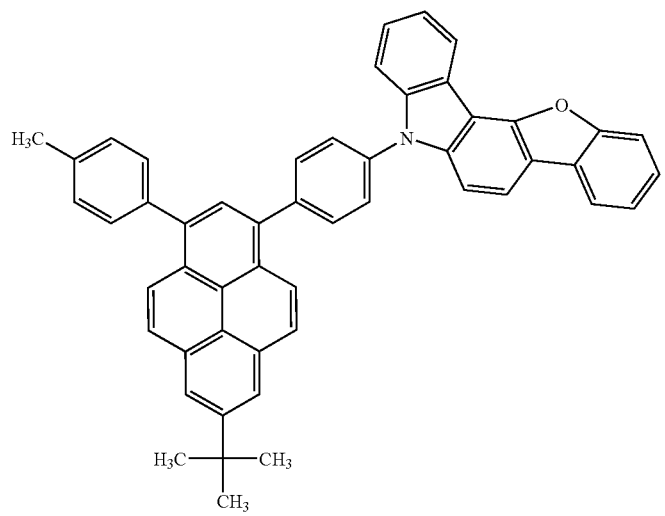
[217]
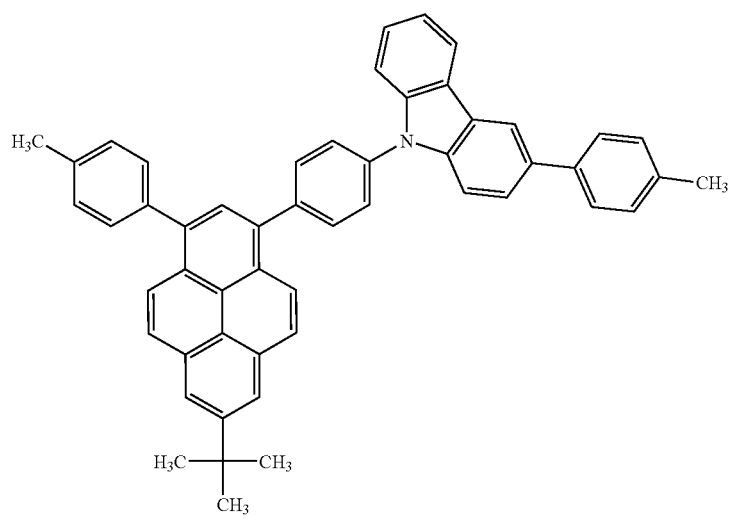
[218]

-continued
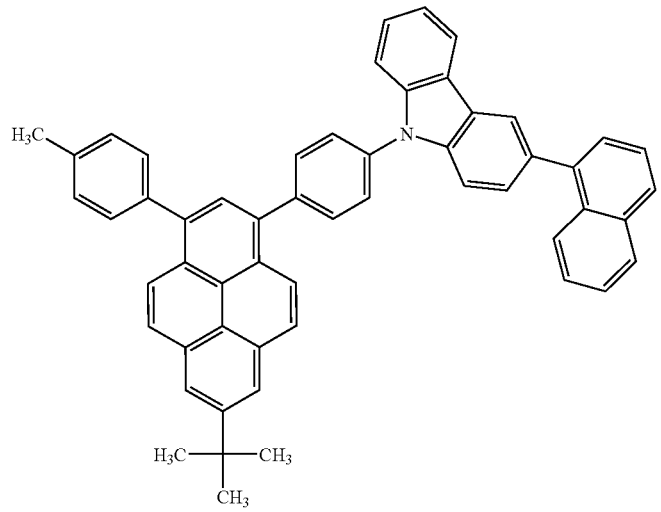
[219]
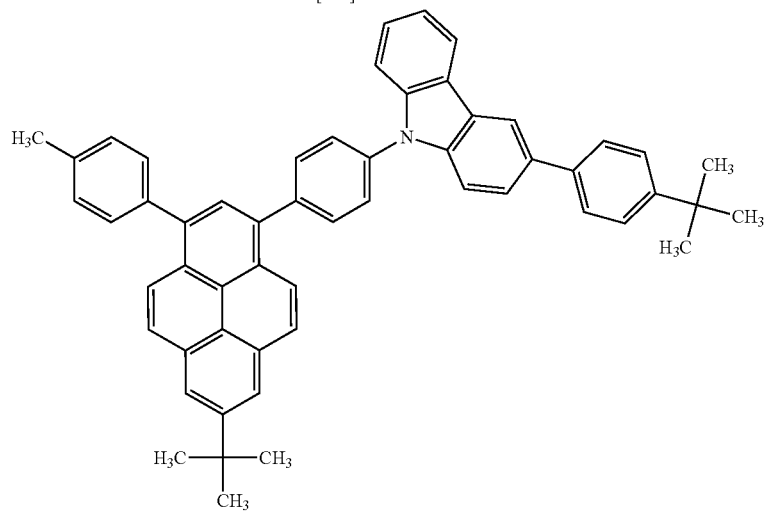
[220]
[Chemical Formula 35]
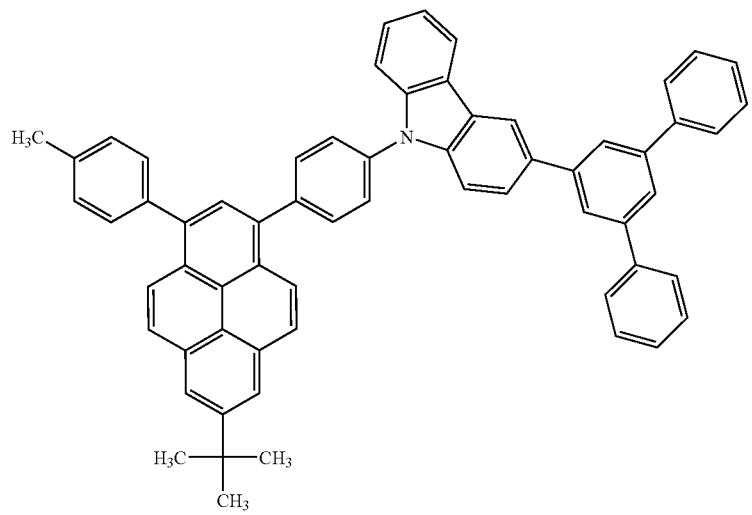
[221]

-continued
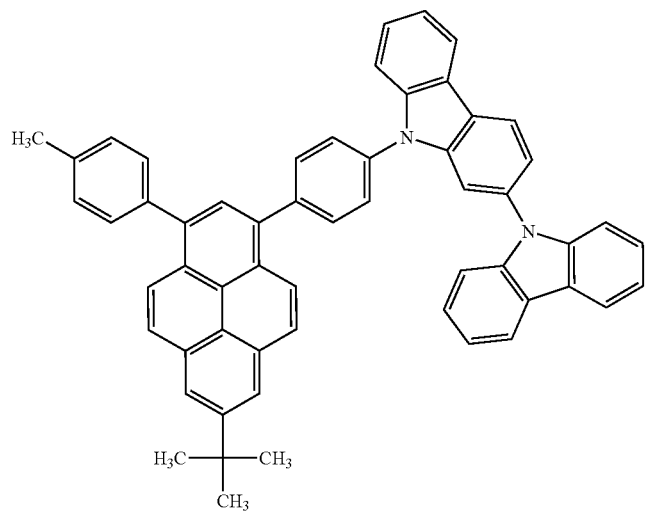
[222]
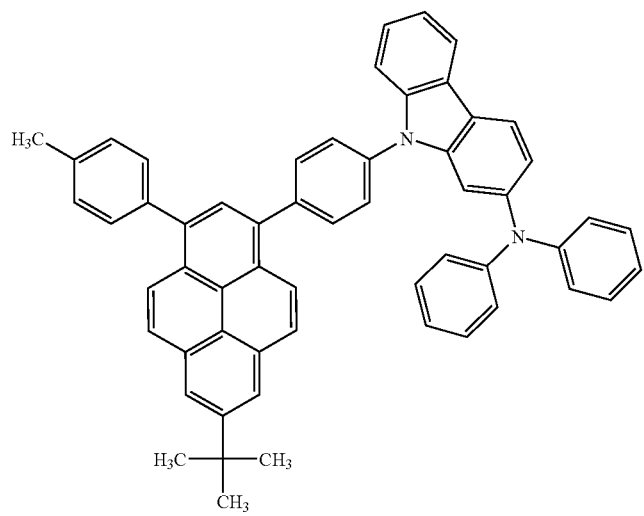
[223]
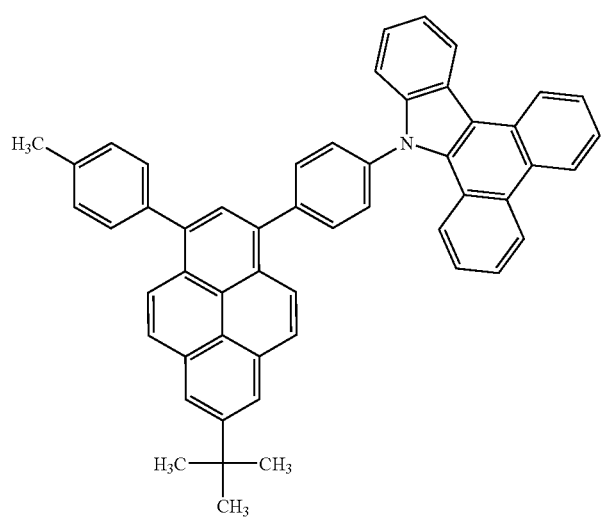
[224]

-continued
[Chemical Formula 36]
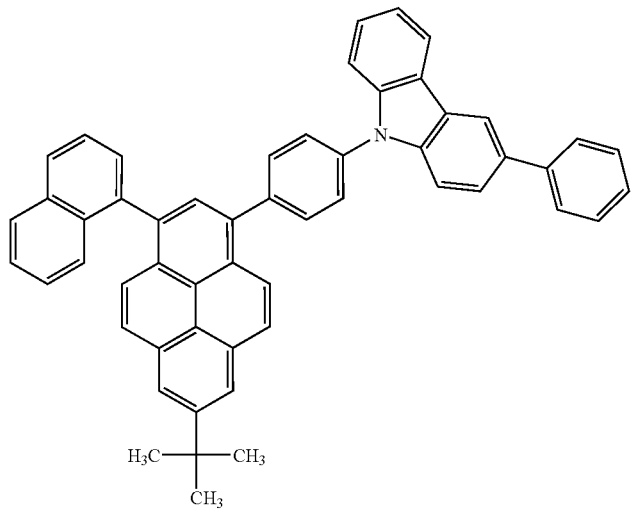
[225]
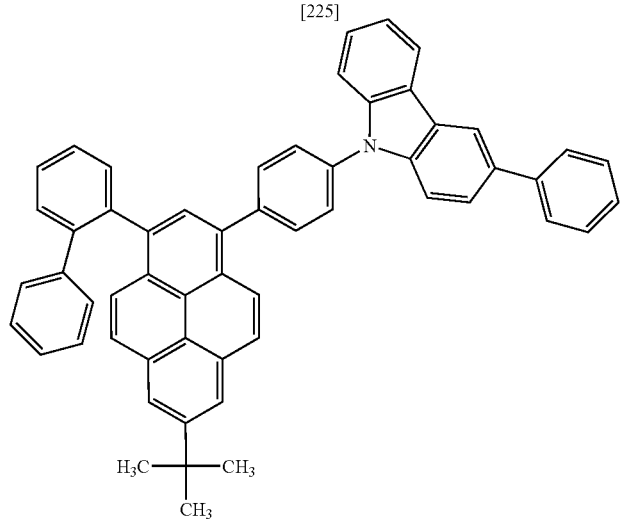
[226]
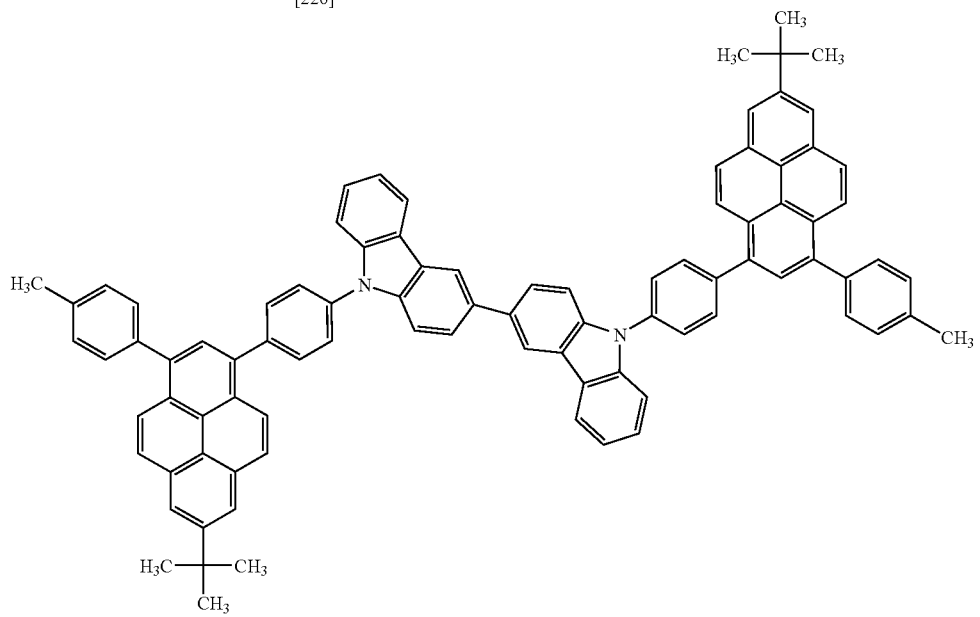
[227]

-continued
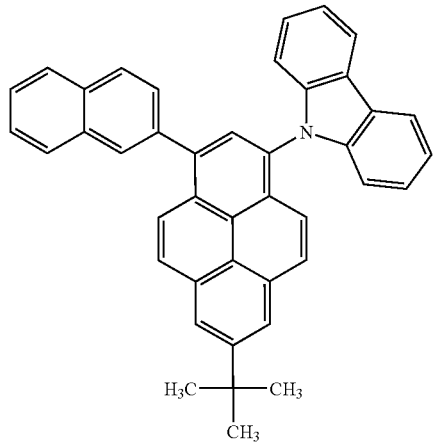
[228]
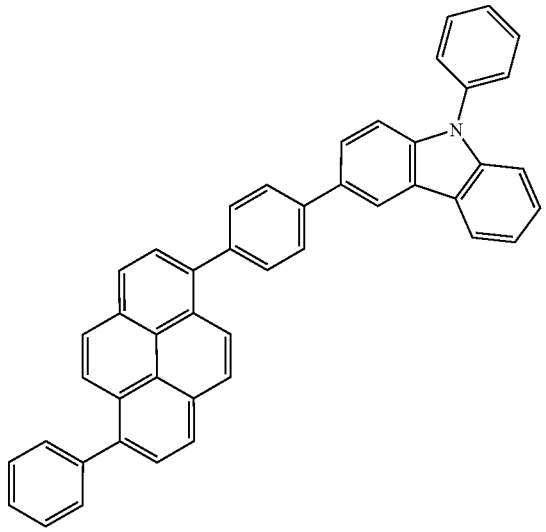
[229]
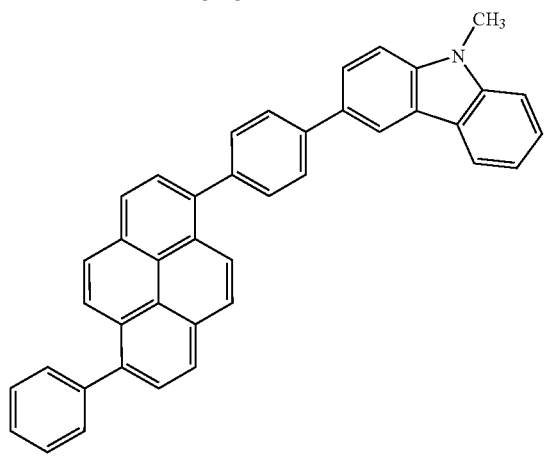
[230]
[Chemical Formula 37]
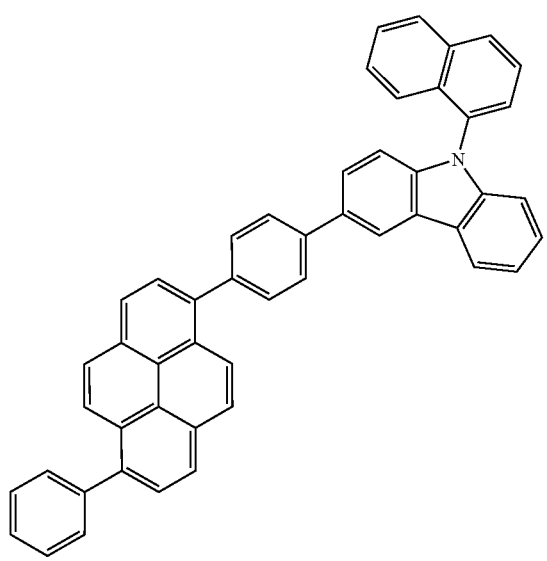
[231]

-continued
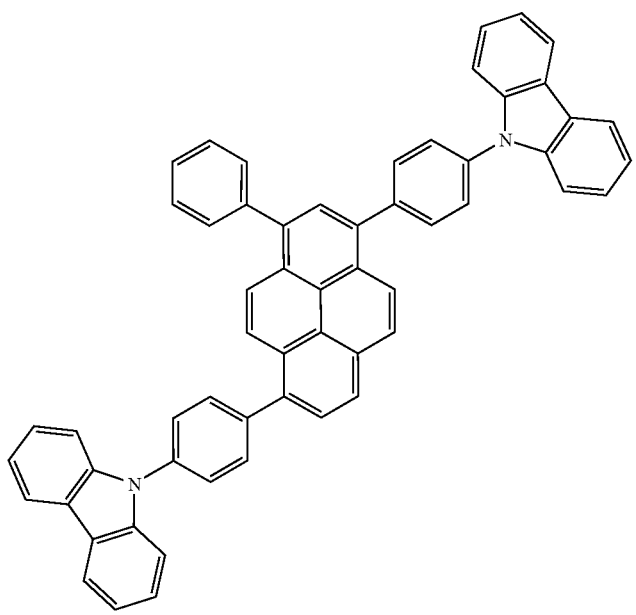
[232]
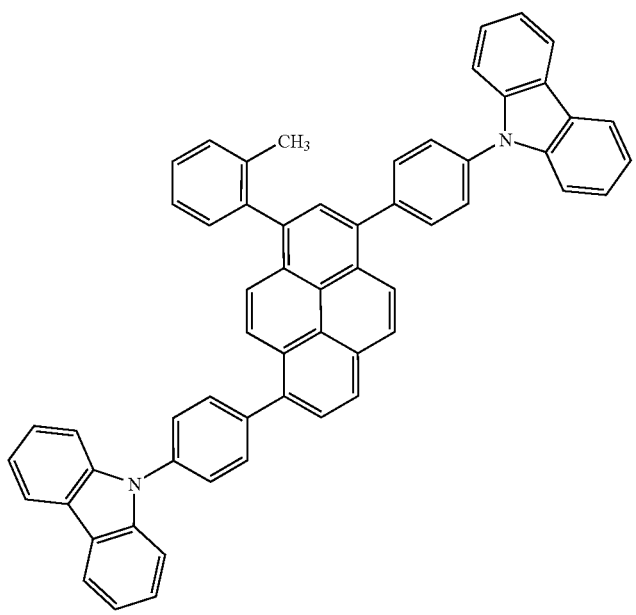
[233]

-continued
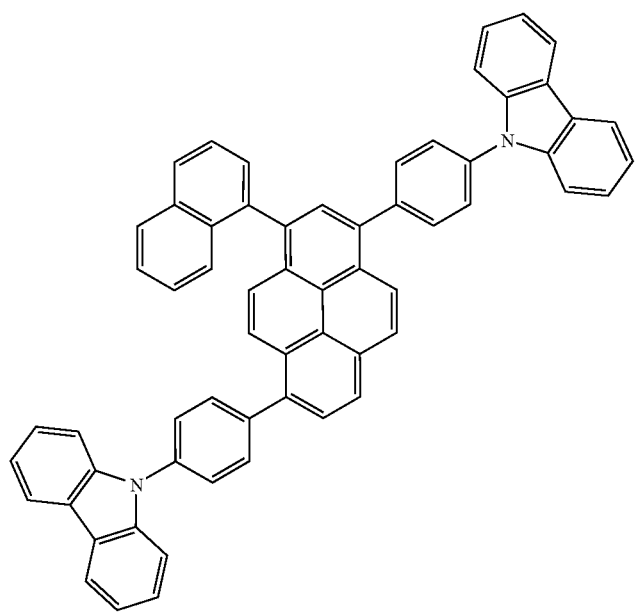
[234]
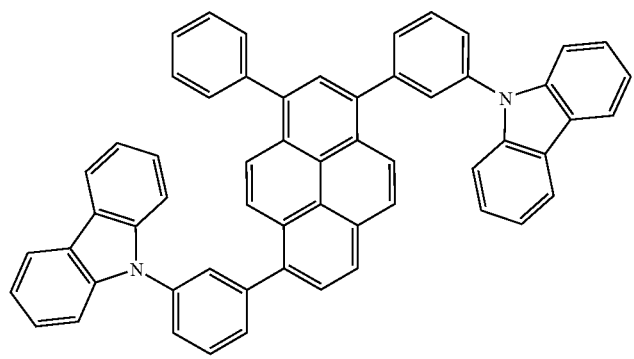
[235]
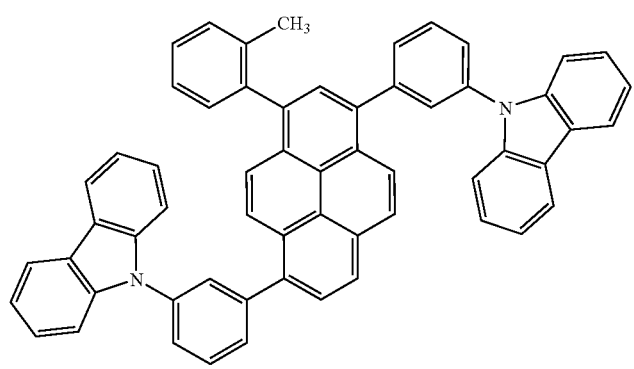
[236]

-continued
[Chemical Formula 38]
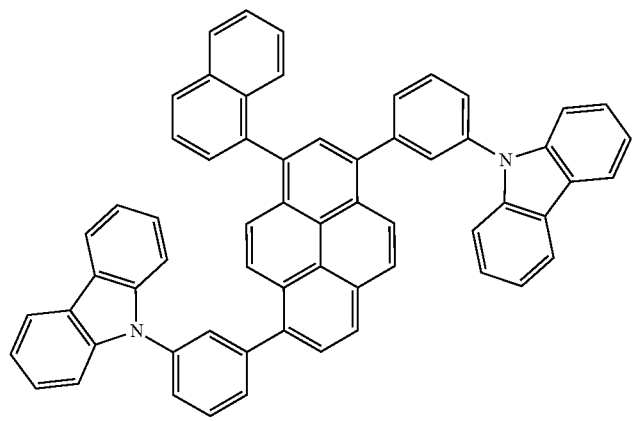
[237]
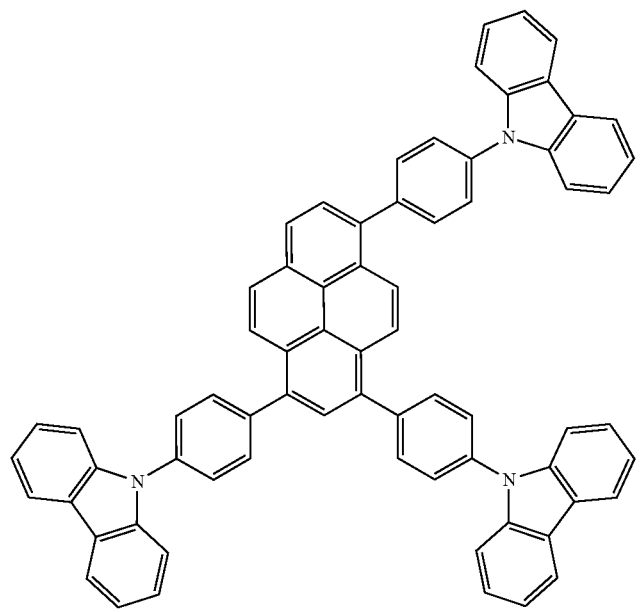
[238]

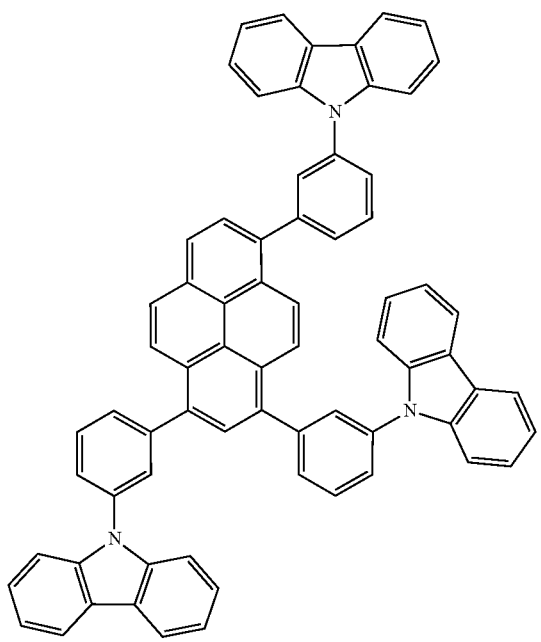
[239]
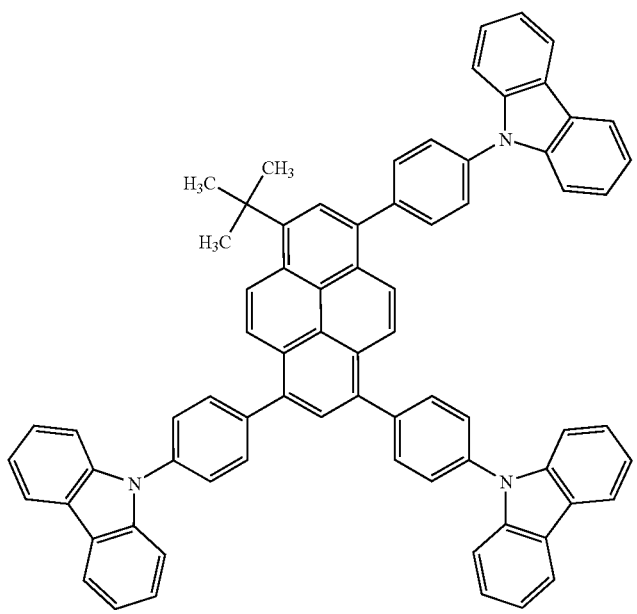
[240]

-continued
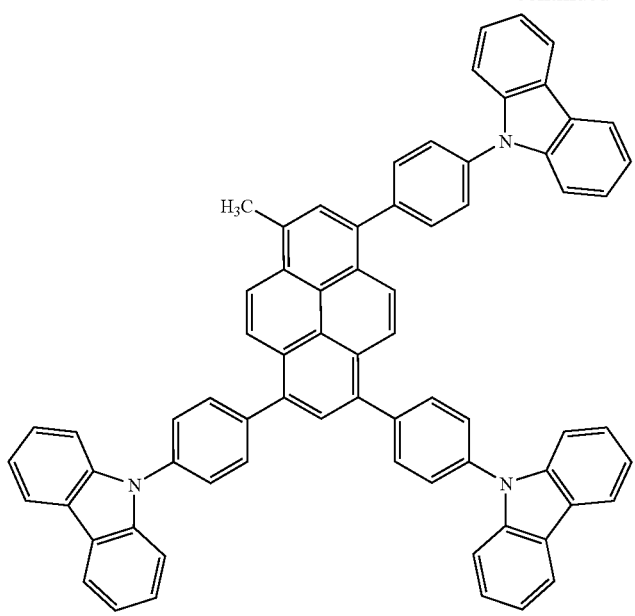
[241]
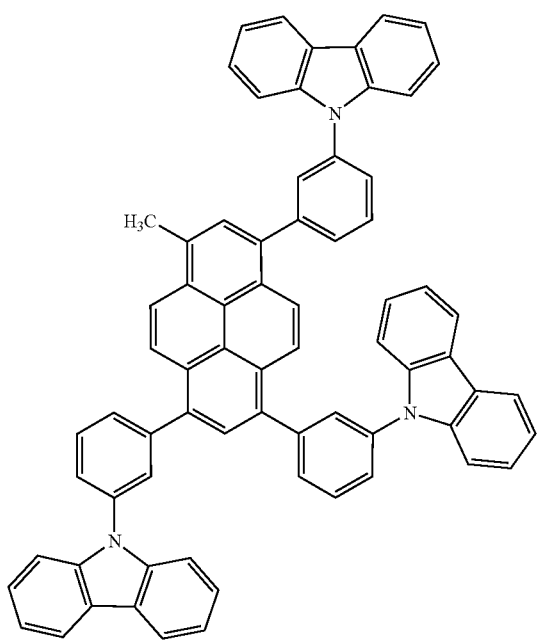
[242]

[Chemical Formula 39]
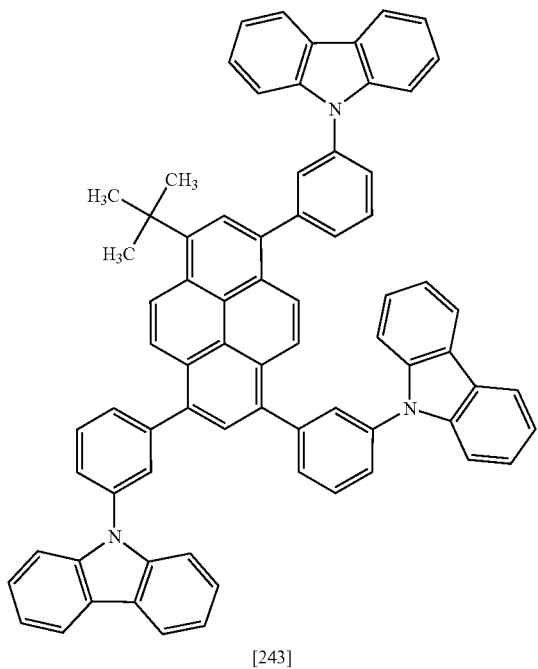
[243]
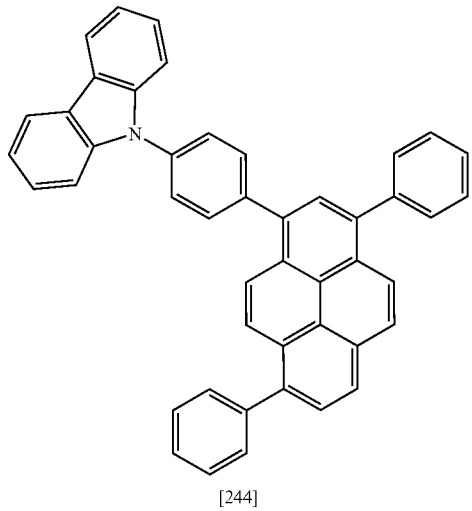
[244]
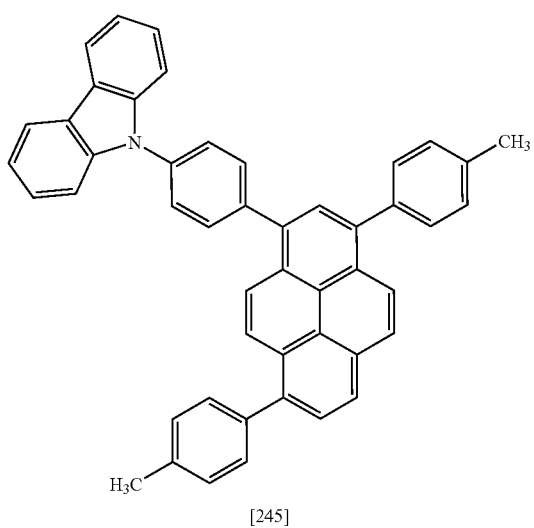
[245]
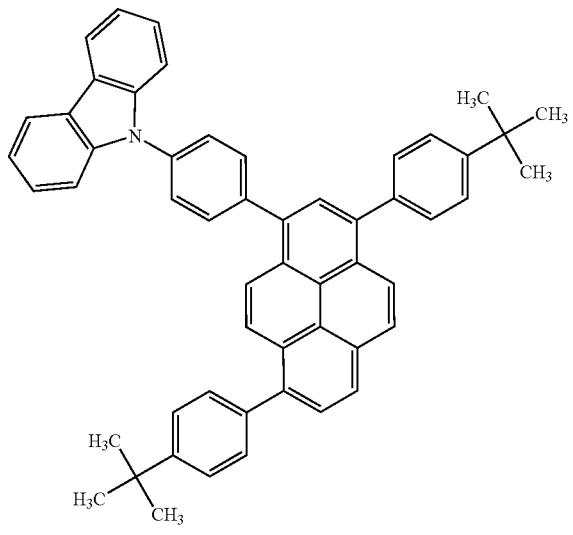
[246]

-continued
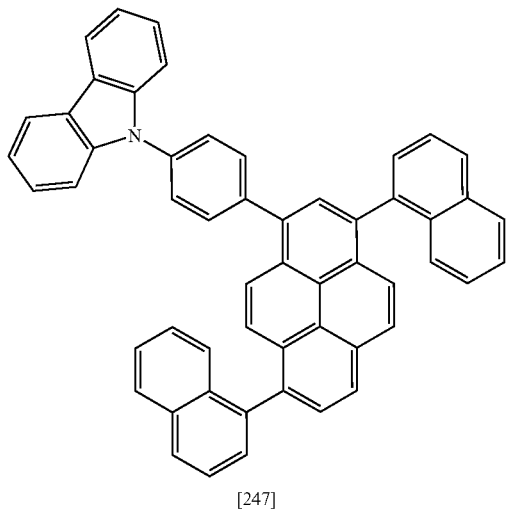
[247]
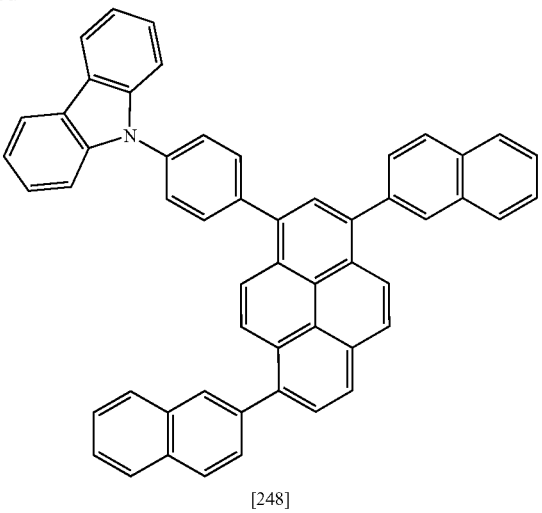
[248]
[Chemical Formula 40]
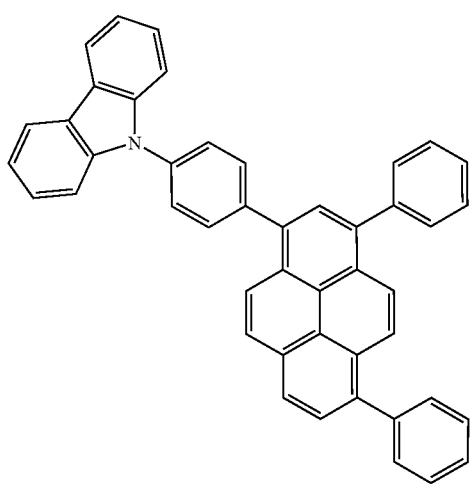
[249]
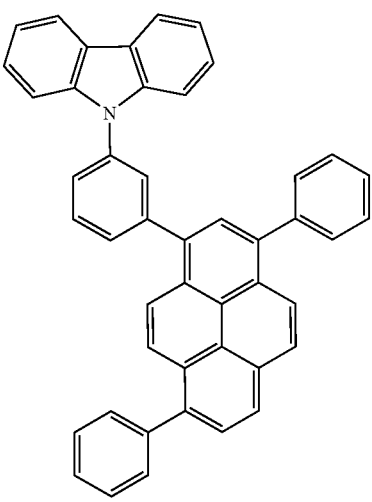
[250]
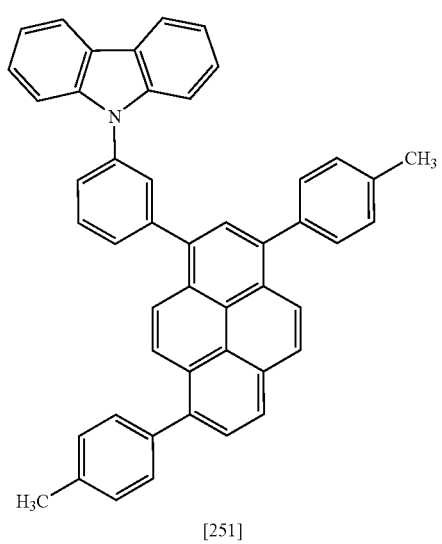
[251]
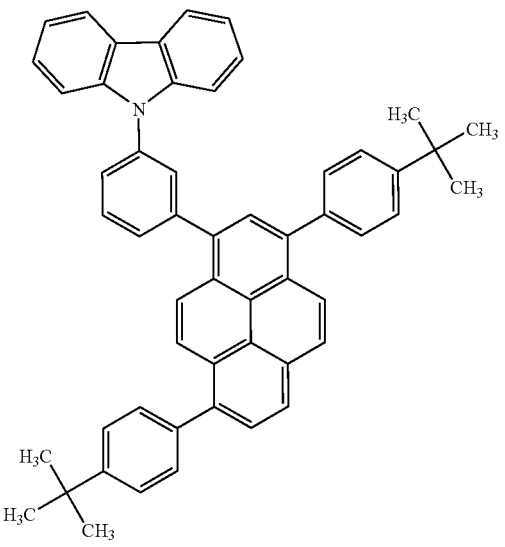
[252]

-continued
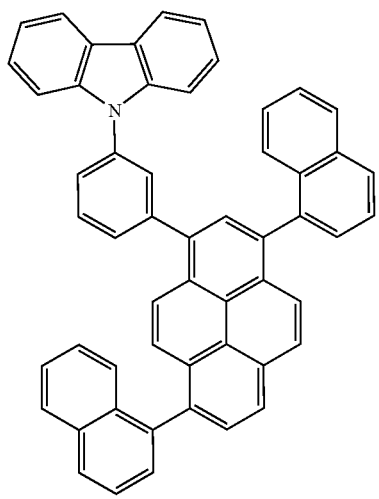
[253]
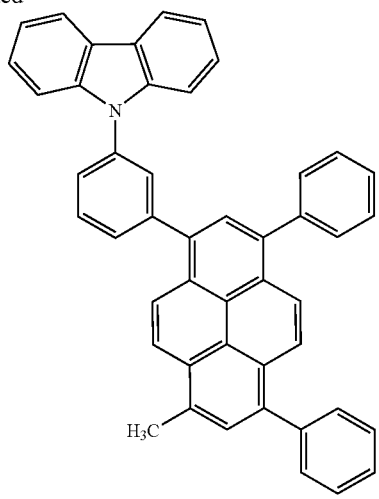
[254]
[Chemical Formula 41]
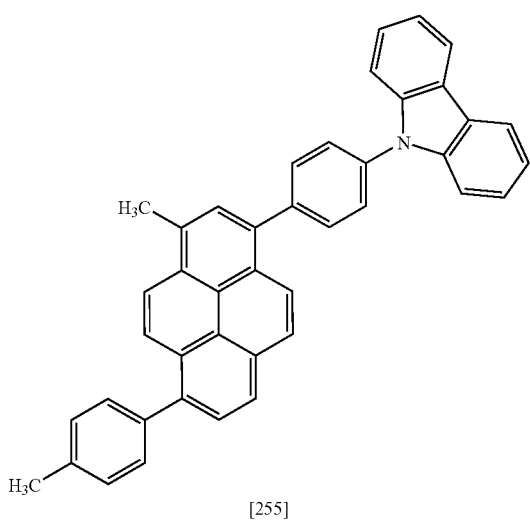
[255]
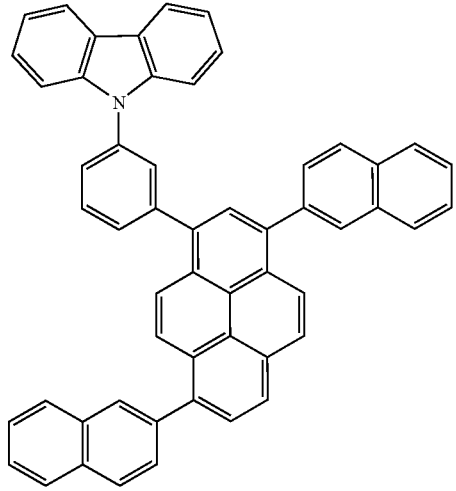
[256]
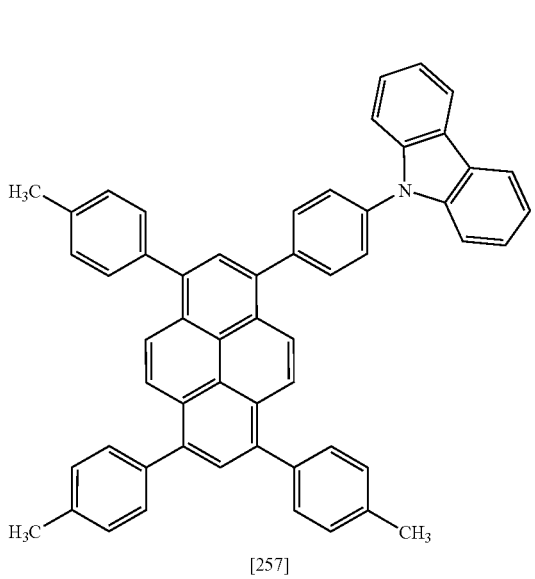
[257]
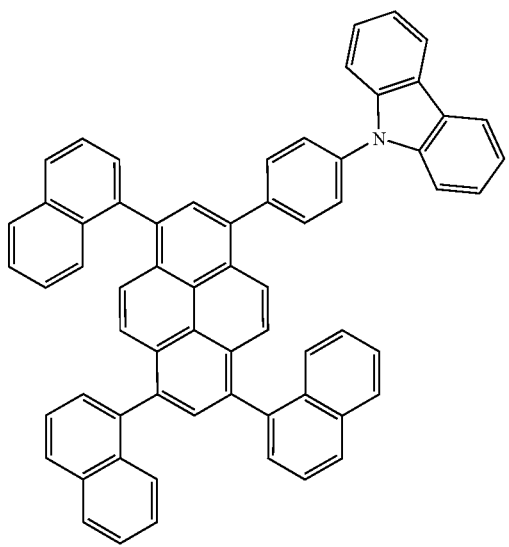
[258]

-continued
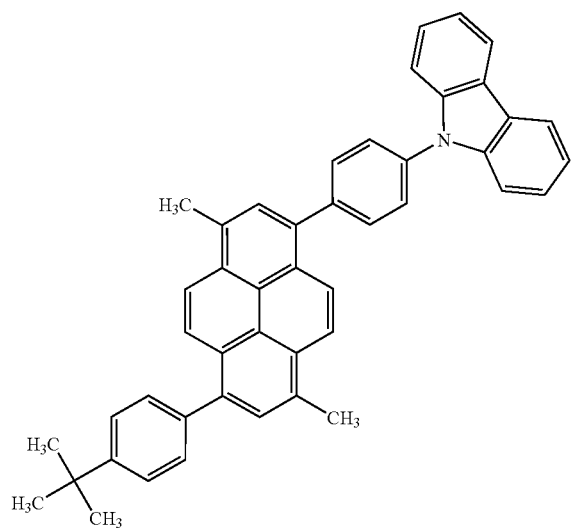
[259]
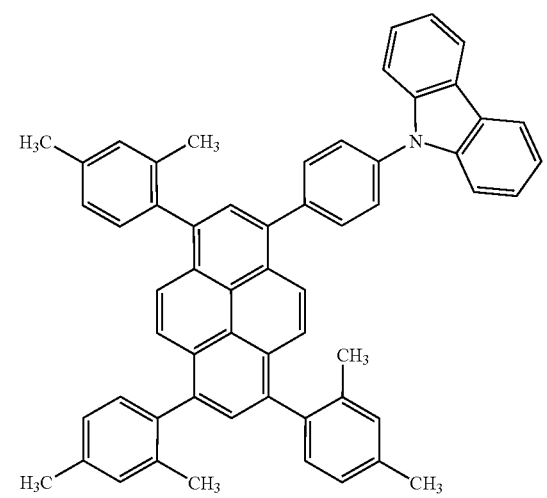
[260]
[Chemical Formula 42]
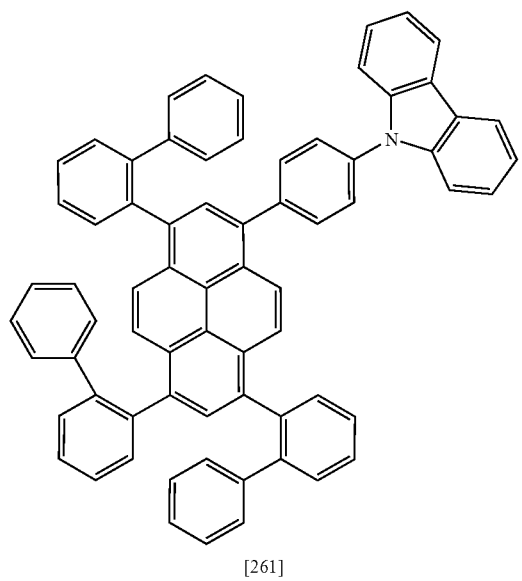
[261]
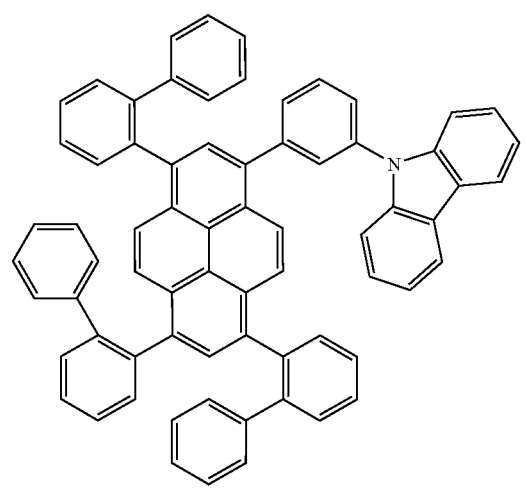
[262]

-continued
133
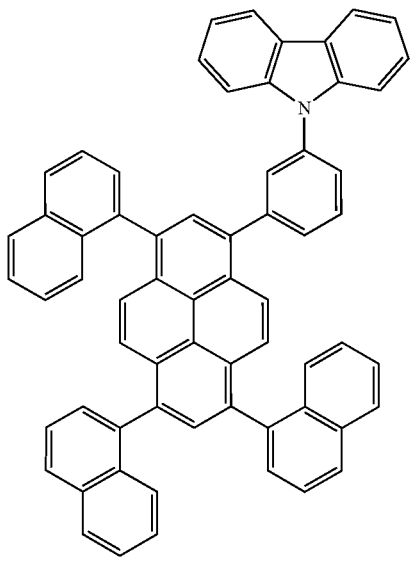
[263]
134
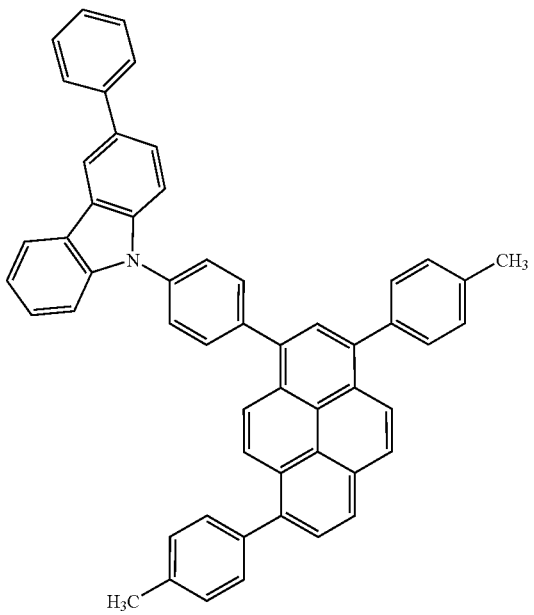
[264]
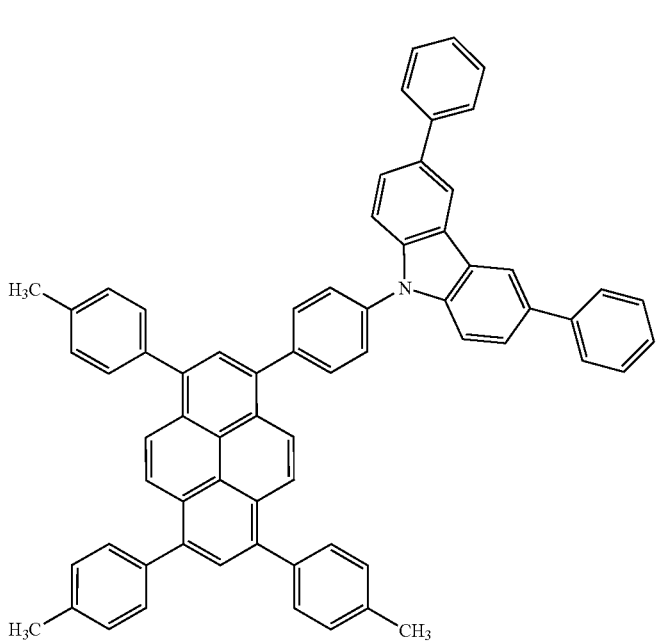
[265]
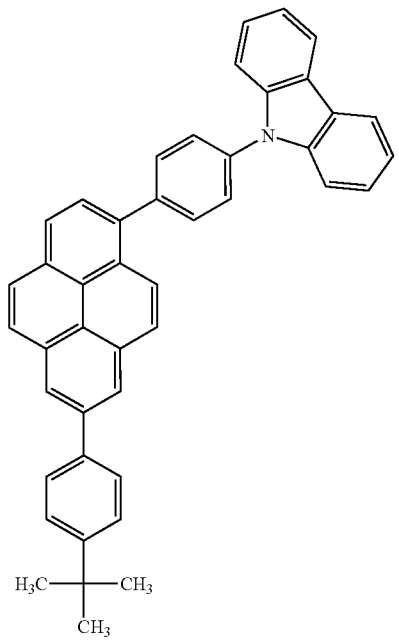
[266]

-continued
[Chemical Formula 43]
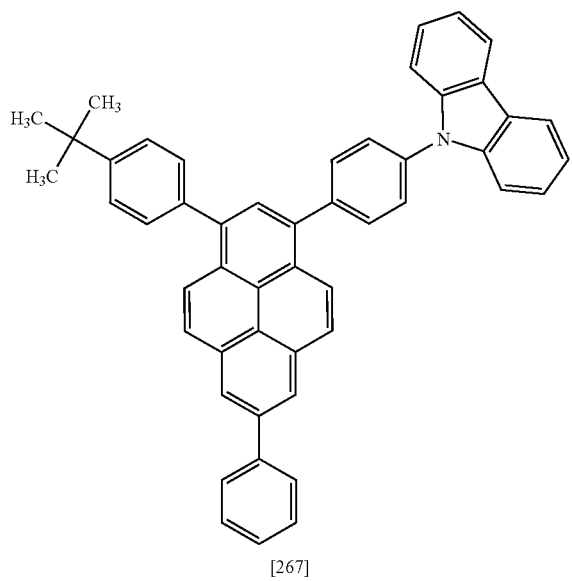
[267]
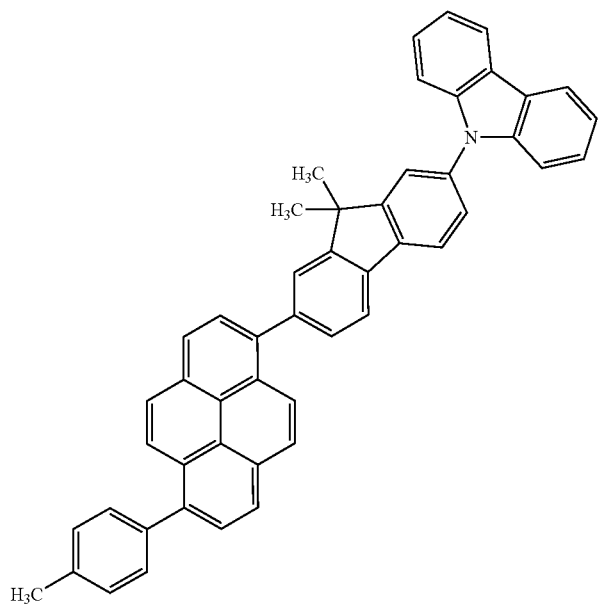
[268]
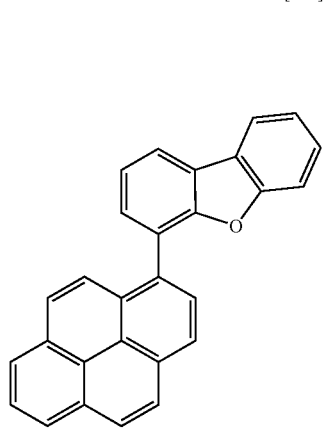
[269]
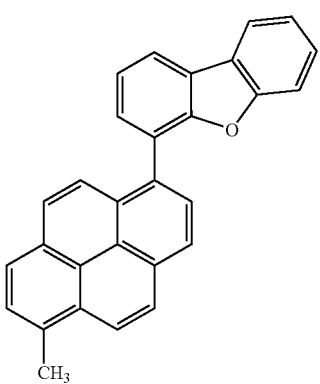
[270]
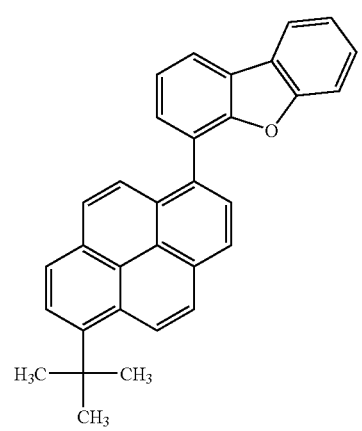
[271]

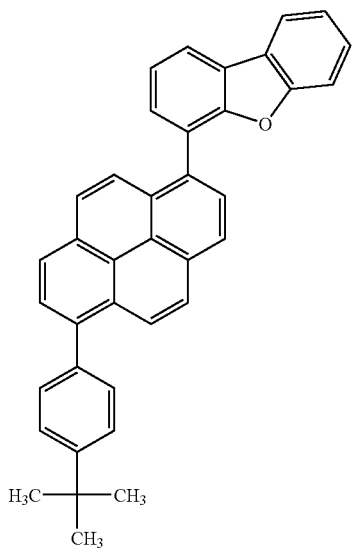
[272]
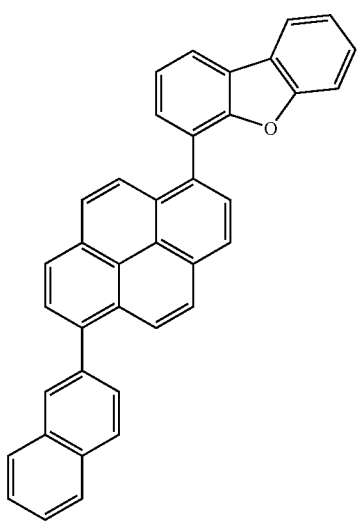
[273]
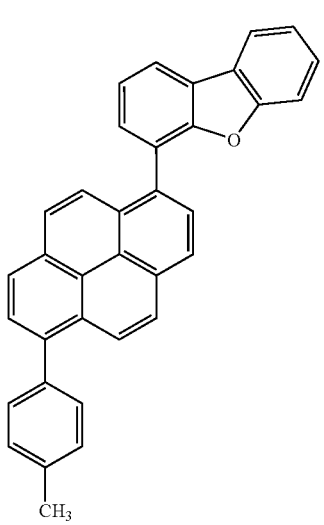
[274]
[Chemical Formula 44]
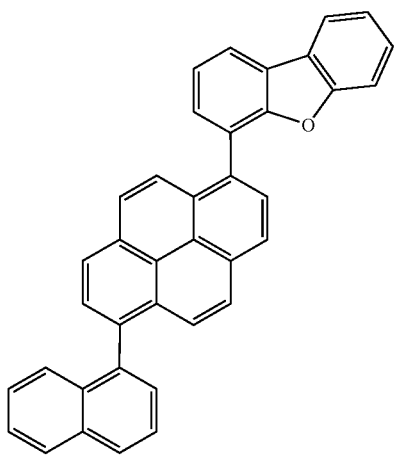
[275]
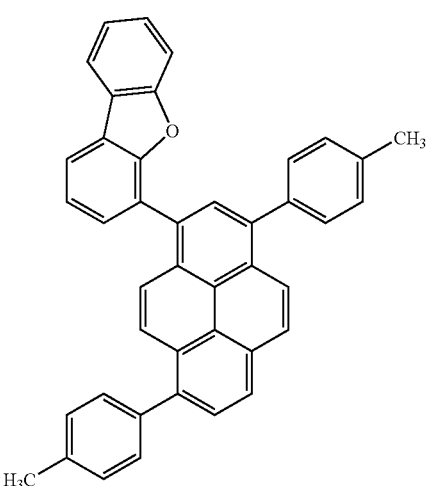
[276]
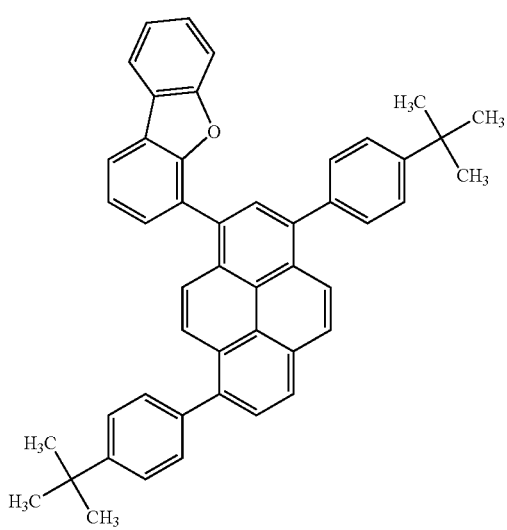
[277]
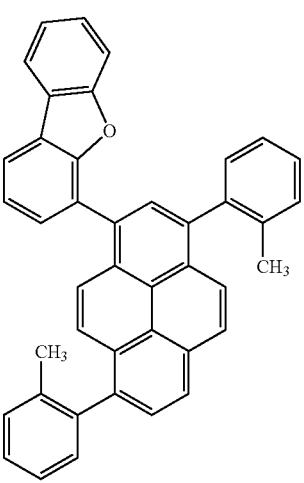
[278]

-continued
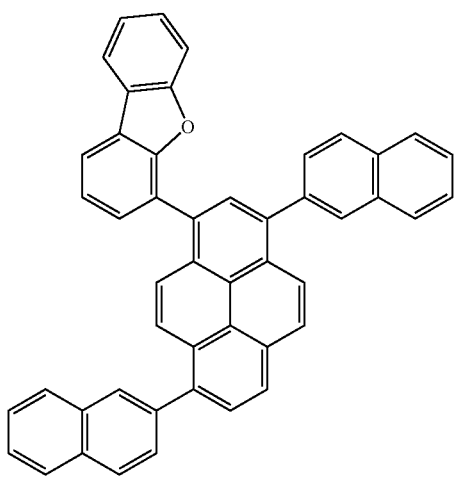
[279]
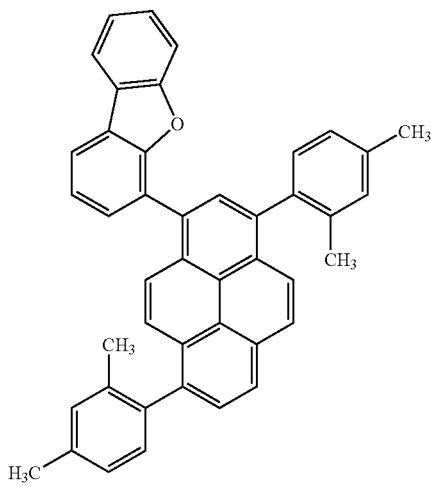
[280]
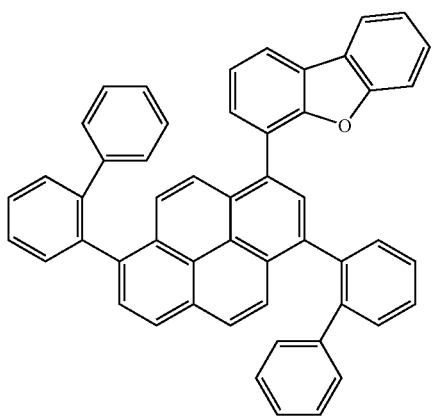
[281]
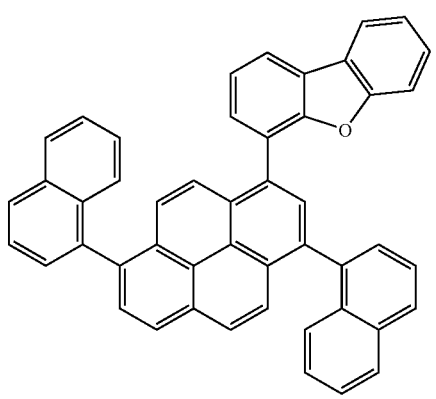
[282]
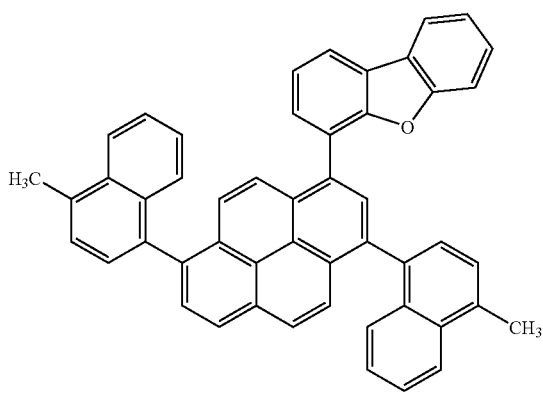
[283]

[Chemical Formula 45]
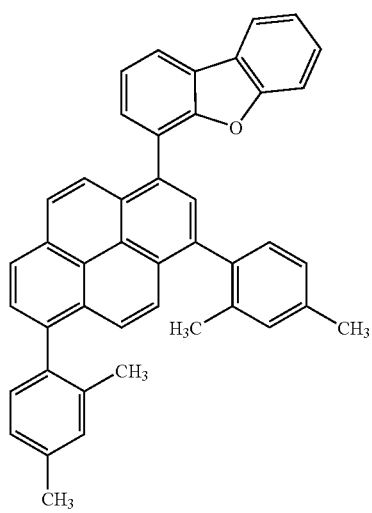
[284]
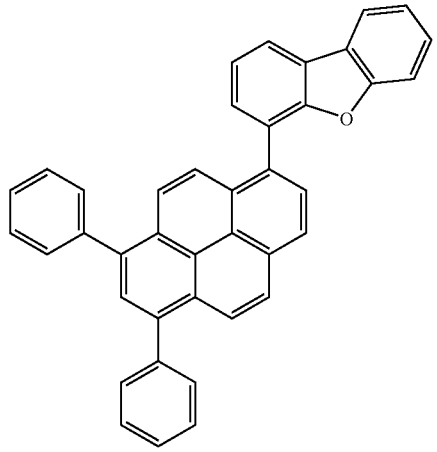
[285]
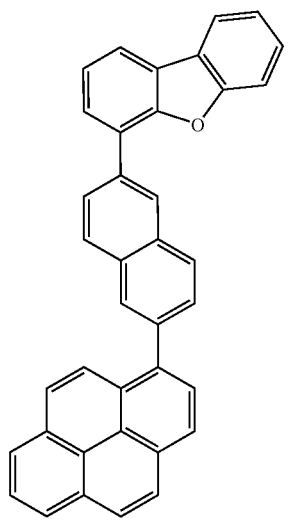
[286]
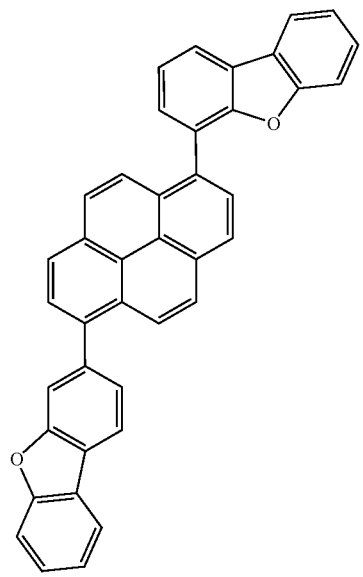
[287]
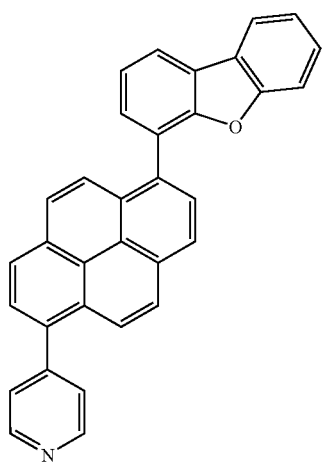
[288]
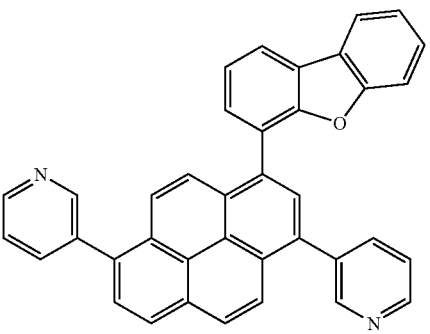
[289]

-continued
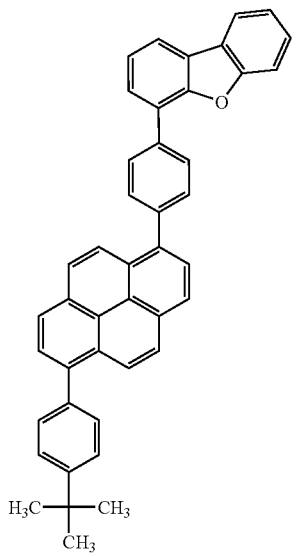
[290]
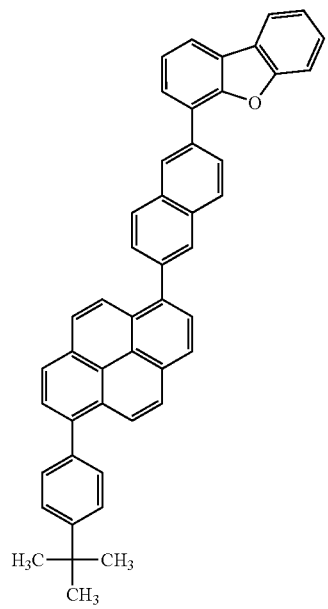
[291]
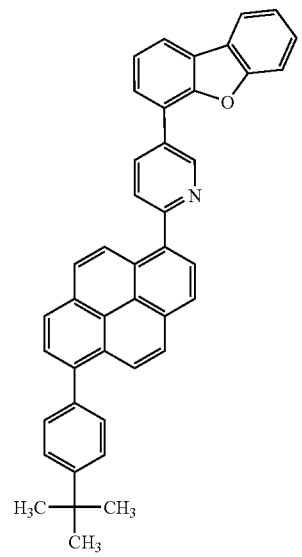
[292]
[Chemical Formula 46]
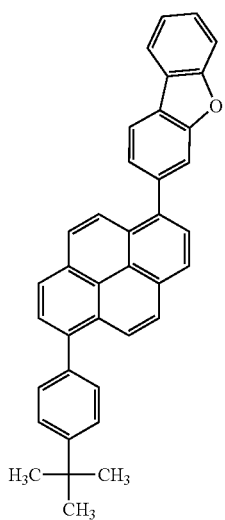
[293]
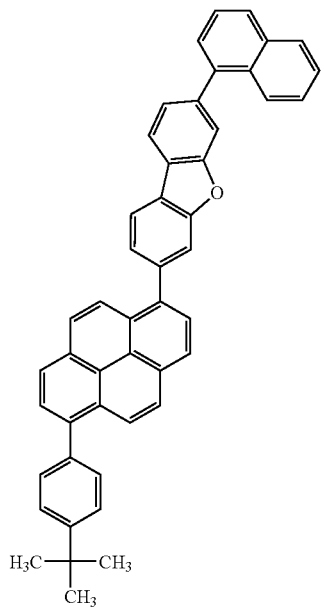
[294]
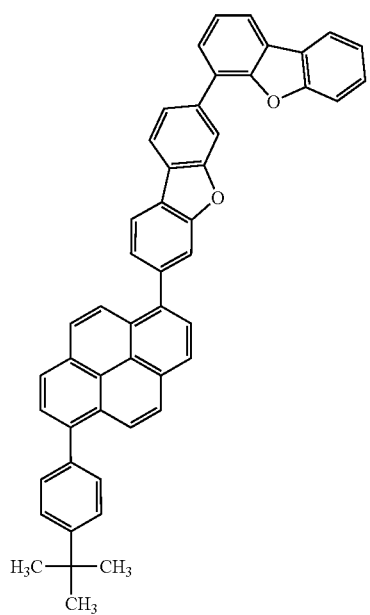
[295]

-continued
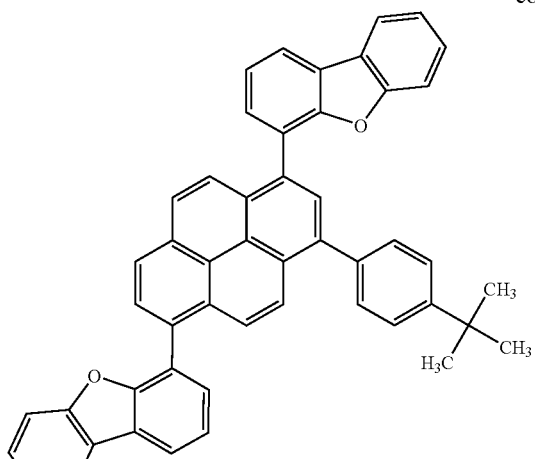
[296]
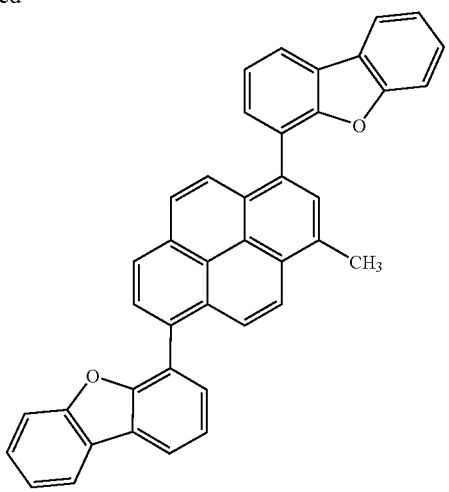
[297]
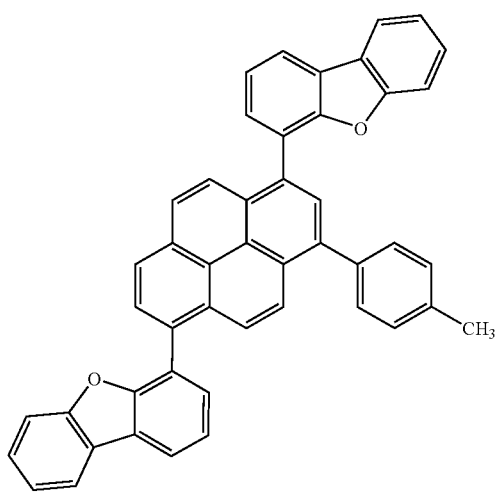
[298]
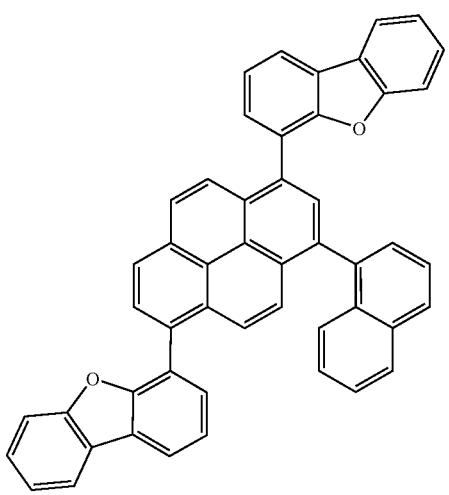
[299]
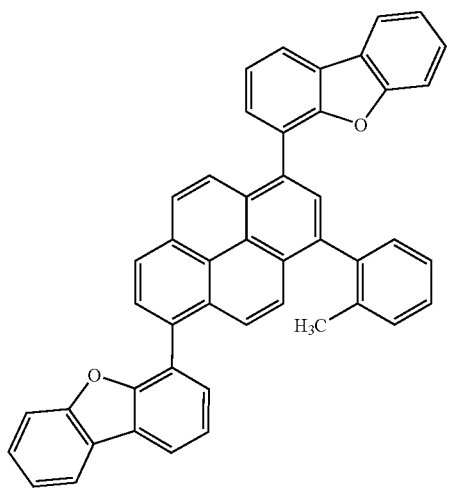
[300]
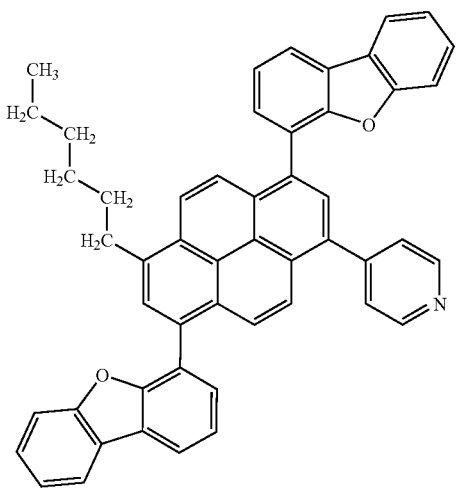
[301]

-continued
[Chemical Formula 47]
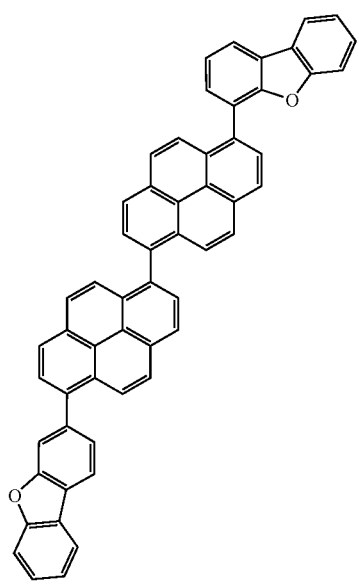
[302]
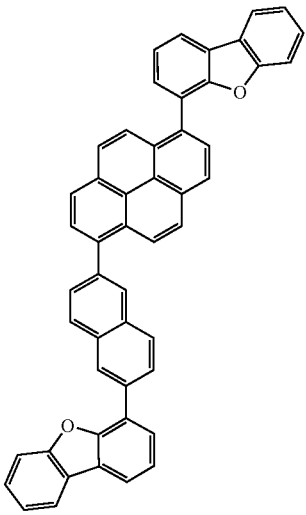
[303]
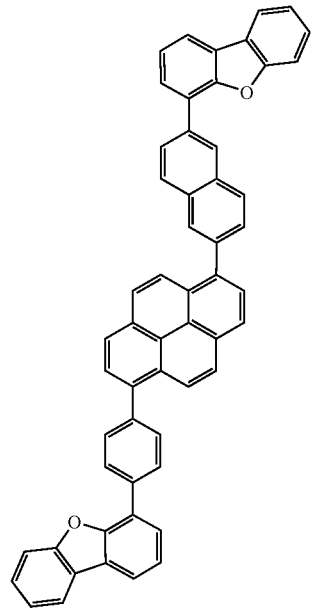
[304]
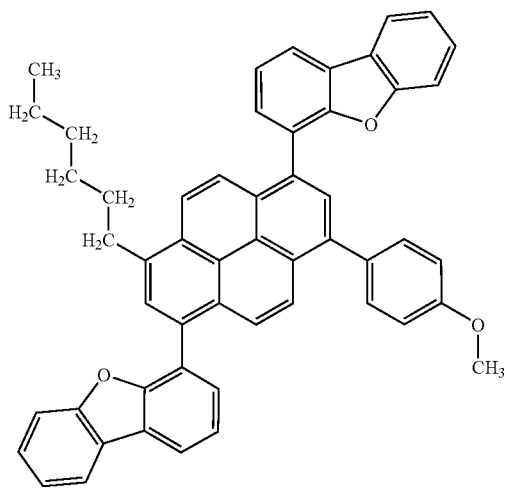
[305]
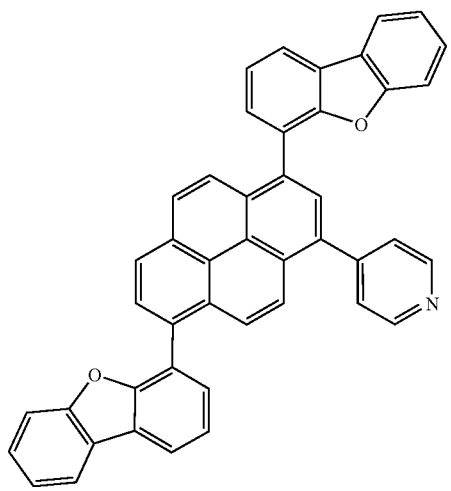
[306]
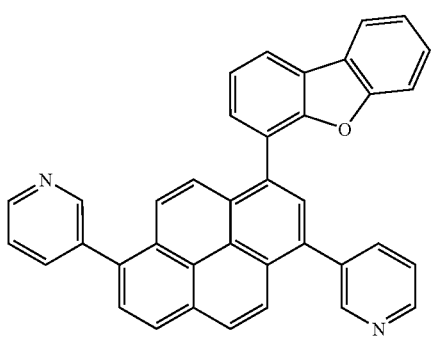
[307]
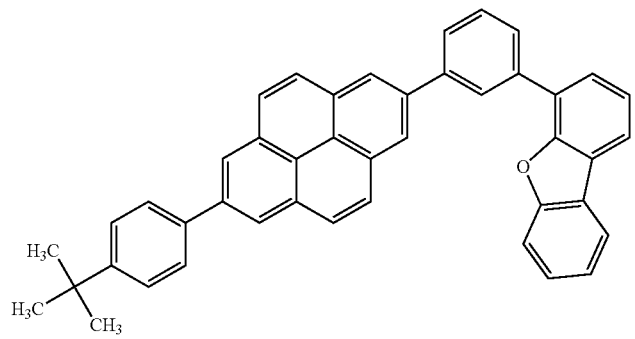
[308]

-continued
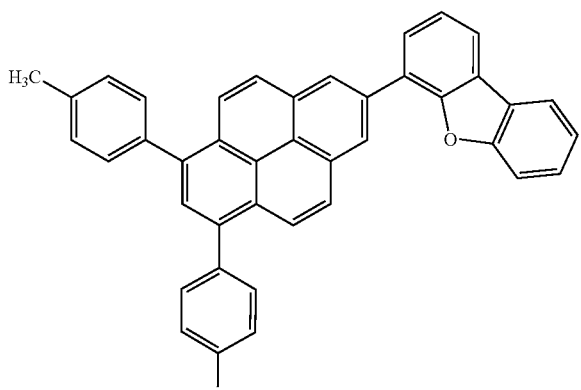
[309]
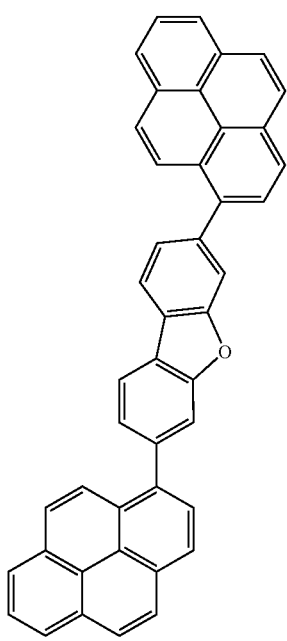
[310]
[Chemical Formula 48]
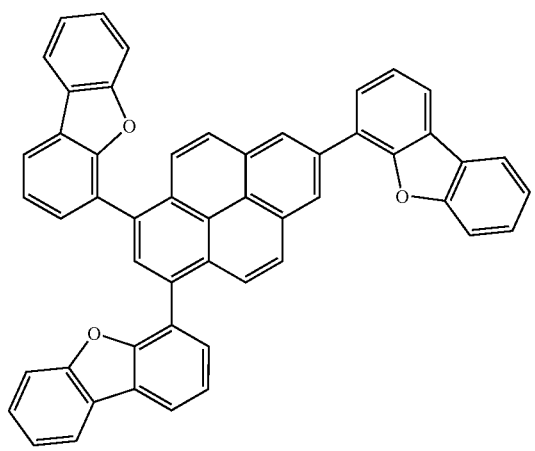
[311]
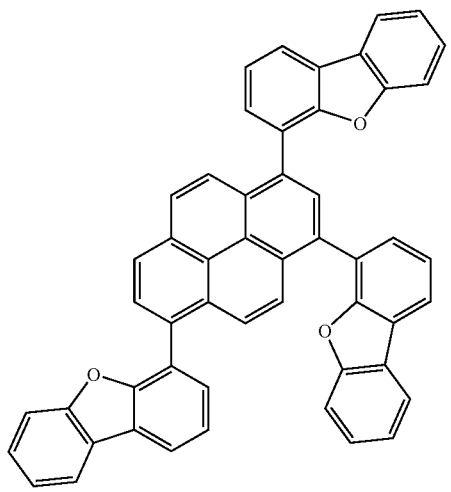
[312]
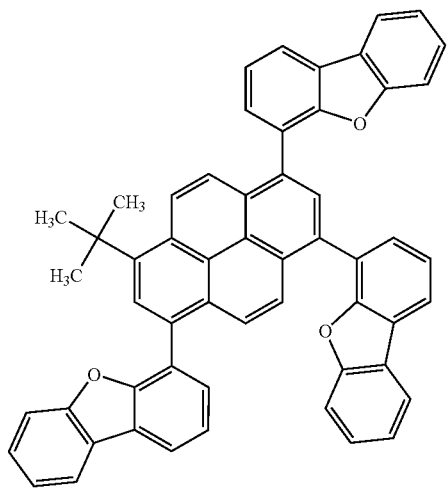
[313]

-continued
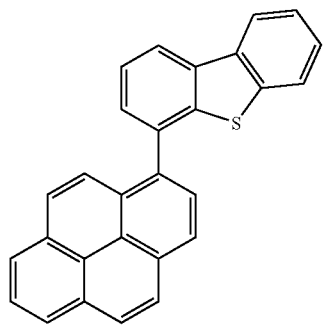
[314]
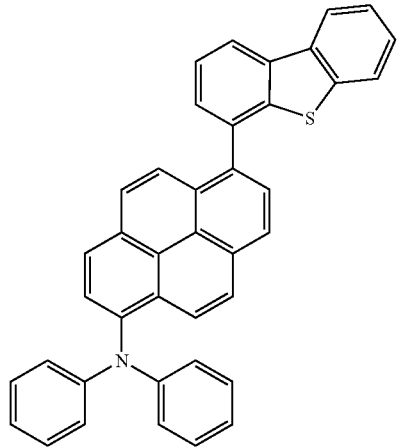
[315]
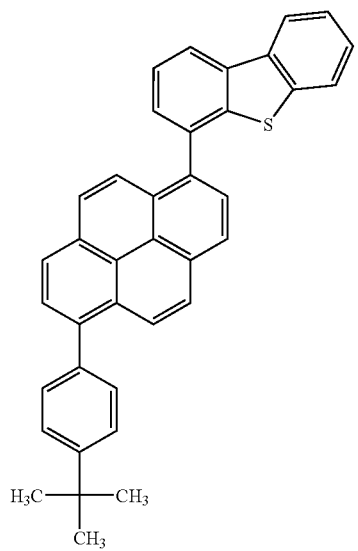
[316]
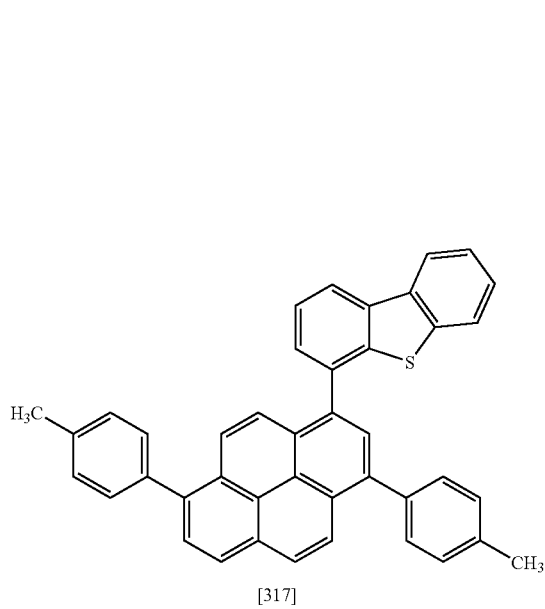
[317]
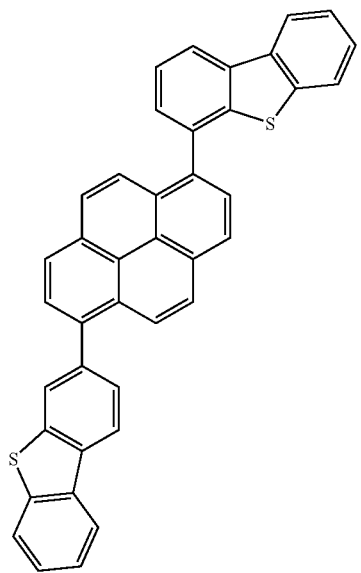
[318]

-continued
[Chemical Formula 49]
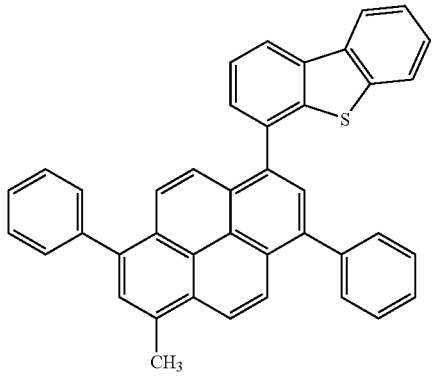
[319]
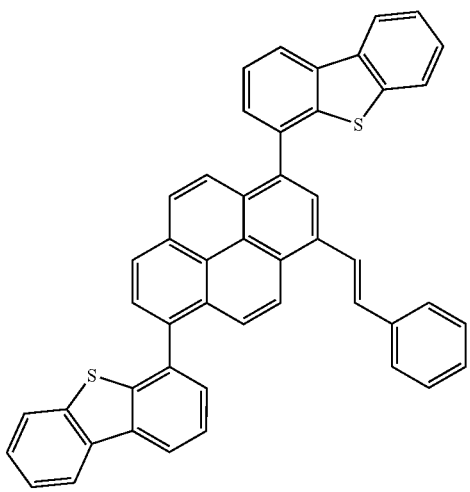
[320]
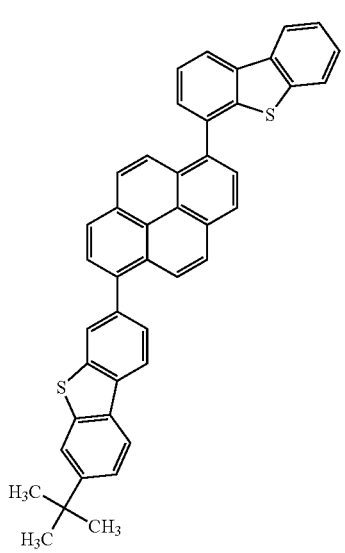
[321]
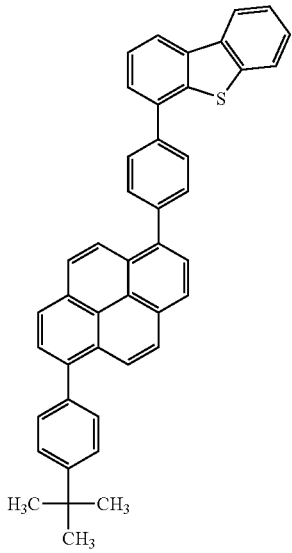
[322]
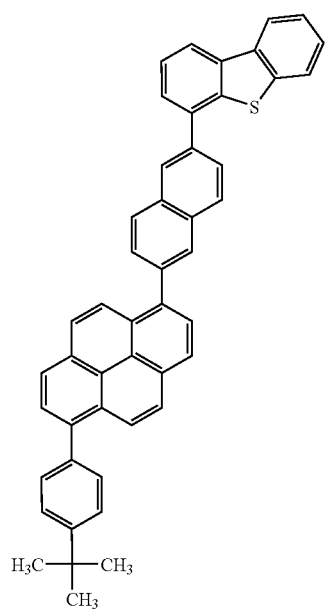
[323]

-continued
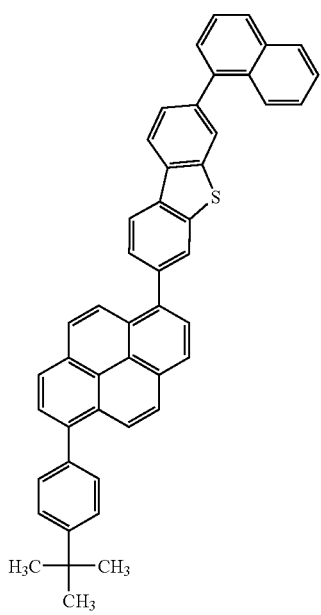
[324]
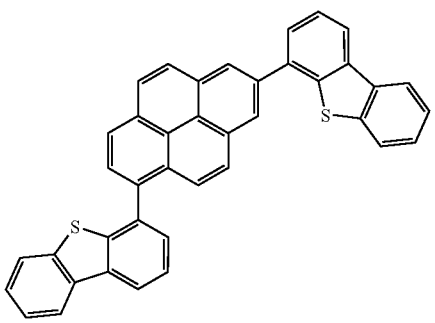
[325]
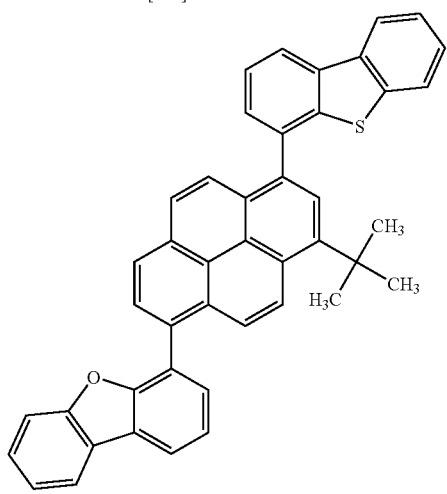
[326]
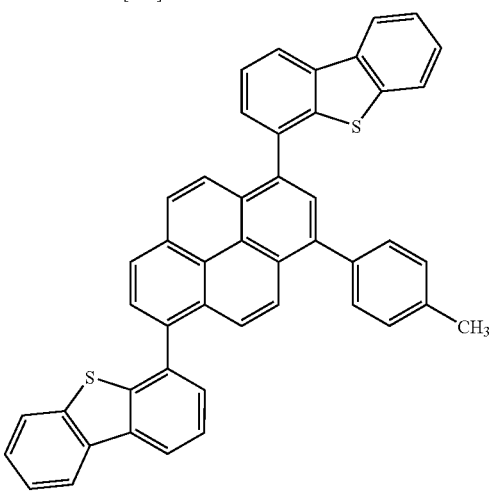
[327]
[Chemical Formula 50]
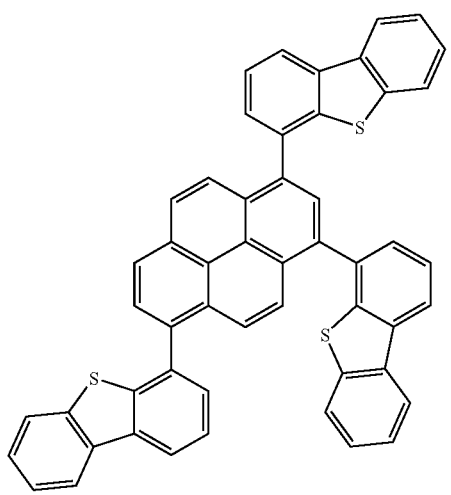
[328]
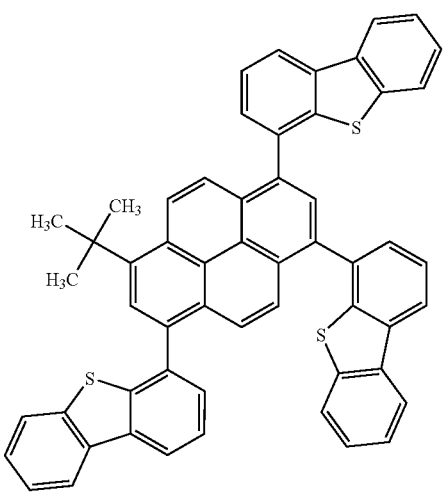
[329]

-continued
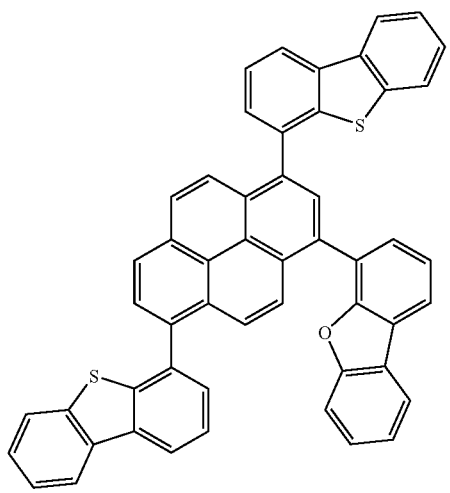
[330]
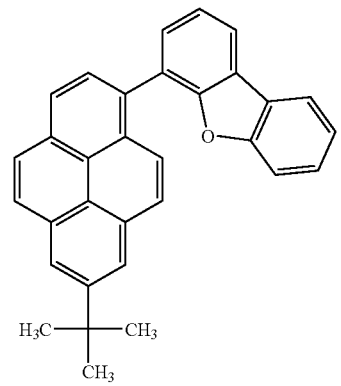
[331]
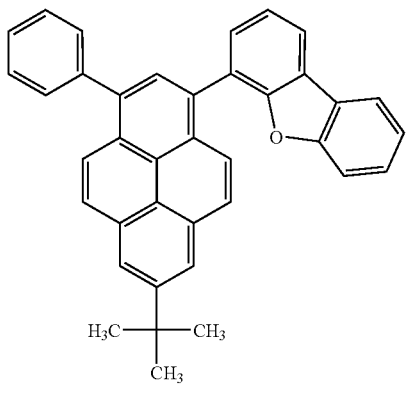
[332]
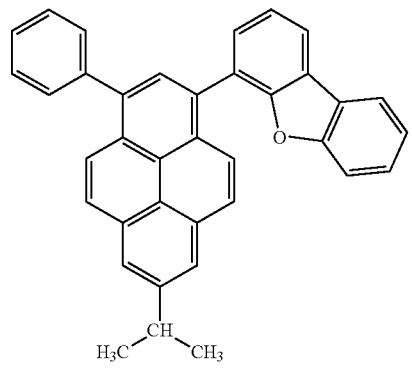
[333]
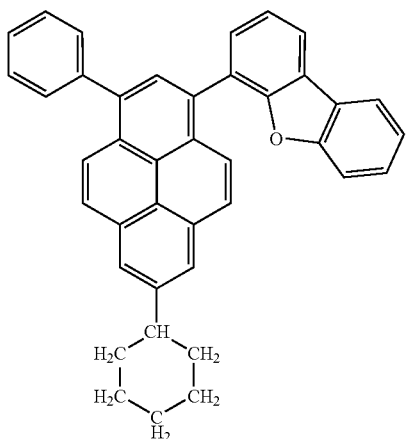
[334]
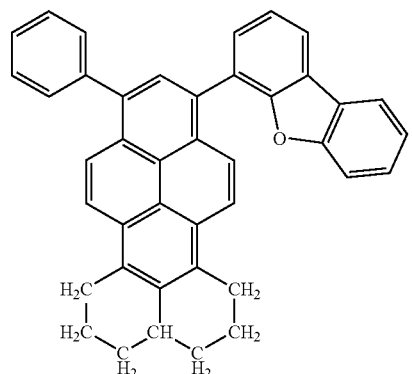
[335]

-continued
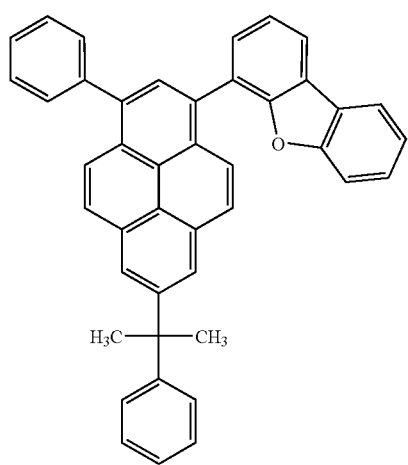
[336]
[Chemical Formula 51]
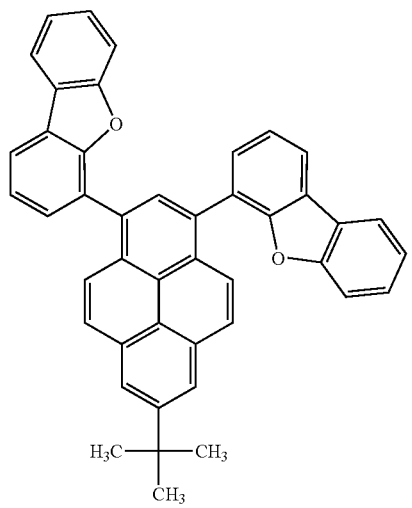
[337]
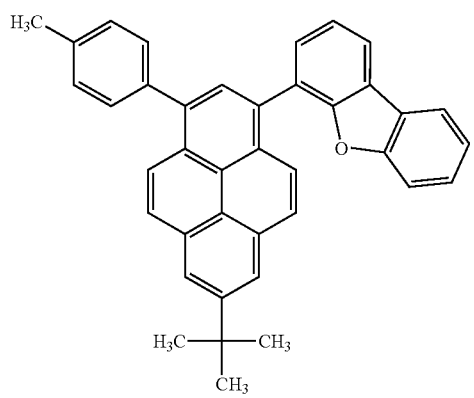
[338]
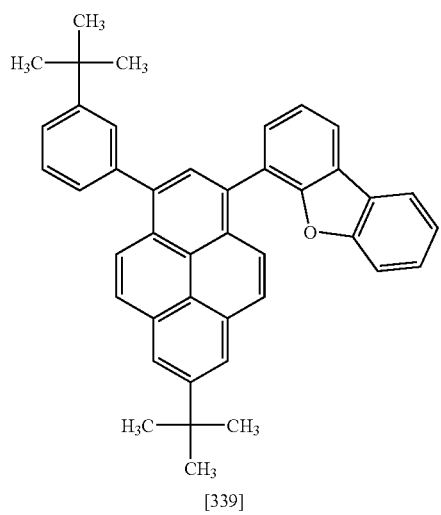
[339]
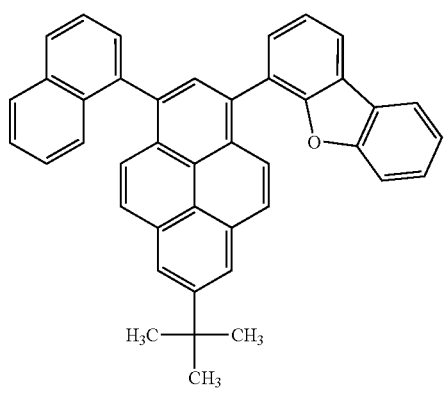
[340]

161
-continued
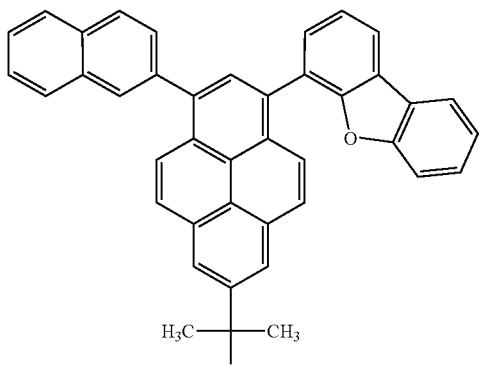
[341]
162
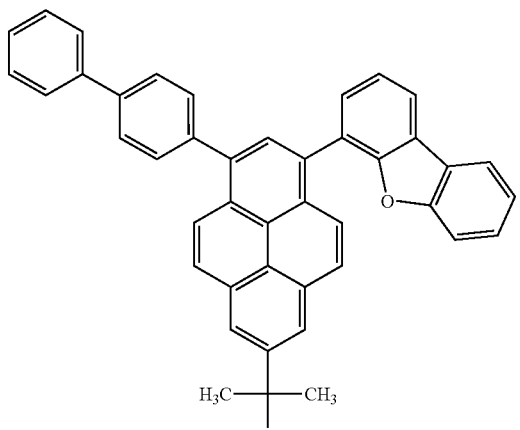
[342]
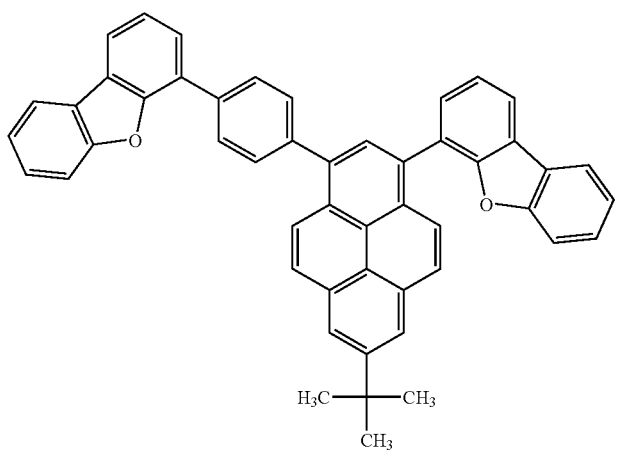
[343]
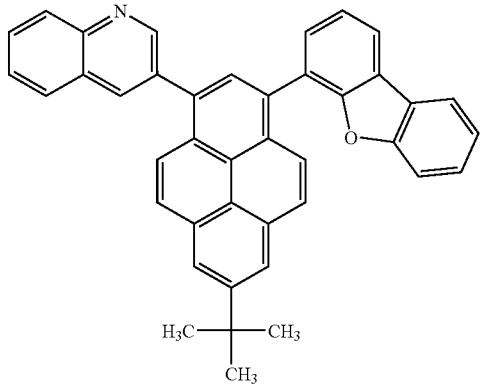
[344]
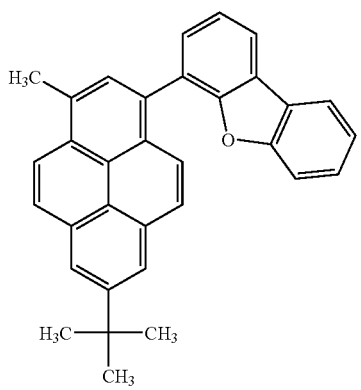
[345]

-continued
[Chemical Formula 52]
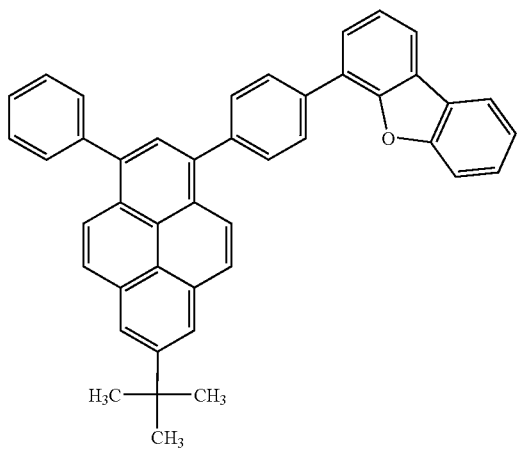
[346]
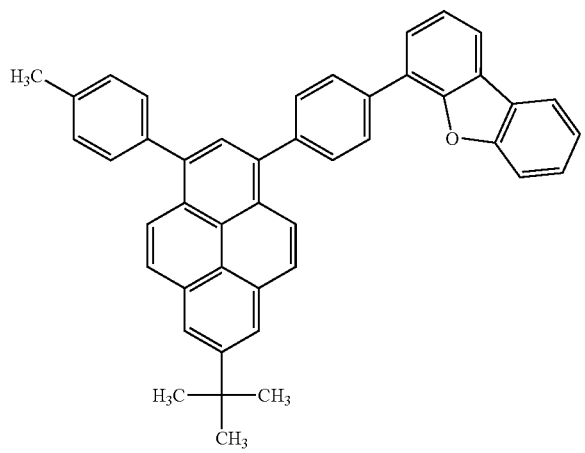
[347]
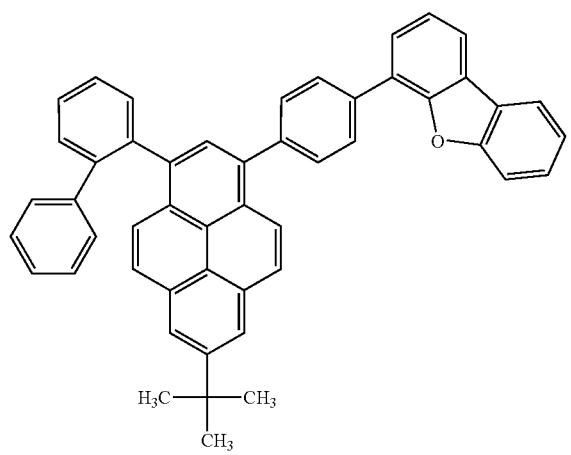
[348]
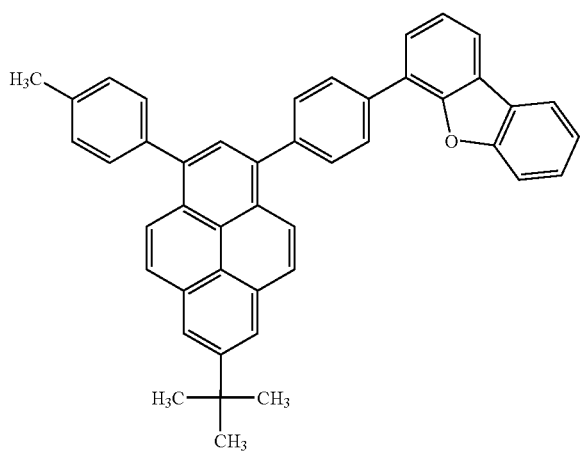
[349]
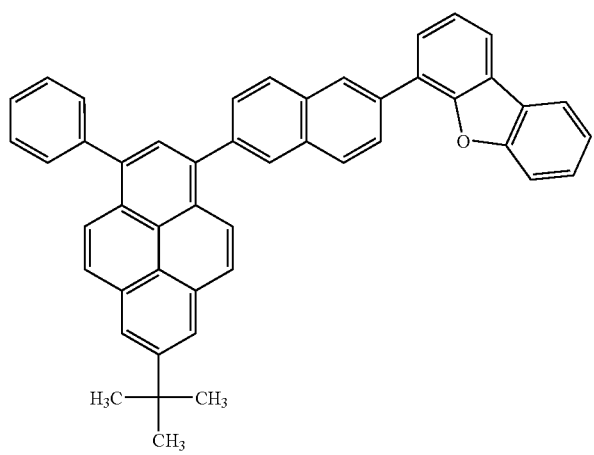
[350]

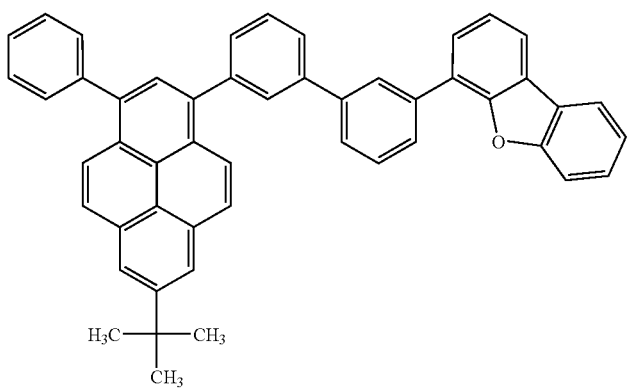
[351]
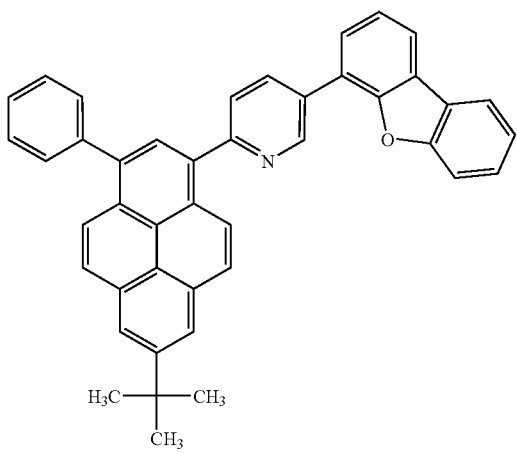
[352]
[Chemical Formula 53]
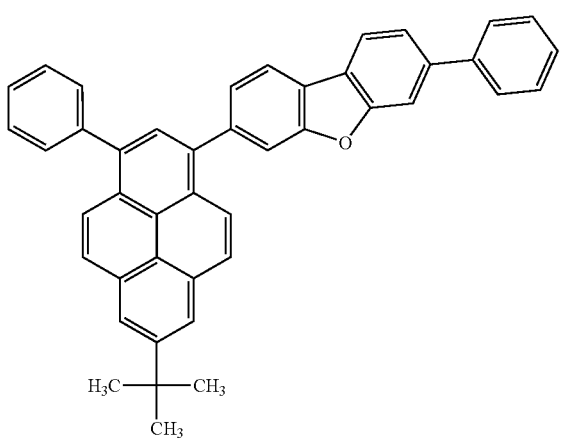
[353]
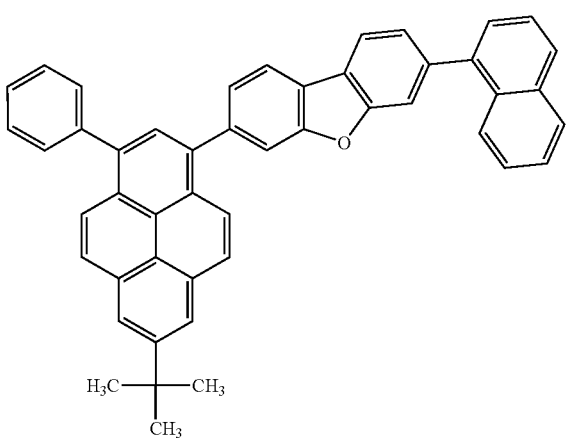
[354]

-continued

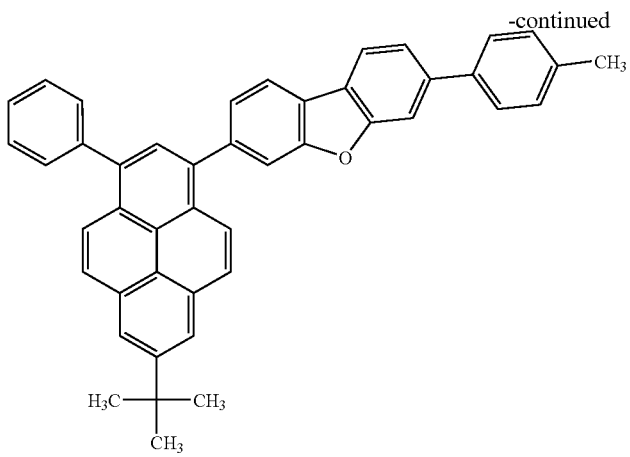
[355]

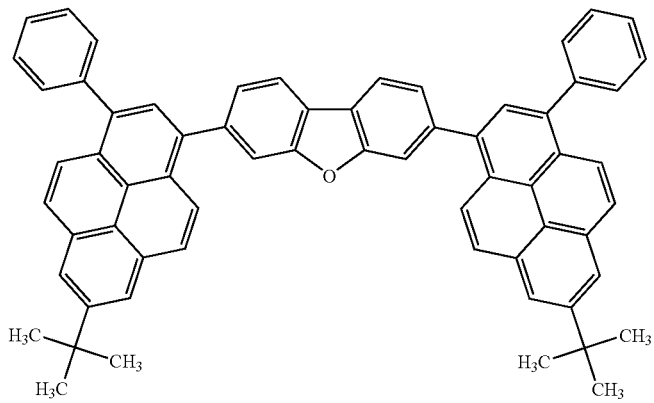
[356]

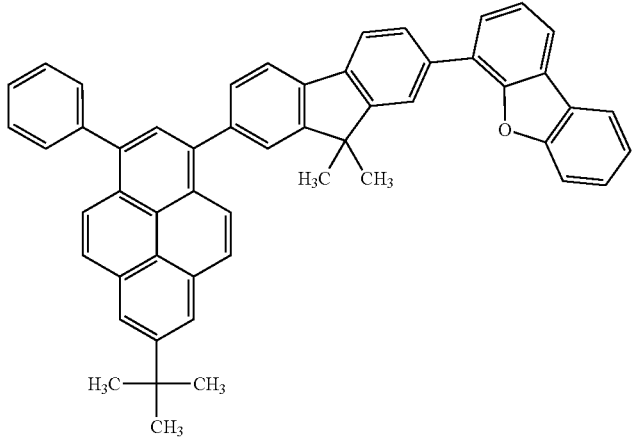
[357]

In the synthesis of the pyrene compound represented by the general formula (1), a known method can be employed. Examples of the method of introducing a carbazolyl group into a pyrene skeleton include, but are not limited to, a method using a coupling reaction between a halogenated pyrene derivative and a carbazole or carbazoylaryl metal complex in the presence of a palladium or nickel catalyst and a method using a coupling reaction between a pyrenylmetal complex and a halogenated carbazole derivative in the presence of a palladium or nickel catalyst. Examples of the method of introducing a dibenzofuranyl group or a dibenzothiophenyl group into a pyrene skeleton include, but are not limited to, a method using a coupling reaction between a halogenated pyrene derivative and a dibenzofuranyl metal complex or a dibenzothiophenyl metal complex in the presence of a palladium or nickel catalyst and a method using a coupling reaction between a pyrenyl metal complex and a halogenated dibenzofuran derivative or a halogenated dibenzothiophene derivative in the presence of a palladium or nickel catalyst.

Next, embodiments of the light emitting device in the present invention are now described by way of examples. The light emitting device of the present invention comprises an anode, a cathode and an organic layer existing between the anode and the cathode, and the organic layer contains at least an emissive layer, and the emissive layer emits light by electric energy The configuration of the organic layer includes, in addition to a configuration composed only of an emissive layer, configurations (1) hole transporting layer/emissive layer/electron transporting layer, (2) emissive layer/electron transporting layer and (3) hole transporting layer/emissive layer. Each layer may be a single- or multi-layer. When the hole transporting layer or the electron transporting layer is composed of a multi-layer, the layer, which is contacted with an electrode, is sometimes called a hole injection layer or an electron injection layer, respectively. In the description hereinafter, the hole injection material is included in the hole transporting material, and the electron injection material is included in the electron transporting material, respectively.

In the light emitting device of the present invention, the organic layer is formed of the light emitting device of the present invention material containing the pyrene compound represented by the general formula (1). The light emitting device material refers to a compound which corresponds to either one which itself emits light, or one which helps light emission, and is involved in light emission. Specific examples thereof include a hole transporting material, an emissive material and an electron transporting material.

The light emitting device of the present invention material may be used as the hole transporting material or electron transporting material, but is preferably used as the emissive material since it has high luminance performance. Also, the light emitting device of the present invention material is preferably used as a blue emissive material since it emits strong light in a blue range, and can also be used as a material for a green to red light emitting device or a white light emitting device.

The anode is not specifically limited as long as it is a material which can efficiently inject holes into an organic layer, and a material having comparatively large work function is preferably used. Examples of the material of the anode include a conductive metal oxide such as tin oxide, indium oxide, indium zinc oxide or indium tin oxide (ITO); metal such as gold, silver or chromium; an inorganic conductive substance such as copper iodide or copper sulfide; and a conductive polymer such as polythiophene, polypyrrole or polyaniline. These electrode materials may be used alone, or plural materials may be used after lamination or mixing.

Resistance of the anode is not specifically limited as long as an electric current enough to emit light of the light emitting device, and is preferably low resistance in view of power consumption of the light emitting device. For example, when the resistance is 300Ω/□ or less, it functions as the electrode. Since it becomes possible to supply an ITO substrate having about 10Ω/□, a material having low resistance of 100Ω/□ or less is used particularly preferably. The thickness of the anode can be optionally selected according to the resistance value, and is usually within a range from 100 to 300 nm.

The light emitting device is preferably formed on the substrate so as to maintain the mechanical strength of the light emitting device. As the substrate, a glass substrate made of soda glass or non-alkali glass is preferably used. The thickness of the glass substrate may be a thickness enough to maintain the mechanical strength, and is therefore 0.5 mm or more. The glass is preferably glass which emits less dissolved ion, and thus non-alkali glass is preferable and commercially available soda lime glass with a barrier coat made of $SiO_2$ can also be used. It is not necessary that the substrate is made of glass as long as the anode stably functions and, for example, the anode may be formed on a plastic substrate. The method of forming an anode is not specifically limited and, for example, an electron beam method, a sputtering method and a chemical reaction method can be employed.

The material used in a cathode is not specifically limited as long as it is a substance which can efficiently inject electrons into the organic layer, and examples thereof include platinum, gold, silver, copper, iron, tin, zinc, aluminum, indium, chromium, lithium, sodium, potassium, cesium, calcium and magnesium, and alloys thereof. Lithium, sodium, potassium, cesium, calcium, magnesium or alloys containing these low work function metals are effective so as to improve element characteristics by increasing electron injection efficiency. However, these low work function metals are often unstable in an atmospheric air, and thus a method of doping the organic layer with a trace amount (1 nm or less in terms of indication of a thickness tester of vacuum deposition) of lithium or magnesium to obtain an electrode with high stability is exemplified as a preferred example. Also, an inorganic salt such as lithium fluoride can be used. It is preferred to laminate a metal such as platinum, gold, silver, copper, iron, tin, aluminum and indium, or an alloy using these metals, an inorganic matter such as silica, titania or silicon nitride, and an organic polymer compound such as polyvinyl alcohol, polyvinyl chloride or a hydrocarbon-based polymer compound so as to protect the electrode. The method of forming an electrode is not specifically limited and, for example, a resistance heating, an electron beam, sputtering, an ion plating or a coating method can be used.

The hole transporting layer is formed by a method of laminating or mixing one or two or more kinds of hole transporting materials, or a method using a mixture of a hole transporting material and a polymer binder. The hole transporting layer may be formed by adding an inorganic salt such as iron(III) chloride to the hole transporting material. The hole transporting material is not specifically limited as long as it is a compound which can form a thin film and can inject holes from the anode, and also can transport holes. Preferred examples thereof are heterocyclic compounds, for example, a triphenylamine derivative such as 4,4'-bis(N-(3-methylphenyl)-N-phenylamino)biphenyl, 4,4'-bis(N-(1-naphthyl)-N-phenylamino)biphenyl or 4,4',4"-tris(3-methylphenyl(phenyl)amino)triphenylamine; a biscarbazole derivative such as bis(N-allylcarbazole) or bis(N-alkylcarbazole); a pyrazoline derivative; a stilbene-based compound; a hydrazone-based compound; a benzofuran derivative; a thiophene derivative; an oxadiazole derivative; a phthalocyanine derivative; and a porphyrin derivative. Preferred examples of the polymer-based hole transporting material are a polycarbonate containing the above monomer in the side chain, a styrene derivative, polythiophene, polyaniline, polyfluorene, polyvinylcarbazole and polysilane.

The emissive layer may be made of either a mixture of a host material and a dopant material, or a host material alone. The host material or the dopant material may be used alone or in combination, respectively. The dopant material may be included in all or a portion of the host material. The dopant material may be either laminated with the host material, or dispersed in the host material. When the amount of the dopant material is too large, concentration quenching occurs and is therefore preferably 20% by weight or less, and more preferably 10% by weight or less, based on the total of the host material and the dopant material. Regarding the doping method, a dopant material may be formed by a co-evaporation method with the host material, or vapor deposition may be carried out after preliminarily mixing the host material and the dopant material. The pyrene compound of the present invention may be used as the dopant material, and is preferably used as the host material since it is excellent in thin-film stability.

Ionization potential of the pyrene compound of the present invention is not specifically limited, and is preferably 4.6 eV or more and 6.2 eV or less, and more preferably 4.8 eV or more and 6.0 eV or less. The absolute value of the ionization potential sometimes varies depending on the measuring method. The ionization potential of the present invention is the value obtained by measuring a thin film having a thickness of 30 to 100 nm formed on an ITO glass substrate through vapor deposition using an atmospheric air atmosphere type ultraviolet photoelectron analyzer (AC-1, manufactured by RIKENKIKI CO., LTD).

The host material used in the present invention is not limited only to one kind of the pyrene compound represented by the general formula (1), and plural pyrene compounds may be used in combination, or one or more kinds of other host materials may be used in combination with the pyrene compound represented by the general formula (1). Preferred examples of the host material to be used in combination are a fused ring derivative such as anthracene or perylene as a luminous body; an aromatic amine derivative such as N,N'-dinaphthyl-N,N'-diphenyl-4,4'-diphenyl-1,1'-diamine; a metal-chelated oxynoid compound such as tris(8-quinolinate)aluminum(III); a bisstyryl derivative such as a distyrylbenzene derivative; a tetraphenylbutadiene derivative; an indene derivative; a coumarin derivative; an oxadiazole derivative; a pyrrolopyridine derivative; a perinon derivative; a cyclopentadiene derivative; an oxadiazole derivative; a carbazole derivative; and a pyrrolopyrrole derivative. Preferred polymer-based host materials to be used are a polyphenylenevinylene derivative, a polyparaphenylene derivative, a polyfluorene derivative, a polyvinylcarbazole derivative and a polythiophene derivative.

Examples of the dopant material contained in the emissive material include, but are not limited to, a compound having an aryl ring or a derivative thereof, such as naphthalene, anthracene, phenanthrene, pyrene, triphenylene, perylene, fluorene or indene (for example, 2-(benzothiazol-2-yl)-9,10-diphenylanthracene, 5,6,11,12-tetraphenylnaphthacene, etc.); a compound having a heteroaryl ring or a derivative thereof, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine or thioxanthene; a distyrylbenzene derivative; an aminostyryl derivative such as 4,4'-bis(2-(4-diphenylaminophenyl)ethenyl)biphenyl or 4,4'-bis(N-(stilben-4-yl)-N-phenylamino)stilbene; an aromatic acetylene derivative; a tetraphenylbutadiene derivative; a stilbene derivative; an aldazine derivative; a pyrromethene derivative; a diketopyrrolo[3,4-c]pyrrole derivative; a coumarin derivative such as 2,3,5,6-1H,4H-tetrahydro-9-(2'-benzothiazolyl)quinolidino[9,9a, 1-gh]coumarin; an azole derivative and a metal complex, such as imidazole, thiazole, thiadiazole, carbazole, oxazole, oxadiazole and triazole; and an aromatic amine derivative such as N,N'-diphenyl-N,N'-di(3-methylphenyl)-4,4'-diphenyl-1,1'-diamine. It is preferred to use a fused aromatic ring derivative having an electron-accepting substituent as the dopant since a more remarkable effect of thin-film stability of the pyrene compound of the present invention is exerted. Specifically, a pyrene compound having a benzoazole group such as 1-(benzooxazol-2-yl)-3,8-bis(4-methylphenyl)pyrene is a particularly preferred dopant.

The electron transporting layer is a layer into which electrons are injected from a cathode, the layer further transporting the electrons. It is required for the electron transporting layer that it has high electron injection efficiency and efficiently transport the electrons therein. Therefore, it is desired that the electron transporting layer is made of a substance which has large electron affinity and large electron mobility, and is also excellent in stability and is less likely to generate impurities serving as a trap during the production and use. However, considering transportation balance between holes and electrons, if the electron transporting layer mainly plays a role of efficiently suppressing holes flowing toward the cathode from the anode without being recombined, there is exerted the same effect of improving luminance efficiency as that in the case where the electron transportation capability is made of a material having high electron transportation capability even when the electron transportation capability is made of a material having not so high electron transportation capability.

Examples of the electron transporting material used in electron transporting layer include, but are not limited to, a compound having a fused aryl ring or a derivative thereof, such as naphthalene or anthracene; a styryl-based aromatic ring derivative such as 4,4'-bis(diphenylethenyl)biphenyl; a perylene derivative; a perinon derivative; a coumarin derivative; a naphthalimide derivative; a quinone derivative such as anthraquinone or diphenoquinone; a phosphorus oxide derivative; a carbazole derivative and an indole derivative; a quinolinol complex such as tris(8-quinolinolate)aluminum (III); a hydroxyazole complex such as a hydroxyphenyloxazole complex; an azomethine complex; a tropolone metal complex and a flavonol metal complex; and a compound having a heteroaryl ring. Of these electron transporting materials, a compound having a heteroaryl ring with an electron-accepting nitrogen is preferable since it has high electron transportation capability.

The electron-accepting nitrogen represents a nitrogen atom which is combined with an adjacent atom to form a multiple bond. The nitrogen atom has high electronegativity, and thus the multiple bond has electron-accepting properties. Therefore, a heteroaryl ring containing an electron-accepting nitrogen has high electron affinity. Examples of the heteroaryl ring containing an electron-accepting nitrogen include a pyridine ring, a pyrazine ring, pyrimidine ring, a quinoline ring, a quinoxaline ring, a naphthyridine ring, a pyrimidopyrimidine ring, a benzoquinoline ring, a phenanthroline ring, an imidazole ring, an oxazole ring, an oxadiazole ring, a triazole ring, a thiazole ring, a thiadiazole ring, a benzooxazole ring, a benzothiazole ring, a benzimidazole ring and a phenanthroimidazole ring.

It is preferred that the compound having a heteroaryl ring structure containing an electron-accepting nitrogen is preferably composed of an element selected from carbon, hydrogen, nitrogen, oxygen, silicon and phosphorus. The compound having a heteroaryl ring structure containing an electron-accepting nitrogen composed of elements selected from these elements have high electron transportation capability and can remarkably decrease the driving voltage of the light emitting device. Preferred compounds are a benzimidazole derivative, a benzoxazole derivative, a benzthiazole derivative, an oxadiazole derivative, a thiadiazole derivative, a triazole derivative, a pyrazine derivative, a phenanthroline derivative, a quinoxaline derivative, a quinoline derivative, a benzoquinoline derivative, an oligopyridine derivative such as bipyridine or terpyridine, a quinoxaline derivative and a naphthyridine derivative. Of these compounds, an imidazole derivative such as tris(N-phenylbenzimidazol-2-yl)benzene, an oxadiazole derivative such as 1,3-bis[(4-tert-butylphenyl) 1,3,4-oxadiazolyl]phenylene, a triazole derivative such as N-naphthyl-2,5-diphenyl-1,3,4-triazole, a phenanthroline derivative such as bathocuproine or 1,3-bis(1,10-phenanthrolin-9-yl)benzene, a benzoquinoline derivative such as 2,2'-bis(benzo[h]quinolin-2-yl)-9,9'-spirobifluorene, a bipyridine derivative such as 2,5-bis(6'-(2',2''-bipyridyl))-1,1-dimethyl-3,4-diphenylsilole, a terpyridine derivative such as 1,3-bis(4'-(2,2':6'2''-terpyridinyl))benzene and a naphthyridine derivative such as bis(1-naphthyl)-4-(1,8-naphthyridin-2-yl)phenylphosphine oxide in view of electron transportation capability. Particularly preferred examples are a phenanthroline dimer such as 1,3-bis(1,10-phenanthrolin-9-yl)benzene, 2,7-bis(1,10-phenanthrolin-9-yl)naphthalene or 1,3-bis(2-phenyl-1,10-phenanthrolin-9-yl)benzene and a bipyridine dimer such as 2,5-bis(6'-(2',2''-bipyridyl))-1,1-dimethyl-3,4-diphenylsilole since a remarkably high effect of improving durability is exerted when used in combination with an emissive layer containing the pyrene compound represented by the general formula (1).

These electron transporting materials can be used alone, or two or more kinds of these electron transporting materials may be used in combination, or one or more kinds of other electron transporting materials may be used in combination with the electron transporting material. It is also possible to use in combination with a metal such as an alkali metal or an alkali earth metal. Ionization potential of the electron transporting layer is not specifically limited, and is preferably 5.8 eV or more and 8.0 eV or less, and more preferably 6.0 eV or more and 7.5 eV or less.

Examples of the method of forming each layer constituting the light emitting device include, but are not limited to, a resistance heating evaporation, an electron beam deposition method, a sputtering method, a molecular stacking method, a coating method, an ink jet method, a printing method and a laser-induced thermal transfer method. Of these methods, a resistance heating evaporation method or an electron beam deposition method is preferable in view of device characteristics.

The thickness of the layer varies depending on the resistance value of the light emitting substance and is not specifically limited, and is selected from a range from 1 to 1,000 nm. Each thickness of the emissive layer, the electron transporting layer and the hole transporting layer is preferably 1 nm or more and 200 nm or less, and more preferably 5 nm or more and 100 nm or less.

The light emitting device of the present invention has a function capable of converting electric energy into light. Herein, a DC current is mainly used as the electric energy, and a pulse current and an AC current can also be used. The electric current value and the voltage value are not specifically limited. In view of power consumption and lifetime of the device, these values should be selected so as to obtain a maximum luminance at an energy as small as possible.

The light emitting device of the present invention is preferably used as a display which displays using a matrix system and/or a segment system.

In the matrix system, pixels for display are quadratically disposed in the form of lattice or mosaic, and characters and images are displayed by sets of pixels. The shape and size of the pixel are decided by applications. For example, a rectangular pixel with a side of 300 μm or less is commonly used in image and character display of PC, monitors and televisions. In the case of a large-sized display such as display panel, a pixel with a side of mm order is used. In the case of a monochromic display, pixels having the same color may be arranged. In the case of a color display, display is carried out by arranging red, green and blue pixels. In the case of a color display, an arrangement system typically includes a delta type system and a stripe type system. The method of matrix driving may be either passive matrix driving or active matrix driving. In the case of passive matrix driving, the light emitting device has a simple structure. Taking account of operation characteristics, active matrix driving is sometimes excellent. The driving method is properly used according to application.

The segment system is a system wherein a pattern is formed so as to display predetermined information and light emission of the range decided by this pattern is carried out. Examples of the display include time and temperature display in digital watches and thermometers, operating state display of audio equipments and electromagnetic cookers, and automobile panel display. Matrix display and segment display may coexist in the same panel.

The light emitting device of the present invention is also used as a backlight of various equipments. The backlight is mainly used for the purpose of improving visibility of a display device which itself emits no light, and is used in liquid crystal display devices, watches, audio equipments, automobile panels, display plates and marks. The light emitting device of the present invention is preferably used as the backlight of a liquid crystal display device, particularly a PC wherein thickness reduction has been studied. According to the light emitting device of the present invention, it is possible to provide a backlight which is more thin and lightweight than that of the prior art.

EXAMPLES

The present invention is now described by way of examples, but the present invention is not limited to the following examples. The number of the compound in the following examples indicates the number of the compound described in the above chemical formulas. The evaluation method with respect to structural analysis is shown below.

$^1$H-NMR measurement was carried out by a deuterated chloroform solution using superconductive FTNMR EX-270 (manufactured by JEOL Ltd.).

HPLC purity was measured by a 0.1 g/L chloroform solution using a high performance liquid chromatograph LC-10 (manufactured by Shimadzu Corporation). As the eluent of the column, a mixed solution of an aqueous 0.1% phosphoric acid solution and acetonitrile was used.

Example 1

Synthesis of Compound [30]

A mixed solution of 2 g of 1,6-dibromopyrene, 1 g of 4-t-butylphenylboronic acid, 2.4 g of tripotassium phosphate, 0.4 g of tetrabutylammonium bromide, 22 mg of palladium acetate and 60 ml of dimethylformamide was heated and stirred under a nitrogen gas stream at 130° C. for 6 hours. The solution was cooled to room temperature and 30 ml of water was poured into the solution, followed by extraction with 100 ml of dichloromethane. The organic layer was washed twice with 50 ml of water, dried over magnesium sulfate and then evaporated. The concentrate was purified by silica gel column chromatography and then vacuum-dried to obtain 0.7 g of 1-bromo-6-(4-t-butylphenyl)pyrene.

Next, a mixed solution of 0.7 g of 1-bromo-6-(4-t-butylphenyl)pyrene, 0.74 g of 9-[4-(4,4,5,5-tetramethyl-[1,3,2]dioxaborolan-2-yl)phenyl]carbazole, 0.85 g of tripotassium phosphate, 0.13 g of tetrabutylammonium bromide, 8.0 mg of palladium acetate and 20 ml of dimethylformamide was heated and stirred under a nitrogen gas stream at 130° C. for 5 hours. The solution was cooled to room temperature and 30 ml of water was poured into the solution, followed by filtration. The resulting solid was washed with 30 ml of ethanol, purified by silica gel column chromatography, recrystallized from dimethylformamide and then vacuum-dried to obtain 0.69 g of a white crystal. $^1$H-NMR analytical results of the resulting powder are as follows and reveal that the resulting white crystal is compound [30].

$^1$H-NMR (CDCl$_3$(d=ppm)): 1.47 (s, 9H), 7.34 (t, 2H), 7.49 (t, 2H), 7.61-7.64 (m, 6H), 7.76-7.90 (m, 4H), 8.02-8.35 (m, 10H)

This compound [30] was used as a light emitting device material after sublimation refining under a pressure of $1\times10^{-3}$ Pa at about 240° C. using an oil diffusion pump. HPLC purity (area % at measuring wavelength of 254 nm) was 99.6% before sublimation refining and was 99.7% after sublimation refining.

Example 2

Synthesis of Compound [69]

A mixed solution of 45.0 g of 1-bromopyrene, 21.7 g of 4-methylphenylboronic acid, 34.0 g of tripotassium phosphate, 10.3 g of tetrabutylammonium bromide, 0.71 g of palladium acetate and 1.6 L of dimethylformamide was heated and stirred under a nitrogen gas stream at 120° C. for 5 hours. The solution was cooled to room temperature and 1.6 L of water was poured into the solution, followed by stirring at room temperature for 0.5 hours. The precipitated solid was collected by filtration and then washed twice with 200 ml of water. The resulting solid was dissolved in 500 ml of dichloromethane, dried over magnesium sulfate and then filtered through Celite. The filtrate was evaporated and the residue was washed twice with 200 ml of methanol, and then the precipitated solid was collected by filtration and vacuum-dried to obtain 40.0 g of 1-(4-methylphenyl)pyrene.

Next, a mixed solution of 40.0 g of 1-(4-methylphenyl)pyrene, 24.4 g of N-bromosuccinimide and 1.4 L of dimethylformamide was heated and stirred under a nitrogen gas stream at 40° C. for 7 hours. The solution was cooled to room temperature and 1.0 L of water was poured into the solution, followed by extraction with 500 ml of dichloromethane. The organic layer was washed twice with 200 ml of water, dried over magnesium sulfate and then filtered through Celite. The filtrate was evaporated and the residue was washed twice with 200 ml of ethyl acetate, and then the precipitated solid was collected by filtration and vacuum-dried to obtain 11.4 g of 1-bromo-6-(4-methylphenyl)pyrene.

Next, a mixed solution of 6 g of 1-bromo-6-(4-methylphenyl)pyrene, 7.75 g of 9-[3-(4,4,5,5-tetramethyl-[1,3,2]dioxaborolan-2-yl)phenyl]carbazole, 8.9 g of tripotassium phosphate, 1.4 g of tetrabutylammonium bromide, 94 mg of palladium acetate and 200 ml of dimethylformamide was heated and stirred under a nitrogen gas stream at 130° C. for 5 hours. The solution was cooled to room temperature and 30 ml of water was poured into the solution, followed by filtration. The resulting solid was washed with 30 ml of ethanol and dissolved at 140° C. by adding 150 ml of xylene. The solution was cooled to 100° C. and then filtered through Celite. The filtrate was evaporated and 50 ml of cyclopentyl methyl ether was added, followed by heating and stirring at 120° C. The solution was cooled to room temperature, filtered and then vacuum-dried to obtain 4.4 g of a yellowish white crystal. $^1$H-NMR analytical results of the resulting powder are as follows and reveal that the resulting yellowish white crystal is compound [69].

$^1$H-NMR (CDCl$_3$ (d=ppm)): 2.50 (s, 3H), 7.27-8.32 (m, 24H)

This compound [69] was used as a light emitting device material after sublimation refining under a pressure of $1\times10^{-3}$ Pa at about 240° C. using an oil diffusion pump. HPLC purity (area % at measuring wavelength of 254 nm) was 99.4% before sublimation refining and was 99.5% after sublimation refining.

Example 3

Synthesis of Compound [47]

A mixed solution of 59 g of 1-bromopyrene, 40 g of p-chlorophenylboronic acid, 108 g of tripotassium phosphate, g of tetrabutylammonium bromide, 1.15 g of palladium acetate and 1,250 ml of dimethylformamide was heated and stirred under a nitrogen gas stream at 130° C. for 3 hours. The solution was cooled to room temperature and 1,000 ml of water was poured into the solution, followed by filtration. The resulting solid was washed with 200 ml of methanol, dissolved in 1,000 ml of dichloromethane, dried over magnesium sulfate, filtered through Celite and then evaporated. The resulting solid was washed with 200 ml of methanol and then vacuum-dried to obtain 58.2 g of 1-(4-chlorophenyl)pyrene.

Next, a mixed solution of 58.2 g of 1-(4-chlorophenyl)pyrene, 36.4 g of N-bromosuccinimide and 1,900 ml of dimethylformamide was heated and stirred under a nitrogen gas stream at 40° C. for 6 hours. The solution was cooled to room temperature and 500 ml of water was poured into the solution, followed by filtration. The filtrate was washed with 200 ml of methanol and then vacuum-dried to obtain a mixture of 1-bromo-6-(4-chlorophenyl)pyrene and 1-bromo-8-(4-chlorophenyl)pyrene.

Next, a mixed solution of a mixture of 1-bromo-6-(4-chlorophenyl)pyrene and 1-bromo-8-(4-chlorophenyl)pyrene, and 500 ml of dichloromethane was heated and stirred while refluxing under a nitrogen gas stream for 30 minutes. The solution was cooled to room temperature while stirring and further stirred for 30 minutes, and then the precipitate was filtered. A mixed solution of the resulting precipitate and 300 ml of dichloromethane was heated and stirred while refluxing under a nitrogen gas stream for one hour. The solution was cooled to room temperature while stirring and further stirred for 30 minutes, and then the precipitate was filtered and vacuum-dried to obtain 15 g of 1-bromo-6-(4-chlorophenyl)pyrene.

Next, a mixed solution of 4.9 g of 1-bromo-6-(4-chlorophenyl)pyrene, 3.7 g of 2-biphenylboronic acid, 8.0 g of tripotassium phosphate, 1.2 g of tetrabutylammonium bromide, 84 mg of palladium acetate and 125 ml of dimethylformamide was heated and stirred under a nitrogen gas stream at 130° C. for 6 hours. The solution was cooled to room temperature and 100 ml of water was poured into the solution, followed by filtration. The resulting solid was washed with 50 ml of methanol, dissolved in 100 ml of dichloromethane, dried over magnesium sulfate, filtered and then evaporated. The concentrate was purified by silica gel column chromatography and then vacuum-dried to obtain 3.6 g of 1-(biphenyl-2-yl)-6-(4-chlorophenyl)pyrene.

Next, a mixed solution of 3.6 g of 1-(biphenyl-2-yl)-6-(4-chlorophenyl)pyrene, 1.54 g of carbazole, 884 mg of sodium t-butoxide, 200 mg of tri-t-butylphosphine tetrafluoroborate, 440 mg of bis(dibenzylideneacetone)palladium and 77 ml of m-xylene was heated and stirred under a nitrogen gas stream at 140° C. for 6 hours. The solution was cooled to room temperature and 100 ml of water was poured into the solution, followed by extraction with 50 ml of ethyl acetate. The organic layer was washed twice with 50 ml of water, dried over magnesium sulfate and then concentrated by evaporation. The resulting solid was purified by silica gel chromatography and then vacuum-dried to obtain 3.9 g of a white crystal. $^1$H-NMR analytical results of the resulting powder are as follows and reveal that the resulting white crystal is compound [47].

$^1$H-NMR (CDCl$_3$(d=ppm)): 6.95-7.05(m, 3H), 7.05-7.15 (m, 2H), 7.30-7.70(m, 10H), 7.83(dd, 4H), 8.00-8.15(m, 5H), 8.17-8.32(m, 5H)

This compound [47] was used as a light emitting device material after sublimation refining under a pressure of $1 \times 10^{-3}$ Pa at about 260° C. using an oil diffusion pump. HPLC purity (area % at measuring wavelength of 254 nm) was 99.7% before sublimation refining and was 99.8% after sublimation refining.

Example 4

Synthesis of Compound [29]

A mixed solution of 3.5 g of 1-bromo-6-(4-chlorophenyl) pyrene, 1.6 g of 4-methylphenylboronic acid, 4.9 g of tripotassium phosphate, 0.75 g of tetrabutylammonium bromide, 52 mg of palladium acetate and 30 ml of dimethylformamide was heated and stirred under a nitrogen gas stream at 130° C. for 3 hours. The solution was cooled to room temperature and 100 ml of water was poured into the solution, followed by filtration. The resulting solid was dissolved in 100 ml of dichloromethane and then filtered through Celite. The filtrate was evaporated, and then the resulting solid was washed with 30 ml of ethyl acetate and vacuum-dried to obtain 2.6 g of 1-(4-methylphenyl)-6-(4-chlorophenyl)pyrene. Next, a mixed solution of 2.6 g of 1-(4-methylphenyl)-6-(4-chlorophenyl)pyrene, 1.4 g of carbazole, 820 mg of sodium t-butoxide, 145 mg of tri-t-butylphosphine tetrafluoroborate, 320 mg of bis(dibenzylideneacetone)palladium and 50 ml of m-xylene was heated and stirred under a nitrogen gas stream at 140° C. for 6 hours. The solution was cooled to room temperature, filtered through Celite and then concentrated by evaporation. The resulting solid was purified by silica gel chromatography and then vacuum-dried to obtain 2.3 g of a white solid. $^1$H-NMR analytical results of the resulting powder are as follows and reveal that the resulting white solid is compound [29].

$^1$H-NMR (CDCl$_3$ (d=ppm)): 2.42(s, 3H), 7.31-7.43(m, 4H), 7.47-7.53(m, 2H), 7.55(d, 2H), 7.63(d, 2H), 7.79(d, 2H), 7.89 (d, 2H), 8.02(d, 1H), 8.05-8.16(m, 3H), 8.18-8.29(m, 5H), 8.34(d, 1H)

This compound [29] was used as a light emitting device material after sublimation refining under a pressure of $1 \times 10^{-3}$ Pa at about 250° C. using an oil diffusion pump. HPLC purity (area % at measuring wavelength of 254 nm) was 99.6% before sublimation refining and was 99.8% after sublimation refining.

Example 5

Synthesis of Compound [33]

In the same manner as in Example 4, except that 3-t-butylphenylboronic acid was used in place of 2-biphenylboronic acid, synthesis was carried out to obtain 1.2 g of a yellowish white crystal. $^1$H-NMR analytical results of the resulting powder are as follows and reveal that the resulting yellowish white crystal is compound [33].

$^1$H-NMR (CDCl$_3$(d=ppm)): 1.41-1.44(m, 9H), 7.30-7.91 (m, 14H) 8.03-8.35(m, 10H)

This compound [33] was used as a light emitting device material after sublimation refining under a pressure of $1 \times 10^{-3}$ Pa at about 260° C. using an oil diffusion pump. HPLC purity (area % at measuring wavelength of 254 nm) was 99.8% before sublimation refining and was 99.9% after sublimation refining.

Example 6

Synthesis of Compound [28]

In the same manner as in Example 4, except that phenylboronic acid was used in place of 2-biphenylboronic acid, synthesis was carried out to obtain 322 mg of a white crystal. $^1$H-NMR analytical results of the resulting powder are as follows and reveal that the resulting white crystal is compound [28].

$^1$H-NMR (CDCl$_3$(d=ppm)): 7.26-8.36(m, 25H)

This compound [28] was used as a light emitting device material after sublimation refining under a pressure of $1 \times 10^{-3}$ Pa at about 240° C. using an oil diffusion pump. HPLC purity (area % at measuring wavelength of 254 nm) was 99.5% before sublimation refining and was 99.6% after sublimation refining.

Example 7

Synthesis of Compound [35]

In the same manner as in Example 4, except that 2-naphthaleneboronic acid was used in place of 2-biphenylboronic acid, synthesis was carried out to obtain a yellowish white crystal. $^1$H-NMR analytical results of the resulting powder are as follows and reveal that the resulting yellowish white crystal is compound [35].

$^1$H-NMR (CDCl$_3$(d=ppm)): 7.33-8.36(m, 27H)

This compound [35] was used as a light emitting device material after sublimation refining under a pressure of $1 \times 10^{-3}$ Pa at about 280° C. using an oil diffusion pump. HPLC purity (area % at measuring wavelength of 254 nm) was 99.1% before sublimation refining and was 99.8% after sublimation refining.

Example 8

Synthesis of Compound [45]

In the same manner as in Example 4, except that 1-benzofuranboronic acid was used in place of 2-biphenylboronic acid, synthesis was carried out to obtain a white crystal. $^1$H-NMR analytical results of the resulting powder are as follows and reveal that the resulting white crystal is compound [45].

$^1$H-NMR (CDCl$_3$(d=ppm)): 7.33-8.41(m, 27H)

This compound [45] was used as a light emitting device material after sublimation refining under a pressure of $1 \times 10^{-3}$ Pa at about 300° C. using an oil diffusion pump. HPLC purity (area % at measuring wavelength of 254 nm) was 99.5% before sublimation refining and was 99.6% after sublimation refining.

Example 9

Synthesis of Compound [49]

In the same manner as in Example 4, except that 2-(4-biphenyl)phenylboronic acid was used in place of 2-biphenylboronic acid, synthesis was carried out to obtain 0.40 g of a yellowish white crystal. $^1$H-NMR analytical results of the resulting powder are as follows and reveal that the resulting yellowish white crystal is compound [49].

$^1$H-NMR (CDCl$_3$(d=ppm)): 7.15-7.70(m, 19H), 7.83(dd, 4H), 8.00-8.15 (m, 5H), 8.17-8.32 (m, 5H)

This compound [49] was used as a light emitting device material after sublimation refining under a pressure of $1\times10^{-3}$ Pa at about 270° C. using an oil diffusion pump. HPLC purity (area % at measuring wavelength of 254 nm) was 99.7% before sublimation refining and was 99.8% after sublimation refining.

Example 10

Synthesis of Compound [81]

A mixed solution of 8.0 g of 1-bromo-6-(4-methylphenyl)pyrene, 4.5 g of 3,5-dichlorophenylboronic acid, 9.2 g of tripotassium phosphate, 1.4 g of tetrabutylammonium bromide, 97 mg of palladium acetate and 215 ml of dimethylformamide was heated and stirred under a nitrogen gas stream at 120° C. for 5 hours. The solution was cooled to room temperature and 1.0 L of water was poured into the solution, followed by extraction with 600 ml of dichloromethane. The organic layer was washed twice with 200 ml of water, dried over magnesium sulfate and then filtered through Celite. The filtrate was evaporated and the residue was washed twice with 200 ml of ethyl acetate, and then the precipitated solid was collected by filtration. The precipitated solid was recrystallized from 100 ml of dimethylformamide and then vacuum-dried to obtain 5.5 g of 1-(3,5-dichlorophenyl)-6-(4-methylphenyl)pyrene.

A mixed solution of 0.85 g of 1-(3,5-dichlorophenyl)-6-(4-methylphenyl)pyrene, 0.97 g of carbazole, 0.56 g of t-butoxysodium, 0.11 g of (tris-t-butylphosphine)tetrafluoroborate, 0.22 g of bis(dibenzylideneacetone)palladium(0) and 39 ml of m-xylene was heated and stirred under a nitrogen gas stream at 140° C. for 3 hours. The solution was cooled to room temperature and 50 ml of water was poured into the solution, followed by extraction with 200 ml of dichloromethane. The organic layer was washed twice with 50 ml of water, dried over magnesium sulfate and then evaporated. The concentrate was purified by silica gel column chromatography and then vacuum-dried to obtain 0.87 g of a yellowish white crystal. $^1$H-NMR analytical results of the resulting powder are as follows and reveal that the resulting yellowish white crystal is compound [81].

$^1$H-NMR (CDCl$_3$(d=ppm)): 2.51(s, 3H), 7.30-8.50(m, 31H)

This compound [81] was used as a light emitting device material after sublimation refining under a pressure of $1\times10^{-3}$ Pa at about 280° C. using an oil diffusion pump. HPLC purity (area % at measuring wavelength of 254 nm) was 99.2% before sublimation refining and was 99.3% after sublimation refining.

Example 11

Synthesis of Compound [99]

A mixed solution of 4.0 g of 1-bromo-6-(4-chlorophenyl)pyrene, 2.0 g of 4-t-butylphenylboronic acid, 4.8 g of tripotassium phosphate, 0.72 g of tetrabutylammonium bromide, 52 mg of palladium acetate and 100 ml of dimethylformamide was heated and stirred under a nitrogen gas stream at 130° C. for 3 hours. The solution was cooled to room temperature and 100 ml of water was poured into the solution, followed by filtration. The resulting solid was dissolved at 140° C. by adding 100 ml of xylene. The solution was cooled to 100° C. and then filtered through Celite. The filtrate was evaporated, and then the resulting solid was washed with 50 ml of methanol and vacuum-dried to obtain 3.0 g of 1-(4-t-butylphenyl)-6-(4-chlorophenyl)pyrene.

A mixed solution of 0.8 g of 1-(4-t-butylphenyl)-6-(4-chlorophenyl)pyrene, 1.0 g of 9-[4-(4,4,5,5-tetramethyl-[1,3,2]dioxaborolan-2-yl)phenyl]carbazole, 1.1 g of potassium carbonate, 47 mg of bis(dibenzylideneacetone)palladium(0), 23 mg of (tris-t-butylphosphine)tetrafluoroborate and 50 ml of dioxane was heated and stirred under a nitrogen gas stream at 110° C. for 8 hours. The solution was cooled to room temperature and filtered, and then the resulting solid was washed in turn with 30 ml of dioxane, 50 ml of water and 50 ml of ethanol. The resulting solid was recrystallized from 100 ml of xylene and then vacuum-dried to obtain 0.15 g of a yellowish white crystal. $^1$H-NMR analytical results of the resulting powder are as follows and reveal that the resulting yellowish white crystal is compound [99].

$^1$H-NMR (CDCl$_3$(d=ppm)): 1.47(s, 9H), 7.30-8.31(m, 28H) HPLC purity (area % at measuring wavelength of 254 nm) was 99.1%.

Example 12

Synthesis of Compound [104]

A mixed solution of 0.88 g of 1-(3,5-dichlorophenyl)-6-(4-methylphenyl)pyrene, 0.35 g of 2-naphthylboronic acid, 2.9 g of cesium carbonate, 58 mg of (tris-t-butylphosphine)tetrafluoroborate, 0.12 g of bis(dibenzylideneacetone)palladium(0) and 20 ml of 1,4-dioxane was heated and stirred under a nitrogen gas stream at 90° C. for 4 hours. The solution was cooled to room temperature and 50 ml of water was poured into the solution, followed by extraction with 100 ml of dichloromethane. The organic layer was washed twice with 20 ml of water, dried over magnesium sulfate and then evaporated. The concentrate was purified by silica gel column chromatography and then vacuum-dried to obtain 0.40 g of 1-{3-chloro-5-(2-naphthyl)phenyl}-6-(4-methylphenyl)pyrene.

Next, a mixed solution of 0.36 g of 1-{3-chloro-5-(2-naphthyl)phenyl}-6-(4-methylphenyl)pyrene, 0.17 g of carbazole, 98 mg of t-butoxysodium, 20 mg of (tris-t-butylphosphine)tetrafluoroborate, 39 mg of bis(dibenzylideneacetone)palladium(0) and 7 ml of m-xylene was heated and stirred under a nitrogen gas stream at 140° C. for 3 hours. The solution was cooled to room temperature and 20 ml of water was poured into the solution, followed by extraction with 100 ml of dichloromethane. The organic layer was washed twice with 20 ml of water, dried over magnesium sulfate and then evaporated. The concentrate was purified by silica gel column chromatography and then vacuum-dried to obtain 0.40 g of a yellowish white crystal. $^1$H-NMR analytical results of the resulting powder are as follows and reveal that the resulting yellowish white crystal is compound [104].

$^1$H-NMR (CDCl$_3$(d=ppm)): 2.51(s, 3H), 7.30-8.45(m, 30H)

This compound [104] was used as a light emitting device material after sublimation refining under a pressure of $1\times10^{-3}$ Pa at about 280° C. using an oil diffusion pump. HPLC purity (area % at measuring wavelength of 254 nm) was 99.5% before sublimation refining and was 99.7% after sublimation refining.

Example 13

Synthesis of Compound [117]

A mixed solution of 10 g of 2-bromonitrobenzene, 8.2 g of 4-methylphenylboronic acid, 25.4 g of tripotassium phosphate, 3.9 g of tetrabutylammonium bromide, 270 mg of palladium acetate and 150 ml of dimethylformamide was heated and stirred under a nitrogen gas stream at 130° C. for 3 hours. The solution was cooled to room temperature and 100 ml of water was poured into the solution, followed by extraction with 150 ml of ethyl acetate. The organic layer was washed twice with 100 ml of water, dried over magnesium sulfate and then evaporated. The concentrate was purified by silica gel column chromatography and then vacuum-dried to obtain 8.6 g of 2-(4-methylphenyl)nitrobenzene.

3 g of 2-(4-methylphenyl)nitrobenzene and 20 m of triethyl phosphate were heated and stirred at 160° C. for 6 hours. After triethyl phosphate was distilled off under reduced pressure, 10 ml of methanol was added, followed by filtration. The resulting solid was vacuum-dried to obtain 1.5 g of 2-methylcarbazole.

A mixed solution of 0.8 g of 1-(4-methylphenyl)-6-(4-chlorophenyl)pyrene, 0.58 g of 2-methylcarbazole, 0.23 g of t-butoxysodium, 45 mg of (tris-t-butylphosphine)tetrafluoroborate, 99 mg of bis(dibenzylideneacetone)palladium(0) and 30 ml of m-xylene was heated and stirred under a nitrogen gas stream at 140° C. for 3 hours. The solution was cooled to room temperature and then filtered through Celite. The filtrate was evaporated, and then the concentrate was purified by silica gel column chromatography and vacuum-dried to obtain 0.36 g of an opaque white crystal. $^1$H-NMR analytical results of the resulting powder are as follows and reveal that the resulting opaque white crystal is compound [117].

$^1$H-NMR (CDCl$_3$ (d=ppm)): 2.52(s, 3H), 2.57(s, 3H), 7.17 (d, 1H), 7.29-7.60(m, 9H), 7.77(d, 2H), 7.89(d, 2H), 8.00-8.37(m, 9H)

This compound [117] was used as a light emitting device material after sublimation refining under a pressure of $1 \times 10^{-3}$ Pa at about 230° C. using an oil diffusion pump. HPLC purity (area % at measuring wavelength of 254 nm) was 99.7% before sublimation refining and was 99.9% after sublimation refining.

Example 14

Synthesis of Compound [120]

In the same manner as in Example 13, except that 4-biphenylboronic acid was used in place of 4-methylphenylboronic acid, synthesis was carried out to obtain an opaque white crystal. $^1$H-NMR analytical results of the resulting powder are as follows and reveal that the resulting opaque white crystal is compound [120].
$^1$H-NMR (CDCl$_3$ (d=ppm)): 2.52(s, 3H), 7.36-8.37(m, 28H)

This compound [120] was used as a light emitting device material after sublimation refining under a pressure of $1 \times 10^{-3}$ Pa at about 270° C. using an oil diffusion pump. HPLC purity (area % at measuring wavelength of 254 nm) was 99.7% before sublimation refining and was 99.9% after sublimation refining.

Example 15

Synthesis of Compound [123]

In the same manner as in Example 13, except that 1-naphthaleneboronic acid was used in place of 4-methylphenylboronic acid, synthesis was carried out to obtain an opaque white crystal. $^1$H-NMR analytical results of the resulting powder are as follows and reveal that the resulting opaque white crystal is compound [123].

$^1$H-NMR (CDCl$_3$(d=ppm)): 2.51(s, 3H), 7.36-8.31(m, 30H)

This compound [123] was used as a light emitting device material after sublimation refining under a pressure of $1 \times 10^{-3}$ Pa at about 290° C. using an oil diffusion pump. HPLC purity (area % at measuring wavelength of 254 nm) was 99.6% before sublimation refining and was 99.9% after sublimation refining.

Example 16

Synthesis of Compound [127]

In the same manner as in Example 13, except that 4-t-butylphenylboronic acid was used in place of 4-methylphenylboronic acid, synthesis was carried out to obtain 569 mg of a white crystal. $^1$H-NMR analytical results of the resulting powder are as follows and reveal that the resulting white crystal is compound [127].
$^1$H-NMR (CDCl$_3$(d=ppm)): 1.45(s, 9H), 2.52(s, 3H), 7.26-8.38(m, 26H)

This compound [127] was used as a light emitting device material after sublimation refining under a pressure of $1 \times 10^{-3}$ Pa at about 260° C. using an oil diffusion pump. HPLC purity (area % at measuring wavelength of 254 nm) was 99.5% before sublimation refining and was 99.6% after sublimation refining.

Example 17

Synthesis of Compound [128]

In the same manner as in Example 13, except that 9-[4-(4,4,5,5-tetramethyl-[1,3,2]dioxaborolan-2-yl)phenyl]carbazole was used in place of 4-methylphenylboronic acid, synthesis was carried out to obtain an opaque white crystal. $^1$H-NMR analytical results of the resulting powder are as follows and reveal that the resulting opaque white crystal is compound [128].
$^1$H-NMR (CDCl$_3$(d=ppm)): 2.50(s, 3H), 7.27-8.39(m, 31H)

This compound [128] was used as a light emitting device material after sublimation refining under a pressure of $1 \times 10^{-3}$ Pa at about 300° C. using an oil diffusion pump. HPLC purity (area % at measuring wavelength of 254 nm) was 99.8% before sublimation refining and was 99.9% after sublimation refining.

Example 18

Synthesis of Compound [129]

A mixed solution of 10 g of 2-bromonitrobenzene, 8.5 g of 4-chlorophenylboronic acid, 25.4 g of tripotassium phosphate, 3.9 g of tetrabutylammonium bromide, 270 mg of palladium acetate and 150 ml of dimethylformamide was heated and stirred under a nitrogen gas stream at 130° C. for 3 hours. The solution was cooled to room temperature and 100 ml of water was poured into the solution, followed by extraction with 150 ml of ethyl acetate. The organic layer was washed twice with 100 ml of water, dried over magnesium sulfate and then evaporated. The concentrate was purified by silica gel column chromatography and then vacuum-dried to obtain 8.6 g of 2-(4-chlorophenyl)nitrobenzene.

A mixed solution of 2.0 g of 2-(4-chlorophenyl)nitrobenzene, 1.7 g of diphenylamine, 0.99 g of t-butoxysodium, 0.19 g of (tris-t-butylphosphine)tetrafluoroborate, 0.43 g of bis(dibenzylideneacetone)palladium(0) and 30 ml of m-xylene was heated and stirred under a nitrogen gas stream at 140° C. for 5 hours. The solution was cooled to room temperature and filtered through Celite. The filtrate was evaporated, and then the concentrate was purified by silica gel column chromatography and vacuum-dried to obtain 1.5 g of 2-(4-diphenylaminophenyl)nitrobenzene.

1.5 g of 2-(4-diphenylaminophenyl)nitrobenzene and 20 ml of triethyl phosphate were heated and stirred at 160° C. for 8 hours. After triethyl phosphate was distilled off under reduced pressure, 10 ml of methanol was added, followed by filtration. The resulting solid was vacuum-dried to obtain 1.2 g of 2-diphenylaminocarbazole.

A mixed solution of 0.6 g of 1-(4-methylphenyl)-6-(4-chlorophenyl)pyrene, 0.6 g of 2-diphenylaminocarbazole, 0.17 g of t-butoxysodium, 33 mg of (tris-t-butylphosphine)tetrafluoroborate, 74 mg of bis(dibenzylideneacetone)palladium(0) and 20 ml of m-xylene was heated and stirred under a nitrogen gas stream at 140° C. for 5 hours. The solution was cooled to room temperature and filtered through Celite. The filtrate was evaporated, and then the concentrate was purified by silica gel column chromatography and vacuum-dried to obtain 0.65 g of a yellowish white crystal. $^1$H-NMR analytical results of the resulting powder are as follows and reveal that the resulting yellowish white crystal is compound [129].

$^1$H-NMR (CDCl$_3$(d=ppm)): 2.51(s, 3H), 6.99-7.58(m, 19H), 7.67(d, 2H), 7.78(d, 2H), 7.98-8.28(m, 10 h)

This compound [129] was used as a light emitting device material after sublimation refining under a pressure of $1 \times 10^{-3}$ Pa at about 280° C. using an oil diffusion pump. HPLC purity (area % at measuring wavelength of 254 nm) was 99.7% before sublimation refining and was 99.9% after sublimation refining.

Example 19

Synthesis of Compound [131]

A mixed solution of 7.4 g of phenylhydrazine, 10 g of tetralone and 25 ml of acetic acid was heated and stirred under a nitrogen gas stream at 130° C. for one hour. The solution was cooled to room temperature and 30 ml of water was added, followed by filtration. The resulting solid was dispersed in 20 ml of a mixed solvent of water and methanol (1/1), stirred for one hour, filtered and then vacuum-dried to obtain 5.0 g of 1,2-benzo-3,4-dihydrocarbazole.

A mixed solvent of 5.0 g of 1,2-benzo-3,4-dihydrocarbazole, 5.6 g of chloranil and 100 ml of m-xylene was heated and stirred at 140° C. for one hour. The solution was cooled to room temperature, filtered and then washed with 30 ml of xylene. The resulting solid was recrystallized from 100 ml of m-xylene, filtered, washed with 20 ml of ethanol and then vacuum-dried to obtain 3.5 g of 1,2-benzocarbazole.

A mixed solution of 0.8 g of 1-(4-methylphenyl)-6-(4-chlorophenyl)pyrene, 0.43 g of 1,2-benzocarbazole, 0.23 g of t-butoxysodium, 45 mg of (tris-t-butylphosphine)tetrafluoroborate, 99 mg of bis(dibenzylideneacetone)palladium(0) and 30 ml of m-xylene was heated and stirred under a nitrogen gas stream at 140° C. for 12 hours. The solution was cooled to room temperature and then filtered through Celite. The filtrate was evaporated, and then the concentrate was purified by silica gel column chromatography and vacuum-dried to obtain 0.30 g of a yellowish white crystal. $^1$H-NMR analytical results of the resulting powder are as follows and reveal that the resulting yellowish white crystal is compound [131].

$^1$H-NMR (CDCl$_3$(d=ppm)): 2.53(s, 3H), 7.35-8.39(m, 26H)

This compound [131] was used as a light emitting device material after sublimation refining under a pressure of $1 \times 10^{-3}$ Pa at about 250° C. using an oil diffusion pump. PLC purity (area % at measuring wavelength of 254 nm) was 99.8% before sublimation refining and was 99.9% after sublimation refining.

Example 20

Synthesis of Compound [135]

A mixed solution of 1.5 g of 2-bromonitrobenzene, 2.5 g of 2-(9-phenanthrene)-4,4,5,5-tetramethyl-1,3,2-dioxaborolane, 3.4 g of tripotassium phosphate, 716 mg of tetrabutylammonium bromide, 50 mg of palladium acetate and 70 ml of dimethylformamide was heated and stirred under a nitrogen gas stream at 130° C. for 6 hours. The solution was cooled to room temperature and 50 ml of water was poured into the solution, followed by extraction with 50 ml of toluene. The organic layer was washed twice with 50 ml of water, dried over magnesium sulfate and then concentrated by evaporation. The concentrate was purified by silica gel chromatography and then vacuum-dried to obtain 2.0 g of 9-(2-nitrophenyl)phenanthrene.

Next, a mixed solution of 2.0 g of 9-(2-nitrophenyl)phenanthrene and 40 ml of triethyl phosphate was heated and stirred under a nitrogen gas stream at 150° C. for 8 hours. After cooling to room temperature, 50 ml of water was poured into the solution, followed by extraction with 50 ml of toluene. The organic layer was washed twice with 50 ml of water, dried over magnesium sulfate and then concentrated by evaporation. The concentrate was purified by silica gel chromatography and then vacuum-dried to obtain 840 mg of 13H-13-azaindeno[1,2-l]phenanthrene.

Next, a mixed solution of 975 mg of 1-(4-chlorophenyl)-6-p-tolylpyrene, 840 mg of 13H-13-azaindeno[1,2-l]phenanthrene, 349 mg of sodium t-butoxide, 63 mg of tri-t-butylphosphine tetrafluoroborate, 139 mg of bis(dibenzylideneacetone)palladium and 25 ml of m-xylene was heated and stirred under a nitrogen gas stream at 140° C. for 3 hours. The solution was cooled to 80° C., filtered through Celite and then evaporated. The resulting solid was washed with 50 ml of methanol, recrystallized from m-xylene and then vacuum-dried to obtain 1.0 g of a greenish white crystal. $^1$H-NMR analytical results of the resulting powder are as follows and reveal that the resulting greenish white crystal is compound [135].

$^1$H-NMR (CDCl$_3$(d=ppm)): 2.52(s, 3H), 7.39-8.38(m, 24H), 8.70-9.01(m, 4H)

This compound [135] was used as a light emitting device material after sublimation refining under a pressure of $1 \times 10^{-3}$ Pa at about 310° C. using an oil diffusion pump. HPLC purity (area % at measuring wavelength of 254 nm) was 99.5% before sublimation refining and was 99.9% after sublimation refining.

Example 21

Synthesis of Compound [141]

A mixed solution of 1.0 g of 1-bromo-2-nitrobenzene, 1.2 g of 3-biphenylboronic acid, 2.2 g of tripotassium phosphate, 0.33 mg of tetrabutylammonium bromide, 48 mg of palladium acetate and 50 mL of dimethylformamide was heated and stirred under a nitrogen gas stream at 130° C. for 4.5 hours. The solution was cooled to room temperature and 50 mL of ethyl acetate was added. After stirring at room temperature for a while and filtration, the filtered substance was washed with 50 mL of ethyl acetate. To the filtrate, 50 mL of ethyl acetate was added, and then the solution was washed with water (150 mL, 2×50 mL), dried over magnesium sulfate and concentrated. The resulting crude product was purified by column chromatography to obtain 1.4 g of 1-(3-biphenyl)-2-nitrobenzene.

A mixed solution of 1.4 g of 1-(3-biphenyl)-2-nitrobenzene and 10 mL of triethyl phosphate was heated and stirred under a nitrogen gas stream at 160° C. for 20 hours. The solution was cooled to room temperature and 50 mL of ethyl acetate was added. The solution was washed with water (3×50 mL), dried over magnesium sulfate and then concentrated. The resulting crude product was purified by column chromatography and then vacuum-dried to obtain 0.31 g of 3-phenylcarbazole.

A mixed solution of 0.41 g of 1-(4-chlorophenyl)-6-p-tolylpyrene, 0.31 g of 3-phenylcarbazole, 31 mg of tri-t-butylphosphonium tetrafluoroborate, 0.15 g of sodium t-butoxide, 59 mg of bis(dibenzylideneacetone)palladium(0) and 10 mL of m-xylene was heated and stirred under a nitrogen gas stream at 130° C. for 5 hours. The solution was cooled to room temperature and then 10 mL of dichloromethane was added. After stirring at room temperature for a while and filtration, the filtered substance was washed with dichloromethane. The filtrate was collected, washed with water, dried over magnesium sulfate and then concentrated. The resulting crude product was purified by column chromatography and then vacuum-dried to obtain 0.50 g of compound [141] as a whitish pink solid.

This compound [141] was used as a light emitting device material after sublimation refining under a pressure of $1 \times 10^{-3}$ Pa at about 280° C. using an oil diffusion pump. HPLC purity (area % at measuring wavelength of 254 nm) was 99.7% before sublimation refining and was 99.9% after sublimation refining.

Example 22

Synthesis of Compound [183]

A mixed solution of 7 g of 1-bromopyrene, 6 g of trimethylboroxin, 12 g of cesium carbonate, 2 g of PdCl$_2$(dppf).CH$_2$Cl$_2$, 80 ml of dimethylformamide and 8 ml of distilled water was heated and stirred under a nitrogen gas stream at 80° C. for 7 hours. The solution was cooled to room temperature and 50 ml of water was poured into the solution, followed by filtration. The resulting solid was purified by silica gel column chromatography and then vacuum-dried to obtain 4.4 g of 1-methylpyrene.

Next, a mixed solution of 4.4 g of 1-methylpyrene, 2 g of t-butylchloride and 33 ml of dichloromethane was cooled to 0° C. under a nitrogen gas stream and then 2.7 g of aluminum chloride was added. This mixed solution was stirred at room temperature for 3 hours and 30 ml of water was poured into the solution, followed by extraction with 30 ml of dichloromethane. The organic layer was washed twice with 20 ml of water, dried over magnesium sulfate and then evaporated. The concentrate was purified by silica gel column chromatography and then vacuum-dried to obtain 3 g of 7-t-butyl-1-methylpyrene.

Next, a mixed solution of 3 g of 7-t-butyl-1-methylpyrene, 130 ml of dichloromethane and 43 ml of methanol was cooled to 0° C. under a nitrogen gas stream and then 4.3 g of benzyltrimethylammonium tribromide dissolved in 5 ml of dichloromethane was added dropwise. This mixed solution was stirred at room temperature for 4 hours and 50 ml of water was poured into the solution, followed by extraction with 50 ml of dichloromethane. The organic layer was washed twice with 50 ml of water, dried over magnesium sulfate and then evaporated. The concentrate was purified by silica gel column chromatography and then vacuum-dried to obtain 3.4 g of 1-bromo-7-t-butyl-3-methylpyrene.

Next, a mixed solution of 1 g of 1-bromo-7-t-butyl-3-methylpyrene, 1.3 g of 9-[4-(4,4,5,5-tetramethyl-[1,3,2]dioxaborolan-2-yl)phenyl]carbazole, 1.5 g of tripotassium phosphate, 0.22 g of tetrabutylammonium bromide, 16 mg of palladium acetate and 30 ml of dimethylformamide was heated and stirred under a nitrogen gas stream at 130° C. for 2 hours. The solution was cooled to room temperature and 30 ml of water was poured into the solution, followed by filtration. The resulting solid was washed with 30 ml of ethanol, purified by silica gel chromatography and then vacuum-dried to obtain 1.2 g of a white crystal. $^1$H-NMR analytical results of the resulting powder are as follows and reveal that the resulting white crystal is compound [183].

$^1$H-NMR (CDCl$_3$(d=ppm)): 1.61(s, 9H), 3.05(s, 3H), 7.23-8.30(m, 19H)

This compound [183] was used as a light emitting device material after sublimation refining under a pressure of $1 \times 10^{-3}$ Pa at about 230° C. using an oil diffusion pump. HPLC purity (area % at measuring wavelength of 254 nm) was 99.1% before sublimation refining and was 99.3% after sublimation refining.

Example 23

Synthesis of Compound [185]

A mixed solution of 4.1 g of pyrene, 2 g of t-butylchloride and 33 ml of dichloromethane was cooled to 0° C. under a nitrogen gas stream and then 2.7 g of aluminum chloride was added. This mixed solution was stirred at room temperature for 3 hours and 30 ml of water was poured into the solution, followed by extraction with 30 ml of dichloromethane. The organic layer was washed twice with 20 ml of water, dried over magnesium sulfate and then evaporated. The concentrate was purified by silica gel column chromatography and then vacuum-dried to obtain 3 g (content: 65%) of 2-t-butylpyrene.

Next, a mixed solution of 3 g (content: 65%) of 2-t-butylpyrene, 50 ml of dichloromethane and 15 ml of methanol was cooled to 0° C. under a nitrogen gas stream and then 3.3 g of benzyltrimethylammonium tribromide dissolved in 10 ml of dichloromethane was added dropwise. This mixed solution was stirred at room temperature for 2 hours and 50 ml of water was poured into the solution, followed by extraction with 50 ml of dichloromethane. The organic layer was washed twice with 50 ml of water, dried over magnesium sulfate and then evaporated. To the resulting solid, 10 ml of methanol was added, followed by stirring for 10 minutes and further filtration. Furthermore, 30 ml of hexane was added and, after stirring for 30 minutes, the solution was filtered and the filtrate was vacuum-dried to obtain 2.3 g of 1-bromo-7-t-butylpyrene.

Next, a mixed solution of 2.3 g of 1-bromo-7-t-butylpyrene, 1.1 g of phenylboronic acid, 3.8 g of tripotassium phosphate, 0.58 g of tetrabutylammonium bromide, 12 mg of palladium acetate and 30 ml of dimethylformamide was heated and stirred under a nitrogen gas stream at 130° C. for 2 hours. The solution was cooled to room temperature and 30 ml of water was poured into the solution, followed by extraction with 50 ml of dichloromethane. The organic layer was washed twice with 20 ml of water, dried over magnesium sulfate and then evaporated. The concentrate was purified by silica gel column chromatography and then vacuum-dried to obtain 1.5 g of 7-t-butyl-1-phenylpyrene.

Next, a mixed solution of 1.5 g of 7-t-butyl-1-phenylpyrene, 25 ml of dichloromethane and 8 ml of methanol was cooled to 0° C. under a nitrogen gas stream and then 1.7 g of benzyltrimethylammonium tribromide dissolved in 5 ml of dichloromethane was added dropwise. This mixed solution was stirred at room temperature for 2 hours and 20 ml of water was poured into the solution, followed by extraction with 20 ml of dichloromethane. The organic layer was washed twice with 20 ml of water, dried over magnesium sulfate and then evaporated. To the resulting solid, 10 ml of methanol was added, followed by standing overnight. The precipitated solid was filtered and then vacuum-dried to obtain 1.9 g of 1-bromo-7-t-butyl-3-phenylpyrene.

Next, a mixed solution of 1.9 g of 1-bromo-7-t-butyl-3-phenylpyrene, 2.2 g of 9-[4-(4,4,5,5-tetramethyl-[1,3,2]dioxaborolan-2-yl)phenyl]carbazole, 2.5 g of tripotassium phosphate, 0.38 g of tetrabutylammonium bromide, 27 mg of palladium acetate and 40 ml of dimethylformamide was heated and stirred under a nitrogen gas stream at 130° C. for 2 hours. The solution was cooled to room temperature and 40 ml of water was poured into the solution, followed by filtration. The resulting solid was washed with 40 ml of methanol, purified by silica gel chromatography and then vacuum-dried to obtain 2.5 g of a yellowish white crystal. $^1$H-NMR analytical results of the resulting powder are as follows and reveal that the resulting yellowish white crystal is compound [185].

$^1$H-NMR (CDCl$_3$(d=ppm)): 1.61(s, 9H), 7.30-8.35(m, 24H)

This compound [185] was used as a light emitting device material after sublimation refining under a pressure of $1\times10^{-3}$ Pa at about 250° C. using an oil diffusion pump. HPLC purity (area % at measuring wavelength of 254 nm) was 99.4% before sublimation refining and was 99.6% after sublimation refining.

Example 24

Synthesis of Compound [174]

A mixed solution of 2.3 g of 1-bromo-7-t-butylpyrene, 1.2 g of 4-methylphenylboronic acid, 3.8 g of tripotassium phosphate, 0.58 g of tetrabutylammonium bromide, 12 mg of palladium acetate and 30 ml of dimethylformamide was heated and stirred under a nitrogen gas stream at 130° C. for 2 hours. The solution was cooled to room temperature and 30 ml of water was poured into the solution, followed by extraction with 50 ml of dichloromethane. The organic layer was washed twice with 20 ml of water, dried over magnesium sulfate and then evaporated. The concentrate was purified by silica gel column chromatography and then vacuum-dried to obtain 1.5 g of 7-t-butyl-1-(4-methylphenyl)pyrene.

Next, a mixed solution of 1.5 g of 7-t-butyl-1-(4-methylphenyl)pyrene, 25 ml of dichloromethane and 8 ml of methanol was cooled to 0° C. under a nitrogen gas stream and then 1.7 g of benzyltrimethylammonium tribromide dissolved in 5 ml of dichloromethane was added dropwise. This mixed solution was stirred at room temperature for 2 hours and 20 ml of water was poured into the solution, followed by extraction with 20 ml of dichloromethane. The organic layer was washed twice with 20 ml of water, dried over magnesium sulfate and then evaporated. To the resulting solid, 10 ml of methanol was added, followed by standing overnight. The precipitated solid was filtered and then vacuum-dried to obtain 1.9 g of 1-bromo-7-t-butyl-3-(4-methylphenyl)pyrene.

Next, a mixed solution of 1.9 g of 1-bromo-7-t-butyl-3-(4-methylphenyl)pyrene, 2.2 g of 9-[4-(4,4,5,5-tetramethyl-[1,3,2]dioxaborolan-2-yl)phenyl]carbazole, 2.5 g of tripotassium phosphate, 0.38 g of tetrabutylammonium bromide, 27 mg of palladium acetate and 40 ml of dimethylformamide was heated and stirred under a nitrogen gas stream at 130° C. for 2 hours. The solution was cooled to room temperature and 40 ml of water was poured into the solution, followed by filtration. The resulting solid was washed with 40 ml of methanol, purified by silica gel chromatography and then vacuum-dried to obtain 2.4 g of a yellowish white crystal. $^1$H-NMR analytical results of the resulting powder are as follows and reveal that the resulting yellowish white crystal is compound [174].

$^1$H-NMR (CDCl$_3$(d=ppm)): 1.61(s, 9H), 2.51(s, 3H), 7.30-8.34(m, 23H)

This compound [174] was used as a light emitting device material after sublimation refining under a pressure of $1\times10^{-3}$ Pa at about 260° C. using an oil diffusion pump. HPLC purity (area % at measuring wavelength of 254 nm) was 99.4% before sublimation refining and was 99.6% after sublimation refining.

Example 25

Synthesis of Compound [199]

A mixed solution of 1.9 g of 1-bromo-7-t-butyl-3-(4-methylphenyl)pyrene, 2.2 g of 9-[3-(4,4,5,5-tetramethyl-[1,3,2]dioxaborolan-2-yl)phenyl]carbazole, 2.5 g of tripotassium phosphate, 0.38 g of tetrabutylammonium bromide, 27 mg of palladium acetate and 40 ml of dimethylformamide was heated and stirred under a nitrogen gas stream at 130° C. for 2 hours. The solution was cooled to room temperature and 40 ml of water was poured into the solution, followed by filtration. The resulting solid was washed with 40 ml of methanol, purified by silica gel chromatography and then vacuum-dried to obtain 2.3 g of a yellowish white crystal. $^1$H-NMR analytical results of the resulting powder are as follows and reveal that the resulting yellowish white crystal is compound [199].

$^1$H-NMR (CDCl$_3$(d=ppm)): 1.59(s, 9H), 2.49(s, 3H), 7.26-8.31(m, 23H)

This compound [199] was used as a light emitting device material after sublimation refining under a pressure of $1\times10^{-3}$ Pa at about 230° C. using an oil diffusion pump. HPLC purity (area % at measuring wavelength of 254 nm) was 99.4% before sublimation refining and was 99.6% after sublimation refining.

Example 26

Synthesis of Compound [245]

A mixed solution of 4 g of 1,6-dibromopyrene, 3.8 g of 4-methylphenylboronic acid, 12 g of tripotassium phosphate, 2 g of tetrabutylammonium bromide, 30 mg of palladium acetate and 60 ml of dimethylformamide was heated and stirred under a nitrogen gas stream at 130° C. for 6 hours. The solution was cooled to room temperature and 60 ml of water was poured into the solution, followed by filtration. The resulting solid was washed with 60 ml of ethanol, recrystallized from toluene and then vacuum-dried to obtain 2.6 g of 1,6-bis(4-methylphenyl)pyrene.

Next, a mixed solution of 2.6 g of 1,6-bis(4-methylphenyl)pyrene, 1.2 g of N-bromosuccinimide and 60 ml of dimethylformamide was stirred under a nitrogen gas stream at 60° C. for 5 hours. The solution was cooled to room temperature and 60 ml of water was poured into the solution, followed by extraction with 100 ml of dichloromethane. The organic layer was washed twice with 50 ml of water, dried over magnesium sulfate and then evaporated. The resulting solid was recrystallized from toluene and then vacuum-dried to obtain 1.4 g of 3-bromo-1,6-bis(4-methylphenyl)pyrene.

Next, a mixed solution of 1.0 g of 3-bromo-1,6-bis(4-methylphenyl)pyrene, 1.04 g of 9-[4-(4,4,5,5-tetramethyl-[1,3,2]dioxaborolan-2-yl)phenyl]carbazole, 1.2 g of tripotassium phosphate, 0.18 g of tetrabutylammonium bromide, 10 mg of palladium acetate and 20 ml of dimethylformamide was heated and stirred under a nitrogen gas stream at 130° C. for 5 hours. The solution was cooled to room temperature and 30 ml of water was poured into the solution, followed by filtration. The resulting solid was washed with 30 ml of ethanol, purified by silica gel chromatography and then vacuum-dried to obtain a pale yellow crystal. $^1$H-NMR analytical results of the resulting powder are as follows and reveal that the resulting pale yellow crystal is compound [245].

$^1$H-NMR (CDCl$_3$(d=ppm)): 2.50(ss, 6H), 7.29-7.49(m, 8H), 7.53-7.63(m, 6H), 7.72-7.90(m, 4H), 7.99-8.09(m, 3H), 8.16-8.30 (m, 6H)

This compound [245] was used as a light emitting device material after sublimation refining under a pressure of $1\times10^{-3}$ Pa at about 270° C. using an oil diffusion pump. HPLC purity (area % at measuring wavelength of 254 nm) was 99.5% before sublimation refining and was 99.6% after sublimation refining.

Example 27

Synthesis of Compound [267]

A mixed solution of 2.0 g of 1-bromopyrene, 1.9 g of 4-t-butylphenylboronic acid, 3.1 g of tripotassium phosphate, 0.46 g of tetrabutylammonium bromide, 70 mg of palladium acetate and 70 mL of dimethylformamide was heated and stirred under a nitrogen gas stream at 130° C. for 2 hours. The solution was cooled to room temperature and poured into 350 mL of water, and then the precipitated solid was collected by filtration. The resulting solid was dissolved in dichloromethane, washed with water, dried over magnesium sulfate and then concentrated. The resulting crude product was purified by column chromatography and then vacuum-dried to obtain 1.9 g of 1-(4-t-butylphenyl)pyrene.

A mixed solution of 1.9 g of 1-(4-t-butylphenyl)pyrene and 60 mL of cyclohexane was dissolved by heating and stirring under a nitrogen gas stream at 80° C. and 0.19 g of di-μ-methoxybis[(η-cycloocta-1,5-diene)iridium(I)] was added under a nitrogen gas stream, followed by heating and stirring at 80° C. for 5 minutes, addition of 0.16 g of 4,4'-di t-butyl-2,2'-bipyridine and further heating and stirring under a nitrogen gas stream at 80° C. for 9.5 hours. The solution was cooled to room temperature and then concentrated. The resulting crude product was purified by column chromatography and then vacuum-dried to obtain 0.61 g of 2-[1-(4-t-butylphenyl)pyren-7-yl]-4,4,5,5-tetramethyl 1,3,2-dioxaborolane.

A mixed solution of 0.61 g of 2-[1-(4-t-butylphenyl)pyren-7-yl]-4,4,5,5-tetramethyl 1,3,2-dioxaborolane, 0.28 mL of bromobenzene, 1.2 g of tripotassium phosphate, 0.18 g of tetrabutylammonium bromide, 14 mg of palladium acetate and 15 mL of dimethylformamide was heated and stirred under a nitrogen gas stream at 130° C. for 8 hours. The solution was cooled to room temperature and poured into 75 mL of water, and then the precipitated solid was collected by filtration. The resulting solid was dissolved in dichloromethane, washed with water, dried over magnesium sulfate and then concentrated. The resulting crude product was purified by column chromatography and then vacuum-dried to obtain 0.49 g of 1-(4-t-butylphenyl)-7-phenylpyrene.

A mixed solution of 0.49 g of 1-(4-t-butylphenyl)-7-phenylpyrene, 120 ml of dichloromethane and 40 ml of methanol was cooled to 0° C. under a nitrogen gas stream and then 0.52 g of benzyltrimethylammonium tribromide dissolved in 10 ml of dichloromethane was added dropwise. This mixed solution was stirred at room temperature for 5 hours and 100 ml of dichloromethane was added. The solution was washed with water (200 mL, 2×100 ml), dried over magnesium sulfate and then concentrated. The resulting crude product was purified by column chromatography and then vacuum-dried to obtain 0.52 g of a mixture of 1-(4-t-butylphenyl)-3-bromo-7-phenylpyrene and a position isomer.

A mixed solution of 0.52 g of the mixture of 1-(4-t-butylphenyl)-3-bromo-7-phenylpyrene and a position isomer, 0.59 g of 9-[4-(4,4,5,5-tetramethyl-[1,3,2]dioxaborolan-2-yl)phenyl]carbazole, 0.45 g of tripotassium phosphate, 72 mg of tetrabutylammonium bromide, 10 mg of palladium acetate and 20 mL of dimethylformamide was heated and stirred under a nitrogen gas stream at 130° C. for 5 hours. The solution was cooled to room temperature and poured into 75 mL of water, and then the precipitated solid was collected by filtration. The resulting solid was dissolved in dichloromethane, washed with water, dried over magnesium sulfate and then concentrated. The resulting crude product was purified by column chromatography and then vacuum-dried to obtain 0.54 g of a white solid. To the resulting solid, 20 mL of ethyl acetate was added and this suspension was heated and stirred. The suspension was cooled to room temperature, filtered and then vacuum-dried to obtain 0.21 g of a white solid. $^1$H-NMR analytical results of the resulting powder are as follows and reveal that the resulting white crystal is compound [267].

$^1$H-NMR (CDCl$_3$(d=ppm)): 8.34-8.03(m, 9H), 7.62-7.28 (m, 19H), 1.47(s, 9H)

HPLC purity (area % at measuring wavelength of 254 nm) was 99.8%.

Example 28

Synthesis of Compound [283]

A mixed solution of 2 g of 1,6-dibromopyrene, 2 g of 4-methyl-1-naphthaleneboronic acid, 2.9 g of tripotassium phosphate, 0.59 g of tetrabutylammonium bromide, 40 mg of palladium acetate and 100 ml of dimethylformamide was heated and stirred under a nitrogen gas stream at 130° C. for 9 hours. The solution was cooled to room temperature and 500 ml of water was poured into the solution, followed by extraction with 200 ml of dichloromethane. The organic layer was washed twice with 100 ml of water, dried over magnesium sulfate and then concentrated by evaporation. The resulting concentrate was recrystallized from toluene and then vacuum-dried at 70° C. to obtain 1.7 g of 1,6-di(4-methylnaphthalen-1-yl)pyrene as an opaque white powder.

A mixed solution of 1.7 g of 1,6-di(4-methylnaphthalen-1-yl)pyrene, 0.54 g of N-bromosuccinimide and 30 ml of dimethylformamide was stirred under a nitrogen gas stream at 60° C. for 6 hours. The solution was cooled to room temperature and 50 ml of water was poured into the solution, followed by extraction with 100 ml of dichloromethane. The organic layer was washed twice with 50 ml of water, dried over magnesium sulfate and then concentrated by evaporation. The resulting concentrate was recrystallized from toluene and then vacuum-dried at 70° C. to obtain 1.5 g of 1-bromo-3,8-di(4-methylnaphthalen-1-yl)pyrene as a pale yellow powder.

A mixed solution of 1 g of 1-bromo-3,8-di(4-methylnaphthalen-1-yl)pyrene, 0.4 g of 4-dibenzofuranboronic acid, 0.66 g of tripotassium phosphate, 0.1 g of tetrabutylammonium bromide, 7 mg of palladium acetate and 16 ml of dimethylformamide was heated and stirred under a nitrogen gas stream at 130° C. for 6 hours. The solution was cooled to room temperature and 50 ml of water was poured into the solution, followed by extraction with 70 ml of dichloromethane. The organic layer was washed twice with 20 ml of water, dried over magnesium sulfate and then concentrated by evaporation. The concentrate was purified by silica gel column chromatography and then vacuum-dried at 70° C. to obtain 0.61 g of a pale yellow crystal. $^1$H-NMR analytical results of the resulting powder are as follows and reveal that the resulting pale yellow crystal is compound [283].

$^1$H-NMR (CDCl$_3$(d=ppm)): 2.65(ss, 6H), 7.05-8.15(m, 25H), 8.26(s, 1H)

This compound [283] was used as a light emitting device material after sublimation refining under a pressure of $1 \times 10^{-3}$ Pa at about 270° C. using an oil diffusion pump. HPLC purity (area % at measuring wavelength of 254 nm) was 99.5% before sublimation refining and was 99.8% after sublimation refining.

Example 29

Synthesis of Compound [312]

A mixed solution of 5 g of 1-bromopyrene, 7.9 g of N-bromosuccinimide and 140 ml of dimethylformamide was stirred under a nitrogen gas stream at 80° C. for 10 hours. The solution was cooled to room temperature and 400 ml of water was poured into the solution, and then the precipitate was filtered. The solid removed by filtration was washed in turn with 50 ml of water, 100 ml of methanol and 200 ml of dichloromethane and then vacuum-dried at 70° C. to obtain 6.1 g of 1,3,6-tribromopyrene as a pale yellow ocher powder.

A mixed solution of 4 g of 1,3,6-tribromopyrene, 7.7 g of 4-dibenzofuranboronic acid, 11.6 g of tripotassium phosphate, 1.8 g of tetrabutylammonium bromide, 0.12 g of palladium acetate and 270 ml of dimethylformamide was heated and stirred under a nitrogen gas stream at 130° C. for 9 hours. The solution was cooled to room temperature and 800 ml of water was poured into the solution, followed by extraction with 200 ml of dichloromethane. The organic layer was washed twice with 100 ml of water, dried over magnesium sulfate and then concentrated by evaporation. The concentrate was purified by silica gel column chromatography and then vacuum-dried at 70° C. to obtain 4 g of compound [48] as a pale yellow powder.

$^1$H-NMR analytical results of the resulting powder are as follows.

$^1$H-NMR (CDCl$_3$(d=ppm)): 7.28-7.85(m, 15H), 7.92-8.17 (m, 10H), 8.28(dd, 2H), 8.37(s, 1H)

This compound [49] was used as a light emitting device material after sublimation refining under a pressure of $1 \times 10^{-3}$ Pa at about 300° C. using an oil diffusion pump. HPLC purity (area % at measuring wavelength of 254 nm) was 99.3% before sublimation refining and was 99.4% after sublimation refining.

Example 30

Synthesis of Compound [338]

A mixed solution of 100 g of pyrene, 55.4 g of t-butylchloride and 400 ml of dichloromethane was cooled to 0° C. under an argon gas stream and then 70.4 g of aluminum chloride was added. This mixed solution was stirred at room temperature for 5 hours and poured into 500 g of ice, followed by stirring at room temperature for 30 minutes. After the mixed solution was suction-filtered, the filtrate was extracted twice with 300 ml of dichloromethane. The organic layer was washed with 300 ml of water, dried over magnesium sulfate and then evaporated. To the concentrated residue, 300 ml of methanol was added, followed by stirring at 80° C. and further filtration. Furthermore, 300 ml of methanol was added, followed by stirring at 80° C. and further filtration. To 59.1 g of the crude product obtained by vacuum drying among 110.7 g of the crude product, 150 ml of methanol was added. The resulting solution was stirred at 85° C. for one hour, filtered and then vacuum-dried to obtain 50.3 g (content: 83%) of 2-t-butylpyrene.

Next, a mixed solution of 45.0 g (content: 83%) of 2-t-butylpyrene, 660 ml of dichloromethane and 220 ml of methanol was cooled to 0° C. under an argon gas stream and then 56.4 g of benzyltrimethylammonium tribromide dissolved in 100 ml of dichloromethane was added dropwise. This mixed solution was stirred at room temperature for 2.5 hours and 5.64 g of benzyltrimethylammonium tribromide was added, followed by stirring for 1.5 hours. After the organic layer was isolated by pouring 250 ml of water into this mixed solution, the aqueous layer was extracted twice with 250 ml of dichloromethane. The combined organic layer was washed with 300 ml of water, dried over magnesium sulfate and then evaporated. To the resulting solid, 300 ml of methanol was added, followed by stirring and further filtration. To the resulting solid, 200 ml of hexane was added, and then the resulting solution was stirred, filtered and vacuum-dried to obtain 44.5 g of 1-bromo-7-t-butylpyrene.

Next, a mixed solution of 11.0 g of 1-bromo-7-t-butylpyrene, 5.78 g of 4-methylphenylboronic acid, 18.05 g of tripotassium phosphate, 2.74 g of tetrabutylammonium bromide, 191 mg of palladium acetate and 220 ml of dimethylformamide was heated and stirred under an argon gas stream at 130° C. for 14 hours. The solution was cooled to room temperature and 250 ml of water was poured into the solution, followed by extraction with 250 ml of dichloromethane. The organic layer was washed three times with 250 ml of water, dried over magnesium sulfate and then evaporated. The concentrate was purified by silica gel column chromatography and then vacuum-dried to obtain 7.63 g of 7-t-butyl-1-(4-methylphenyl)pyrene.

Next, a mixed solution of 7.63 g of 7-t-butyl-1-(4-methylphenyl)pyrene, 105 ml of dichloromethane and 35 ml of methanol was cooled to 0° C. under an argon gas stream and then 8.54 g of benzyltrimethylammonium tribromide was added over 5 minutes. This mixed solution was stirred at room temperature for 4 hours and 0.85 g of benzyltrimethylammonium tribromide was added, followed by stirring for 1.5 hours. To the reaction solution, 40 ml of water was poured, followed by extraction twice with 80 ml of dichloromethane. The combined organic layer was washed with 50 ml of water, dried over magnesium sulfate and then evaporated. To the resulting solid, 25 ml of methanol was added, and then the resulting solution was stirred for one hour, filtered and vacuum-dried to obtain 8.91 g of 1-bromo-7-t-butyl-3-(4-methylphenyl)pyrene.

Next, a mixed solution of 1.00 g of 1-bromo-7-t-butyl-3-(4-methylphenyl)pyrene, 645 mg of 4-dibenzofuranboronic acid, 1.29 g of tripotassium phosphate, 196 mg of tetrabutylammonium bromide, 13.7 mg of palladium acetate and 23.5 ml of dimethylformamide was heated and stirred under an argon gas stream at 130° C. for 3 hours. The solution was cooled to room temperature and 60 ml of water was poured into the solution, followed by stirring for 10 minutes. The precipitated solid was filtered, washed three times with 20 ml of water, washed four times with 20 mL of methanol and then vacuum-dried. To the resulting crude product, 15 ml of hexane/dichloromethane (30/1) was added, and then the resulting solution was stirred, filtered and dried under reduced pressure. To the resulting solid, 10 ml of hexane/dichloromethane (30/1) was added, and then the resulting solution was stirred for 30 minutes, filtered and dried under reduced pressure to obtain 435 mg of a white powder. 1H-NMR analytical results of the resulting powder are as follows and reveal that the resulting white powder is compound [338].

$^1$H-NMR (CDCl$_3$(d=ppm)): 1.59(s, 9H), 2.49(s, 3H), 7.34-7.43(m, 5H), 7.55(t, 1H), 7.62(d, 2H), 7.69(dd, 1H), 7.93(d, 1H), 7.97(d, 1H), 8.04-8.13(m, 4H), 8.20-8.28(m, 3H)

This compound [338] was used as a light emitting device material after sublimation refining under a pressure of $1\times10^{-3}$ Pa at about 250° C. using an oil diffusion pump. HPLC purity (area % at measuring wavelength of 254 nm) was 99.3% before sublimation refining and was 99.5% after sublimation refining.

Example 31

A light emitting device using compound [29] was produced in the following manner. A glass substrate (manufactured by Asahi Glass Co., Ltd., 15Ω/□, electron beam deposited product) with an ITO transparent conductive film having a thickness of 150 nm deposited on the surface was cut into pieces measuring 30×40 mm. The ITO film was patterned using a photolithographic method to form a light emitting portion and an electrode drawing portion. The resulting substrate was ultrasonic-washed in turn with acetone and "SEMICO-CLEAN® 56" (manufactured by Furuuchi Chemical Corporation) for 15 minutes and then washed with ultrapure water. Subsequently, the substrate was ultrasonic-washed with isopropyl alcohol for 15 minutes, and then immersed in hot methanol for 15 minutes and dried. Immediately before producing an device, this substrate was subjected to a UV-ozone treatment for one hour and was placed in a vacuum deposition device, and then the vacuum deposition device was evacuated until the vacuum degree in the device became $5\times10^{-4}$ Pa or less.

First, 10 nm of copper phthalocyanine as a hole injection material was vapor-deposited on an ITO film of the substrate using resistance heating, and then 50 nm of 4,4'-bis(N-(1-naphthyl)-N-phenylamino)biphenyl as a hole transporting material was vapor-deposited thereon. Next, as an emissive material, compound [29] as a host material and D-1 represented by the formula shown below as a dopant material were vapor-deposited with a thickness of 35 nm so as to adjust the dope concentration to 2%. Next, 20 nm of E-1 represented by the formula shown below as an electron transporting material was laminated. After 0.5 nm of lithium fluoride was vapor-deposited on the organic layer thus formed, 1,000 nm of aluminum was vapor-deposited to form a cathode, and thus an element measuring 5 mm by 5 mm was produced. As used herein, the film thickness is an indicated value of a quartz oscillating type film thickness monitor. This light emitting device was DC-driven at 10 mA/cm$^2$. As a result, high-efficiency blue light emission of 4.8 m/W was obtained. This light emitting device was continuously driven at an electric current of 10 mA/cm$^2$. As a result, the luminance half-time was 7,000 hours.

[Chemical Formula 54]

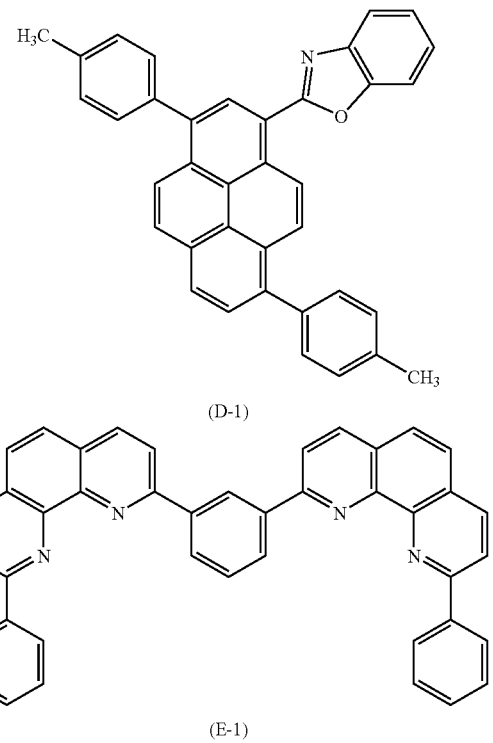

(D-1)

(E-1)

Examples 32 to 122, Comparative Examples 1 to 6

In the same manner as in Example 31, except that the materials described in Tables 1 to 3 were used as the host material, light emitting devices were produced. The results of the respective examples are shown in Tables 1 to 3.

TABLE 1

|  | Emissive layer | | Electron | | Luminance | Luminance |
|  | Host material | Dopant material | transporting layer | Luminescent color | efficiency (lm/W) | half-time (h) |
| --- | --- | --- | --- | --- | --- | --- |
| Example 31 | Compound [29] | D-1 | E-1 | Blue | 4.8 | 7000 |
| Example 32 | Compound [28] | D-1 | E-1 | Blue | 5.2 | 6200 |

TABLE 1-continued

|  | Emissive layer | | Electron | | Luminance | Luminance |
|  | Host material | Dopant material | transporting layer | Luminescent color | efficiency (lm/W) | half-time (h) |
| --- | --- | --- | --- | --- | --- | --- |
| Example 33 | Compound [30] | D-1 | E-1 | Blue | 4.0 | 7500 |
| Example 34 | Compound [33] | D-1 | E-1 | Blue | 4.3 | 7800 |
| Example 35 | Compound [35] | D-1 | E-1 | Blue | 4.7 | 6100 |
| Example 36 | Compound [37] | D-1 | E-1 | Blue | 4.0 | 5500 |
| Example 37 | Compound [44] | D-1 | E-1 | Blue | 4.2 | 6500 |
| Example 38 | Compound [45] | D-1 | E-1 | Blue | 4.8 | 5700 |
| Example 39 | Compound [46] | D-1 | E-1 | Blue | 4.4 | 6700 |
| Example 40 | Compound [47] | D-1 | E-1 | Blue | 4.6 | 6000 |
| Example 41 | Compound [48] | D-1 | E-1 | Blue | 4.3 | 6500 |
| Example 42 | Compound [49] | D-1 | E-1 | Blue | 4.5 | 6300 |
| Example 43 | Compound [52] | D-1 | E-1 | Blue | 4.6 | 6000 |
| Example 44 | Compound [53] | D-1 | E-1 | Blue | 4.9 | 6500 |
| Example 45 | Compound [59] | D-1 | E-1 | Blue | 4.8 | 7000 |
| Example 46 | Compound [60] | D-1 | E-1 | Blue | 4.8 | 6500 |
| Example 47 | Compound [69] | D-1 | E-1 | Blue | 5.0 | 6600 |
| Example 48 | Compound [72] | D-1 | E-1 | Blue | 4.7 | 6400 |
| Example 49 | Compound [81] | D-1 | E-1 | Blue | 4.6 | 6000 |
| Example 50 | Compound [40] | D-1 | E-1 | Blue | 4.7 | 5500 |
| Example 51 | Compound [43] | D-1 | E-1 | Blue | 4.8 | 5300 |
| Example 52 | Compound [78] | D-1 | E-1 | Blue | 4.6 | 6800 |
| Example 53 | Compound [99] | D-1 | E-1 | Blue | 4.9 | 6000 |
| Example 54 | Compound [93] | D-1 | E-1 | Blue | 4.7 | 5500 |
| Example 55 | Compound [96] | D-1 | E-1 | Blue | 4.8 | 6500 |
| Example 56 | Compound [268] | D-1 | E-1 | Blue | 5.0 | 7000 |
| Example 57 | Compound [103] | D-1 | E-1 | Blue | 4.5 | 5900 |
| Example 58 | Compound [104] | D-1 | E-1 | Blue | 4.2 | 6200 |
| Example 59 | Compound [106] | D-1 | E-1 | Blue | 4.6 | 6400 |
| Example 60 | Compound [108] | D-1 | E-1 | Blue | 4.3 | 7000 |
| Example 61 | Compound [117] | D-1 | E-1 | Blue | 4.5 | 9000 |
| Example 62 | Compound [120] | D-1 | E-1 | Blue | 4.8 | 10000 |
| Example 63 | Compound [121] | D-1 | E-1 | Blue | 5.2 | 8000 |

TABLE 2

|  | Emissive layer | | Electron | | Luminance | Luminance |
|  | Host material | Dopant material | transporting layer | Luminescent color | efficiency (lm/W) | half-time (h) |
| --- | --- | --- | --- | --- | --- | --- |
| Example 64 | Compound [122] | D-1 | E-1 | Blue | 4.6 | 9300 |

TABLE 2-continued

|  | Emissive layer | | Electron | | Luminance | Luminance |
|  | Host material | Dopant material | transporting layer | Luminescent color | efficiency (lm/W) | half-time (h) |
| --- | --- | --- | --- | --- | --- | --- |
| Example 65 | Compound [123] | D-1 | E-1 | Blue | 5.0 | 8300 |
| Example 66 | Compound [127] | D-1 | E-1 | Blue | 4.9 | 8500 |
| Example 67 | Compound [128] | D-1 | E-1 | Blue | 5.0 | 8000 |
| Example 68 | Compound [129] | D-1 | E-1 | Blue | 4.5 | 9000 |
| Example 69 | Compound [131] | D-1 | E-1 | Blue | 4.7 | 12000 |
| Example 70 | Compound [135] | D-1 | E-1 | Blue | 4.6 | 11000 |
| Example 71 | Compound [137] | D-1 | E-1 | Blue | 4.8 | 11500 |
| Example 72 | Compound [140] | D-1 | E-1 | Blue | 4.5 | 10000 |
| Example 73 | Compound [141] | D-1 | E-1 | Blue | 4.8 | 10500 |
| Example 74 | Compound [146] | D-1 | E-1 | Blue | 4.5 | 9000 |
| Example 75 | Compound [149] | D-1 | E-1 | Blue | 4.8 | 10000 |
| Example 76 | Compound [164] | D-1 | E-1 | Blue | 4.3 | 6000 |
| Example 77 | Compound [168] | D-1 | E-1 | Blue | 4.0 | 5500 |
| Example 78 | Compound [172] | D-1 | E-1 | Blue | 4.1 | 6000 |
| Example 79 | Compound [182] | D-1 | E-1 | Blue | 4.0 | 5800 |
| Example 80 | Compound [183] | D-1 | E-1 | Blue | 4.0 | 5700 |
| Example 81 | Compound [174] | D-1 | E-1 | Blue | 4.5 | 7000 |
| Example 82 | Compound [185] | D-1 | E-1 | Blue | 4.7 | 7500 |
| Example 83 | Compound [186] | D-1 | E-1 | Blue | 4.6 | 7300 |
| Example 84 | Compound [189] | D-1 | E-1 | Blue | 4.8 | 7000 |
| Example 85 | Compound [192] | D-1 | E-1 | Blue | 5.0 | 7000 |
| Example 86 | Compound [195] | D-1 | E-1 | Blue | 5.1 | 6800 |
| Example 87 | Compound [197] | D-1 | E-1 | Blue | 4.8 | 7200 |
| Example 88 | Compound [199] | D-1 | E-1 | Blue | 4.9 | 7500 |
| Example 89 | Compound [205] | D-1 | E-1 | Blue | 4.7 | 7000 |
| Example 90 | Compound [206] | D-1 | E-1 | Blue | 4.5 | 7200 |
| Example 91 | Compound [210] | D-1 | E-1 | Blue | 4.9 | 9000 |
| Example 92 | Compound [211] | D-1 | E-1 | Blue | 4.8 | 10000 |
| Example 93 | Compound [213] | D-1 | E-1 | Blue | 5.1 | 10500 |
| Example 94 | Compound [222] | D-1 | E-1 | Blue | 4.9 | 10000 |
| Example 95 | Compound [223] | D-1 | E-1 | Blue | 4.7 | 11000 |
| Example 96 | Compound [224] | D-1 | E-1 | Blue | 4.8 | 12000 |

TABLE 3

| | Emissive layer | | Electron transporting layer | Luminescent color | Luminance efficiency (lm/W) | Luminance half-time (h) |
|---|---|---|---|---|---|---|
| | Host material | Dopant material | | | | |
| Example 97 | Compound [226] | D-1 | E-1 | Blue | 5.2 | 9000 |
| Example 98 | Compound [234] | D-1 | E-1 | Blue | 4.6 | 6000 |
| Example 99 | Compound [245] | D-1 | E-1 | Blue | 4.8 | 7000 |
| Example 100 | Compound [248] | D-1 | E-1 | Blue | 4.7 | 6800 |
| Example 101 | Compound [257] | D-1 | E-1 | Blue | 4.5 | 6500 |
| Example 102 | Compound [261] | D-1 | E-1 | Blue | 4.8 | 6000 |
| Example 103 | Compound [267] | D-1 | E-1 | Blue | 3.2 | 3500 |
| Example 104 | Compound [2] | D-1 | E-1 | Blue | 4.0 | 3800 |
| Example 105 | Compound [230] | D-1 | E-1 | Blue | 4.0 | 3500 |
| Example 106 | Compound [11] | D-1 | E-1 | Blue | 4.1 | 3500 |
| Example 107 | Compound [91] | D-1 | E-1 | Blue | 3.5 | 3000 |
| Example 108 | Compound [92] | D-1 | E-1 | Blue | 3.6 | 2800 |
| Example 109 | Compound [101] | D-1 | E-1 | Blue | 3.8 | 2900 |
| Example 110 | Compound [272] | D-1 | E-1 | Blue | 4.1 | 4000 |
| Example 111 | Compound [273] | D-1 | E-1 | Blue | 4.0 | 4200 |
| Example 112 | Compound [276] | D-1 | E-1 | Blue | 4.2 | 4500 |
| Example 113 | Compound [283] | D-1 | E-1 | Blue | 4.0 | 4000 |
| Example 114 | Compound [290] | D-1 | E-1 | Blue | 4.2 | 4300 |
| Example 115 | Compound [294] | D-1 | E-1 | Blue | 4.8 | 6000 |
| Example 116 | Compound [296] | D-1 | E-1 | Blue | 4.5 | 4200 |
| Example 117 | Compound [310] | D-1 | E-1 | Blue | 3.8 | 3000 |
| Example 118 | Compound [312] | D-1 | E-1 | Blue | 3.7 | 2800 |
| Example 119 | Compound [313] | D-1 | E-1 | Blue | 3.5 | 3200 |
| Example 120 | Compound [338] | D-1 | E-1 | Blue | 4.2 | 4300 |
| Example 121 | Compound [354] | D-1 | E-1 | Blue | 4.8 | 6200 |
| Example 122 | Compound [316] | D-1 | E-1 | Blue | 3.2 | 4000 |
| Comparative Example 1 | H-1 | D-1 | E-1 | Blue | 3.1 | 500 |
| Comparative Example 2 | H-2 | D-1 | E-1 | Blue | 2.8 | 300 |
| Comparative Example 3 | H-3 | D-1 | E-1 | Blue | 3.2 | 800 |
| Comparative Example 4 | H-4 | D-1 | E-1 | Blue | 3.0 | 500 |
| Comparative Example 5 | H-5 | D-1 | E-1 | Blue | 2.9 | 400 |
| Comparative Example 6 | H-6 | D-1 | E-1 | Blue | 3.5 | 600 |

H-1 to H-6 in Table 3 are compounds represented by the following formulas.
[Chemical Formula 55]
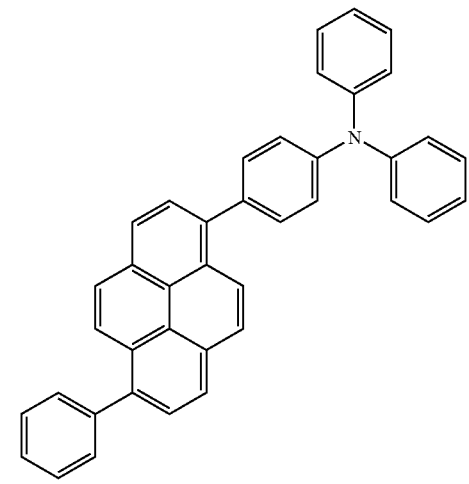
(H-1)
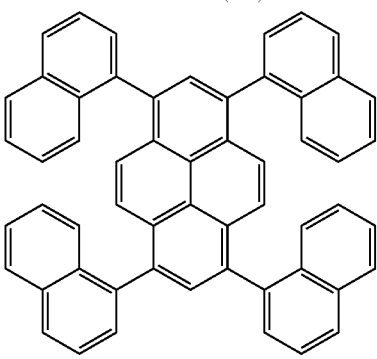
(H-2)
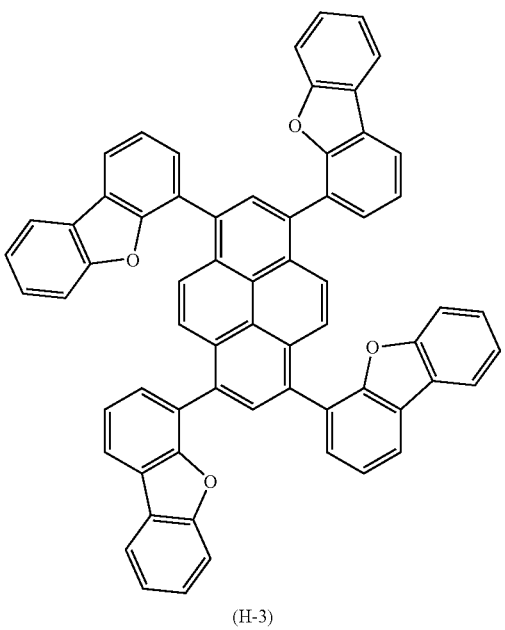
(H-3)
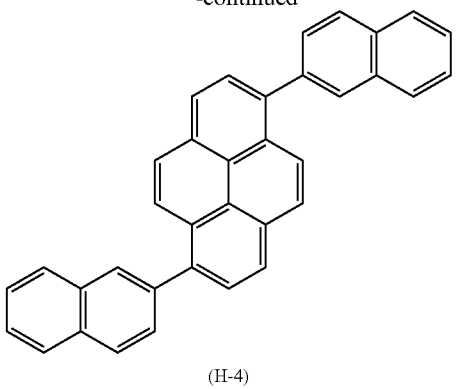
(H-4)
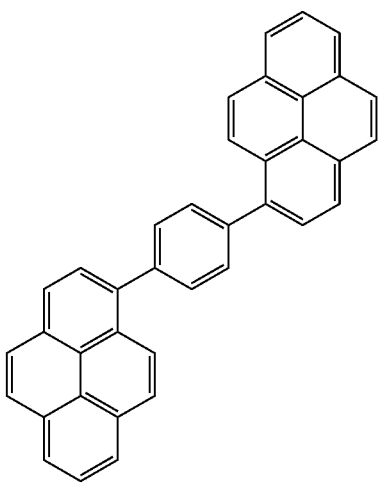
(H-5)
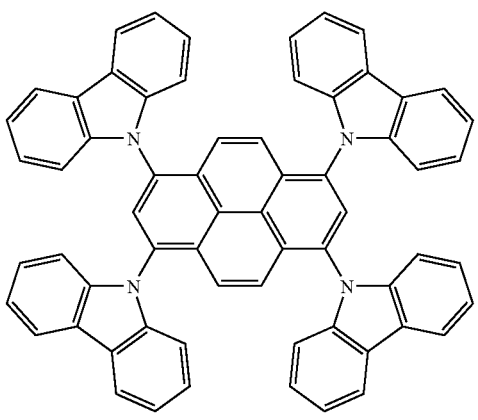
(H-6)
Examples 123 to 133
In the same manner as in Example 31, except that the materials described in Table 4 were used as the dopant material so as to adjust the dope concentration to 2%, light emitting devices were produced. The results of the respective examples are shown in Table 4.

TABLE 4

| | Emissive layer | | Electron transporting layer | Luminescent color | Luminance efficiency (lm/W) | Luminance half-time (h) |
|---|---|---|---|---|---|---|
| | Host material | Dopant material | | | | |
| Example 123 | Compound [29] | D-2 | E-1 | Blue | 5.1 | 8500 |
| Example 124 | Compound [29] | D-3 | E-1 | Blue | 4.9 | 8000 |
| Example 125 | Compound [29] | D-4 | E-1 | Blue | 4.6 | 12000 |
| Example 126 | Compound [29] | D-5 | E-1 | Blue | 4.5 | 9000 |
| Example 127 | Compound [29] | D-6 | E-1 | Blue | 4.5 | 4000 |
| Example 128 | Compound [29] | D-7 | E-1 | Blue | 3.5 | 6000 |
| Example 129 | Compound [29] | D-8 | E-1 | Blue | 3.7 | 5000 |
| Example 130 | Compound [29] | D-9 | E-1 | Blue | 3.2 | 3800 |
| Example 131 | Compound [29] | D-10 | E-1 | Blue | 3.0 | 6000 |
| Example 132 | Compound [141] | D-2 | E-1 | Blue | 5.1 | 12000 |
| Example 133 | Compound [141] | D-3 | E-1 | Blue | 5.0 | 11500 |

D-2 to D-10 in Table 4 are compounds represented by the following formulas.

[Chemical Formula 56]

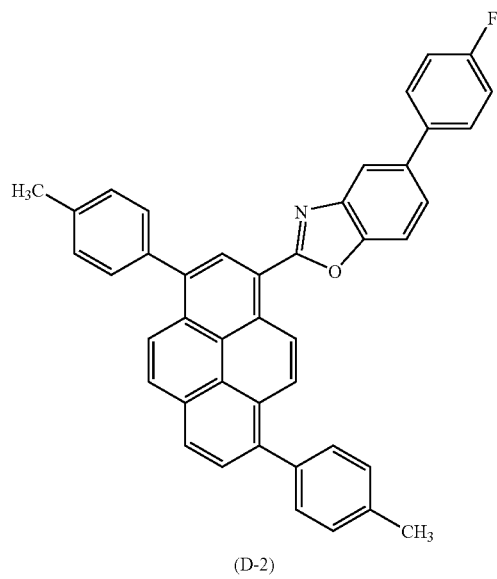

(D-2)

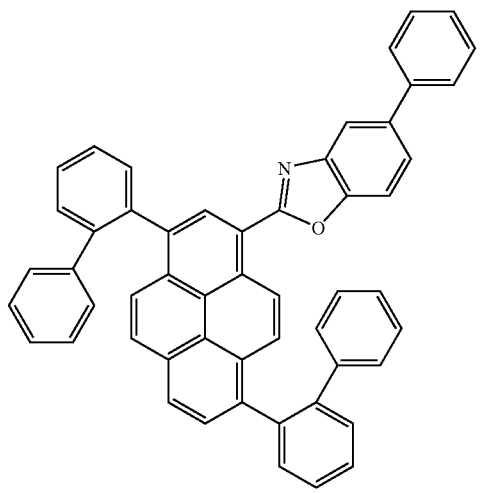

(D-3)

-continued
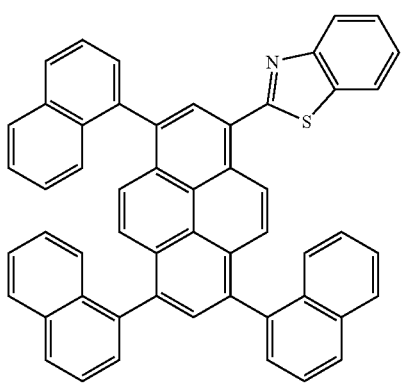
(D-4)
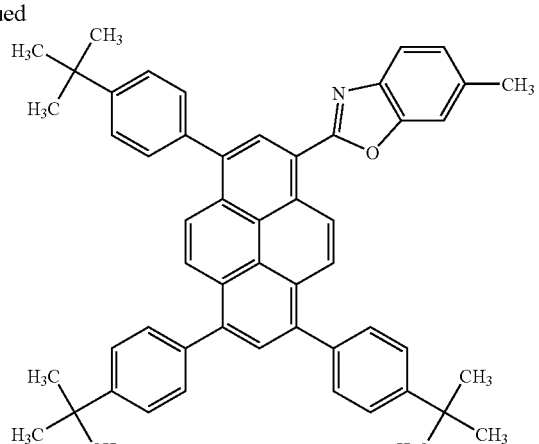
(D-5)
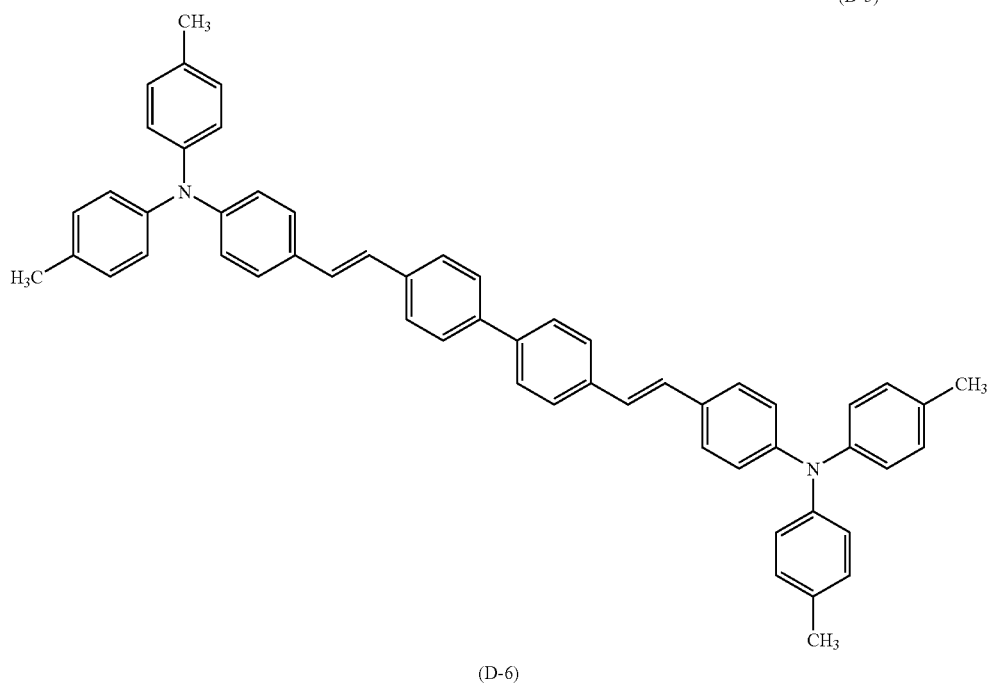
(D-6)
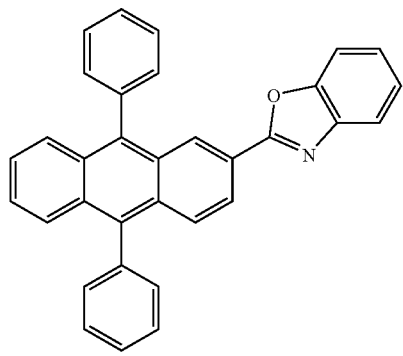
(D-7)
[Chemical Formula 57]
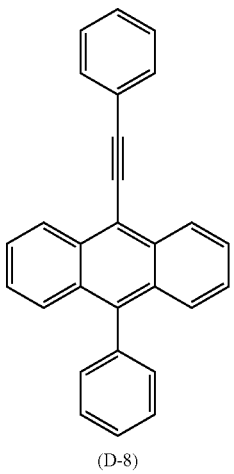
(D-8)

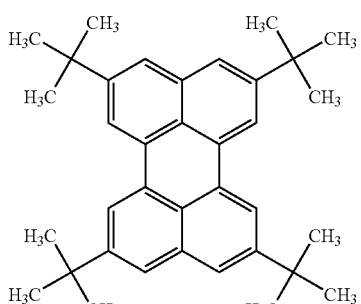

(D-9)

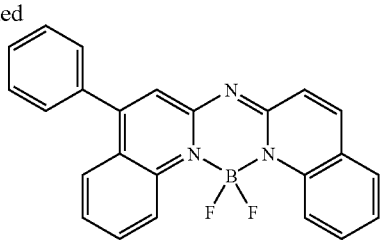

(D-10)

Examples 134 to 140

In the same manner as in Example 31, except that the materials described in Table 5 were used as the electron transporting material, light emitting devices were produced. The results of the respective examples are shown in Table 5.

TABLE 5

| | Emissive layer | | Electron transporting layer | Luminescent color | Luminance efficiency (lm/w) | Luminance half-time (h) |
|---|---|---|---|---|---|---|
| | Host material | Dopant material | | | | |
| Example 134 | Compound [29] | D-1 | E-2 | Blue | 4.7 | 6500 |
| Example 135 | Compound [29] | D-1 | E-3 | Blue | 2.8 | 6000 |
| Example 136 | Compound [29] | D-1 | E-4 | Blue | 4.2 | 6200 |
| Example 137 | Compound [29] | D-1 | E-5 | Blue | 4.3 | 5800 |
| Example 138 | Compound [29] | D-1 | E-6 | Blue | 4.5 | 6000 |
| Example 139 | Compound [29] | D-1 | E-7 | Blue | 4.5 | 4500 |
| Example 140 | Compound [29] | D-1 | E-8 | Blue | 3.2 | 6000 |

E-2 to E-8 in Table 5 are compounds represented by the following formulas.

[Chemical Formula 58]

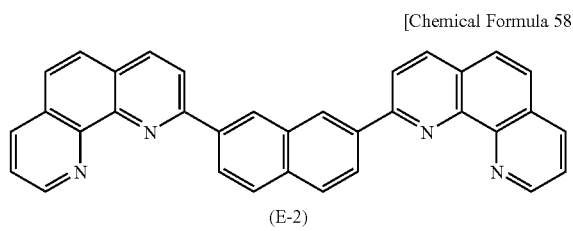

(E-2)

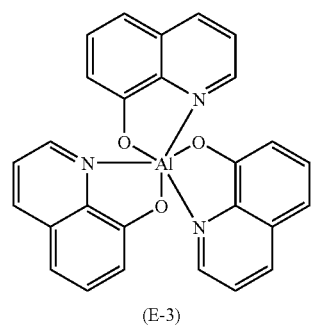

(E-3)

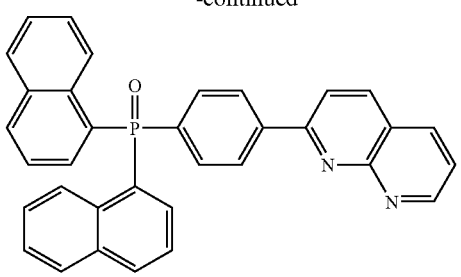

(E-4)

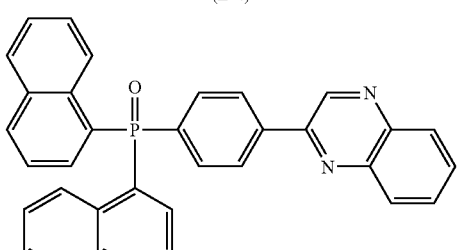

(E-5)

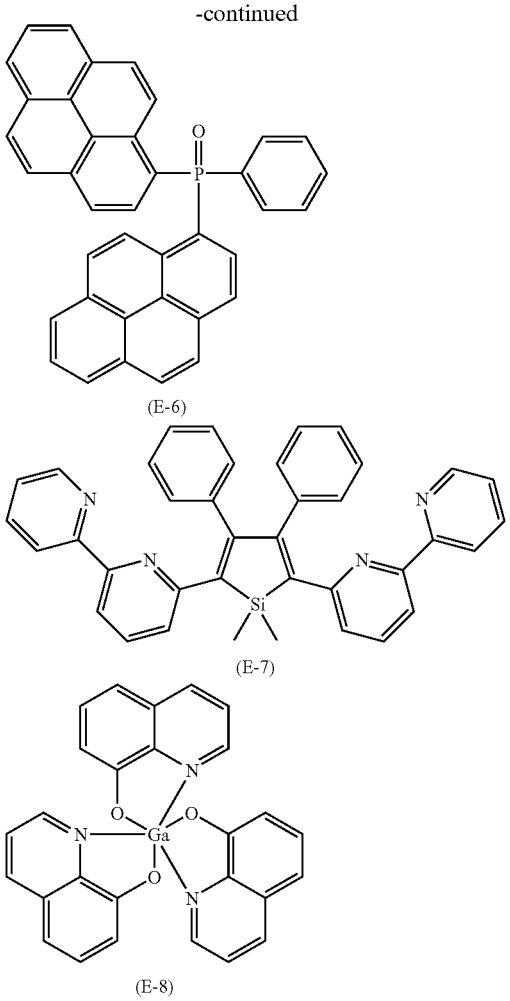

(E-6)

(E-7)

(E-8)

Example 141

In the same manner as in Example 31, except that D-11 shown in the formula shown below was used as the dopant material so as to adjust the dope concentration to 2%, a light emitting device was produced. This light emitting device was DC-driven at 10 mA/cm². As a result, high-efficiency green light emission of luminance efficiency of 5.2 lm/W was obtained. This light emitting device was continuously DC-driven at an electric current of 10 mA/cm². As a result, the luminance half-time was 4,000 hours.

[Chemical Formula 59]

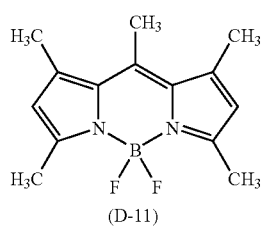

(D-11)

Example 142

In the same manner as in Example 31, except that D-12 shown in the formula shown below was used as the dopant material so as to adjust the dope concentration to 5%, a light emitting device was produced. This light emitting device was DC-driven at 10 mA/cm². As a result, high-efficiency yellow light emission of luminance efficiency of 5.8 μm/W was obtained. This light emitting device was continuously DC-driven at an electric current of 10 mA/cm². As a result, the luminance half-time was 10,000 hours.

[Chemical Formula 60]

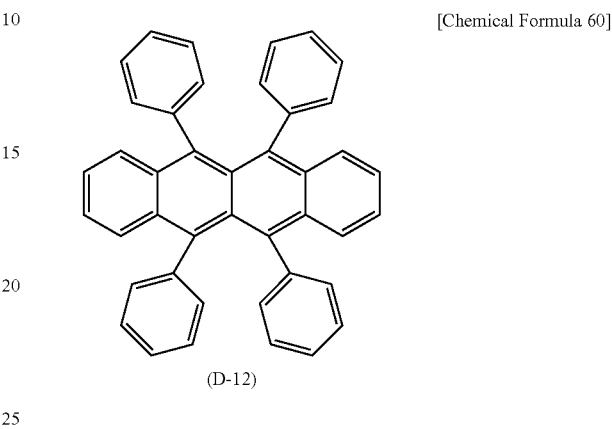

(D-12)

Example 143

In the same manner as in Example 31, except that, as the emissive material, compound [29] as the host material and D-12 shown in the formula shown below as the dopant material were vapor-deposited with a thickness of 5 nm so as to adjust the dope concentration to 5%, and then, as the emissive material, compound [29] as the host material and D-12 shown in the formula shown below as the dopant material were vapor-deposited with a thickness of 30 nm so as to adjust the dope concentration to 2%, a light emitting device was produced. This light emitting device was DC-driven at 10 mA/cm². As a result, high-efficiency white light emission of luminance efficiency of 6.5 μm/W was obtained. This light emitting device was continuously DC-driven at an electric current of 10 mA/cm². As a result, a luminance half-time was 10,000 hours.

Example 144

A glass substrate (manufactured by Asahi Glass Co., Ltd., 15Ω/□, electron beam deposited product) with an ITO transparent conductive film having a thickness of 150 nm deposited on the surface was cut into pieces measuring 30×40 mm. The ITO film was patterned in the form of 32 stripes with a pitch of 300 μm (residual width: 270 μm) using a photolithographic method. One side in the long side direction of the ITO stripes was expanded to a pitch of 1.27 mm (aperture width: 800 μm) so as to facilitate electric connection to the outside. The resulting substrate was ultrasonic-washed in turn with acetone and "SEMICOCLEAN® 56" (manufactured by Furuuchi Chemical Corporation) each for 15 minutes and then washed with ultrapure water. Subsequently, the substrate was ultrasonic-washed with isopropyl alcohol for 15 minutes ultrasonic wave, and then immersed in hot methanol for 15 minutes and dried. Immediately before producing an device, this substrate was subjected to a UV-ozone treatment for one hour and was placed in a vacuum deposition device, and then the vacuum deposition device was evacuated until the vacuum degree in the device became $5 \times 10^{-4}$ Pa or less.

First, 150 nm of 4,4'-bis(N-(m-tolyl)-N-phenylamino)biphenyl as a hole transporting material was vapor-deposited on an ITO film of the substrate. Next, compound [29] as a host material and D-1 as a dopant material were vapor-deposited with a thickness of 35 nm so as to adjust the dope concentration to 2%. Next, 20 nm of E-1 as an electron transporting material was laminated. As used herein, the film thickness is an indicated value of a quartz oscillating type film thickness monitor. Next, a mask provided with 16 apertures having a width of 250 µm (residual width: 50 µm, corresponding to a pitch of 300 µm) through wet etching was disposed on a 50 µm thick Kovar plate so as to perpendicularly intersect with ITO stripes in vacuum, and then fixed by fitting a magnet from the back side of the substrate so as to enable the mask to closely adhere to the ITO substrate. After doping 0.5 nm of lithium on the organic layer, 200 nm of aluminum was vapor-deposited to produce a 32×16 dot matrix device. The resulting device was matrix-driven. As a result, a character could be displayed without causing crosstalk.

Industrial Applicability

The light emitting device of the present invention material can provide a light emitting device material which can be utilized in a light emitting device and is excellent in thin-film stability. According to the present invention, a light emitting device having high luminance efficiency and excellent durability can be obtained. The light emitting device of the present invention can be applied to the fields of display elements, flat panel displays, backlights, illuminations, interiors, signs, billboards, electrophotographic machines and optical signal generators.

The invention claimed is:

1. A light emitting device material containing a pyrene compound represented by the formula (2):

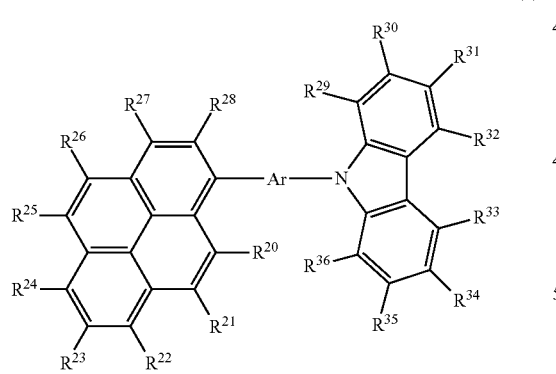

(2)

wherein $R^{20}$ to $R^{36}$ may be the same or different and represent a group selected from hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group selected from a phenyl group, a naphthyl group, a biphenyl group, a phenanthryl group and a terphenyl group, a heteroaryl group, a halogen, a carbonyl group, a carboxyl group, an oxycarbonyl group, a carbamoyl group, an amino group, a phosphine oxide group and a silyl group; adjacent substituents among $R^{20}$ to $R^{36}$ may be combined with each other to form a ring; Ar represents an arylene group selected from a phenyl group and a naphthyl group; and $R^{22}$ or $R^{24}$ is an aryl group or a heteroaryl group.

2. The light emitting device material according to claim 1, wherein at least one of $R^{29}$ to $R^{36}$ in the formula (2) is a group selected from an alkyl group, a cycloalkyl group, an aryl group and a heteroaryl group, or at least two substituents among $R^{29}$ to $R^{36}$ are combined to form a ring.

3. A light emitting device comprising an anode, a cathode and an organic layer existing between the anode and the cathode, the organic layer containing at least an emissive layer, the emissive layer emitting light by electric energy, wherein the organic layer contains a light emitting device material as claimed in claim 1.

4. A light emitting device material containing a pyrene compound represented by the formula (2):

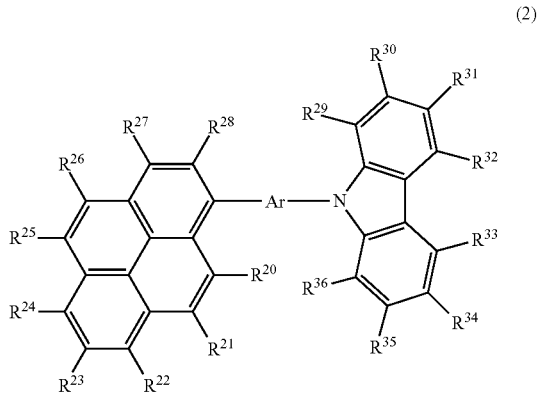

(2)

wherein $R^{20}$ to $R^{36}$ may be the same or different and represent a group selected from hydrogen, an alkyl group, a cycloalkyl group, a heterocyclic group, an alkenyl group, a cycloalkenyl group, an alkynyl group, an alkoxy group, an alkylthio group, an arylether group, an arylthioether group, an aryl group selected from a phenyl group, a naphthyl group, a biphenyl group, a phenanthryl group and a terphenyl group, a heteroaryl group, a halogen, a carbonyl group, a carboxyl group, an oxycarbonyl group, a carbamoyl group, an amino group, a phosphine oxide group and a silyl group; adjacent substituents among $R^{20}$ to $R^{36}$ may be combined with each other to form a ring; Ar represents an arylene group selected from a phenyl group, and a naphthyl group; $R^{23}$ is an alkyl group or a cycloalkyl group.

5. A light emitting device comprising an anode, a cathode and an organic layer existing between the anode and the cathode, the organic layer containing at least an emissive layer, the emissive layer emitting light by electric energy, wherein the organic layer contains a light emitting device material as claimed in claim 4.

6. A light emitting device material containing a pyrene compound represented by the following formula:
[28]
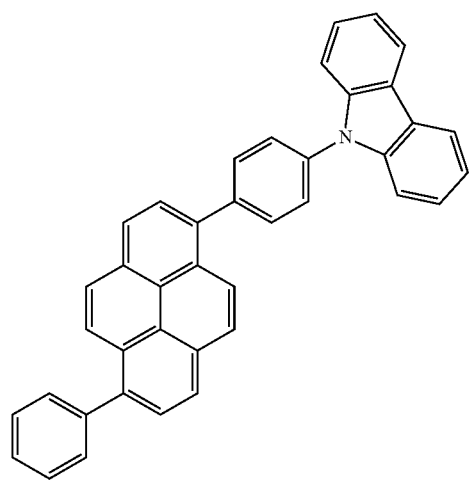
[29]
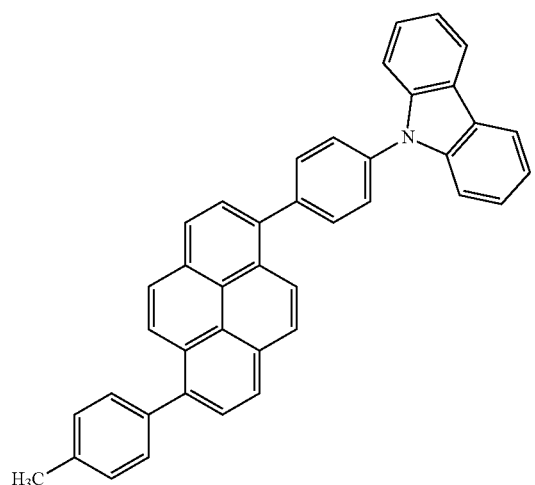
[30]
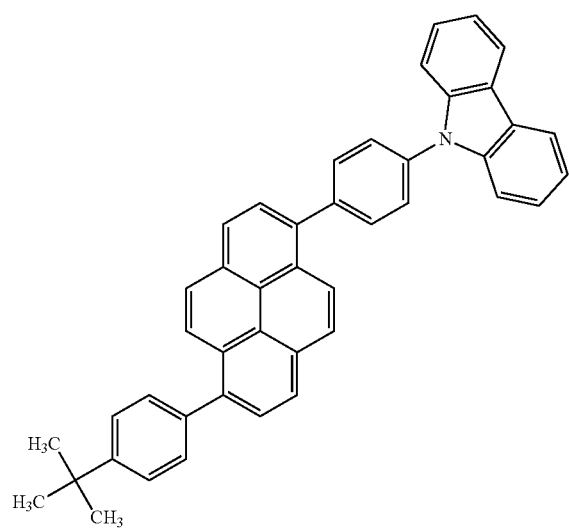
[31]
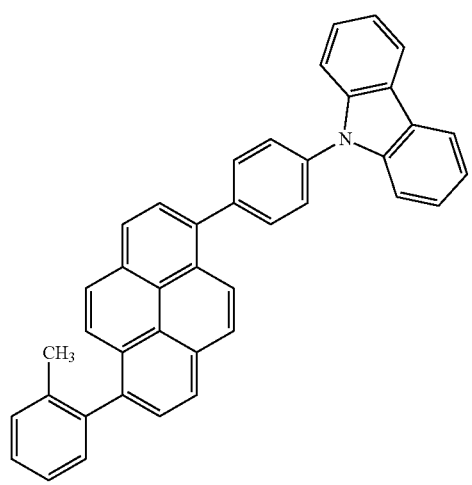
[32]
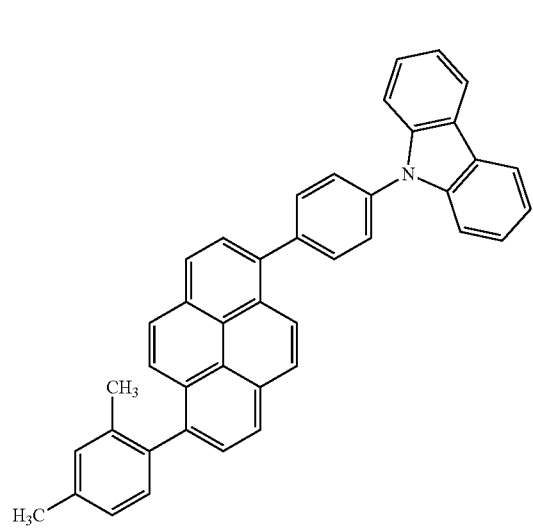
[33]
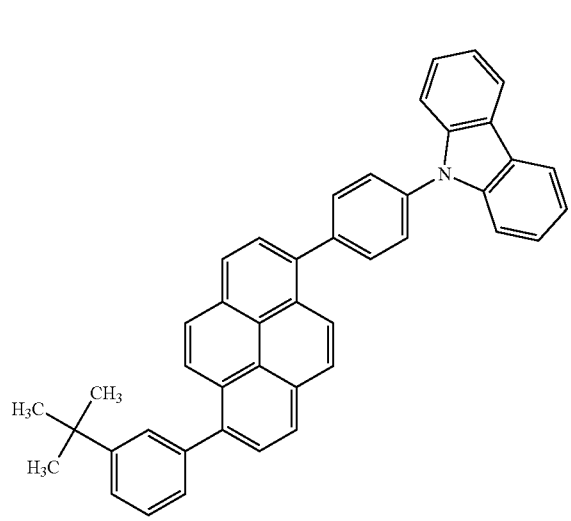

-continued
[34]
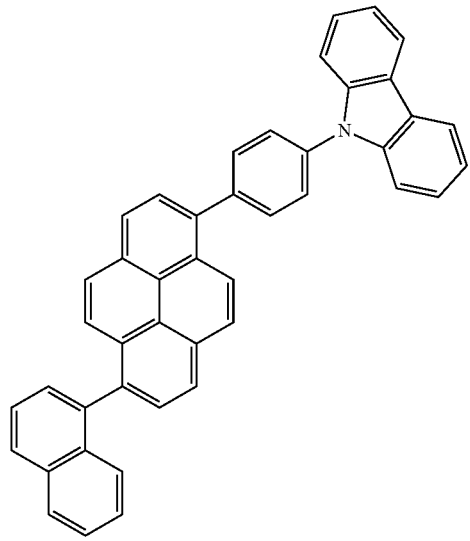
[35]
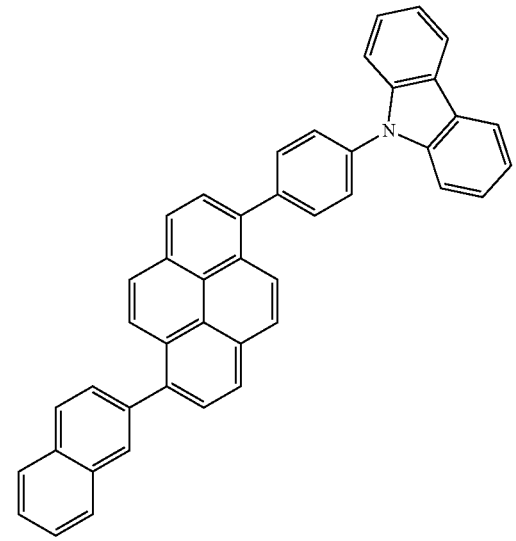
[36]
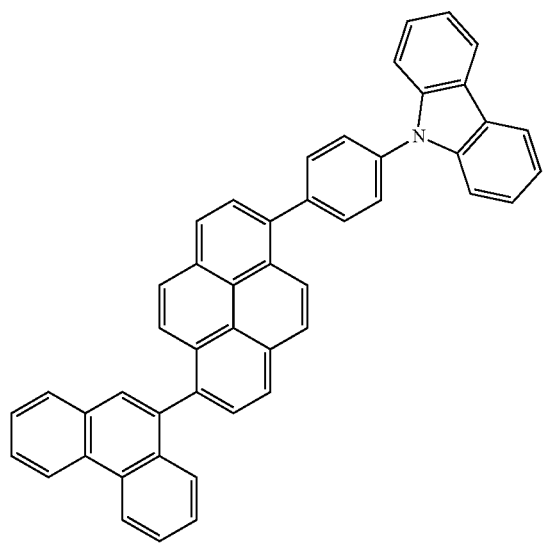
[37]
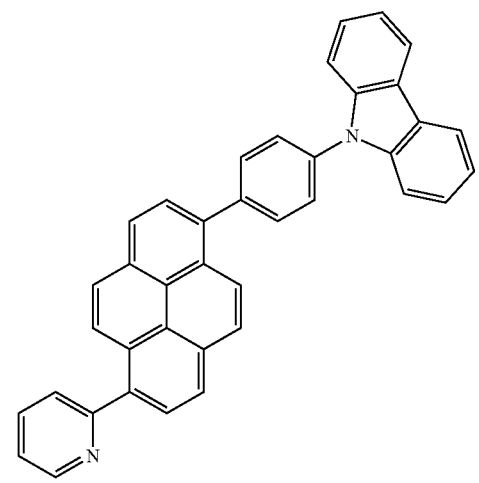
[39]
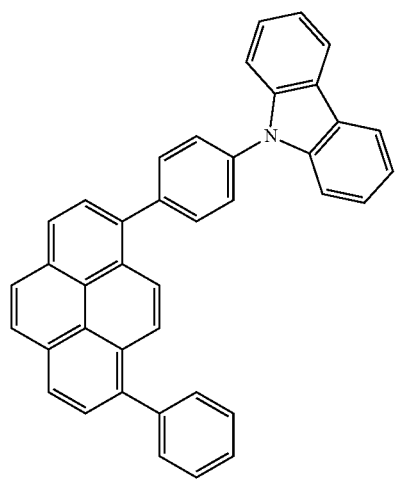
[40]
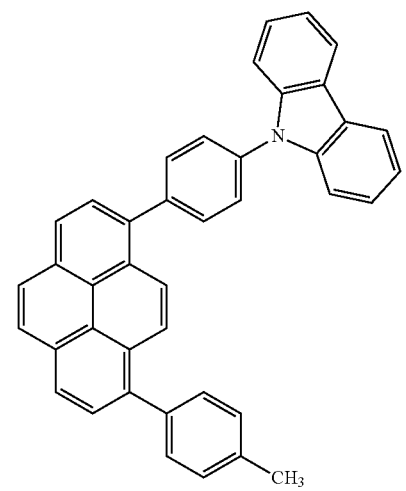

-continued
[41]
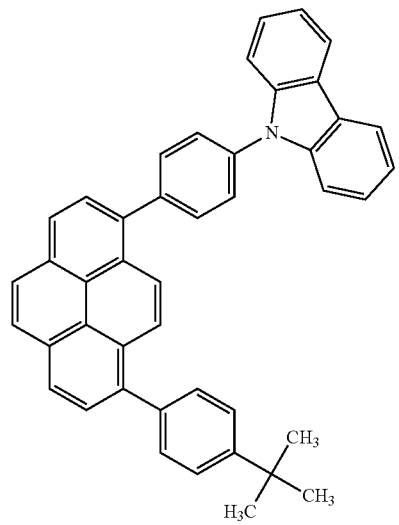
[42]
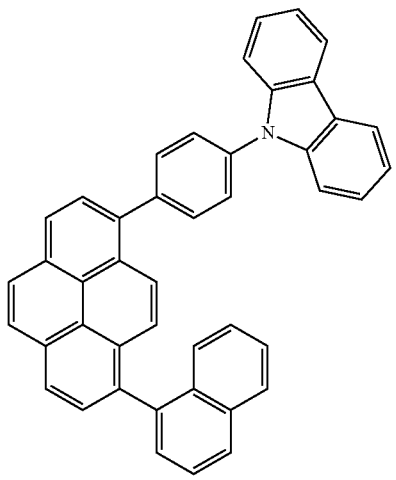
[43]
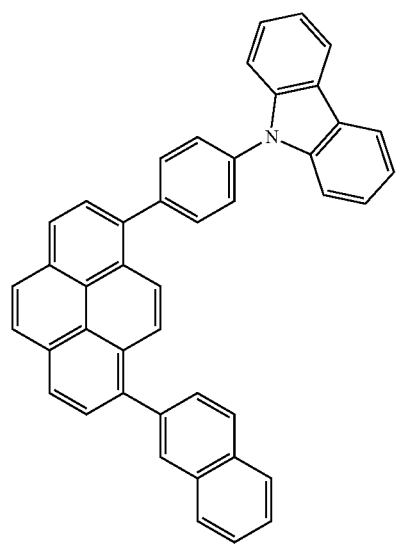
[44]
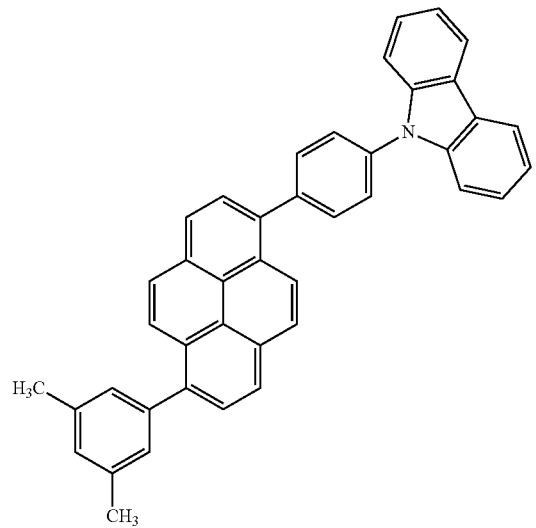
[46]
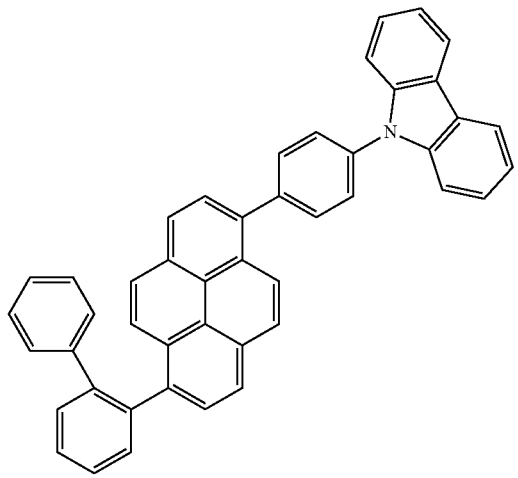
[47]

-continued
[48]
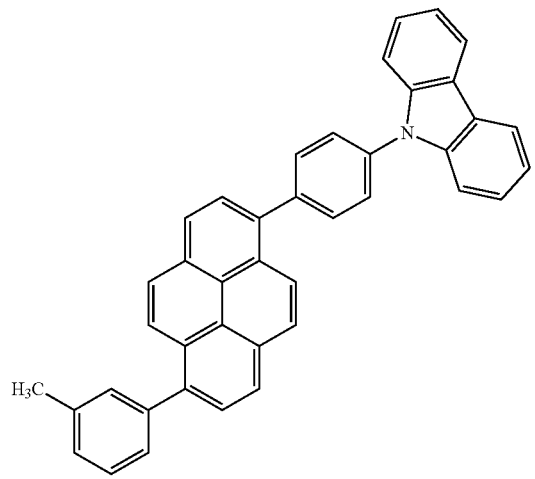
[49]
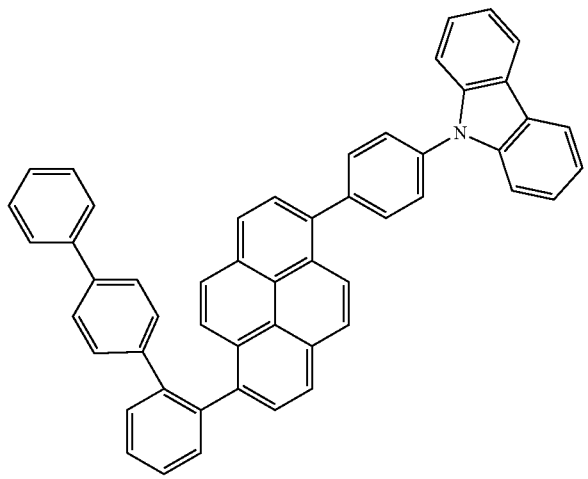
[50]
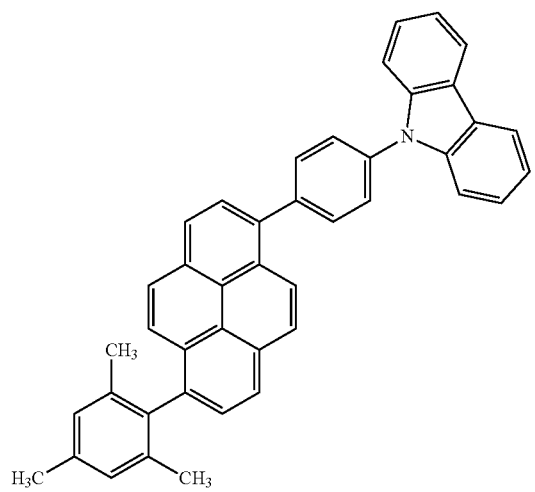
[51]
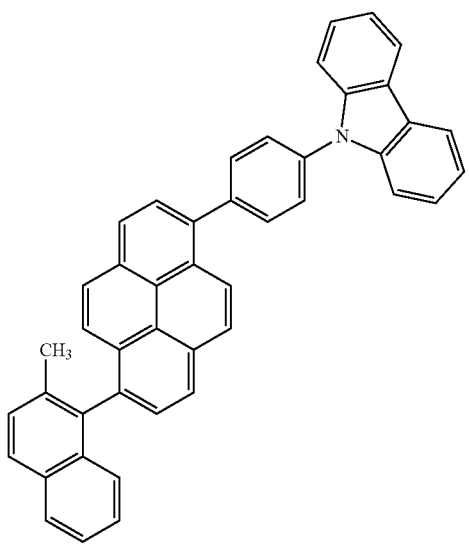
[52]
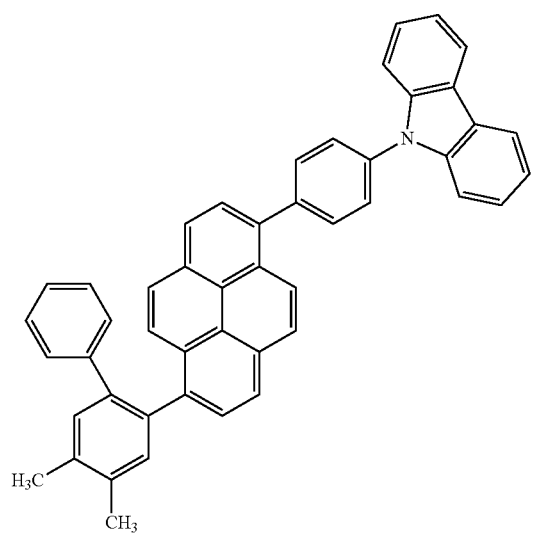
[53]
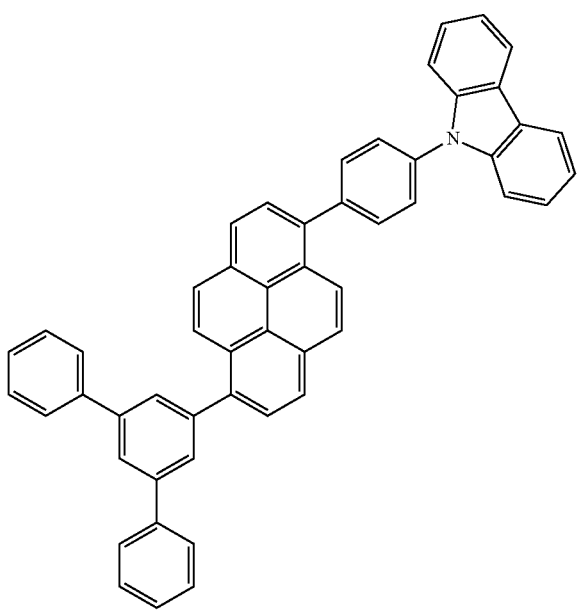

-continued
[54]
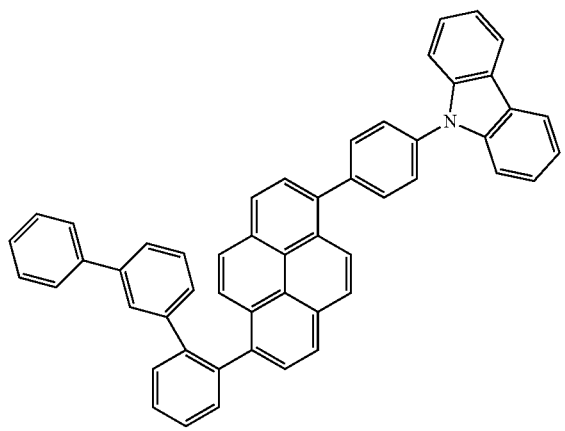
[55]
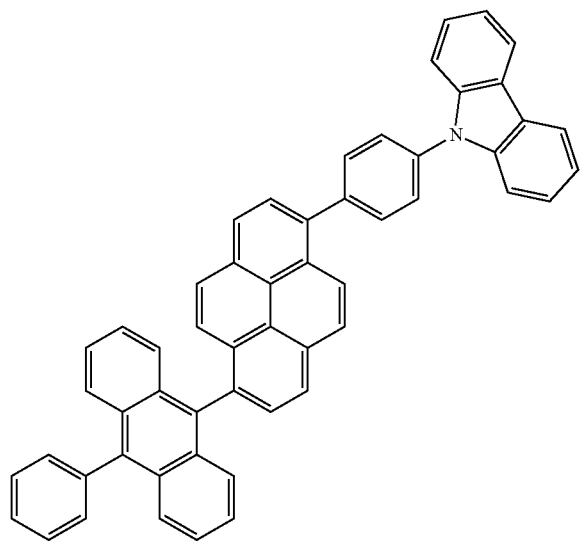
[56]
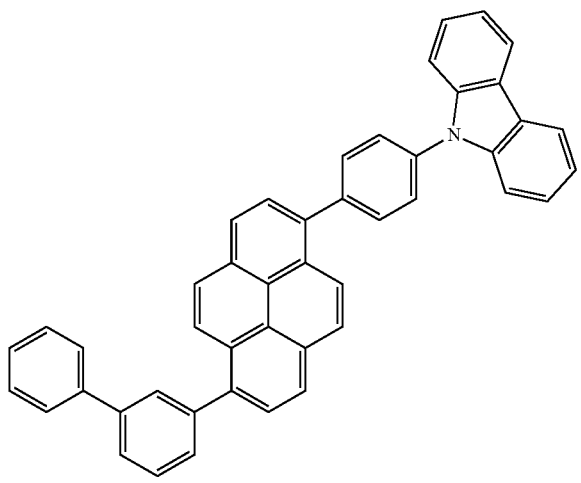
[59]
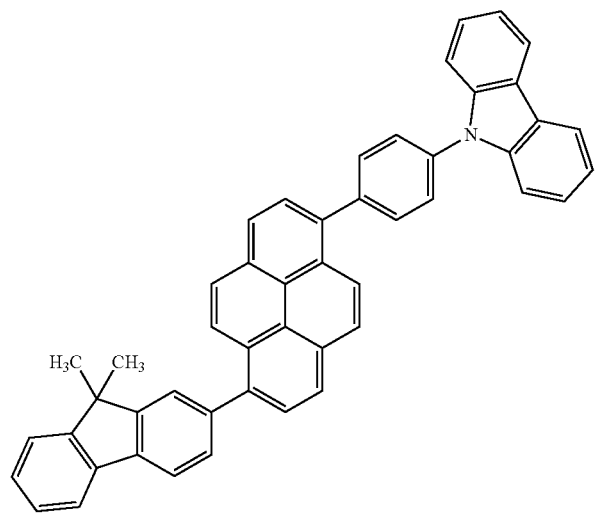
[60]
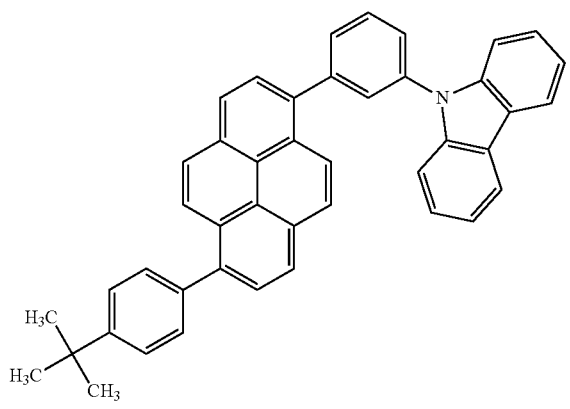
[61]
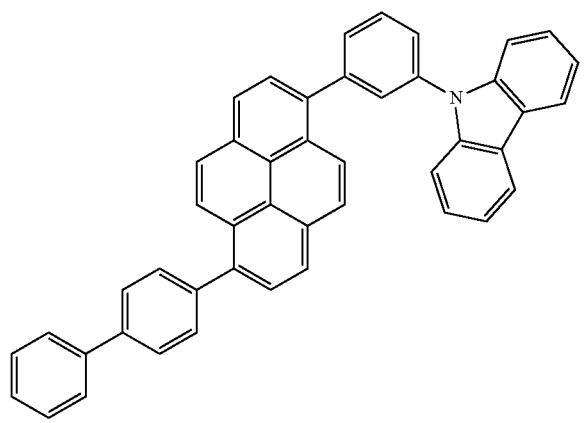

-continued
223
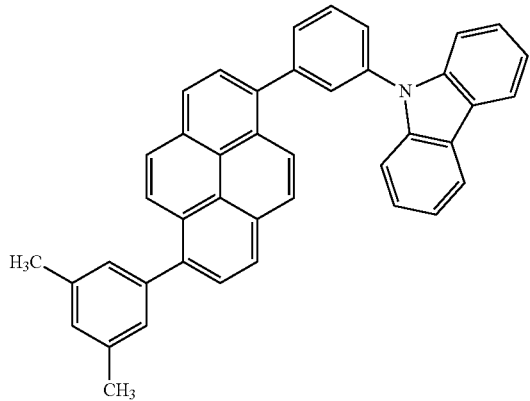
[62]
224
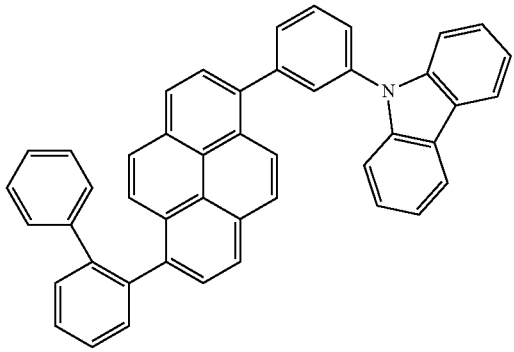
[63]
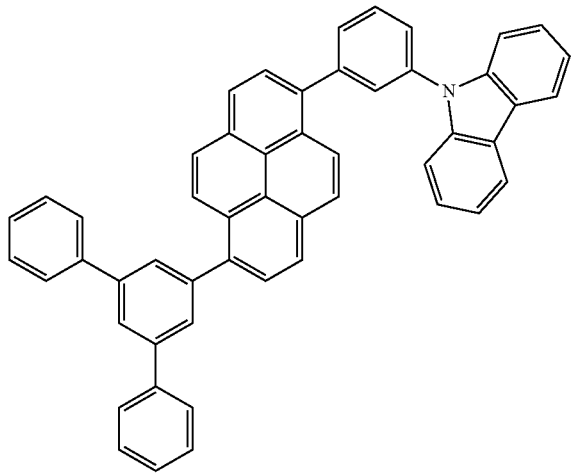
[64]
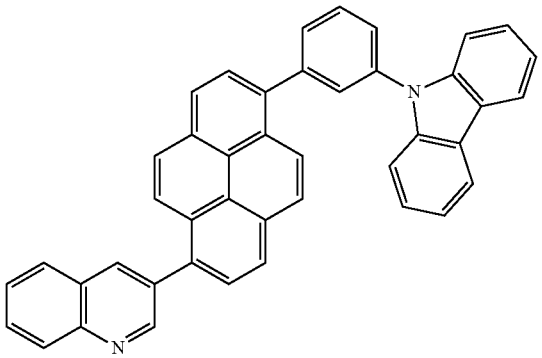
[67]
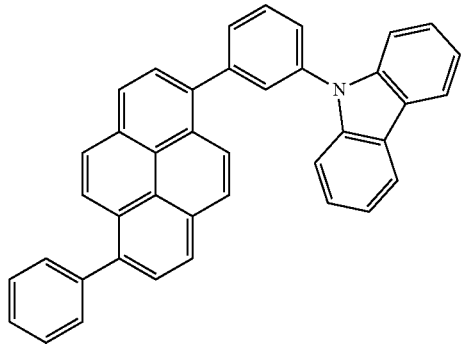
[68]
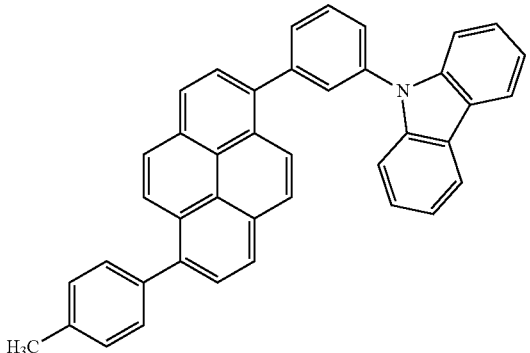
[69]
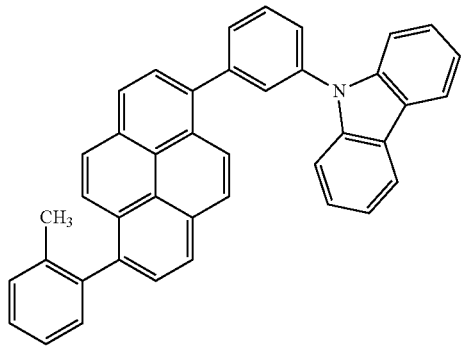
[70]
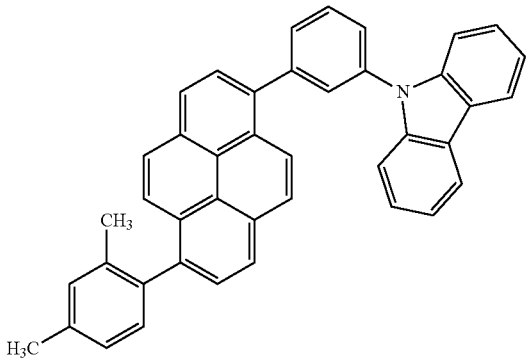
[71]

-continued
[72]
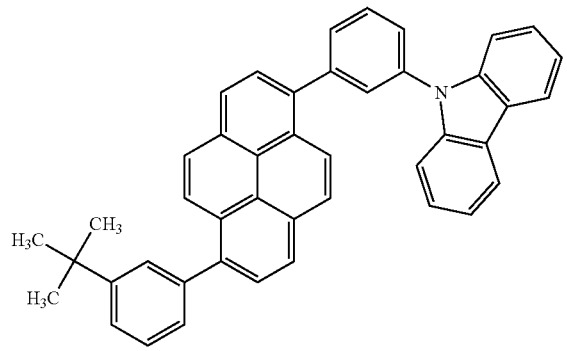
[73]
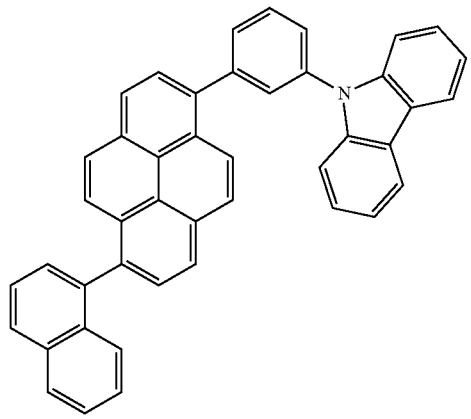
[74]
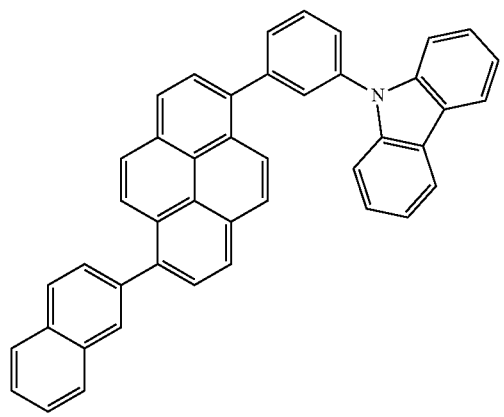
[75]
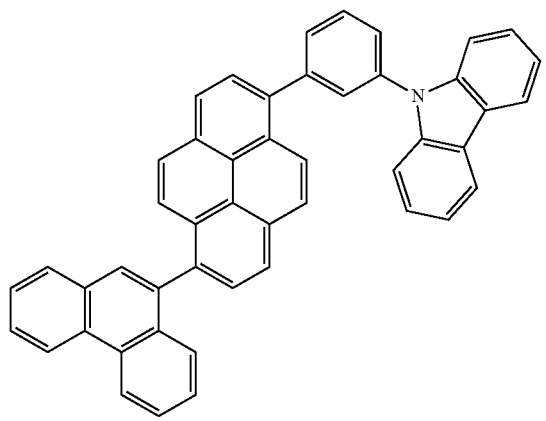
[76]
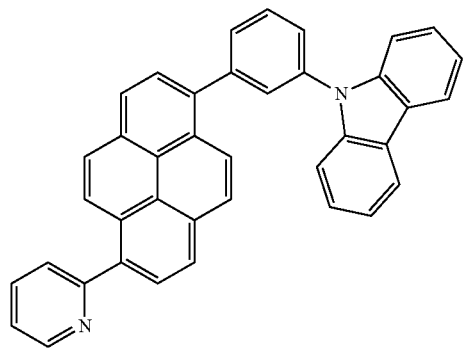
[94]
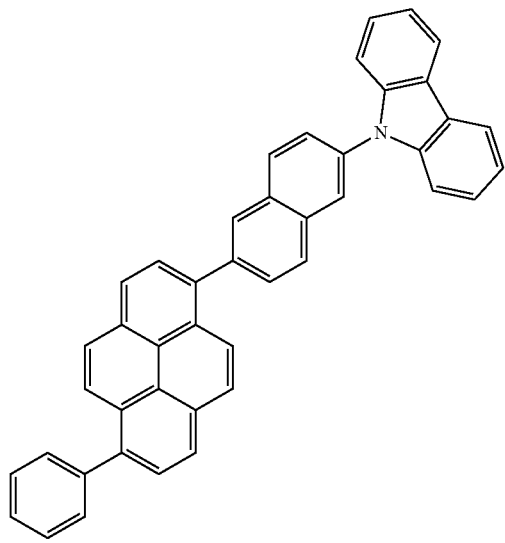

227 228
[96]
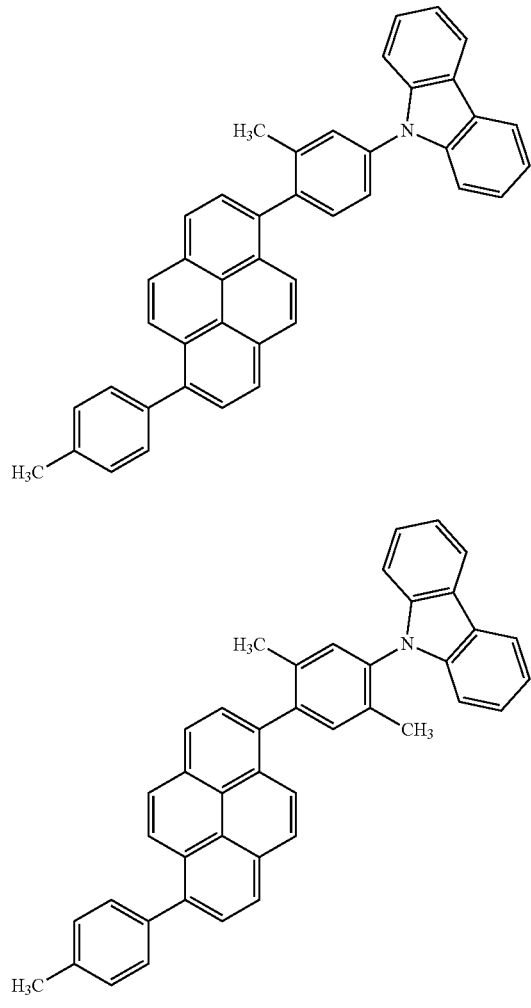
[97]
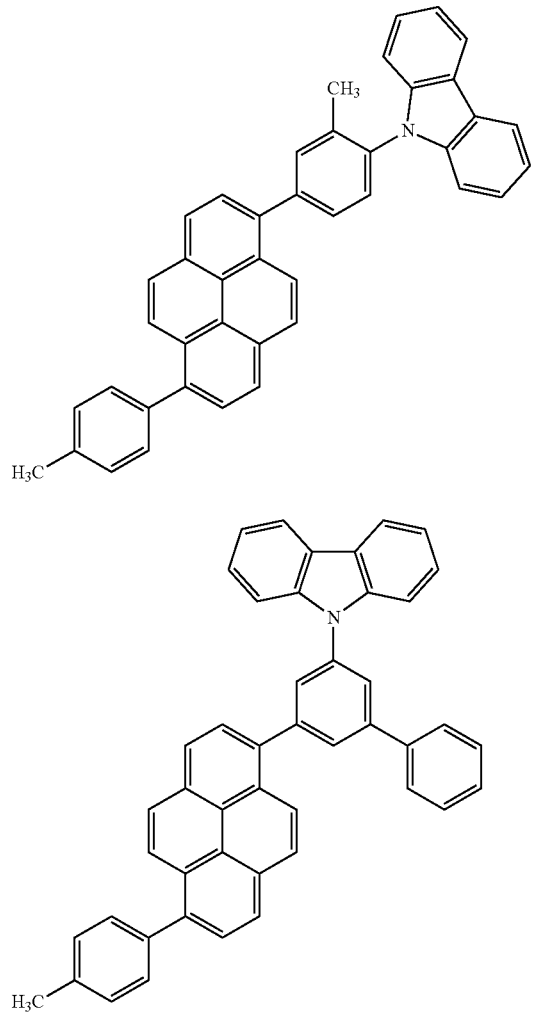
[98]
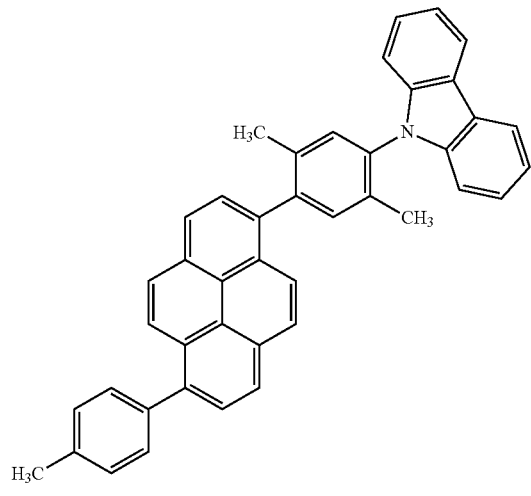
[103]
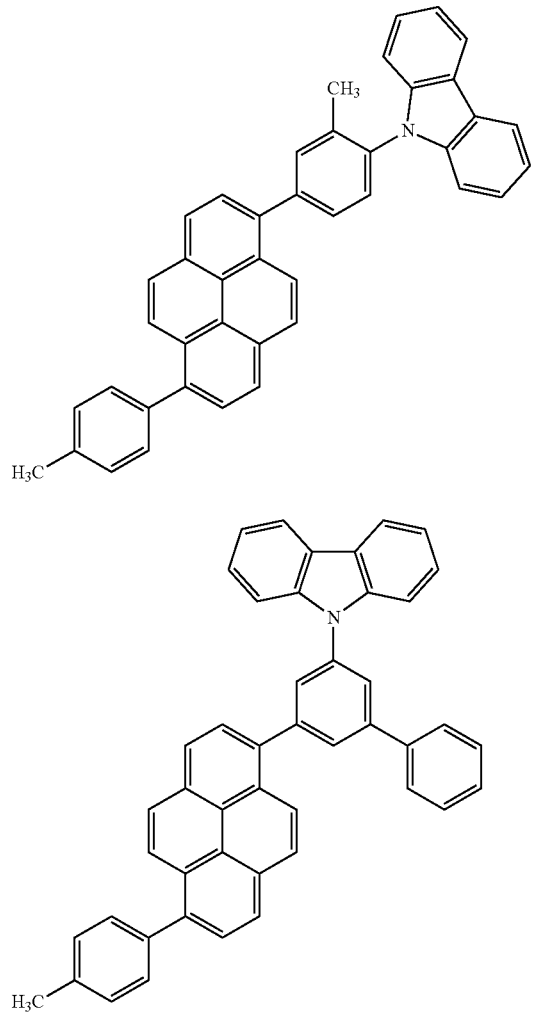
[104]
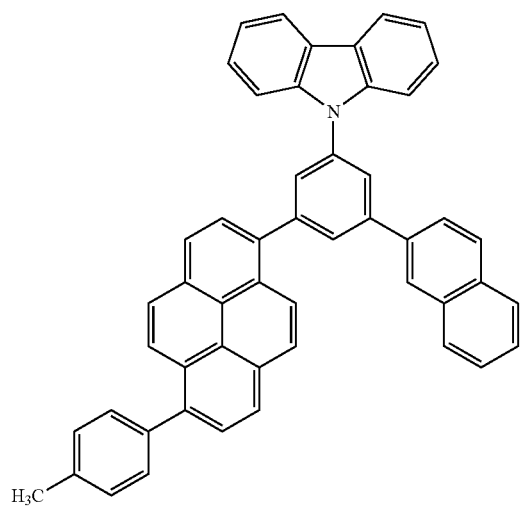
[105]
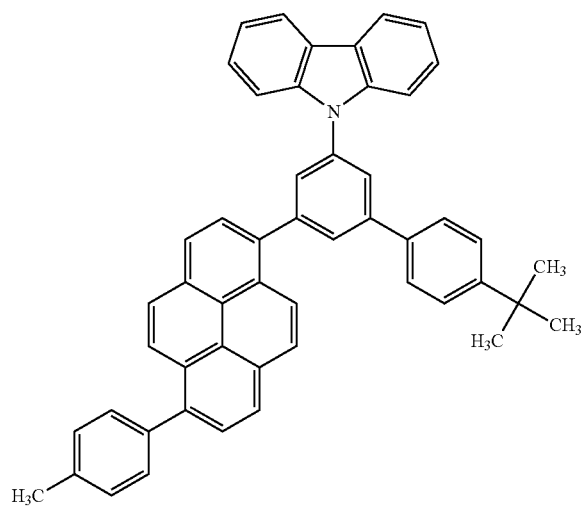

-continued
[106]
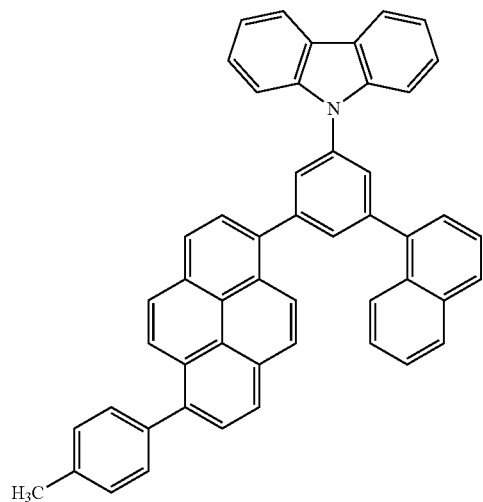
[107]
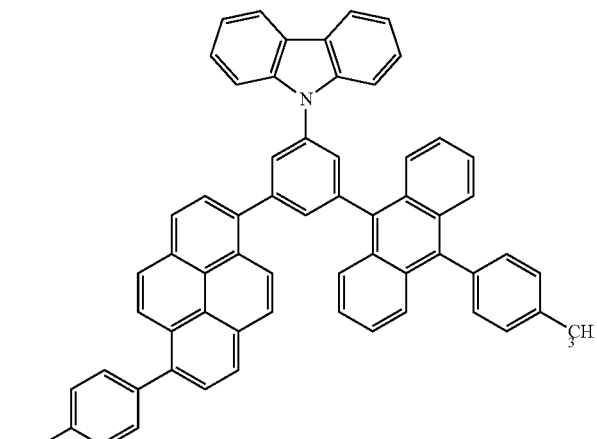
[108]
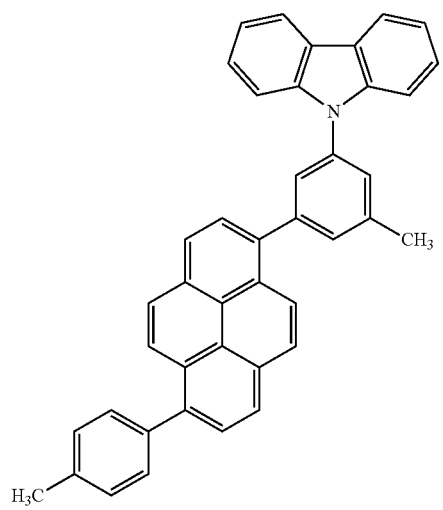
[110]
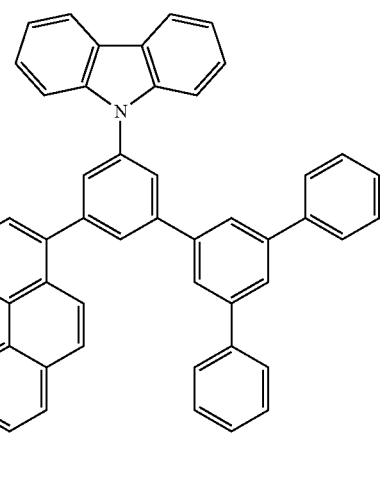
[112]
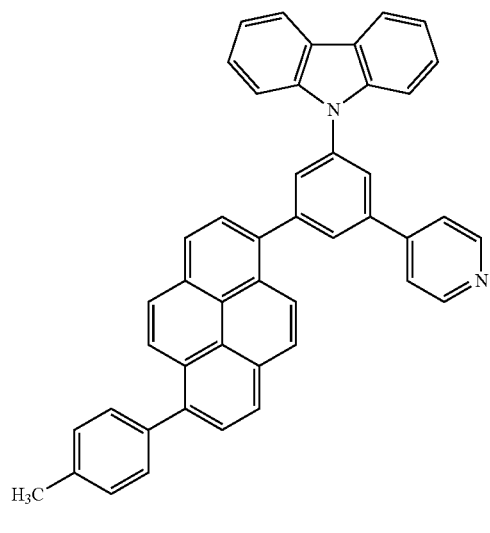
[113]
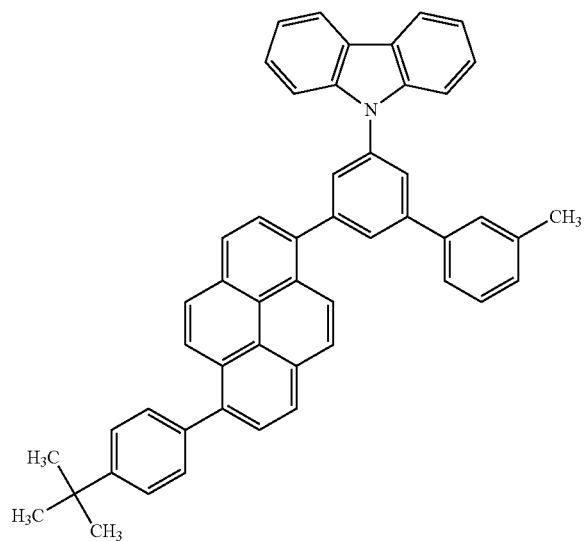

-continued
231
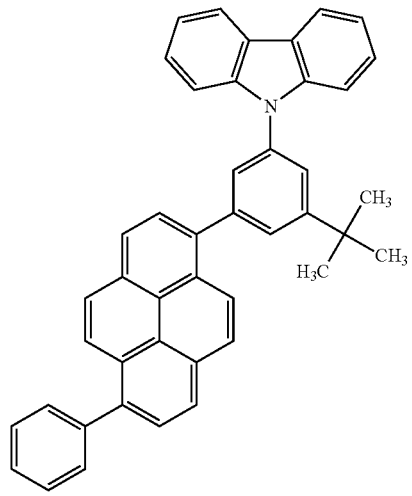
[114]
232
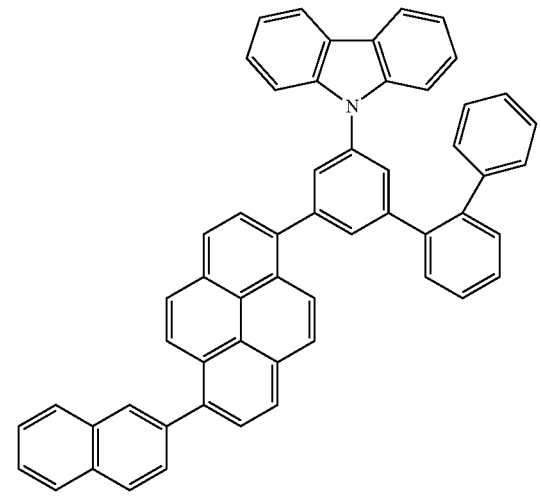
[115]
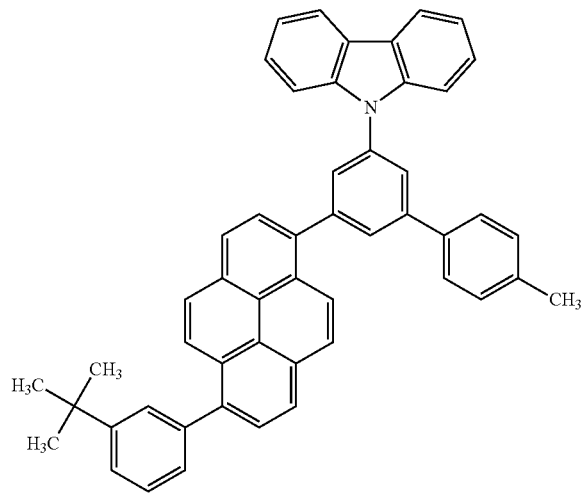
[116]
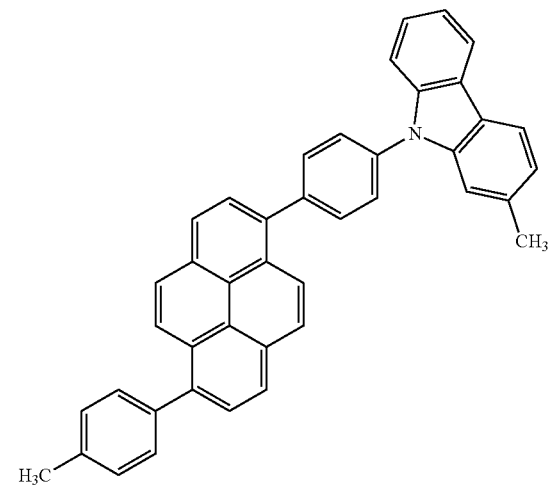
[117]
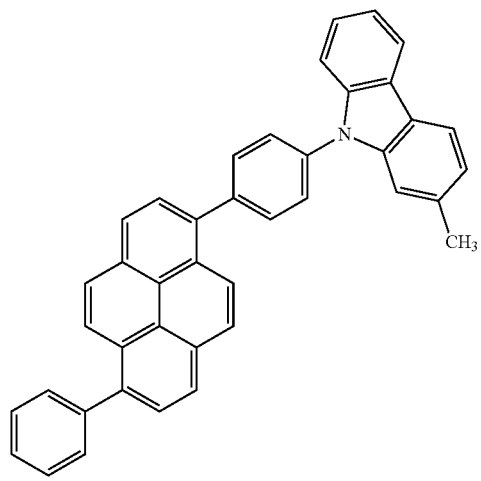
[118]
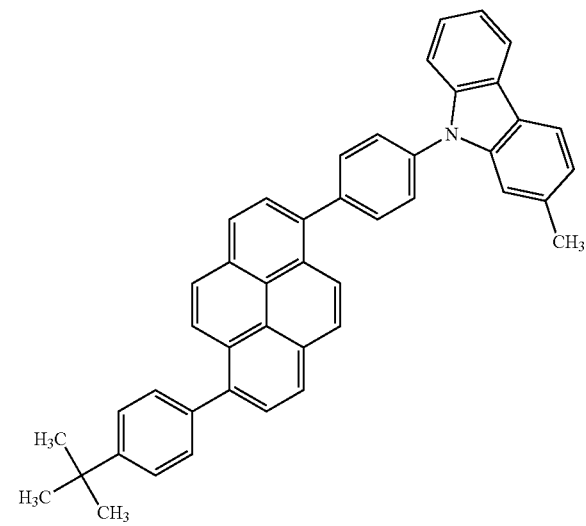
[119]

-continued
[120]
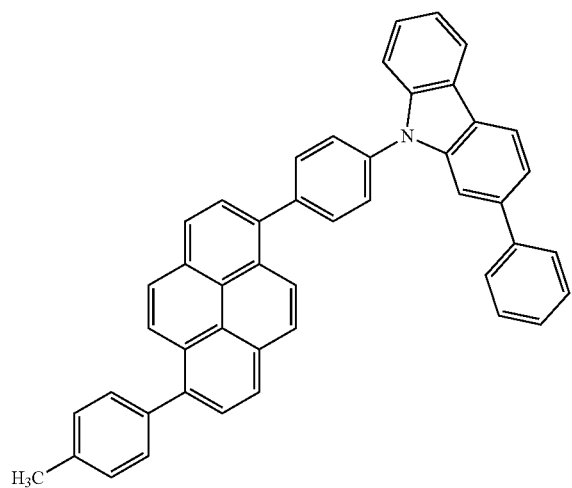
233
[121]
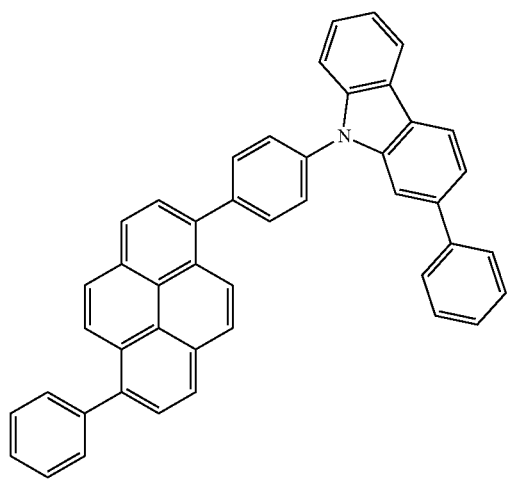
234
[122]
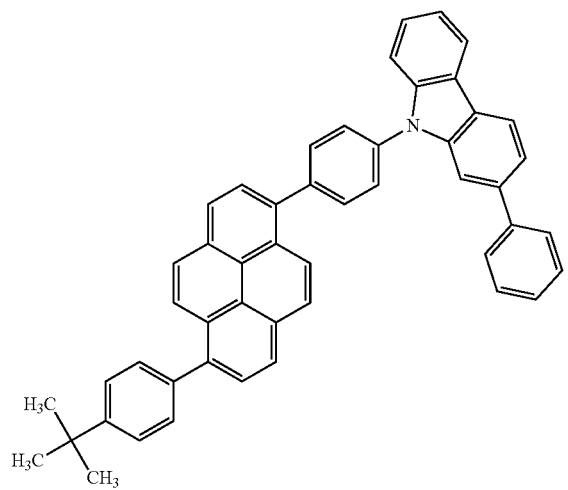
[123]
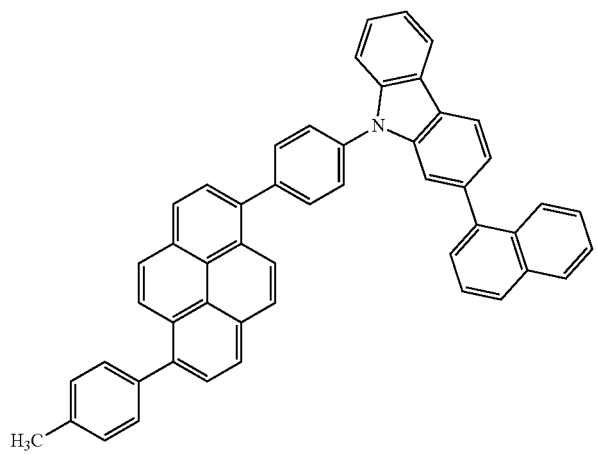
[124]
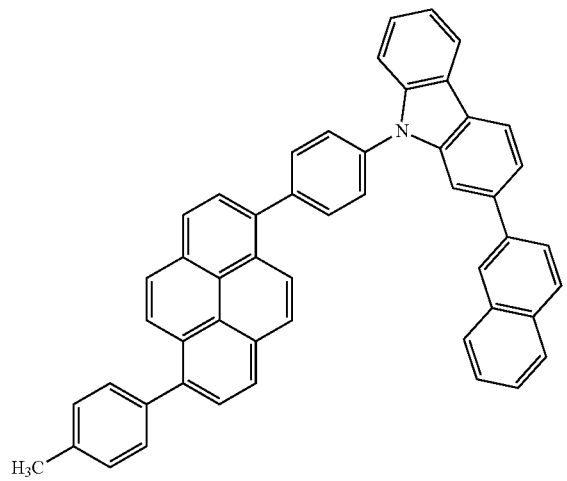
[125]
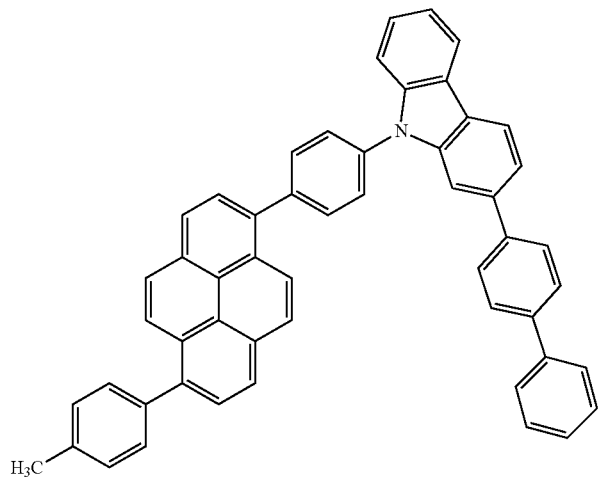

-continued
[126]
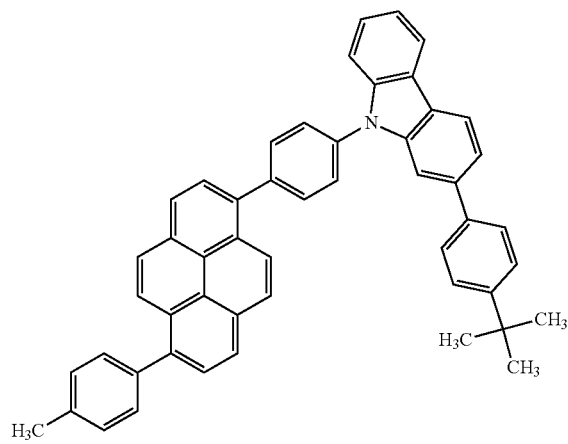
[127]
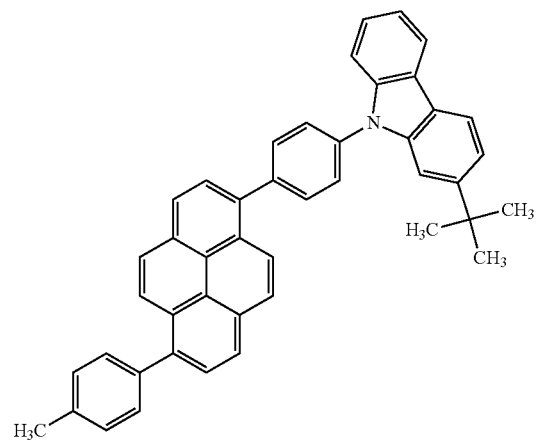
[129]
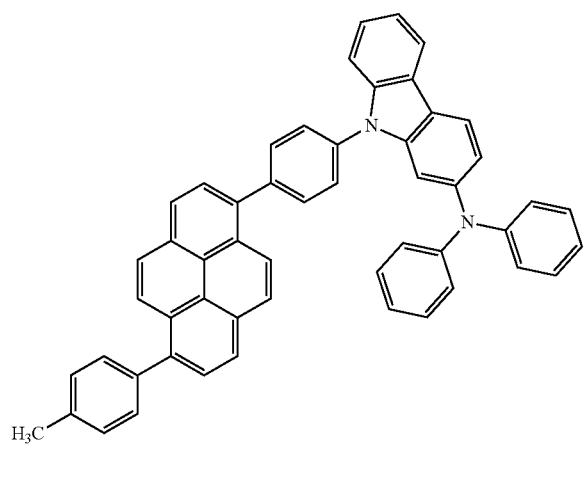
[131]
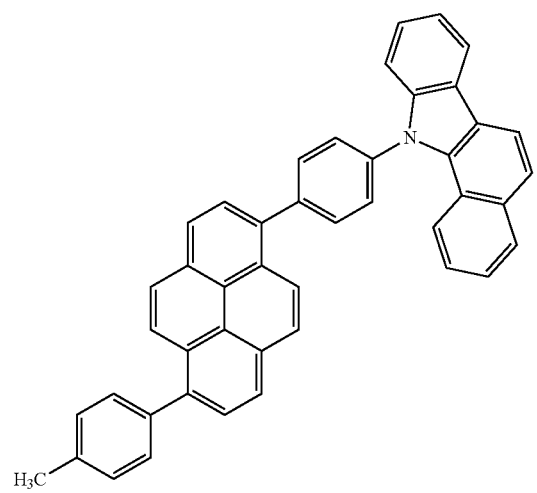
[132]
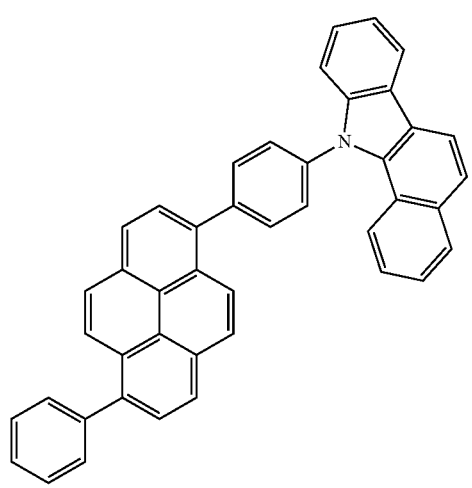
[133]
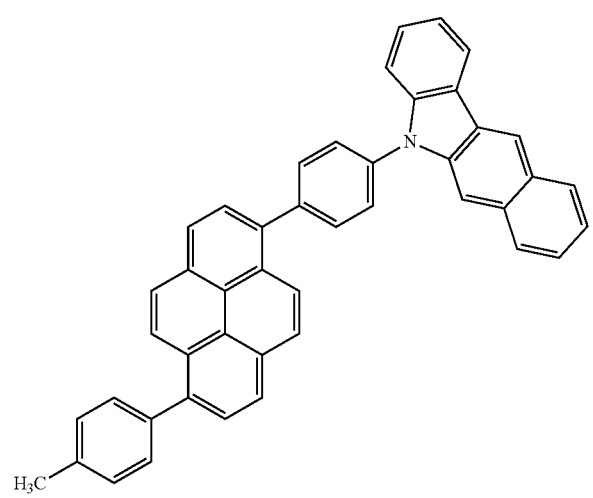

-continued
237
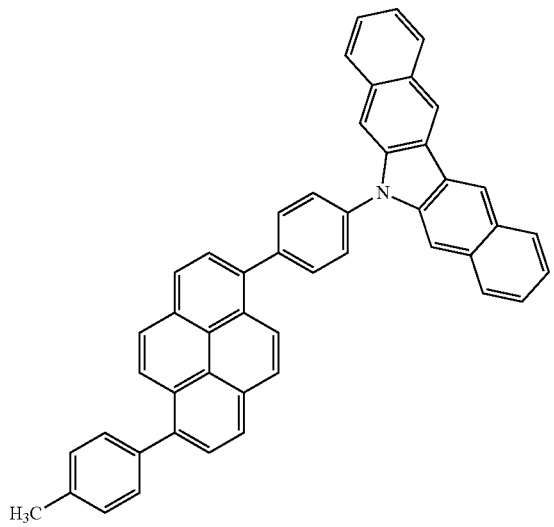
[134]
238
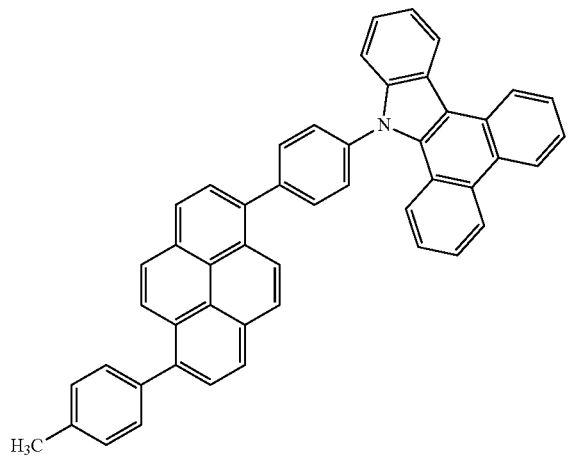
[135]
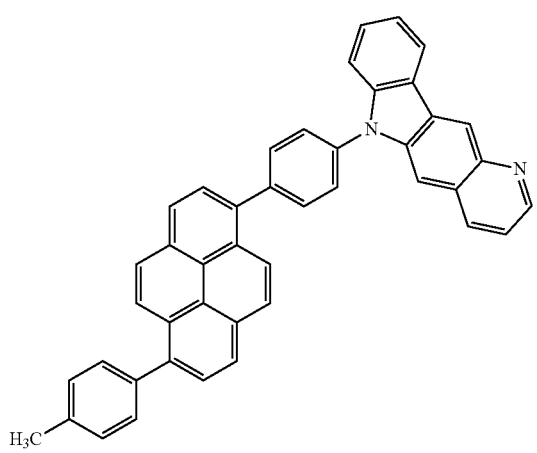
[136]
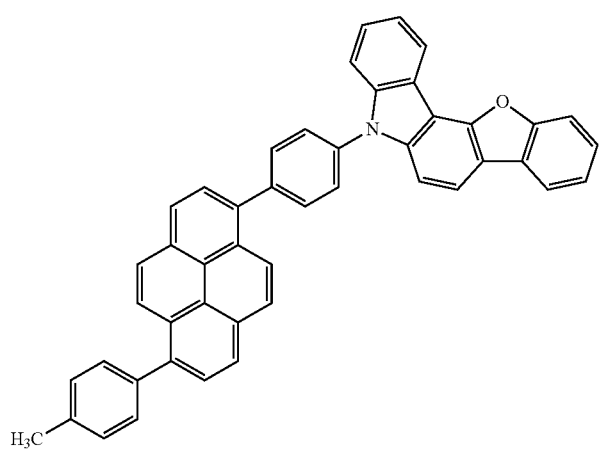
[137]
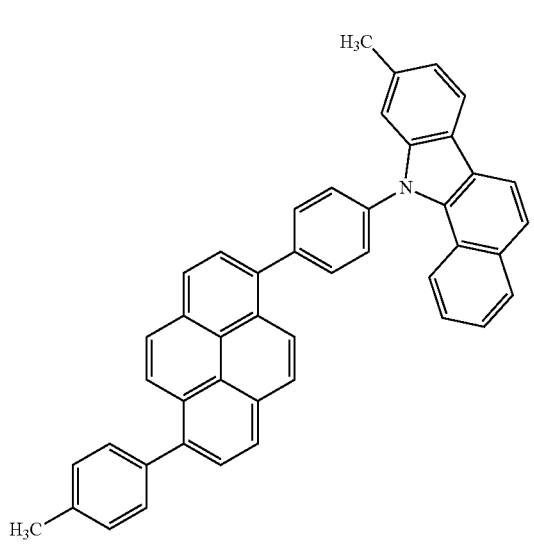
[138]
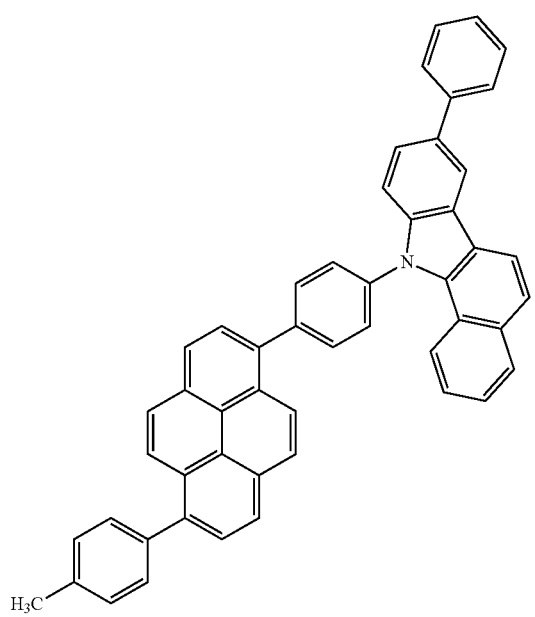
[139]

-continued
239
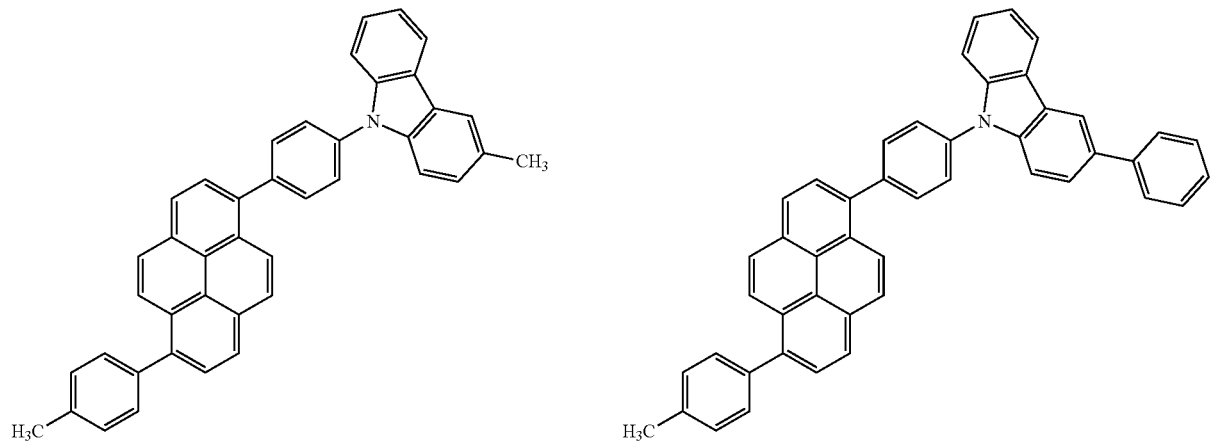
[140]
240
[141]
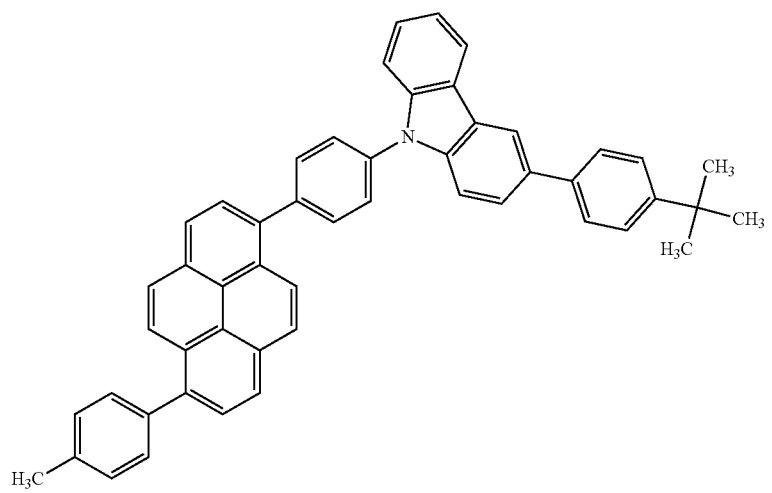
[142]
[143]
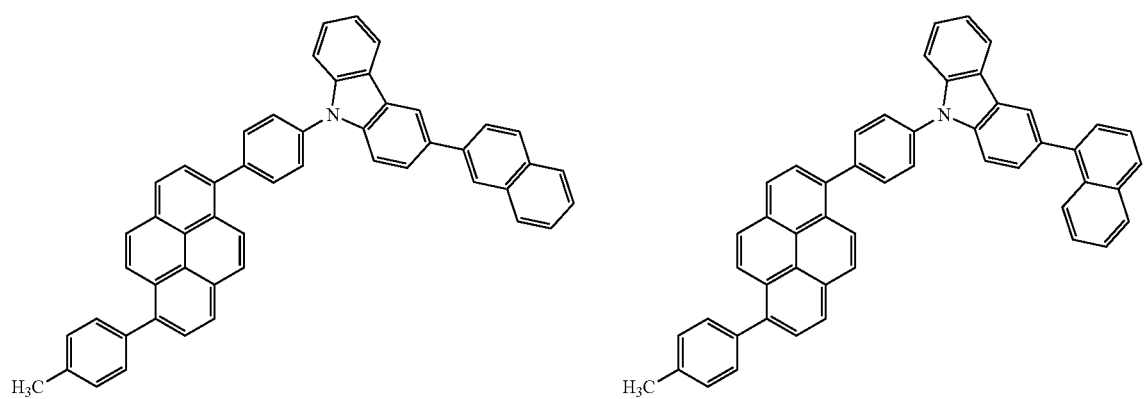
[144]

-continued
[145]
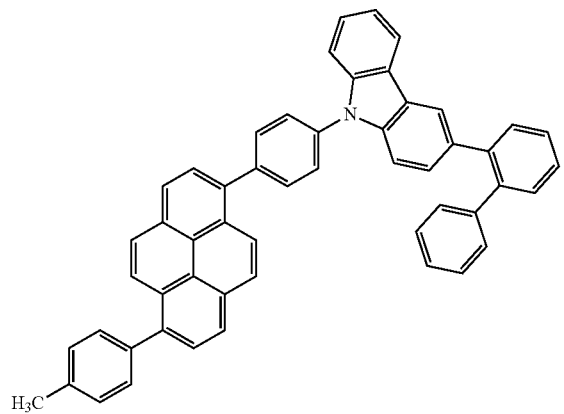
[147]
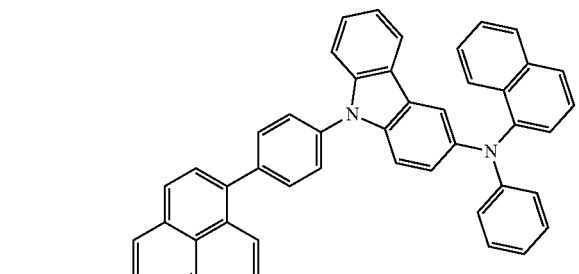
[148]
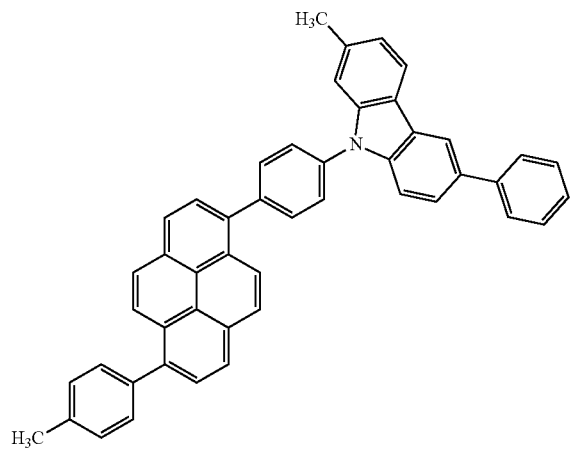
[149]
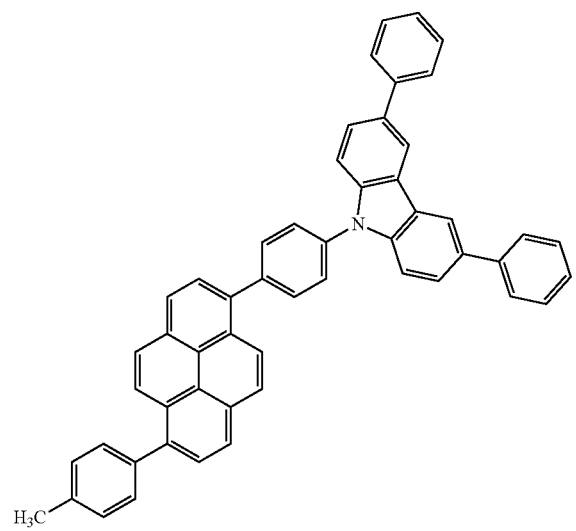
[150]
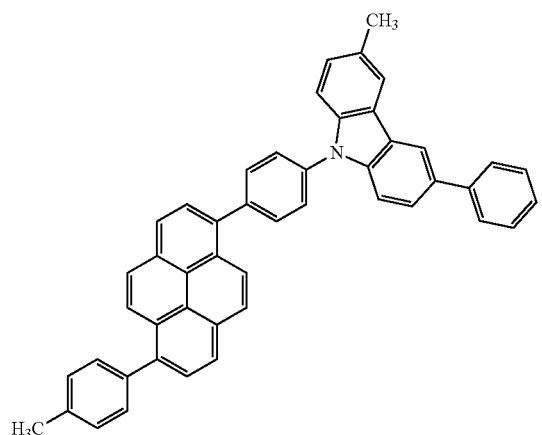
[151]
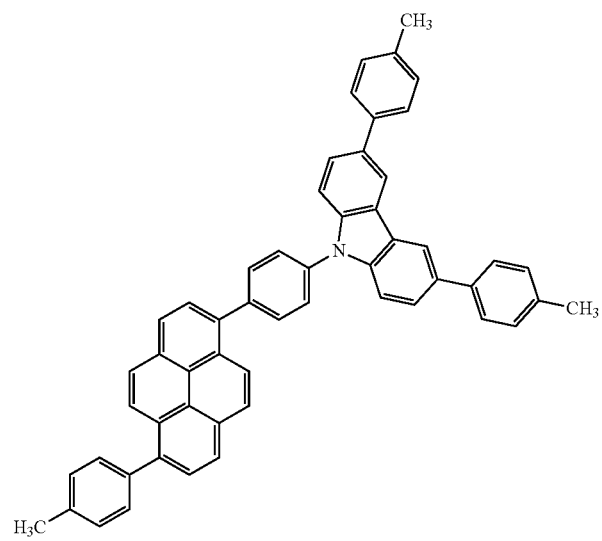

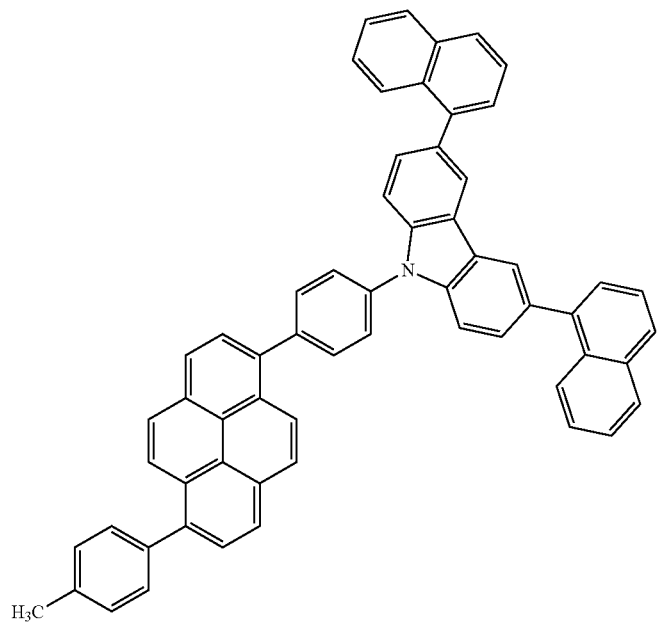
[152]
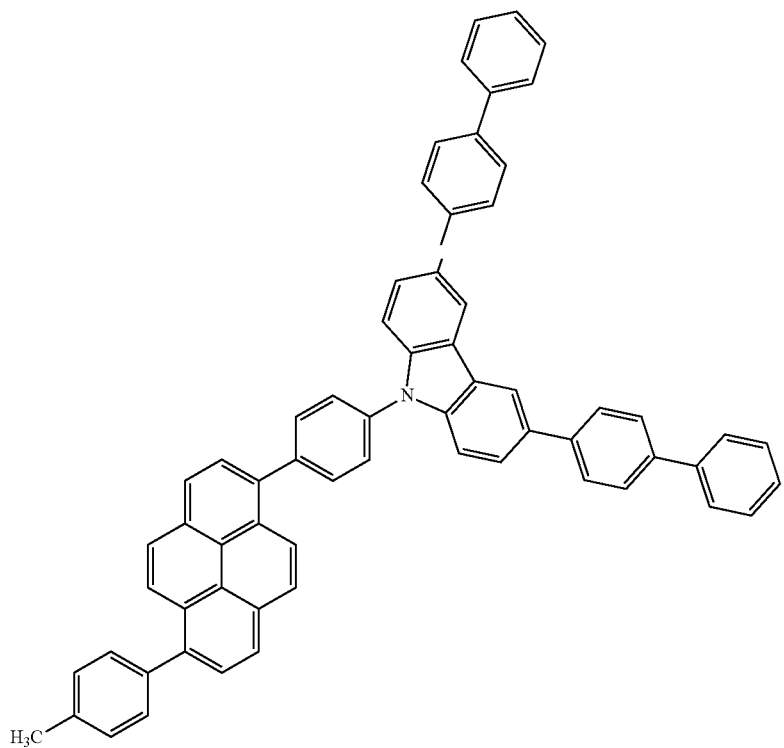
[153]

245
246
-continued
[154]
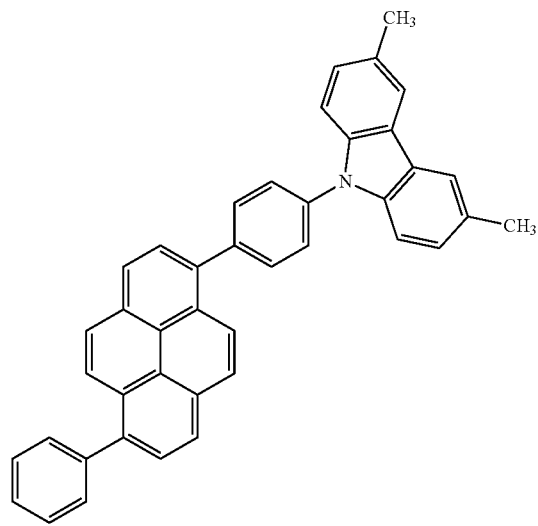
[155]
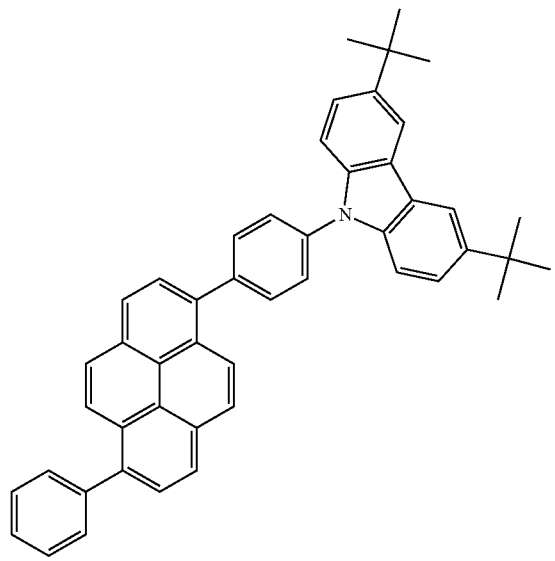
[156]
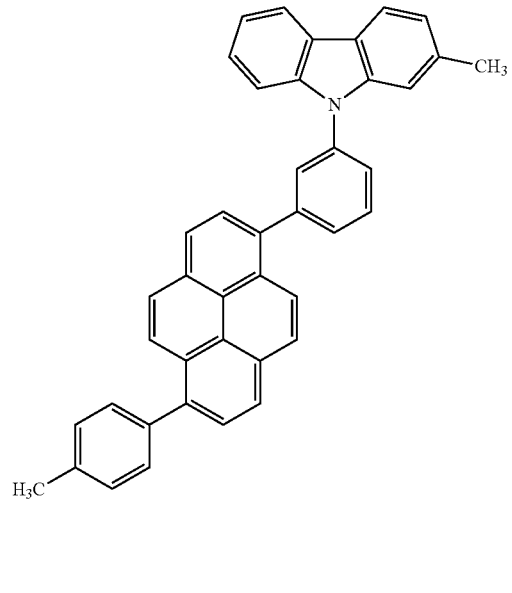
[157]
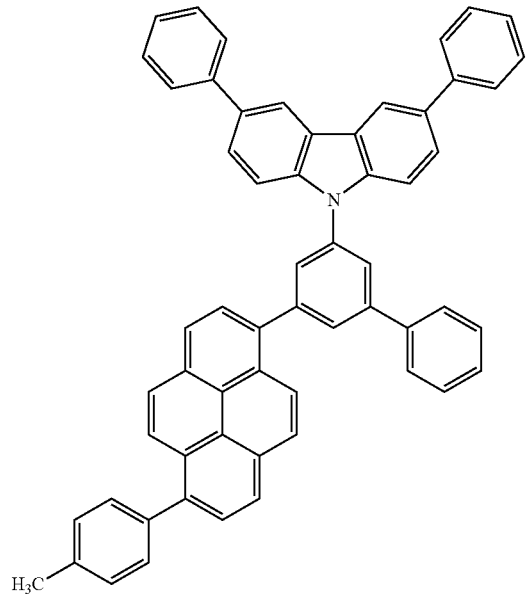

-continued
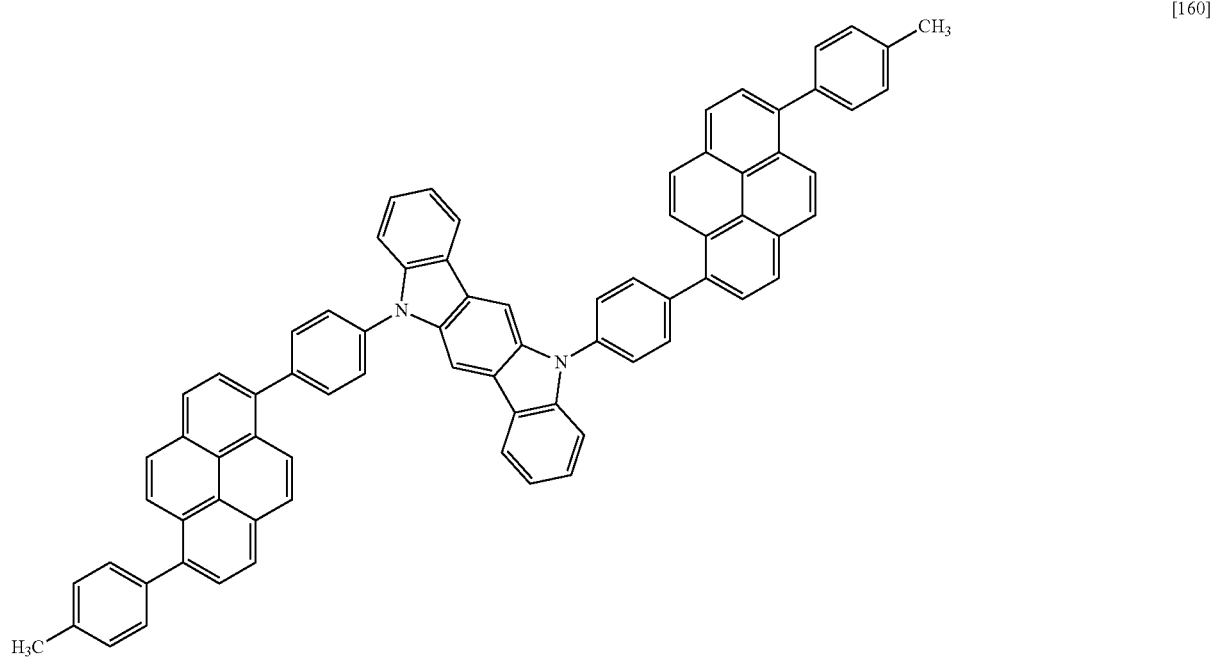
[160]
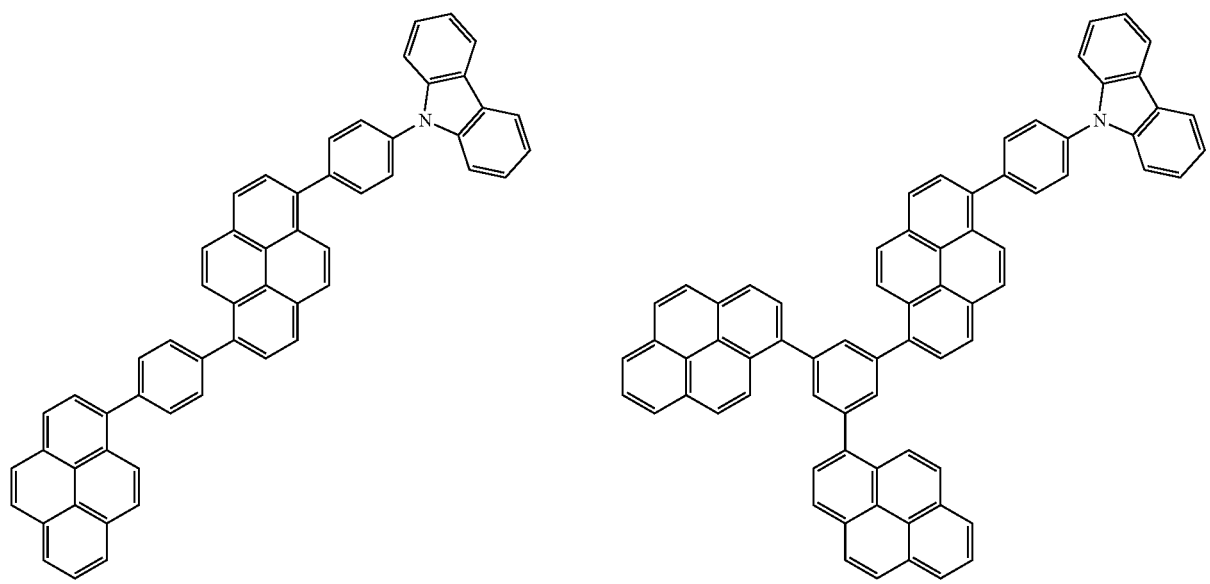
[166] [167]

-continued
[168]
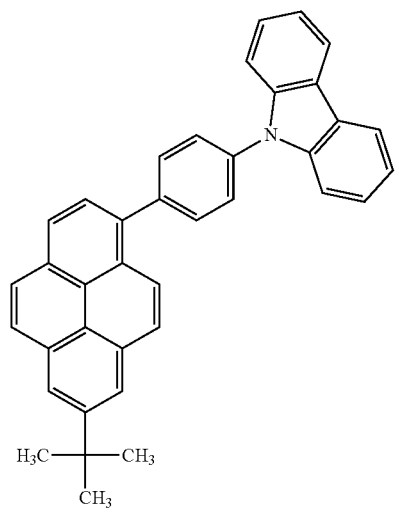
[169]
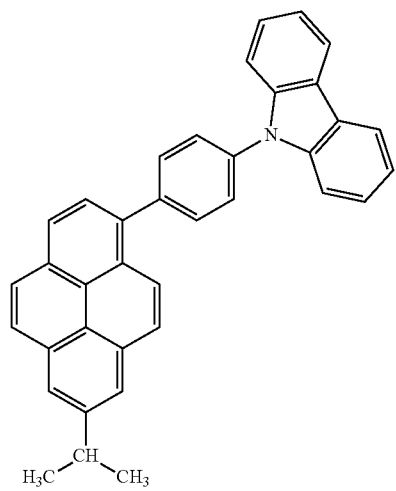
[170]
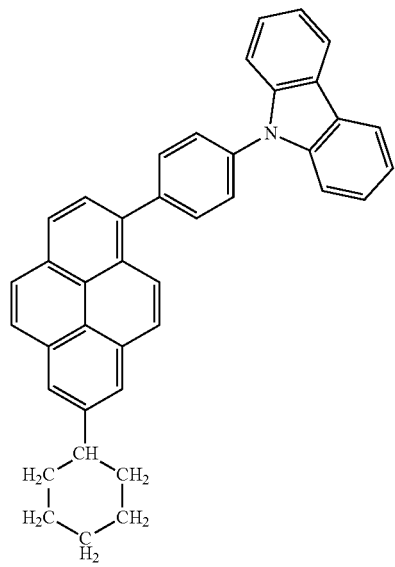
[171]
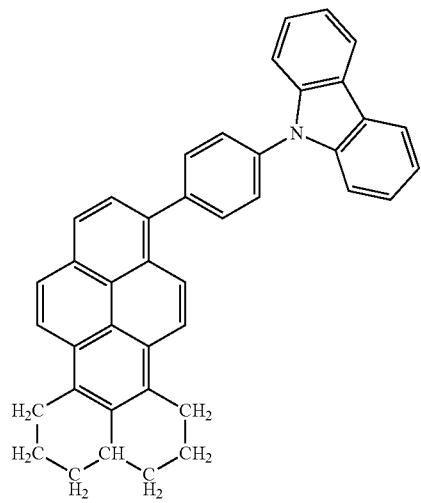
[172]
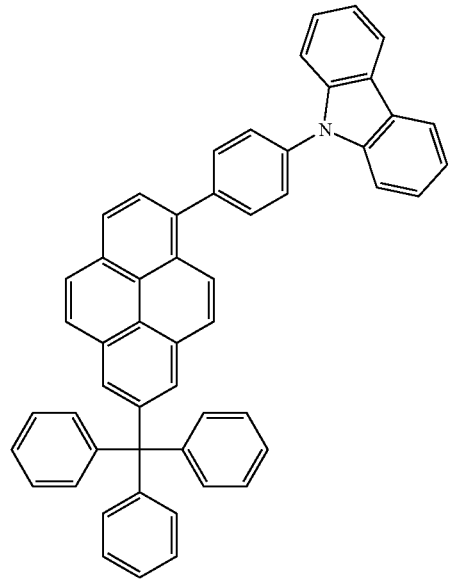
[173]
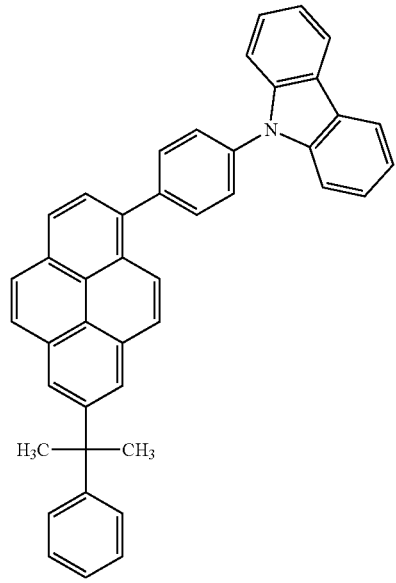

-continued
[174]
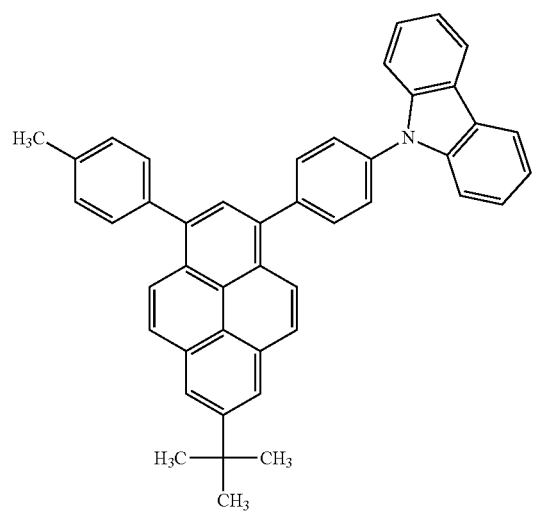
[175]
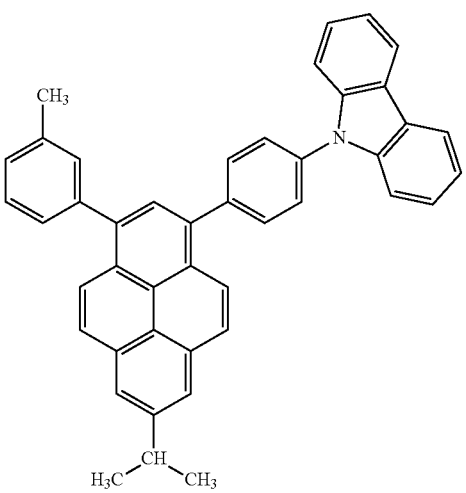
[176]
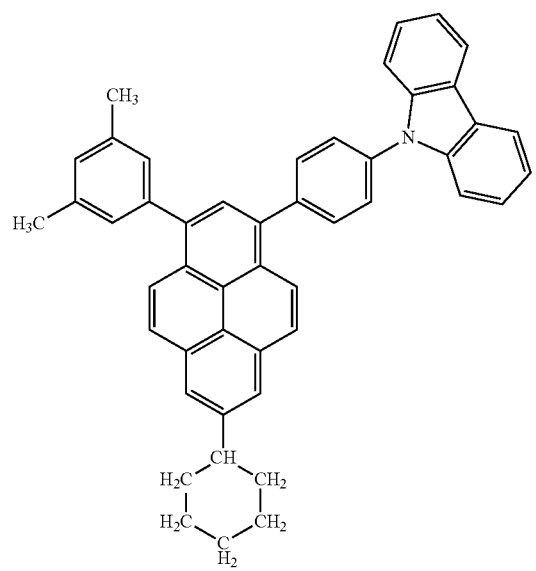
[177]
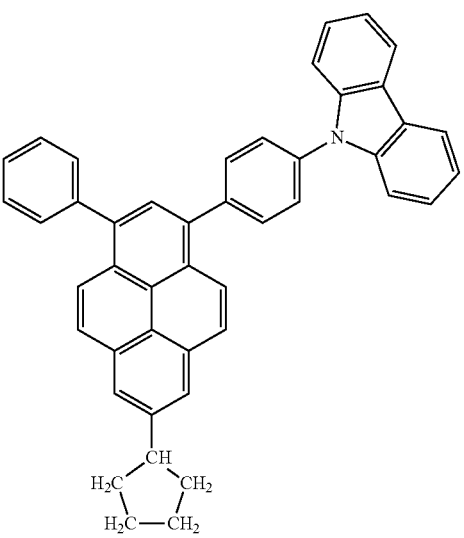
[178]
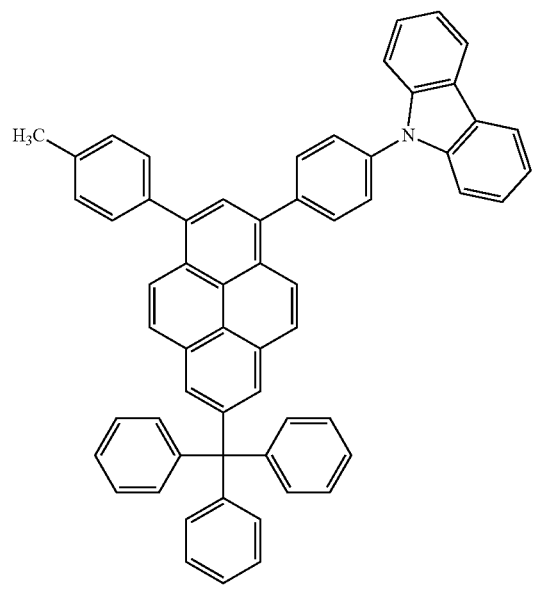
[179]
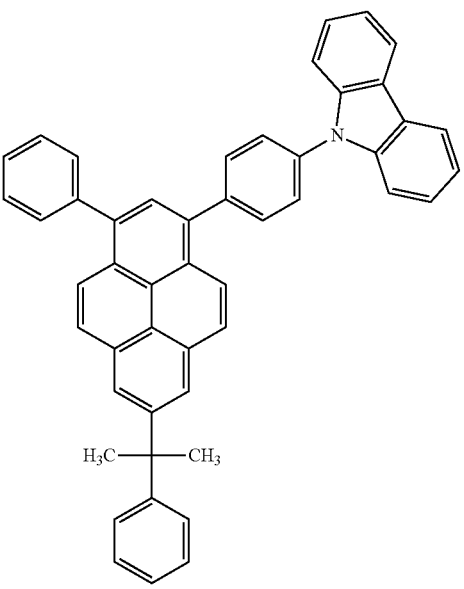

253
[180]
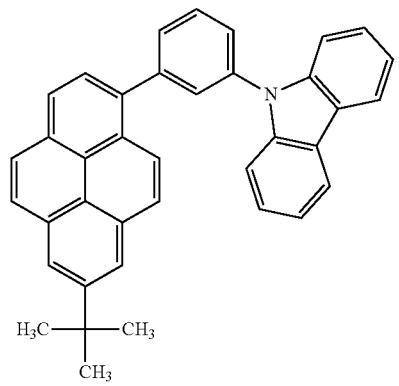
254
[183]
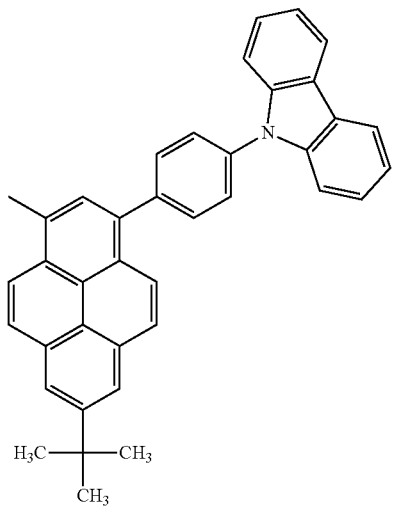
[184]
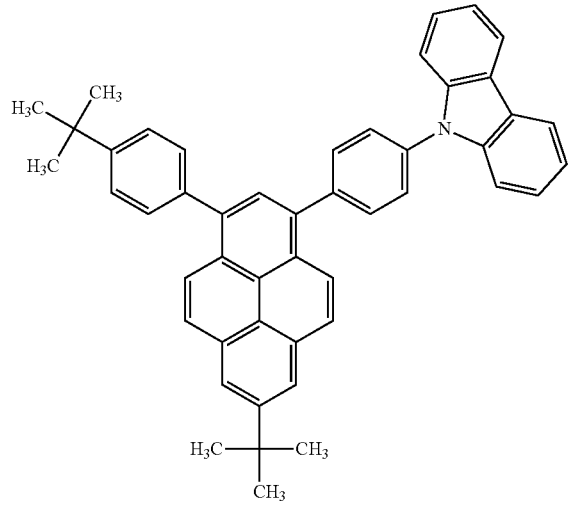
[185]
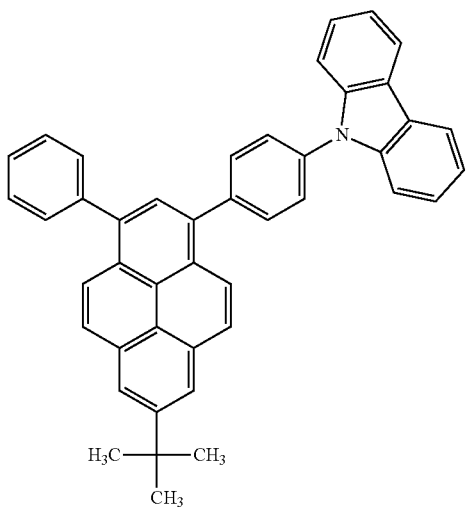
[186]
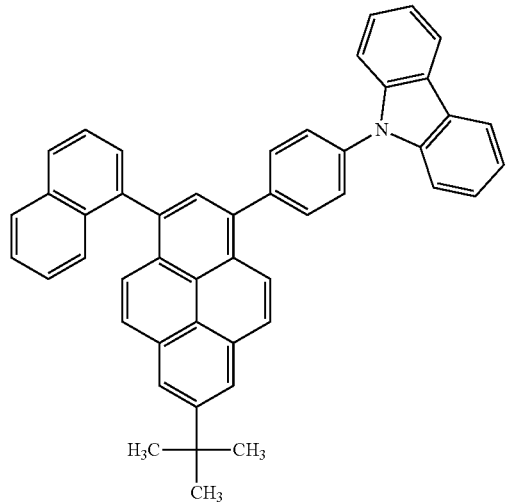
[187]
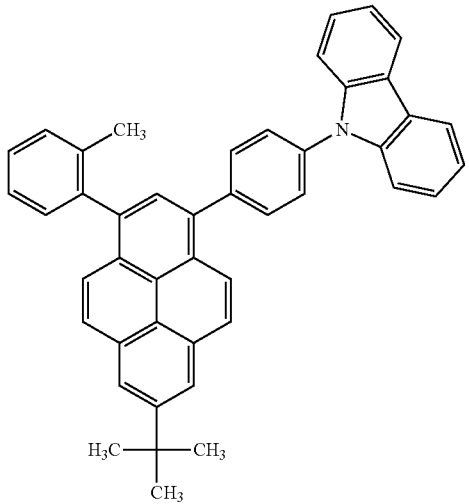

-continued
[188]
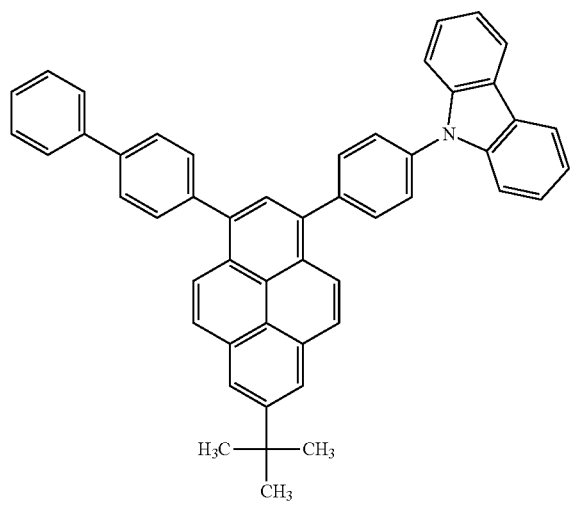
[189]
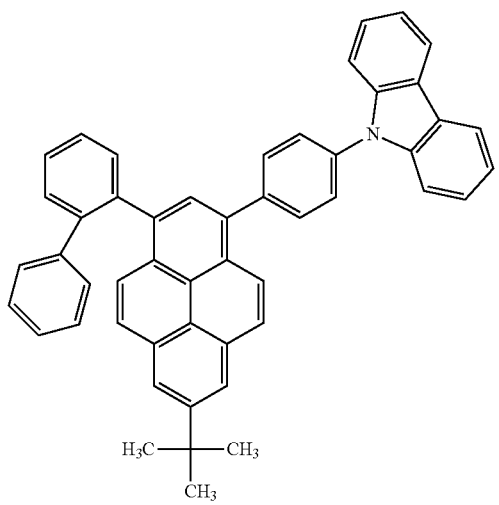
[190]
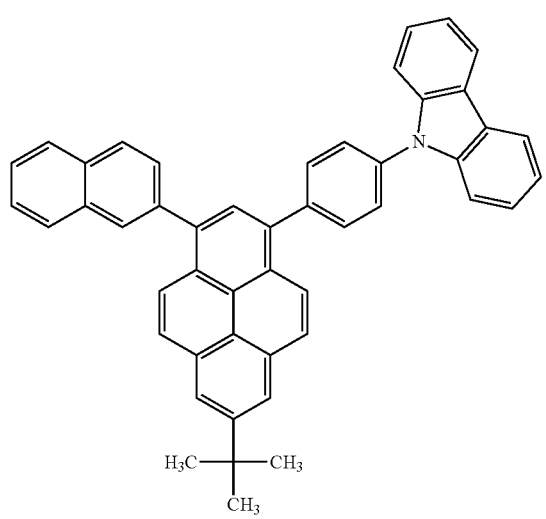
[191]
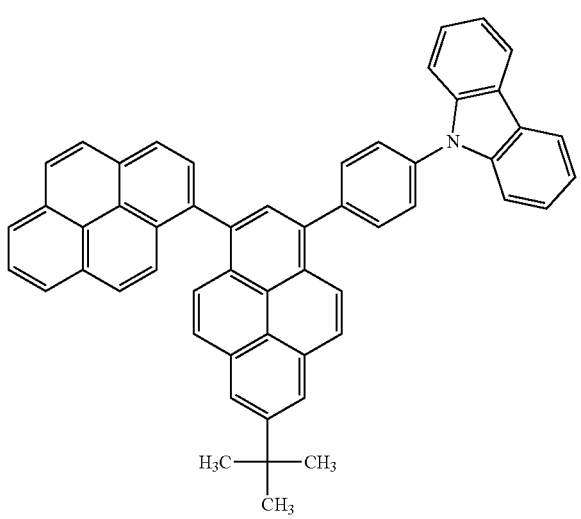
[192]
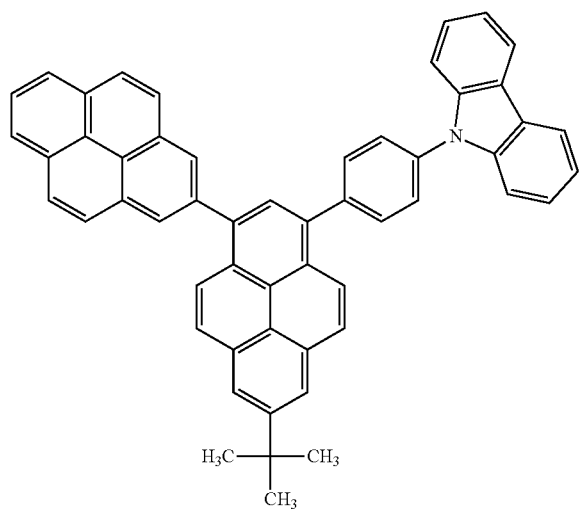
[193]
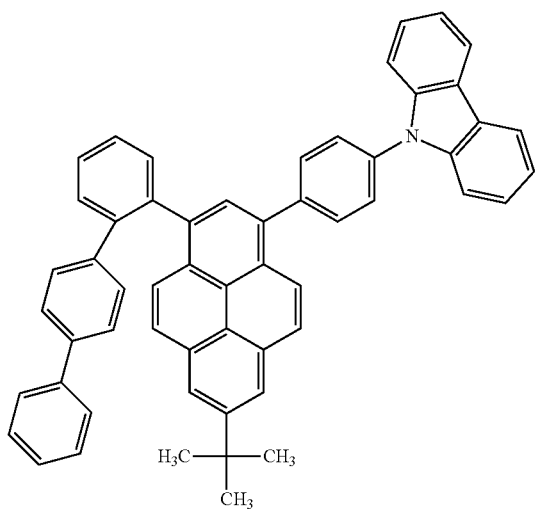

-continued
[194]
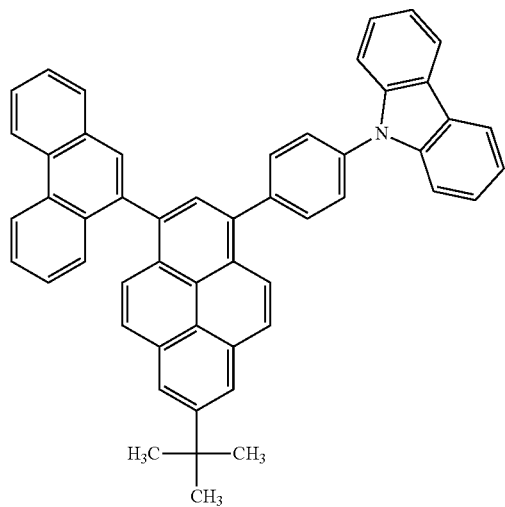
[196]
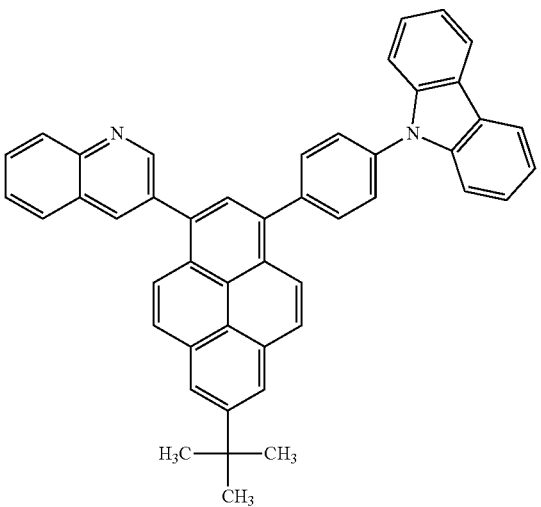
[198]
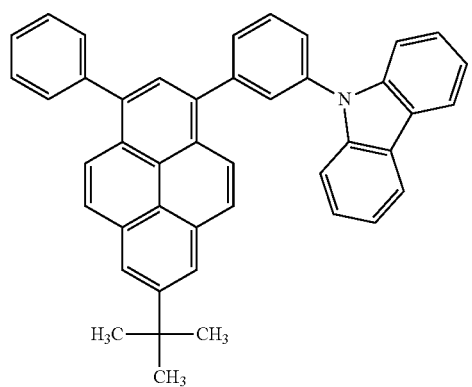
[199]
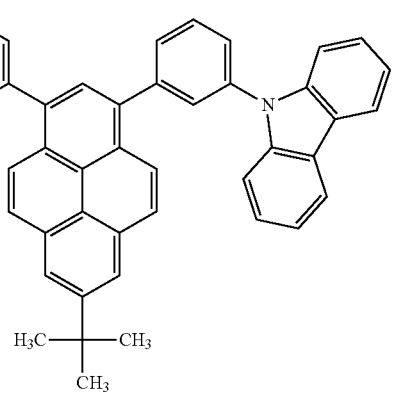
[200]
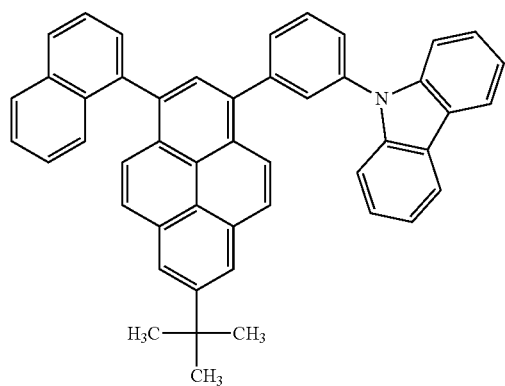
[201]
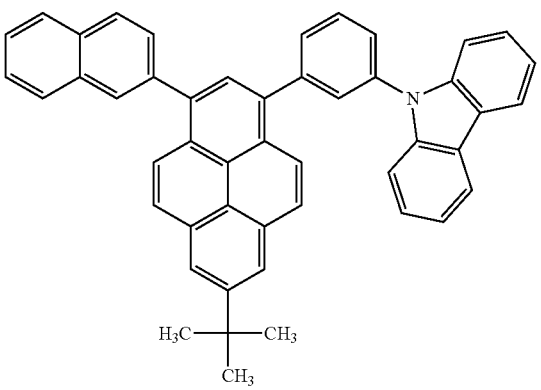

-continued
[202]
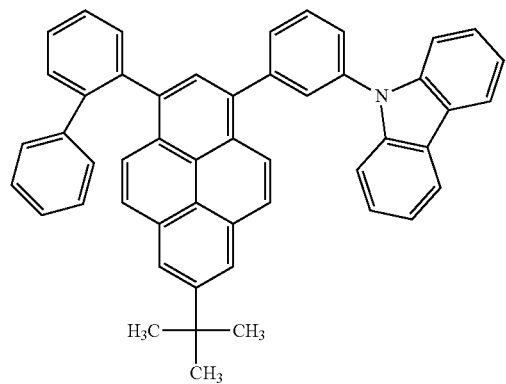
[203]
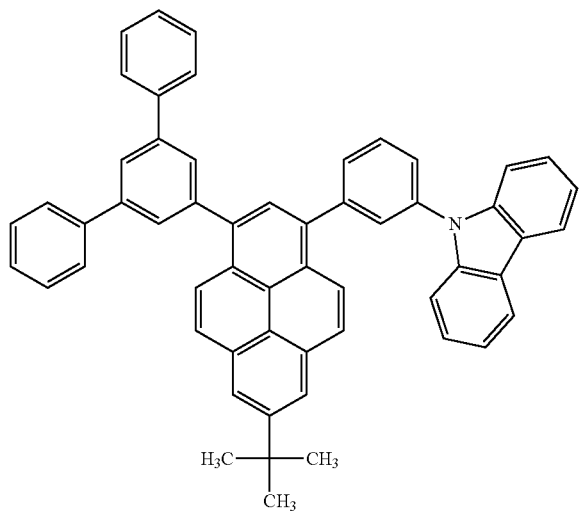
[205]
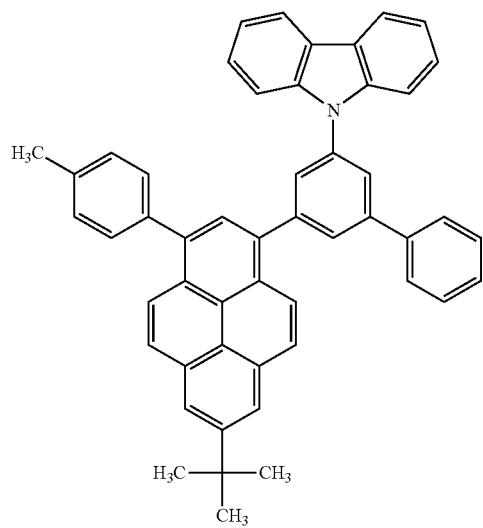
[206]
[207]
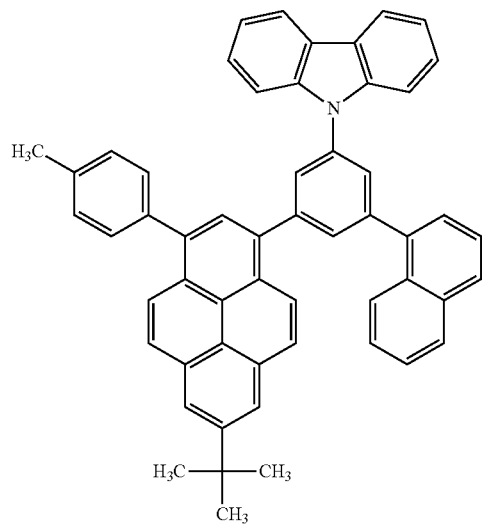
[208]
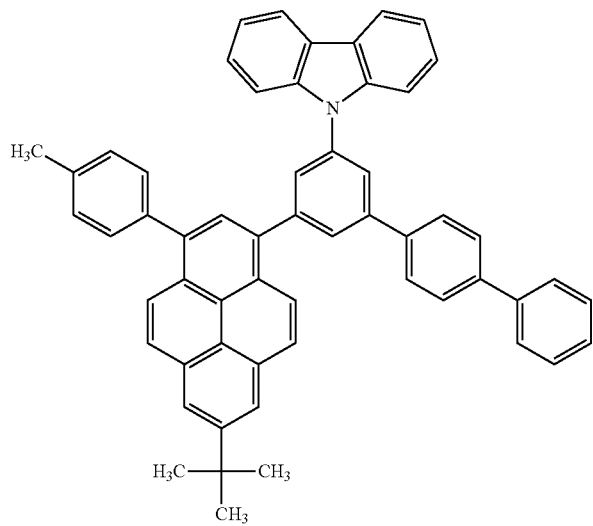

-continued
[209]
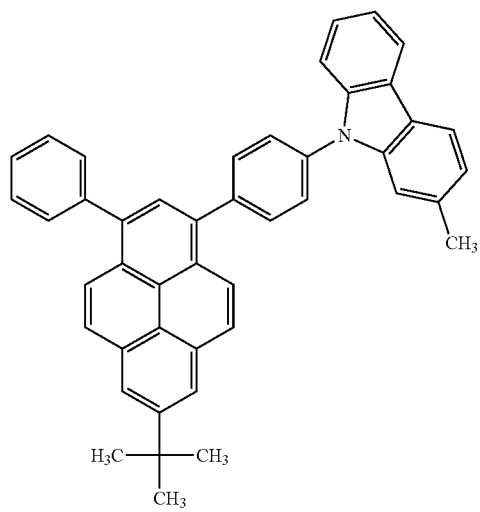
[210]
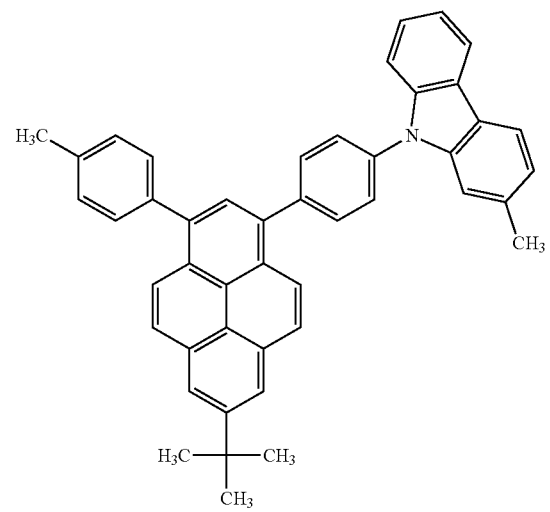
[211]
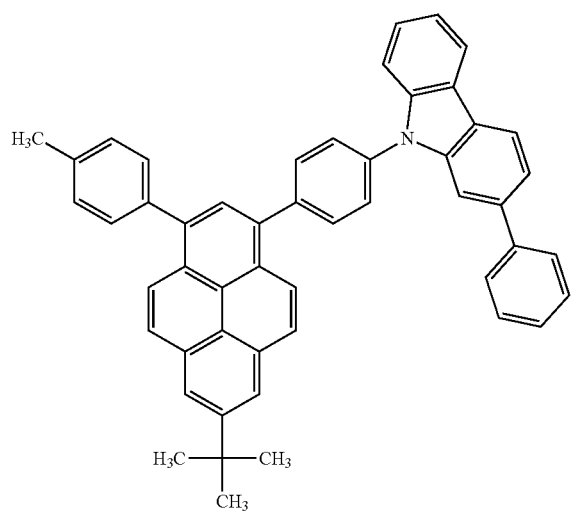
[212]
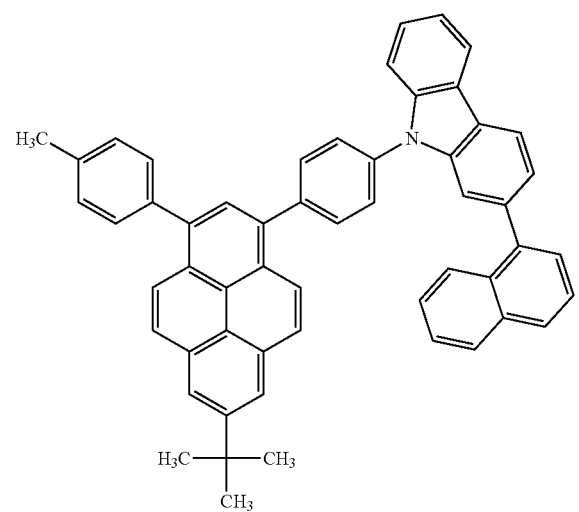
[213]
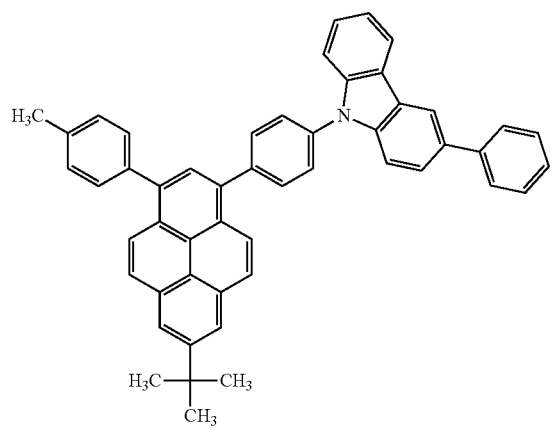
[214]
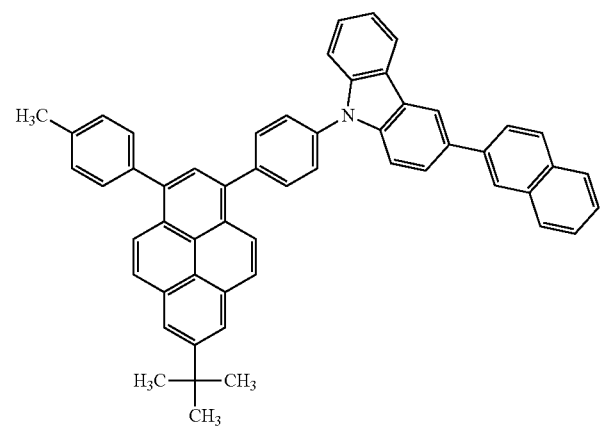

-continued
263
[215]
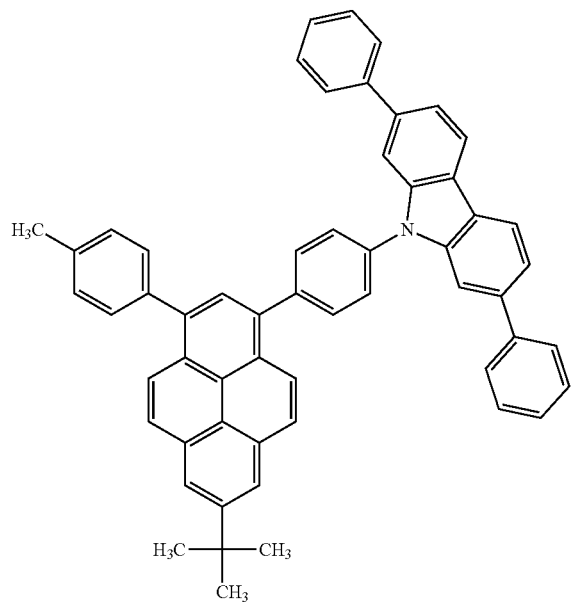
264
[216]
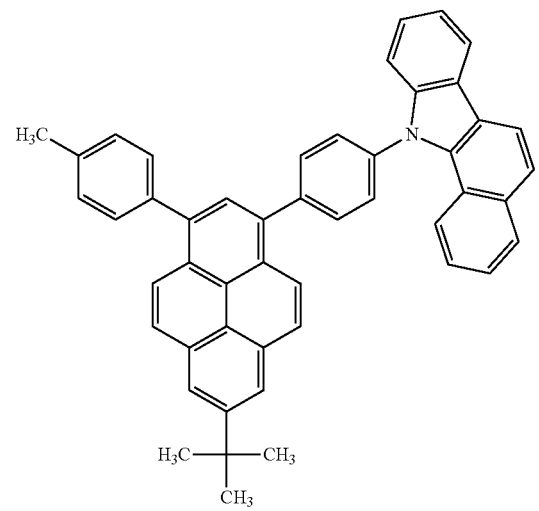
[217]
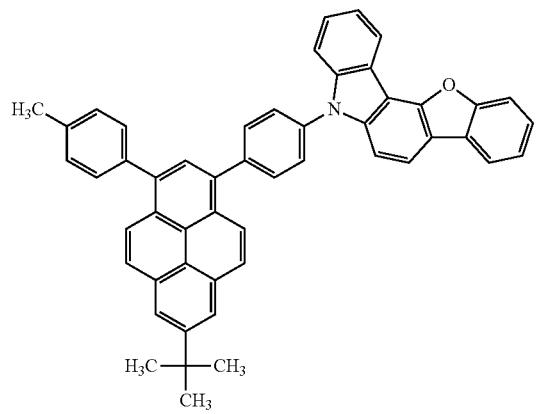
[218]
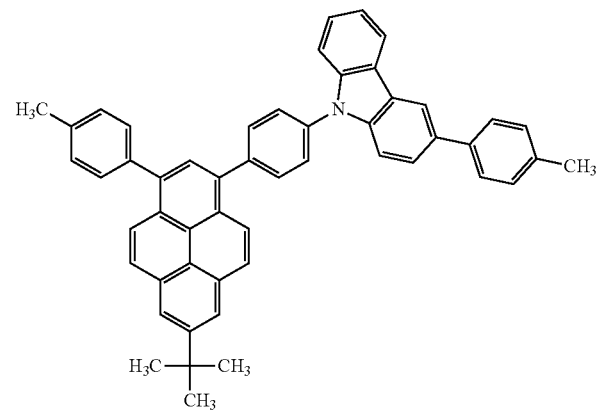
[219]
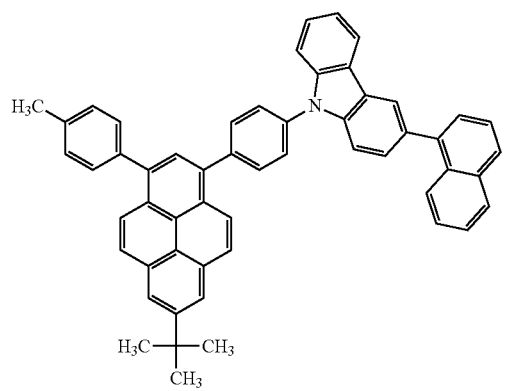
[220]
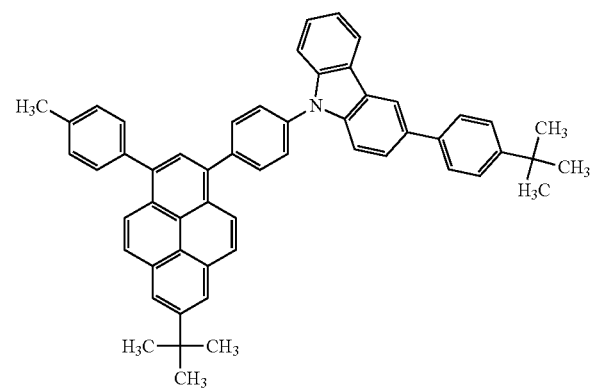

-continued
[221]
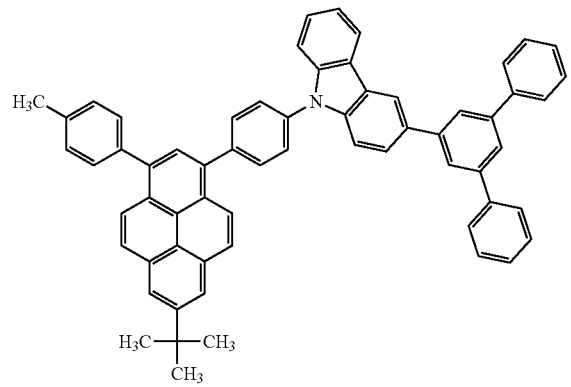
265
[223]
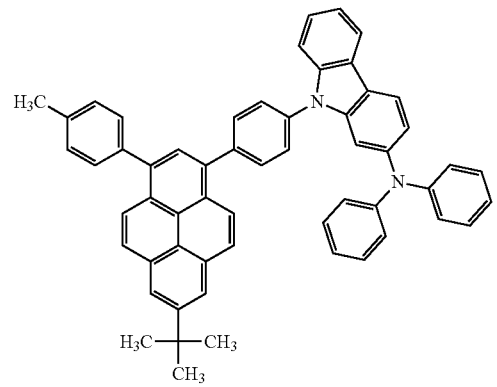
266
[224]
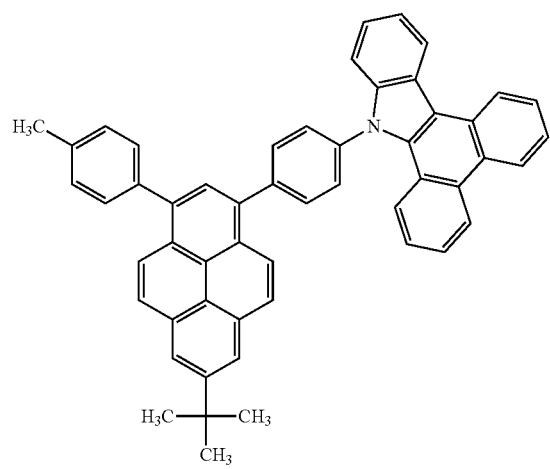
[225]
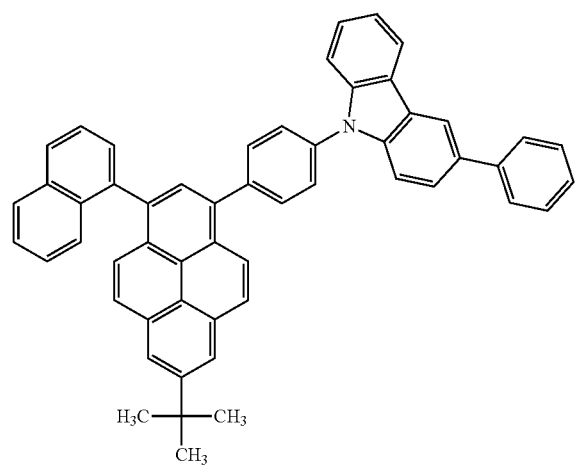
[226]
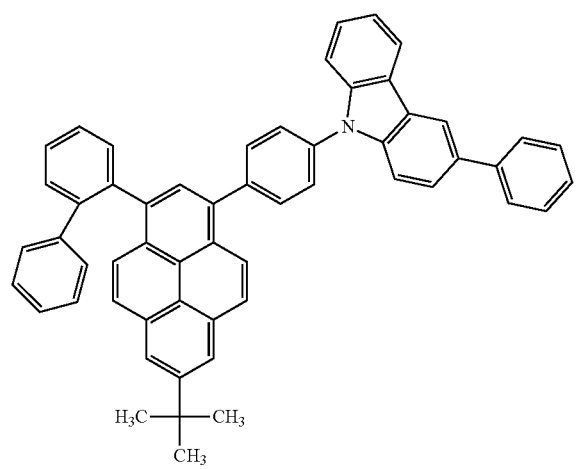
[244]
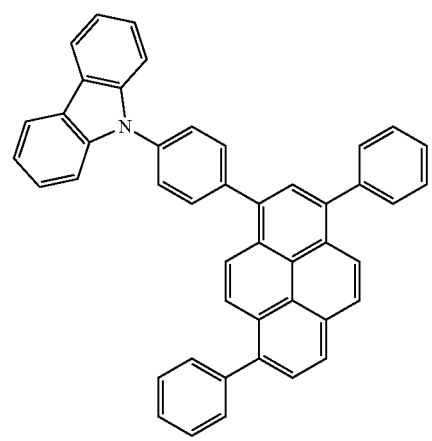

267 268
-continued
[245]
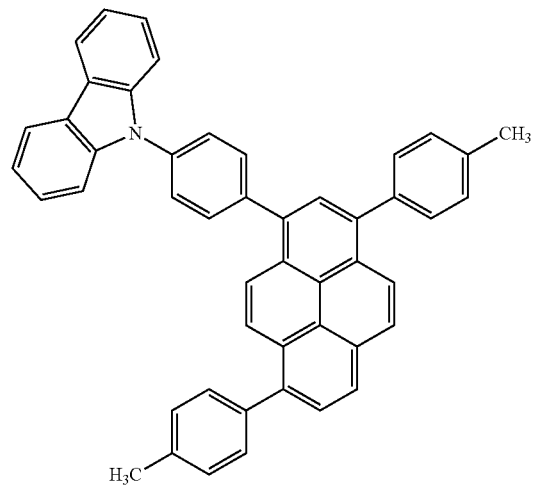
[246]
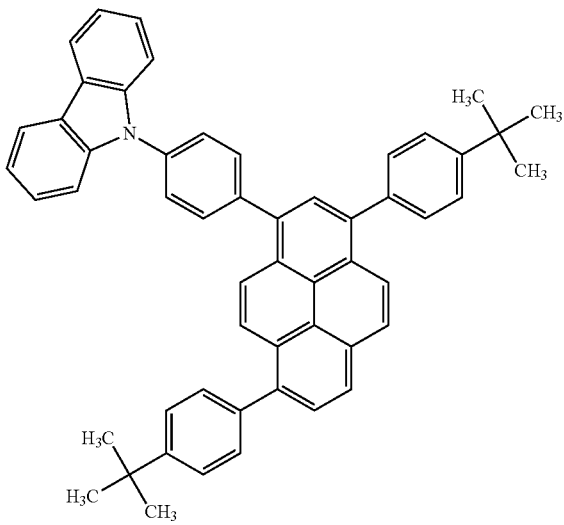
[247]
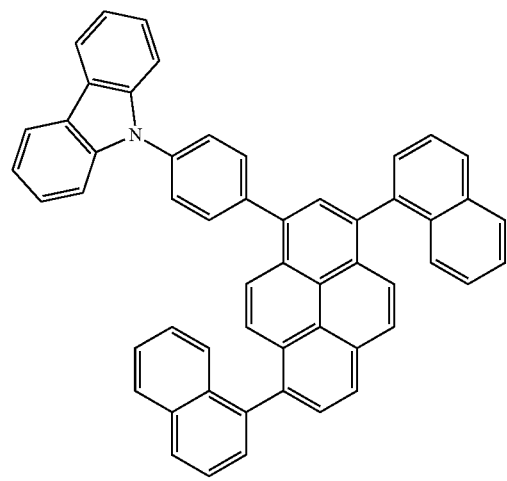
[248]
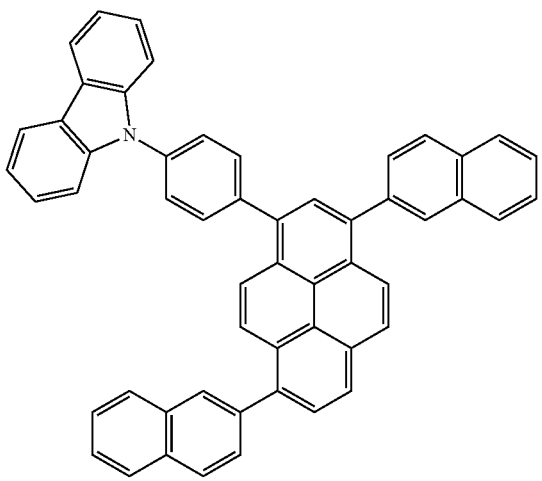
[249]
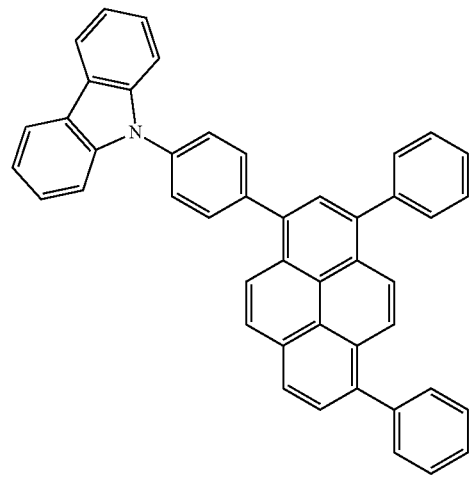
[250]
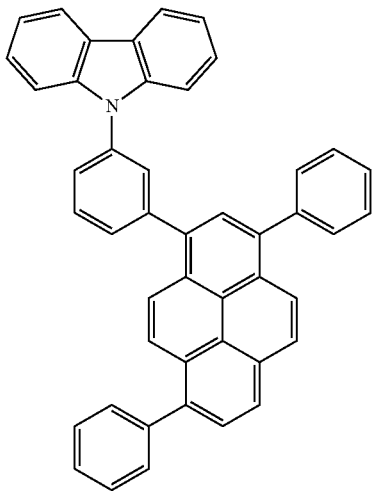

-continued
[251]
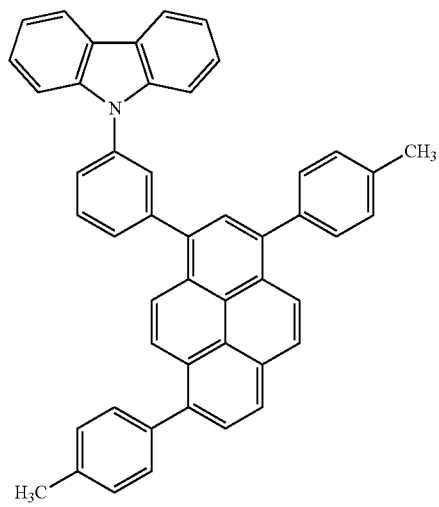
[252]
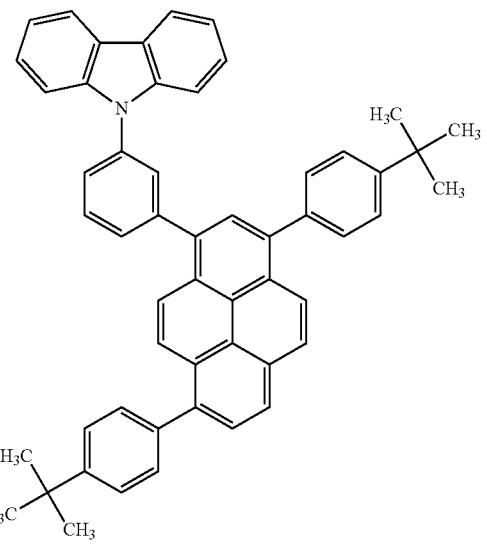
[253]
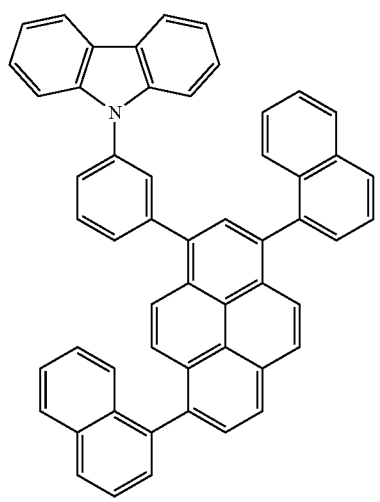
[254]
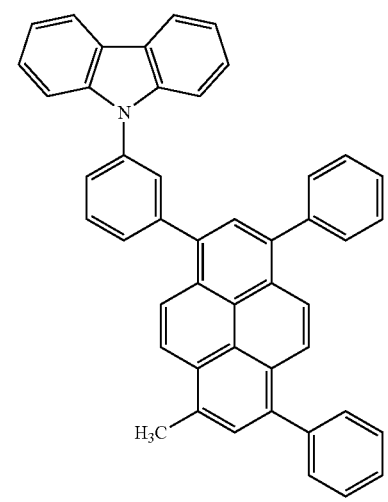
[255]
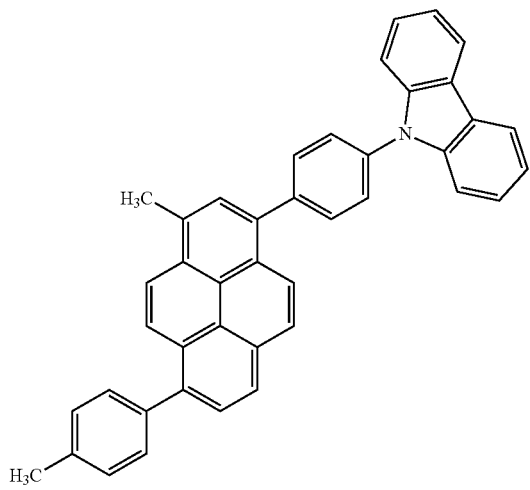
[256]
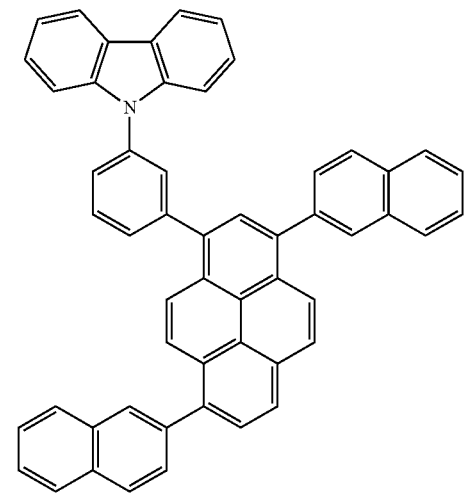

-continued
[257]
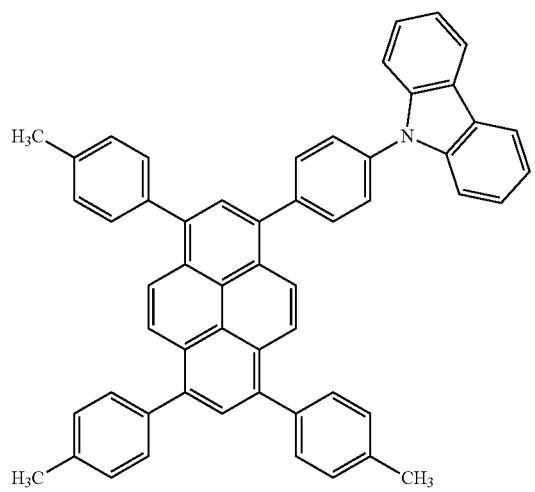
[258]
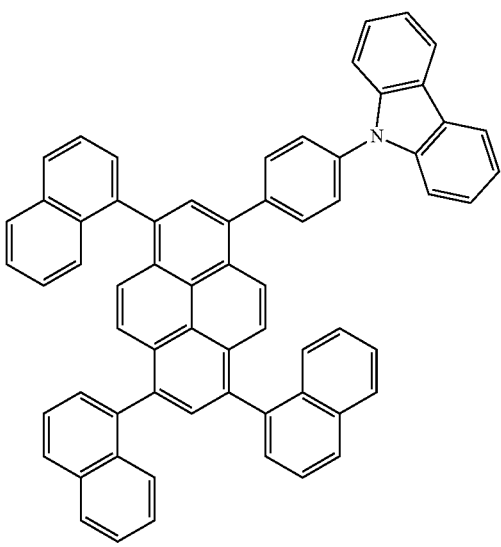
[259]
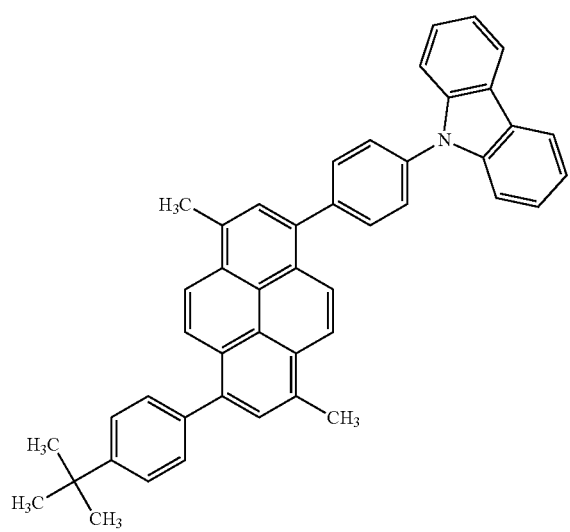
[260]
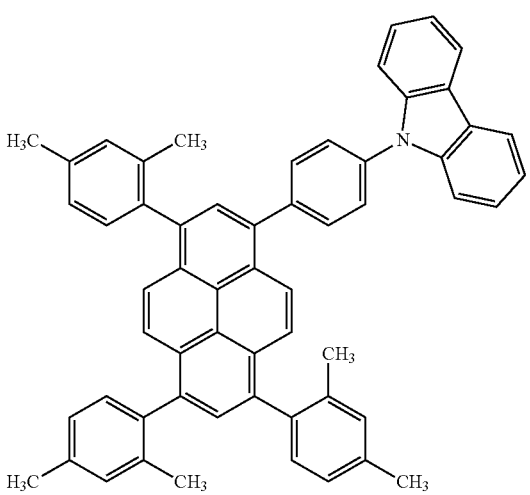
[261]
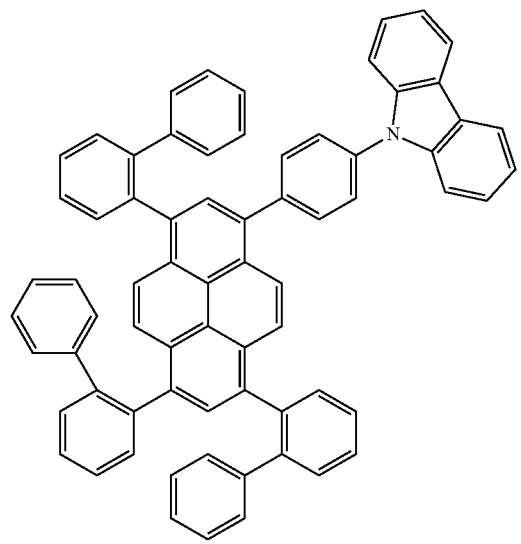
[262]
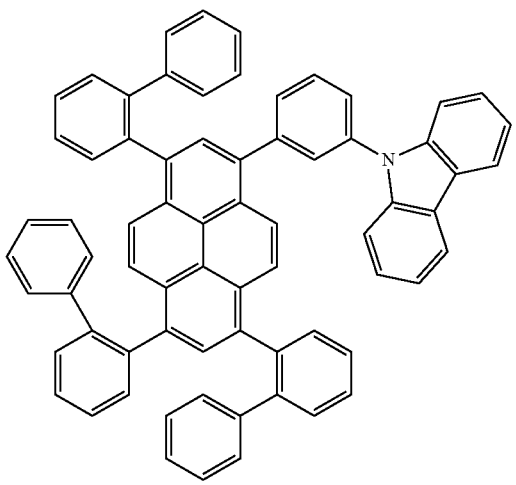

273
[263]
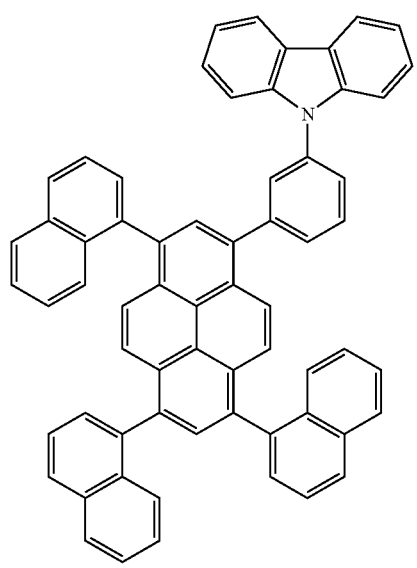
274
[264]
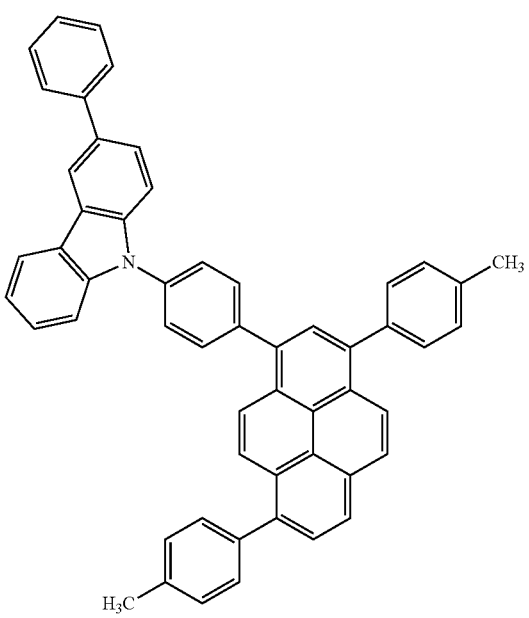
[265]
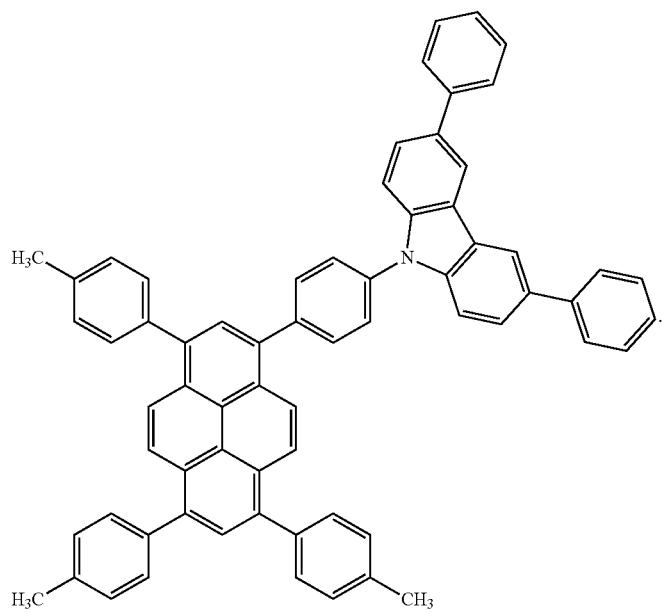
* * * * *